US012740308B2

(12) United States Patent
Jeong et al.

(10) Patent No.: US 12,740,308 B2
(45) Date of Patent: Sep. 15, 2026

(54) ORGANIC LIGHT EMITTING DIODE AND ORGANIC LIGHT EMITTING DEVICE HAVING THEREOF

(71) Applicant: LG DISPLAY CO., LTD., Seoul (KR)

(72) Inventors: Yoo-Jeong Jeong, Paju-si (KR); Han-Sol Park, Paju-si (KR); Ku-Sun Choung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1024 days.

(21) Appl. No.: 17/953,609

(22) Filed: Sep. 27, 2022

(65) Prior Publication Data

US 2023/0172048 A1 Jun. 1, 2023

(30) Foreign Application Priority Data

Nov. 26, 2021 (KR) ........................ 10-2021-0165655

(51) Int. Cl.
*H10K 85/30* (2023.01)
*H10K 50/12* (2023.01)
*H10K 50/125* (2023.01)
*H10K 85/60* (2023.01)

(52) U.S. Cl.
CPC ........... *H10K 85/342* (2023.02); *H10K 50/12* (2023.02); *H10K 50/125* (2023.02); *H10K 85/615* (2023.02); *H10K 85/631* (2023.02); *H10K 85/654* (2023.02); *H10K 85/6572* (2023.02); *H10K 85/6574* (2023.02); *H10K 85/6576* (2023.02)

(58) Field of Classification Search
None
See application file for complete search history.

(56) References Cited

U.S. PATENT DOCUMENTS 10,388,884 B2 * 8/2019 Kaiser .................... H10K 50/11
10,749,113 B2 * 8/2020 Adamovich .......... H10K 85/657
2014/0217378 A1 * 8/2014 Nishimura .......... C07D 491/048 257/40
2014/0306207 A1 * 10/2014 Nishimura .......... H10K 85/6574 252/500
2014/0374711 A1 * 12/2014 Cho ..................... H10K 85/654 257/40
2018/0208836 A1 * 7/2018 Kuma .................. H10K 50/131
2019/0214571 A1 * 7/2019 Huh ..................... H10K 85/654
2019/0245149 A1 * 8/2019 Heo ................... H10K 85/6574
2020/0006657 A1 * 1/2020 Voges .................. C07D 209/86
2020/0052234 A1 * 2/2020 Kum ...................... H10K 50/13
2020/0119285 A1 * 4/2020 No ..................... C07D 491/048
2020/0185633 A1 * 6/2020 Hong ..................... H10K 50/11
2020/0212301 A1 * 7/2020 Montenegro ........ H10K 85/657
2020/0212312 A1 * 7/2020 Kang .................... C07C 211/61
2020/0303651 A1 * 9/2020 Kim ........................ C07F 7/081
2021/0320260 A1 * 10/2021 Jung .................. H10K 85/6572
2022/0123218 A1 * 4/2022 Ha ..................... H10K 85/6572
2022/0209138 A1 * 6/2022 Lee ...................... H10K 85/622
2022/0320442 A1 * 10/2022 Kim ..................... H10K 85/654
2023/0171978 A1 * 6/2023 Choung ............... H10K 85/615 257/40
2023/0171979 A1 * 6/2023 Park ..................... H10K 85/654 257/40
2023/0171980 A1 * 6/2023 Choung ............... H10K 85/626 257/40
2023/0171981 A1 * 6/2023 Park ................... H10K 85/6576 257/40
2023/0172043 A1 * 6/2023 Park ..................... H10K 85/633 257/40
2023/0172044 A1 * 6/2023 Choung ............... H10K 85/654 257/40
2023/0172045 A1 * 6/2023 Choung ............. C07F 15/0033 257/40
2023/0172046 A1 * 6/2023 Choung ............. H10K 85/6572 257/40
2023/0172047 A1 * 6/2023 Jeong ................ H10K 85/6574 257/40
2023/0172049 A1 * 6/2023 Jeong ................ H10K 85/6572 257/40
2023/0172050 A1 * 6/2023 Jeong ................ H10K 85/6574 257/40
2023/0172051 A1 * 6/2023 Jeong .................. H10K 85/654 257/40
2023/0172052 A1 * 6/2023 Park ..................... H10K 85/342 257/40

FOREIGN PATENT DOCUMENTS

WO WO-2018026197 A1 * 2/2018 ............. H10K 50/00

* cited by examiner

*Primary Examiner* — Robert S Loewe
(74) *Attorney, Agent, or Firm* — Morgan, Lewis & Bockius LLP

(57) ABSTRACT

An organic light emitting diode (OLED) in which at least one emitting material layer includes a dopant having a structure represented by Formula 1, $Ir(L_A)_m(L_B)_n$, and a (hetero) aryl-amine-base host and/or an azine-based host, and an organic light emitting device including the OLED. The OLED and the organic light emitting device including the host and the dopant can improve their luminous efficiency and luminous lifespan.

23 Claims, 6 Drawing Sheets

ORGANIC LIGHT EMITTING DIODE AND ORGANIC LIGHT EMITTING DEVICE HAVING THEREOF

CROSS-REFERENCE TO RELATED APPLICATION

This application claims the benefit of and the priority to Korean Patent Application No. 10-2021-0165655, filed in the Republic of Korea on Nov. 26, 2021, which is expressly incorporated hereby in its entirety into the present application.

BACKGROUND

Technical Field

The present disclosure relates to an organic light emitting diode. For example, an organic light emitting diode that may have improved luminous efficiency and luminous lifespan and an organic light emitting device including thereof.

Discussion of the Related Art

A flat display device including an organic light emitting diode (OLED) has attracted attention as a display device that can replace a liquid crystal display device (LCD). The OLED can be formed as a thin organic film less than 2000 Å and the electrode configurations can implement unidirectional or bidirectional images. Also, the OLED can be formed even on a flexible transparent substrate, such as a plastic substrate, so that a flexible or a foldable display device can be realized with ease using the OLED. In addition, the OLED can be driven at a lower voltage and the OLED has advantageous high color purity compared to the LCD.

Since fluorescent material uses only singlet exciton energy in the luminous process, the related art fluorescent material shows low luminous efficiency. On the contrary, phosphorescent material can show high luminous efficiency since it uses triplet exciton energy as well as singlet exciton energy in the luminous process. However, examples of phosphorescent material include metal complexes, which have short luminous lifespans for commercial use. Therefore, there remains a need to develop a luminous compound or an organic light emitting diode that may enhance luminous efficiency and luminous lifespan.

SUMMARY

Accordingly, embodiments of the present disclosure are directed to an organic light emitting diode and an organic light emitting device that substantially obviate one or more of the problems due to the limitations and disadvantages of the related art.

An aspect of the present disclosure is to provide an organic light emitting diode that may have improved luminous efficiency and luminous lifespan. Another aspect of the present disclosure is to provide an organic light emitting device including the organic light emitting diode.

Additional features and aspects will be set forth in the description that follows, and in part will be apparent from the description, or may be learned by practice of the disclosed concepts provided herein. Other features and aspects of the disclosed concept may be realized and attained by the structure particularly pointed out in the written description, or derivable therefrom, and the claims hereof as well as the appended drawings.

To achieve these and other aspects of the disclosed concepts, as embodied and broadly described, in one aspect, the present disclosure provides an organic light emitting diode that includes a first electrode; a second electrode facing the first electrode; and an emissive layer disposed between the first and second electrodes and including at least one emitting material layer including a host including a first host having a structure represented by Formula 7, and a second host having a structure represented by Formula 9, and a dopant including an organometallic compound having a structure represented by Formula 1:

wherein:

the Formula 1 is:

[Formula 1]

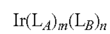

$$Ir(L_A)_m(L_B)_n$$

where in the Formula 1, $L_A$ has a structure represented by Formula 2;

$L_B$ is an auxiliary ligand having a structure represented by Formula 3;

m is 1, 2 or 3;

n is 0, 1 or 2; and m+n is 3;

the Formula 2 is:

[Formula 2]

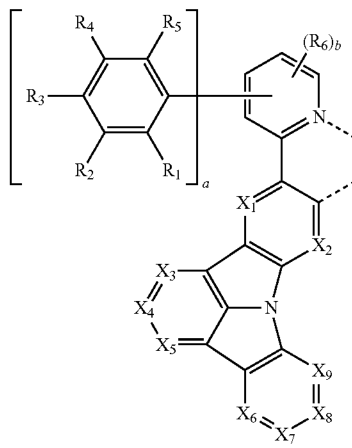

where in the Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently $CR_9$ or N and at least one of $X_6$ to $X_9$ is $CR_9$;

each of $R_1$ to $R_9$ is independently hydrogen, a protium, a deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and where each $R_6$ is identical to or different from each other when b is 2, 3 or 4;

optionally, two adjacent R moieties among $R_1$ to $R_5$, and/or two adjacent $R_6$ when b is 2, 3 or 4, and/or $X_3$ and $X_4$ or $X_4$ and $X_5$, and/or $X_6$ and $X_7$, $X_7$ and $X_8$, or $X_8$ and $X_9$ are further directly or indirectly linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is 0, 1 or 2;

b is 0, 1, 2, 3 or 4, and a+b is no more than 4, the Formula 3 is:

[Formula 3]

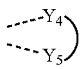

the Formula 7 is:

[Formula 7]

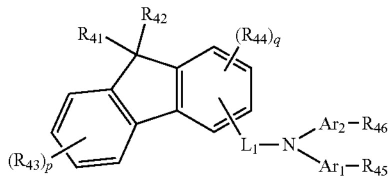

where in the Formula 7, each of $R_{41}$ and $R_{42}$ is independently hydrogen, deuterium, an unsubstituted or substituted $C_1$-$C_{20}$ alkyl, an unsubstituted or substituted $C_6$-$C_{30}$ aryl or an unsubstituted or substituted $C_3$-$C_{30}$ hetero aryl, optionally, each substituent on the substituted $C_6$-$C_{30}$ aryl and substituted $C_3$-$C_{30}$ hetero aryl is independently unsubstituted or further substituted with at least one of $C_6$-$C_{30}$ aryl and $C_3$-$C_{30}$ hetero aryl, optionally, $R_{41}$ and $R_{42}$ are further directly or indirectly linked together to form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the substituted $C_6$-$C_{30}$ aryl, substituted $C_3$-$C_{30}$ hetero aryl, substituted $C_6$-$C_{30}$ aryl amino and substituted $C_3$-$C_{30}$ hetero aryl amino is independently unsubstituted or further substituted with at least one of $C_6$-$C_{30}$ aryl and $C_3$-$C_{30}$ hetero aryl, where each $R_{43}$ is identical to or different from each other when p is 2, 3 or 4 more and each $R_{44}$ is identical to or different from each other when q is 2 or 3;

$L_1$ is a single bond, unsubstituted or substituted $C_6$-$C_{30}$ arylene or unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene forms independently a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3, the Formula 9 is:

[Formula 9]

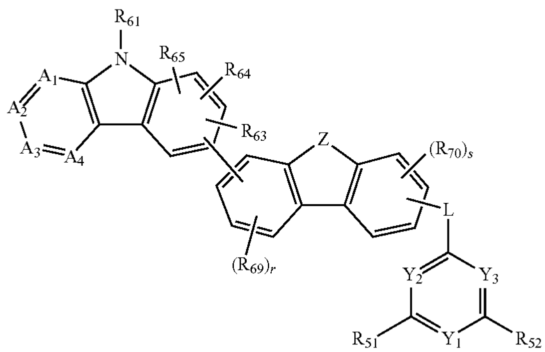

where in the Formula 9, each of $R_{51}$, $R_{52}$ and $R_{61}$ is independently an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl or the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{53}$ or N, where at least one of $Y_1$, $Y_2$ and $Y_3$ is N;

$R_{53}$ is independently a protium, a deuterium, a tritium, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $A_1$ to $A_4$ is independently $CR_{62}$ or N, where at least one of $A_1$ to $A_4$ is $CR_{62}$;

when two adjacent $R_{62}$ and/or two adjacent groups among $R_{63}$ to $R_{65}$ do not form a ring, each of $R_{62}$ to $R_{65}$ is independently a protium, a deuterium, a tritium, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, optionally, two adjacent $R_{62}$ and/or two adjacent R moieties among $R_{63}$ to $R_{65}$ are further directly or indirectly linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

when two adjacent $R_{69}$ when r is an integer of 2 or more and/or two adjacent $R_{70}$ when s is an integer of 2 or more do not form a ring, each of $R_{69}$ and $R_{70}$ is independently hydrogen, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, where each $R_{69}$ is identical to or different from each other when r is 2 or 3 and each $R_{70}$ is identical to or different from each other when s is 2 or 3, optionally, two adjacent $R_{69}$ when r is 2 or 3, and/or two adjacent $R_{70}$ when s is 2 or 3 are further directly or indirectly linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

L is a single bond, an unsubstituted or substituted $C_6$-$C_{30}$ arylene or an unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

Z is O or S; and each of r and s is independently 0, 1, 2 or 3.

The emissive layer may include a single emitting part or multiple emitting parts to form a tandem structure.

In another aspect, the present disclosure provides an organic light emitting diode that includes a first electrode; a second electrode facing the first electrode; and an emissive layer disposed between the first and second electrodes, the emissive layer including a first emitting part disposed between the first and second electrodes and including a blue emitting material layer; a second emitting part disposed between the first emitting part and the second electrode and including at least one emitting material layer; and a first charge generation layer disposed between the first and second emitting parts, wherein the at least one emitting material layer includes a host including a first host having the structure represented by Formula 7, and a second host having the structure represented by Formula 9, and a dopant including an organometallic compound having the structure represented by Formula 1.

In yet another aspect, the present disclosure provides an organic light emitting device. For example, an organic light emitting display device or an organic light emitting illumination device including a substrate and the organic light emitting diode disposed on the substrate.

The organometallic compound as used a dopant includes a metal atom linked (bonded) to a fused hetero aromatic ring ligand including at least 5 rings and a pyridine ring ligand through a covalent bond or a coordination bond. The organometallic compound may be a heteroleptic metal complex including two different bidentate ligands coordinated to the metal atom. The photoluminescence color purity and emission colors of the metal compound may be controlled with ease by combining two different bidentate ligands.

Each of the (hetero) aryl-amine-based compound with a fluorenyl moiety and the azine-based material with a fused hetero aromatic moiety are used as the first host and the second host in the EML, respectively. When the (hetero) aryl-amine-based compound with beneficial hole transportation property and/or the azine-based material with beneficial electron transportation property are used with the organometallic compound, charges and exciton energies may be transferred rapidly from the (hetero) aryl-amine-based material and the azine-based material to the organometallic compound. When an emissive layer includes the organometallic compound as the dopant and the (hetero) aryl-amine-based material and/or the azine-based material as the host, the organic light emitting diode and the organic light emitting device may reduce their driving voltages, and improve their luminous efficiency as well as luminous lifespan.

It is to be understood that both the foregoing general description and the following detailed description are exemplary and explanatory, and are intended to provide further explanation of the disclosed concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
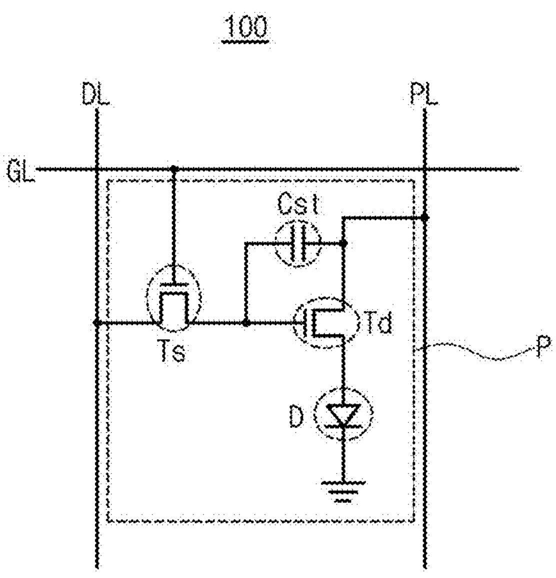
FIG. 1 illustrates a schematic circuit diagram of an organic light emitting display device in accordance with the present disclosure.

Reference will now be made in detail to aspects of the disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, the elements should not be limited by these terms. These terms are used only to identify one element from another. For example, a first element could be termed a second element, and similarly, a second element could be termed a first element, without departing from the scope of the present disclosure.

Although the terms "first," "second," A, B, (a), (b), and the like may be used herein to describe various elements, the elements should not be interpreted to be limited by these terms as they are not used to define a particular order, precedence, or number of the corresponding elements. These terms are used only to identify one element from another.

The expression that an element or layer is "connected" to another element or layer means the element or layer can not only be directly connected to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale in which each of elements is illustrated in the accompanying drawings may differ from an actual scale. Thus, the illustrated elements are not limited to the specific scale in which they are illustrated in the drawings.

The present disclosure relates to an organic emitting diode where at least one emitting material layer includes an organometallic compound with beneficial optical properties and an organic compound with beneficial charge transportation properties and an organic light emitting device including the diode so that the diode and the device can reduce their driving voltages and maximize their luminous efficiency and luminous lifespan. The diode may be applied to an organic light emitting device such as an organic light emitting display device or an organic light emitting illumination device.

FIG. 1 illustrates a schematic circuit diagram of an organic light emitting display device in accordance with the present disclosure. As illustrated in FIG. 1, a gate line GL, a data line DL and power line PL, each of which crosses each other to define a pixel region P, in the organic light emitting display device 100. A switching thin film transistor Ts, a driving thin film transistor Td, a storage capacitor Cst and an organic light emitting diode D are disposed within the pixel region P. The pixel region P may include a red (R) pixel region, a green (G) pixel region and a blue (B) pixel region. However, embodiments of the present disclosure are not limited to such examples.

The switching thin film transistor Ts is connected to the gate line GL and the data line DL. The driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode of the driving thin film transistor Td and one electrode of the storage capacitor Cst through the switching thin film transistor Ts.

The driving thin film transistor Td is turned on by the data signal applied to the gate electrode 130 (FIG. 2) so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
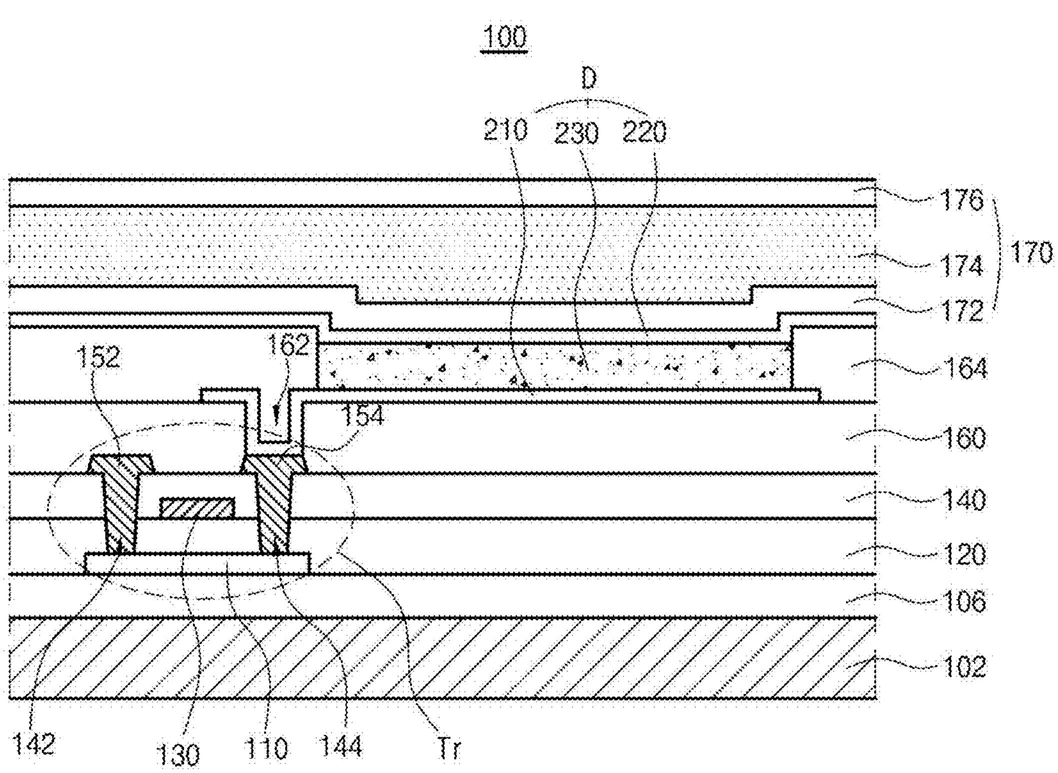
FIG. 2 illustrates a cross-sectional view of an organic light emitting display device as an example of an organic light emitting device in accordance with an example embodiment of the present disclosure.

FIG. 2 illustrates a schematic cross-sectional view of an organic light emitting display device in accordance with an example embodiment of the present disclosure. As illustrated in FIG. 2, the organic light emitting display device 100 includes a substrate 102, a thin-film transistor Tr on the substrate 102, and an organic light emitting diode D connected to the thin film transistor Tr. As an example, the substrate 102 may include a red pixel region, a green pixel region and a blue pixel region and an organic light emitting diode D in each pixel region. Each of the organic light emitting diode D emits red, green or blue light, respectively, and is located correspondingly in the red pixel region, the green pixel region and the blue pixel region.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and/or combinations thereof. The substrate 102, on which the thin film transistor Tr and the organic light emitting diode D are arranged, forms an array substrate.

A buffer layer 106 may be disposed on the substrate 102. The thin film transistor Tr may be disposed on the buffer layer 106. The buffer layer 106 may be omitted. A semiconductor layer 110 is disposed on the buffer layer 106. In one example embodiment, the semiconductor layer 110 may include, but is not limited to, oxide semiconductor materials. In this case, a light-shield pattern may be disposed under the semiconductor layer 110, and the light-shield pattern may prevent or reduce light from being incident toward the semiconductor layer 110, and thereby, preventing or reducing the semiconductor layer 110 from being degraded by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$, wherein $0<x\leq2$) or silicon nitride ($SiN_x$, wherein $0<x\leq2$).

A gate electrode 130 made of a conductive material, such as a metal, is disposed on the gate insulating layer 120 so as to correspond to a center of the semiconductor layer 110. While the gate insulating layer 120 is disposed on a whole area of the substrate 102 as shown in FIG. 2, the gate insulating layer 120 may be patterned identically as the gate electrode 130.

An interlayer insulating layer 140 including an insulating material is disposed on the gate electrode 130 and disposed on an entire surface of the substrate 102. The interlayer insulating layer 140 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose or do not cover a portion of the surface nearer to the opposing ends than to a center of the semiconductor layer 110. The first and second semiconductor layer contact holes 142 and 144 are disposed on opposite sides of the gate electrode 130 and spaced apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other on opposing sides of the gate electrode 130. The source electrode 152 and the drain electrode 154 contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed on the semiconductor layer 110. Alternatively, the thin film transistor Tr may have an inverted staggered structure in which a gate electrode is disposed under a semiconductor layer and a source and drain electrodes are disposed on the semiconductor layer. In this case, the semiconductor layer may include amorphous silicon.

The gate line GL and the data line DL, which cross each other to define a pixel region P, and a switching element Ts, which is connected to the gate line GL and the data line DL, may be further formed in the pixel region P. The switching element Ts is connected to the thin film transistor Tr, which is a driving element. In addition, the power line PL is spaced apart in parallel from the gate line GL or the data line DL. The thin film transistor Tr may further include a storage capacitor Cst configured to constantly keep a voltage of the gate electrode 130 for one frame.

A passivation layer 160 is disposed on the source and drain electrodes 152 and 154. The passivation layer 160 covers the thin film transistor Tr on the whole substrate 102. The passivation layer 160 has a flat top surface and a drain contact hole 162 that exposes or does not cover the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive oxide (TCO). More particularly, the first electrode 210 may include indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and/or the like.

In one example embodiment, when the organic light emitting display device 100 is a bottom-emission type, the first electrode 210 may have a single-layered structure of the TCO. Alternatively, when the organic light emitting display device 100 is a top-emission type, a reflective electrode or a reflective layer may be disposed under the first electrode 210. For example, the reflective electrode or the reflective layer may include, but is not limited to, silver (Ag) or aluminum-palladium-copper (APC) alloy. In the OLED D of the top-emission type, the first electrode 210 may have a triple-layered structure of ITO/Ag/ITO or ITO/APC/ITO.

In addition, a bank layer 164 is disposed on the passivation layer 160 in order to cover edges of the first electrode 210. The bank layer 164 exposes or does not cover a center of the first electrode 210 corresponding to each pixel region. The bank layer 164 may be omitted.

An emissive layer 230 is disposed on the first electrode 210. In one example embodiment, the emissive layer 230 may have a single-layered structure of an emitting material layer (EML). Alternatively, the emissive layer 230 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 3, 5 and 6). In one aspect, the emissive layer 230 may have a single emitting part. Alternatively, the emissive layer 230 may have multiple emitting parts to form a tandem structure.

The emissive layer 230 may include at least one host and a dopant so that the OLED D and the organic light emitting display device may lower their driving voltages and may enhance their luminous efficiency and luminous lifespan.

The second electrode 220 is disposed on the substrate 102 above which the emissive layer 230 is disposed. The second electrode 220 may be disposed on a whole display area. The second electrode 220 may include a conductive material with a relatively low work function value compared to the first electrode 210. The second electrode 220 may be a cathode. For example, the second electrode 220 may include at least one of, and is not limited to, aluminum (Al), magnesium (Mg), calcium (Ca), silver (Ag), alloy thereof, and combinations thereof such as aluminum-magnesium alloy (Al—Mg). When the organic light emitting display device 100 is a top-emission type, the second electrode 220 is thin so as to have light-transmissive (semi-transmissive) property.

In addition, an encapsulation film 170 may be disposed on the second electrode 220 in order to prevent or reduce outer moisture from penetrating into the organic light emitting diode D. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film to reduce reflection of external light. For example, the polarizing plate may be a circular polarizing plate. When the organic light emitting display device 100 is a bottom-emission type, the polarizer may be disposed under the substrate 102. Alternatively, when the organic light emitting display device 100 is a top-emission type, the polarizer may be disposed on the encapsulation film 170. In addition, a cover window may be attached to the encapsulation film 170 or the polarizer. In this case, the substrate 102 and the cover window may have a flexible property, thus the organic light emitting display device 100 may be a flexible display device.

Figure 3:
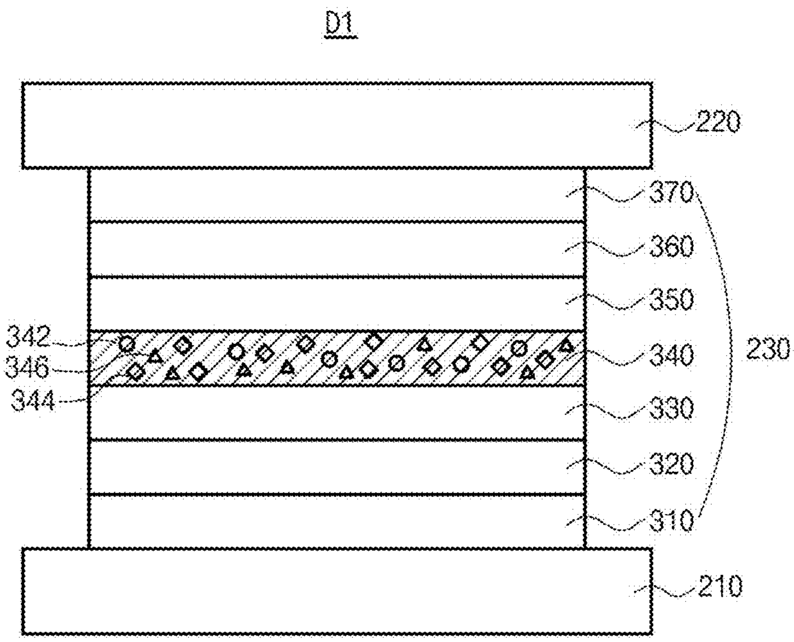
FIG. 3 illustrates a cross-sectional view of an organic light emitting diode having a single emitting part in accordance with an example embodiment of the present disclosure.

Next, the OLED D is described in more detail. FIG. 3 illustrates a schematic cross-sectional view of an organic light emitting diode having a single emitting part in accordance with an example embodiment of the present disclosure. As illustrated in FIG. 3, the organic light emitting diode (OLED) D1 in accordance with the present disclosure includes first and second electrodes 210 and 220 facing each other and an emissive layer 230 disposed between the first and second electrodes 210 and 220. The organic light emitting display device 100 includes a red pixel region, a green pixel region and a blue pixel region, and the OLED D1 may be disposed in the green pixel region.

In an example embodiment, the emissive layer 230 includes an emitting material layer (EML) 340 disposed between the first and second electrodes 210 and 220. Also, the emissive layer 230 may include at least one of an HTL 320 disposed between the first electrode 210 and the EML 340 and an ETL 360 disposed between the second electrode 220 and the EML 340. In addition, the emissive layer 230 may further include at least one of an HIL 310 disposed between the first electrode 210 and the HTL 320 and an EIL 370 disposed between the second electrode 220 and the ETL 360. Alternatively, the emissive layer 230 may further comprise a first exciton blocking layer, i.e. an EBL 330 disposed between the HTL 320 and the EML 340 and/or a second exciton blocking layer, i.e. a HBL 350 disposed between the EML 340 and the ETL 360.

The first electrode 210 may be an anode that provides a hole into the EML 340. The first electrode 210 may include a conductive material having a relatively high work function value, for example, a transparent conductive oxide (TCO). In an example embodiment, the first electrode 210 may include, but is not limited to, ITO, IZO, ITZO, SnO, ZnO, ICO, AZO, and/or the like.

The second electrode 220 may be a cathode that provides an electron into the EML 340. The second electrode 220 may include a conductive material having a relatively low work function values, i.e., a highly reflective material such as Al, Mg, Ca, Ag, and/or alloy thereof and/or combinations thereof such as Al—Mg.

The EML 340 includes a dopant 342 and a first host 344, and optionally a second host 346. A substantial light emission may occur at the dopant 342. The dopant 342 may be an organometallic compound emitting green light and may have a structure represented by Formula 1:

[Formula 1]

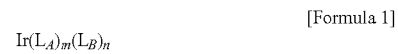

$$Ir(L_A)_m(L_B)_n$$

wherein $L_A$ has a structure represented by Formula 2; $L_B$ is an auxiliary ligand having a structure represented by Formula 3; m is 1, 2 or 3 and n is 0, 1 or 2, wherein m+n is 3;

[Formula 2]

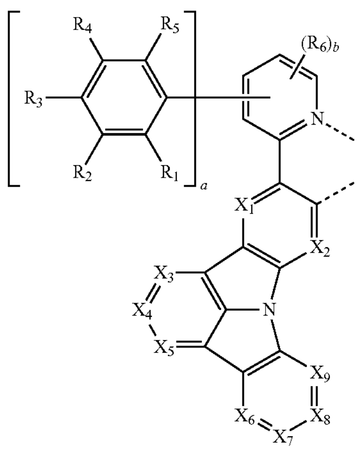

where in the Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently $CR_9$ or N and at least one of $X_6$ to $X_9$ is $CR_9$;

each of $R_1$ to $R_5$ is independently a protium, a deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and where each $R_6$ is identical to or different from each other when b is 2, 3 or 4;

optionally, two adjacent R moieties among $R_1$ to $R_5$, and/or two adjacent $R_6$ when b is 2, 3 or 4, and/or $X_3$ and $X_4$ or $X_4$ and $X_5$, and/or $X_6$ and $X_7$, or $X_7$ and $X_8$, or $X_8$ and $X_9$ are further directly or indirectly linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is 0, 1 or 2;

b is 0, 1, 2, 3 or 4; and a+b is no more than 4,

[Formula 3]

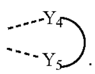

As used herein, the term "unsubstituted" means that a hydrogen atom is directly linked to a carbon atom. "Hydrogen", as used herein, may refer to protium.

As used herein, "substituted" means that the hydrogen is replaced with a substituent. The substituent comprises, but is not limited to, an unsubstituted or deuterium or halogen-substituted $C_1$-$C_{20}$ alkyl, an unsubstituted or deuterium or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "alkyl" refers to a branched or unbranched saturated hydrocarbon group of 1 to 20 carbon atoms, such as methyl, ethyl, or 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, and the like.

As used herein, the term "alkenyl" is a hydrocarbon group of 2 to 20 carbon atoms containing at least one carbon-carbon double bond. The alkenyl group may be substituted with one or more substituents.

As used herein, the term "alicyclic" or "cycloalkyl" refers to a non-aromatic carbon-based ring composed of at least three carbon atoms. Examples of alicyclic groups include, but are not limited to, cyclopropyl, cyclobutyl, cyclopentyl, cyclohexyl, norbornyl, and the like. The alicyclic group may be substituted with one or more substituents.

As used herein, the term "alkoxy" refers to an branched or unbranched alkyl bonded through an ether linkage represented by the formula —O(-alkyl) where "alkyl" is as defined herein. Examples of alkoxy include methoxy, ethoxy, n-propoxy, isopropoxy, butoxy, and tert-butoxy, and the like.

As used herein, the term "alkyl amino" refers to a group represented by the formula —NH(-alkyl) or —N(-alkyl)$_2$ where "alkyl" is as defined herein. Examples of alkyl amino represented by the formula —NH(-alkyl) include, but not limited to, methylamino group, ethylamino group, propylamino group, isopropylamino group, butylamino group, isobutylamino group, (sec-butyl)amino group, (tert-butyl) amino group, pentylamino group, isopentylamino group, (tert-pentyl)amino group, hexylamino group, and the like. Examples of alkyl amino represented by the formula —N(-alkyl)$_2$ include, but not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl) amino group, dihexylamino group, N-ethyl-N-methylamino group, N-methyl-N-propylamino group, N ethyl-N-propylamino group and the like.

As used herein, the term "aromatic" or "aryl" is well known in the art. The term includes monocyclic rings, monocyclic rings linked covalently to each other via a bond, or fused-ring polycyclic groups. An aromatic group may be unsubstituted or substituted. Examples of aromatic or aryl include phenyl, 1-naphthyl, 2-naphthyl, 4-biphenyl, anthracenyl, and phenanthracenyl and the like. Substituents for the aromatic group or the aryl group are as defined herein.

As used herein, the term "alkyl silyl group" refers to any linear or branched, saturated or unsaturated acyclic alkyl, and the alkyl has 1 to 20 carbon atoms. Examples of the alkyl silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, and a phenylsilyl group.

As used herein, the term "halogen" refers to fluorine, chlorine, bromine or iodine atom.

As used herein, the term "hetero" in terms such as "hetero alkyl", "hetero alkenyl", "a hetero alicyclic group", "a hetero aromatic group", "a hetero cycloalkylene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" means that at least one carbon atom, for example 1 to 5 carbons atoms, constituting an aliphatic chain, an alicyclic group or ring or an aromatic group or ring is substituted with at least one hetero atom selected from the group consisting of N, O, S, and P.

As used herein, the term "hetero aromatic" or "hetero aryl" refers to a heterocycle including at least one hetero atom selected from N, O and S in a ring where the ring system is an aromatic ring. The term includes monocyclic rings, monocyclic rings linked covalently to each other via a bond, or fused-ring polycyclic groups. A hetero aromatic group may be unsubstituted or substituted. Examples of hetero aromatic or hetero aryl include pyridyl, pyrrolyl, pyrazinyl, pyrimidinyl, thienyl (alternatively referred to as thiophenyl), thiazolyl, furanyl, imidazolyl, pyrazolyl, triazolyl, tetrazolyl, oxazolyl, oxadiazolyl, and thiadiazolyl.

As used herein, the term "hetero aryl oxy" refers to a group represented by the formula —O-(hetero aryl) where "hetero aryl" is as defined herein.

In one example embodiment, when each of $R_1$ to $R_9$ in Formula 2 is independently a $C_6$-$C_{30}$ aromatic group, each of $R_1$ to $R_9$ may independently be, but is not limited to, a $C_6$-$C_{30}$ aryl group, a $C_7$-$C_{30}$ aryl alkyl group, a $C_6$-$C_{30}$ aryl oxy group and a $C_6$-$C_{30}$ aryl amino group. As an example, when each of $R_1$ to $R_9$ is independently a $C_6$-$C_{30}$ aryl group, each of $R_1$ to $R_9$ may independently be, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl or spiro-fluorenyl. The unfused or fused aryl group may be substituted or unsubstituted. In some embodiments, two adjacent R moieties among $R_1$ to $R_5$ or two adjacent R moieties among $R_7$ to $R_9$ form unfused or fused aryl group that may be substituted or unsubstituted.

Alternatively, when each of $R_1$ to $R_9$ in Formula 2 is independently a $C_3$-$C_{30}$ hetero aromatic group, each of $R_1$ to $R_9$ may independently be, but not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group. As an example, when each of $R_1$ to $R_9$ may independently be a $C_3$-$C_{30}$ hetero aryl group, each of $R_1$ to $R_9$ may independently comprise, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthalzinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzo-thieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl. The unfused or fused aryl group may be substituted or unsubstituted.

As an example, each of the aromatic group or the hetero aromatic group of $R_1$ to $R_9$ may consist of one to three aromatic or hetero aromatic rings. When the number of the aromatic or hetero aromatic rings of $R_1$ to $R_9$ becomes more than four, conjugated structure among the within the whole molecule becomes too long. Thus, the organometallic compound may have too narrow energy bandgap. For example, each of the aryl group or the hetero aryl group of $R_1$ to $R_9$ may comprise independently, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl, or phenothiazinyl.

In one example embodiment, each of the alkyl, the hetero alkyl, the alkenyl, the hetero alkenyl, the alkoxy, the alkyl amino, the alkyl silyl, the alicyclic group, the hetero alicyclic group, the aromatic group and the hetero aromatic group of $R_1$ to $R_9$ may be independently an unsubstituted or substituted with at least one of halogen, $C_1$-$C_{10}$ alkyl, a $C_4$-$C_{20}$ alicyclic group, a $C_3$-$C_{20}$ hetero alicyclic group, a $C_6$-$C_{20}$ aromatic group and a $C_3$-$C_{20}$ hetero aromatic group. In some embodiments, each of the $C_4$-$C_{20}$ alicyclic ring, the $C_3$-$C_{20}$ hetero alicyclic ring, the $C_6$-$C_{30}$ aromatic ring and the $C_3$-$C_{30}$ hetero aromatic ring formed by two adjacent R moieties among $R_1$ to $R_6$, two adjacent $R_8$, and/or two adjacent $R_9$ may independently be unsubstituted or substituted with at least one $C_1$-$C_{10}$ alkyl group.

Alternatively, two adjacent R moieties among $R_1$ to $R_6$, two adjacent $R_8$, and two adjacent $R_9$ may be further directly or indirectly linked together to form an unsubstituted or substituted $C_4$-$C_{30}$ alicyclic ring (e.g., a $C_5$-$C_{10}$ alicyclic ring), an unsubstituted or substituted $C_3$-$C_{30}$ hetero alicyclic ring (e.g. a $C_3$-$C_{10}$ hetero alicyclic ring), an unsubstituted or substituted $C_6$-$C_{30}$ aromatic ring (e.g. a $C_6$-$C_{20}$ aromatic ring) or an unsubstituted or substituted $C_3$-$C_{30}$ hetero aromatic ring (e.g. a $C_3$-$C_{20}$ hetero aromatic ring). The alicyclic ring, the hetero alicyclic ring, the aromatic ring and the hetero aromatic ring formed by two adjacent R moieties among $R_1$ to $R_6$, two adjacent $R_8$, and two adjacent $R_9$ are not limited to specific rings. For example, the aromatic ring or the hetero aromatic ring formed by those groups may comprise, but is not limited to, a benzene ring, a pyridine ring, an indole ring, a pyran ring, or a fluorene ring, each may be unsubstituted or substituted with at least one $C_1$-$C_{10}$ alkyl group. In some embodiments, the aromatic ring or the hetero aromatic ring formed by two adjacent R moieties among $R_1$ to $R_6$, two adjacent $R_8$ or two adjacent $R_9$ may be further directly or indirectly linked together to form an unsubstituted or substituted fused aromatic or heteroaromatic ring. The definitions of the fused aromatic ring and the fused heteroaromatic ring are the same as mentioned above.

The organometallic compound having the structure represented by Formula 1 has a hetero aromatic ligand consisting of at least 5 rings. The organometallic compound may have a rigid chemical conformation so that its conformation is not rotated in the luminous process. Therefore, it may maintain good luminous lifespan. The organometallic compound may have specific ranges of photoluminescence emissions so that its color purity may be improved.

In one example embodiment, each of m and n in Formula 1 may be 1 or 2. When the organometallic compound may be a heteroleptic metal complex including two different bidentate ligands coordinated to the central metal atom, the photoluminescence color purity and emission colors of the organometallic compound may be controlled with ease by combining two different bidentate ligands. In addition, it may be possible to control the color purity and emission peaks of the organometallic compound by introducing various substituents to each of the ligands. Alternatively, m may be 3 and n may be 0 in Formula 1. As an example, the organometallic compound having the structure represented by Formula 1 may emit green color and may improve luminous efficiency of an organic light emitting diode.

As an example, in Formula 2, $X_1$ is $CR_7$, $X_2$ is $CR_7$ or N, each of $X_3$ to $X_5$ is independently $CR_8$ and each of $X_6$ to $X_9$ is independently $CR_9$. That is, each of $X_1$ and $X_3$ to $X_9$ may be independently an unsubstituted or substituted carbon atom.

In one example embodiment, when a is 1 or 2, the phenyl group in Formula 2 may be attached to a meta position of the pyridine ring coordinated to the metal atom and each of $X_1$ and $X_3$ to $X_9$ in Formula 2 may be independently an unsubstituted or substituted carbon atom. Such $L_A$ may have a structure represented by Formula 4A or Formula 4B:

[Formula 4A]

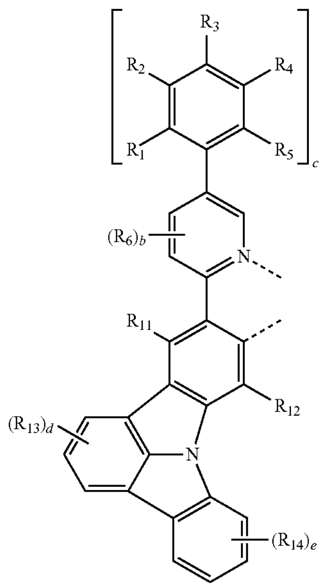

-continued

[Formula 4B]

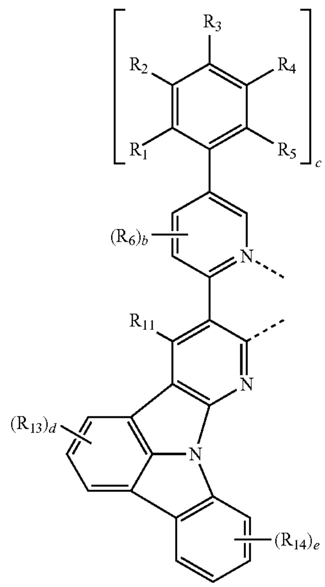

where in the Formulae 4A and 4B, each of $R_1$ to $R_6$ and b is as defined in the Formula 2;

when two adjacent $R_{13}$ when d an integer of 2 or more, and/or two adjacent $R_{14}$ when e is an integer of 2 or more, do not form a ring, each of $R_{11}$ to $R_{14}$ is independently a protium, a deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is 2 or 3, and/or two adjacent $R_{14}$ when e is 2, 3 or 4 are further directly or indirectly linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring when d is 2 or 3 and e is 2, 3 or 4;

c is 0 or 1, and b+c is no more than 4;

d is 0, 1, 2 or 3; and e is 0, 1, 2, 3 or 4.

In another example embodiment, when a is 1 or 2, the phenyl group in Formula 2 may attached to a para position of the pyridine ring coordinated to the metal atom and each of $X_1$ and $X_3$ to $X_9$ in Formula 2 may be independently an unsubstituted or substituted carbon atom. Such $L_A$ may have a structure represented by Formula 4C or Formula 4D:

[Formula 4C]

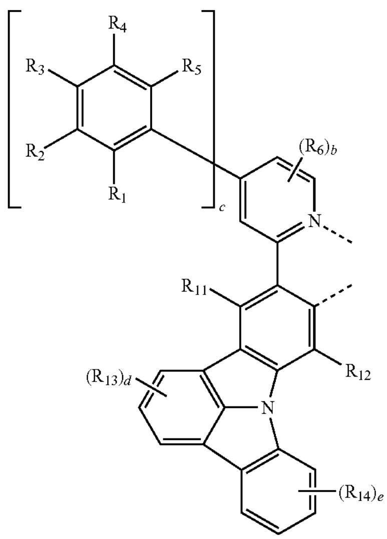

[Formula 4D]

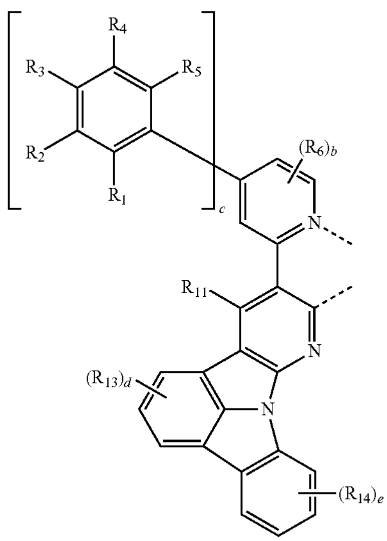

where in the Formulae 4C and 4D, each of $R_1$ to $R_6$ and b is as defined in the Formula 2;

when two adjacent $R_{13}$ when d an integer of 2 or more, and/or two adjacent $R_{14}$ when e is an integer of 2 or more, do not form a ring each of $R_{11}$ to $R_{14}$ is independently a protium, a deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is 2 or 3, and/or two adjacent $R_{14}$ when e is 2, 3 or 4 are further directly or indirectly linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is 0 or 1, and b+c is no more than 4;

d is 0, 1, 2 or 3; and e is 0, 1, 2, 3 or 4.

In one example embodiment, each of the alkyl, the hetero alkyl, the alkenyl, the hetero alkenyl, the alkoxy, the alkyl amino, the alkyl silyl, the alicyclic group, the hetero alicyclic group, the aromatic group and the hetero aromatic group of $R_1$ to $R_6$ and $R_{11}$ to $R_{14}$ in Formulae 4A to 4D may be independently unsubstituted or substituted with at least one of deuterium, tritium, halogen, $C_1$-$C_{10}$ alkyl, a $C_4$-$C_{20}$ alicyclic group, a $C_3$-$C_{20}$ hetero alicyclic group, a $C_6$-$C_{20}$ aromatic group and a $C_3$-$C_{20}$ hetero aromatic group. In some embodiments, each of the $C_4$-$C_{20}$ alicyclic ring, the $C_3$-$C_{20}$ hetero alicyclic ring, the $C_6$-$C_{30}$ aromatic ring and the $C_3$-$C_{30}$ hetero aromatic ring formed by two adjacent R moieties among $R_1$ to $R_6$, two adjacent $R_{13}$, and two adjacent $R_{14}$ in Formulae 4A to 4D may be independently unsubstituted or substituted with at least one $C_1$-$C_{10}$ alkyl group.

In yet another example embodiment, $L_B$ as the auxiliary ligand may be a phenyl-pyridino-based ligand or an acetylacetonate-based ligand. As an example, $L_B$ may have, but is not limited to, the following structure represented by Formula 5A or Formula 5B:

[Formula 5A]

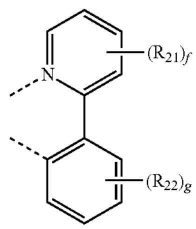

[Formula 5B]

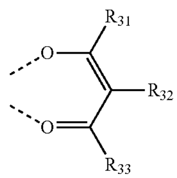

where in the Formulae 5A and 5B, each of $R_{21}$, $R_{22}$ and $R_{31}$ to $R_{33}$ is independently a protium, a deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent $R_{21}$ when f is 2, 3 or 4, and/or two adjacent $R_{22}$ when g is 2, 3 or 4, and/or $R_{31}$ and $R_{32}$ or $R_{32}$ and $R_{33}$ are further directly or indirectly linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring; and each of f and g is 0, 1, 2, 3 or 4.

The substituents of $R_{21}$ to $R_{22}$ and $R_{31}$ to $R_{33}$ or the ring formed by $R_{21}$ to $R_{22}$, $R_{31}$ and $R_{32}$ and/or $R_{32}$ and $R_{33}$ may be identical to the substituents or the ring as described in Formula 2. In one example embodiment, the organometallic compound having the structures represented by Formulae 1 to 5B may include at least one of the following organometallic compounds of Formula 6. In one example embodiment, the organometallic compound having the structures represented by Formulae 1 to 5B may be selected from, but is not limited to, the following organometallic compounds of Formula 6:

[Formula 6]

1

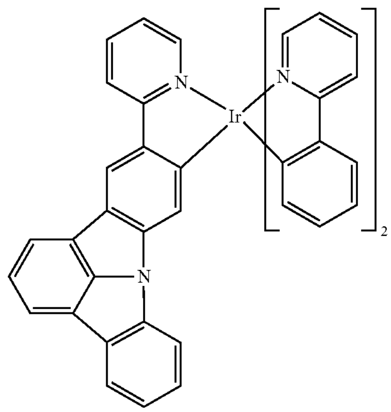

2

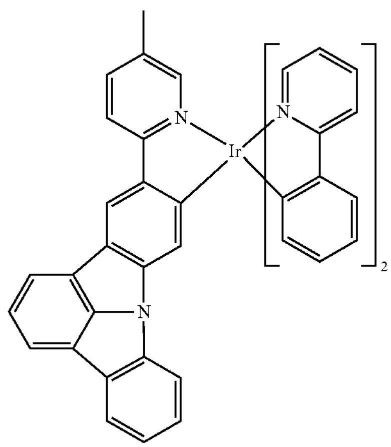

-continued

3

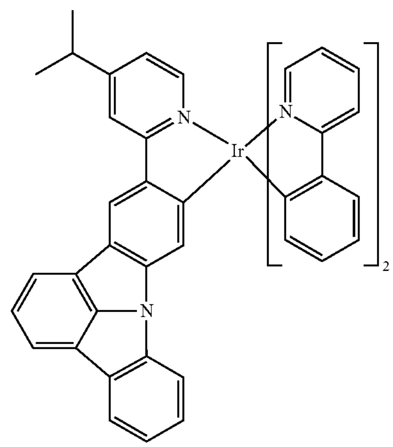

4

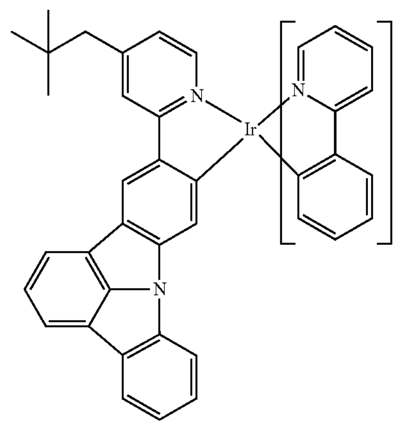

5

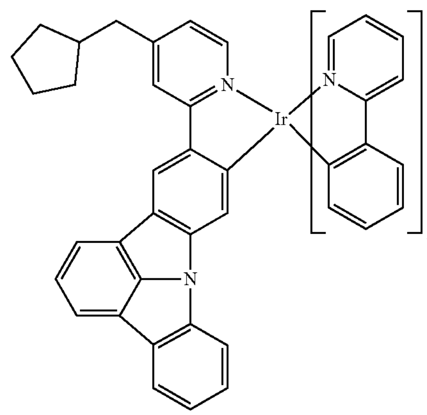

-continued
6
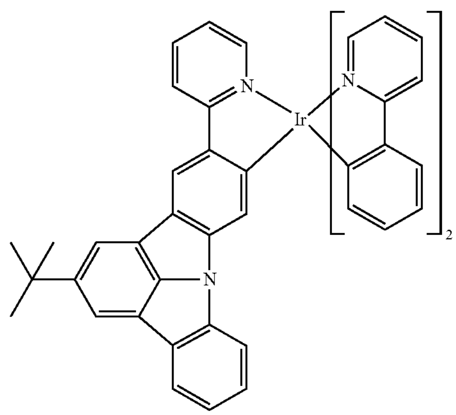
7
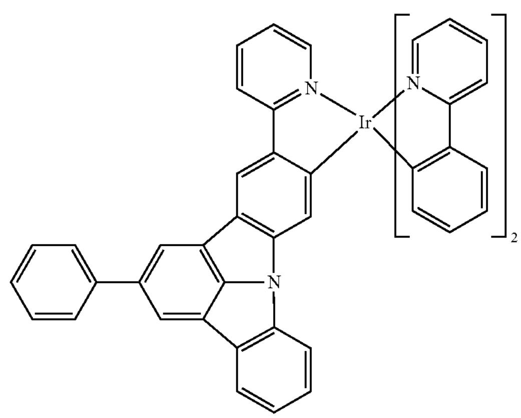
8
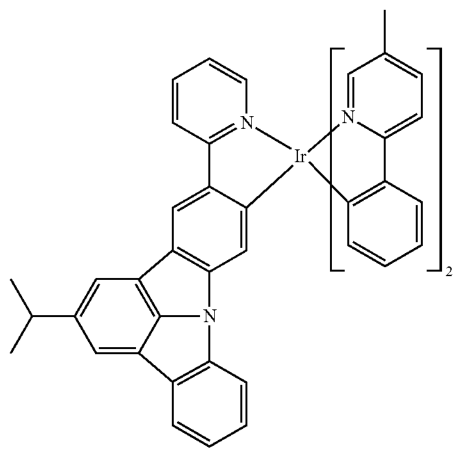
-continued
9
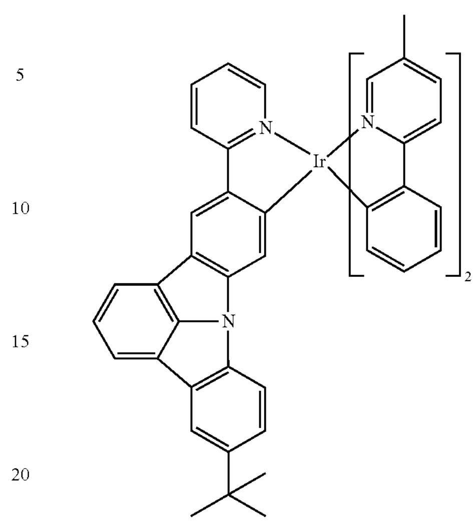
10
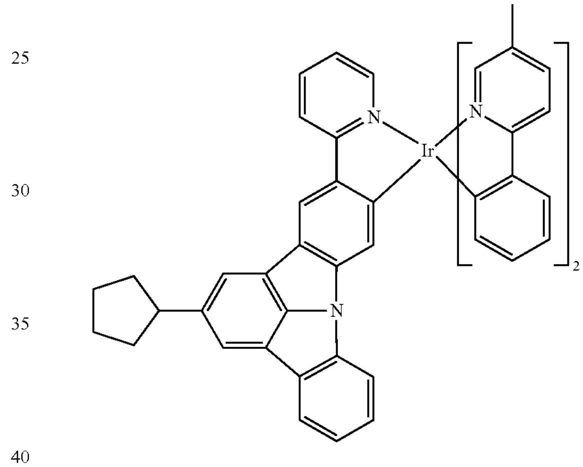
11
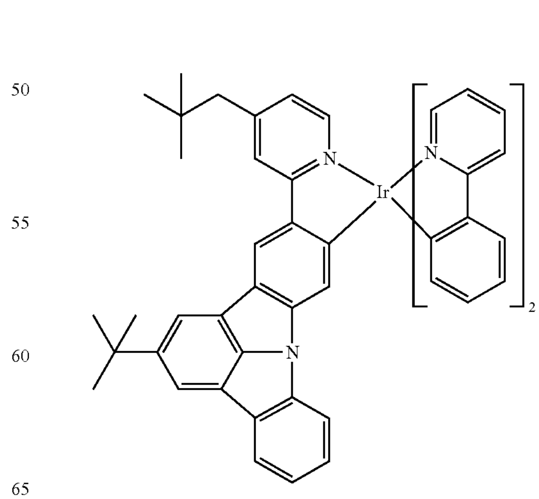

-continued
12
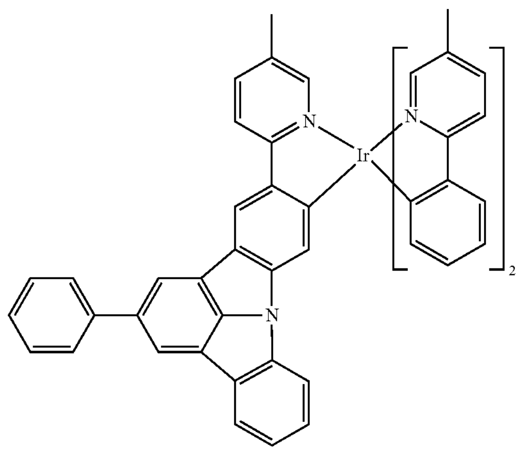
13
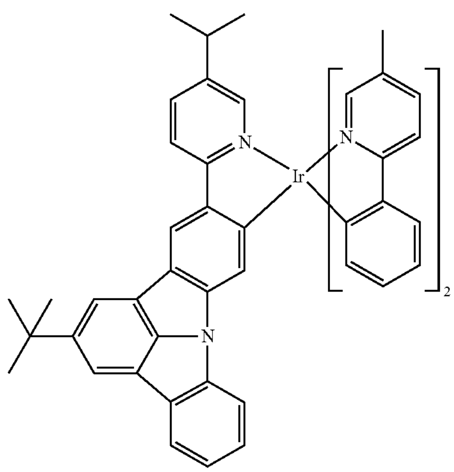
14
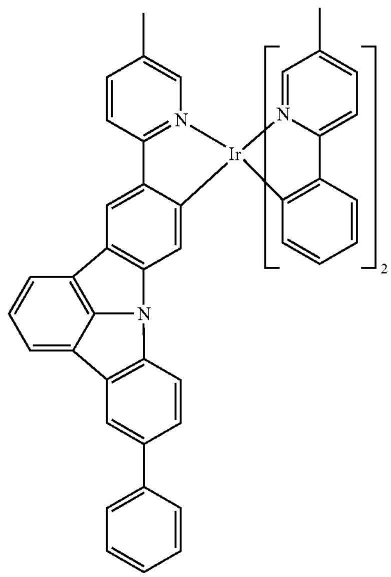
-continued
15
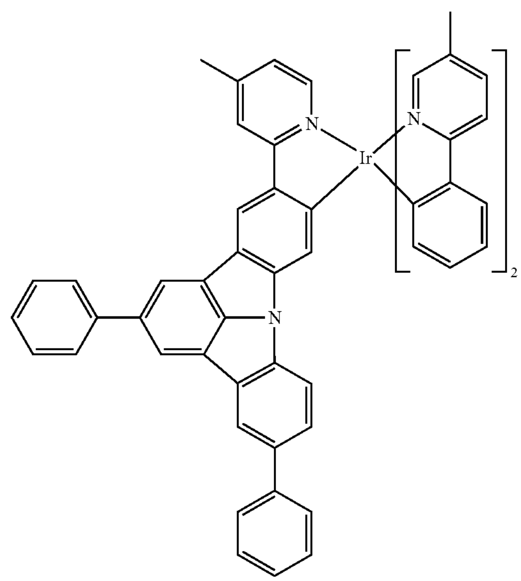
16
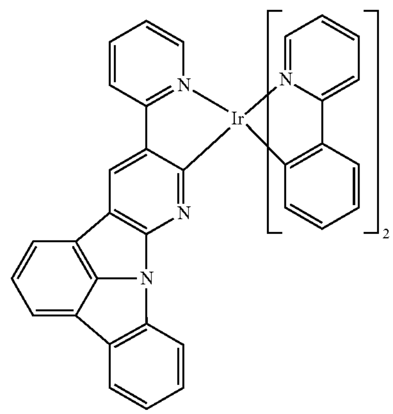
17
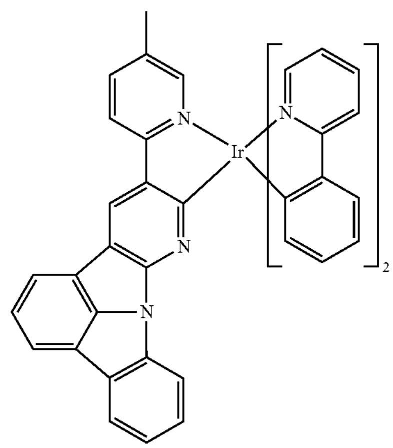

-continued
18
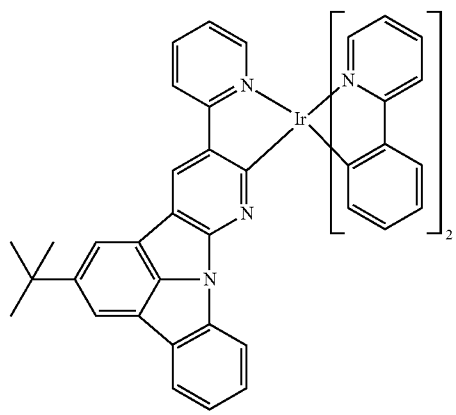
19
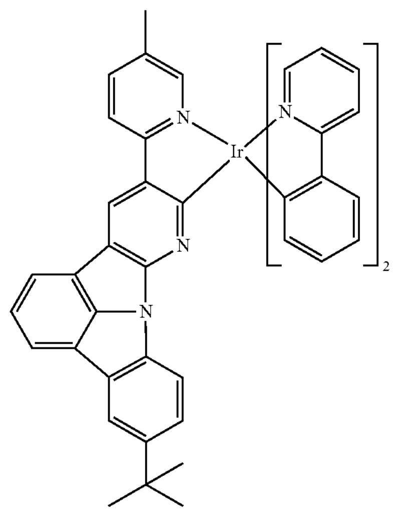
20
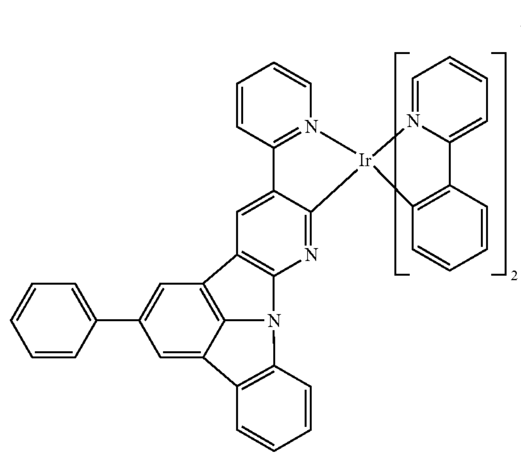
-continued
21
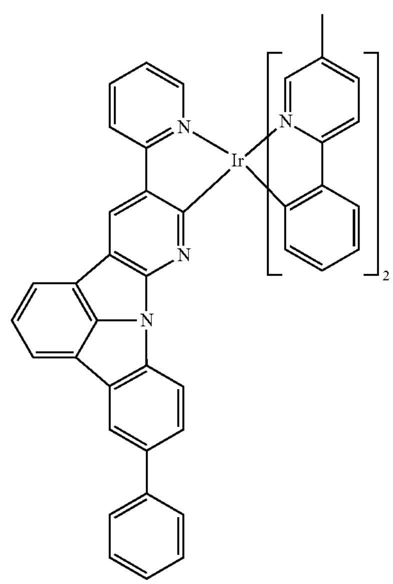
22
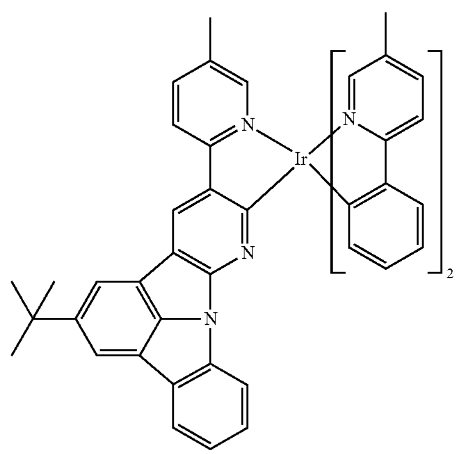
23
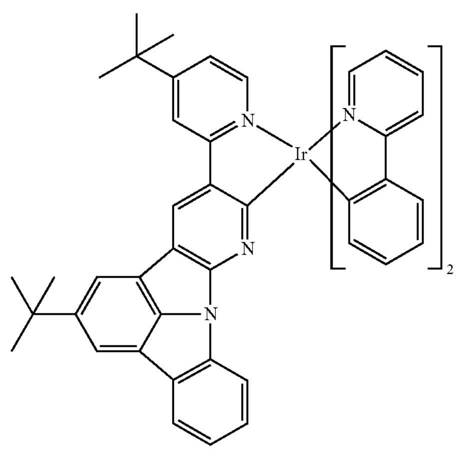

-continued
24
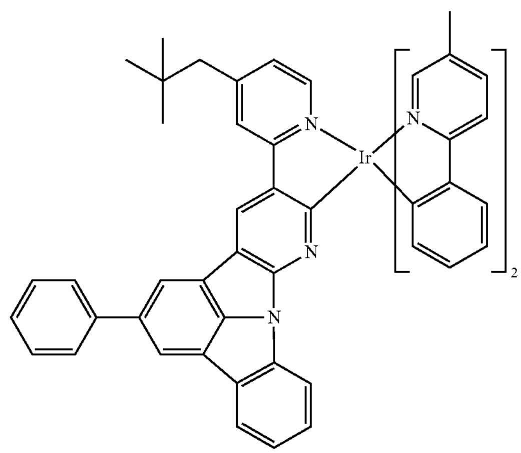
25
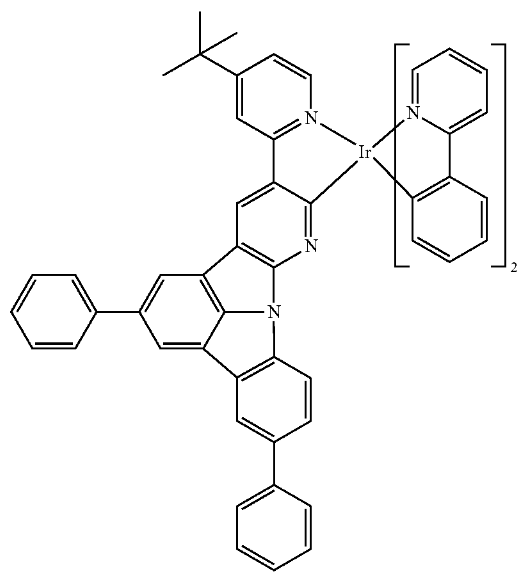
26
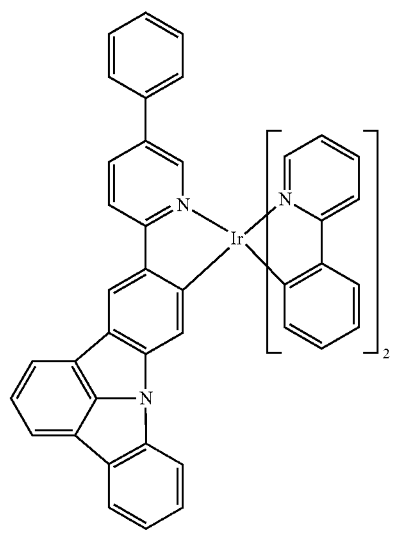
-continued
27
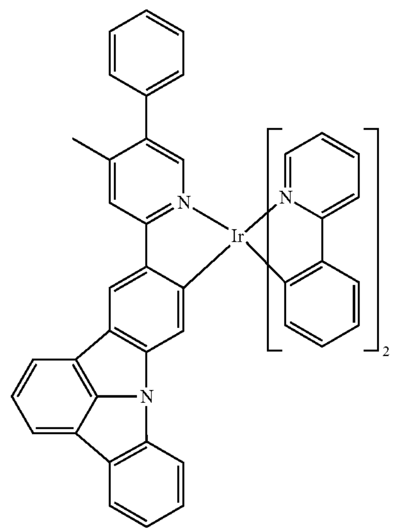
28
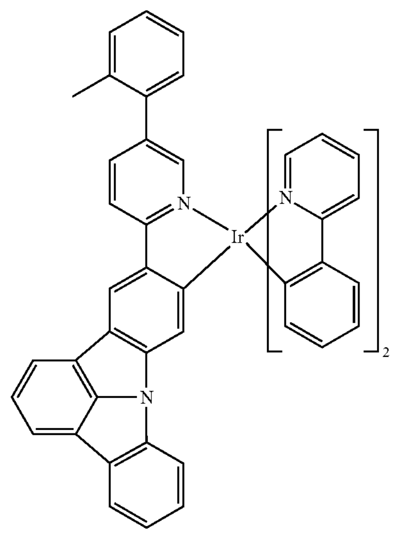
29
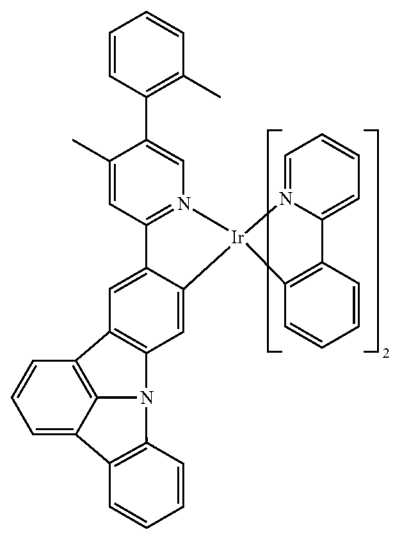

-continued
30
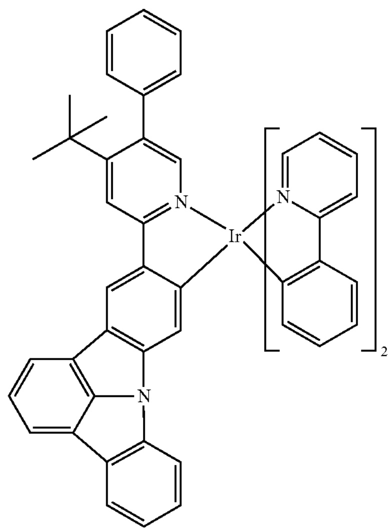
31
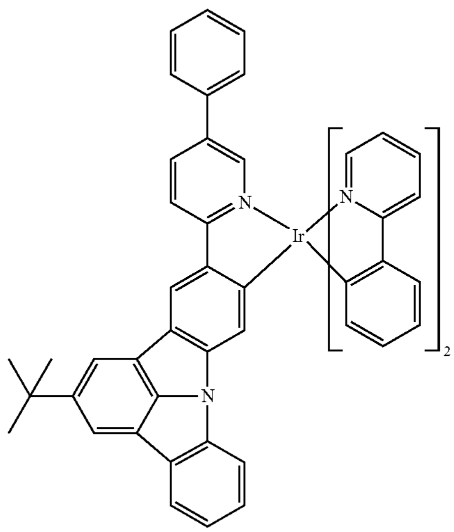
32
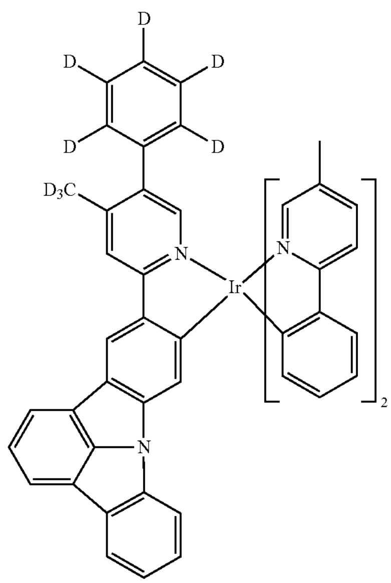
-continued
33
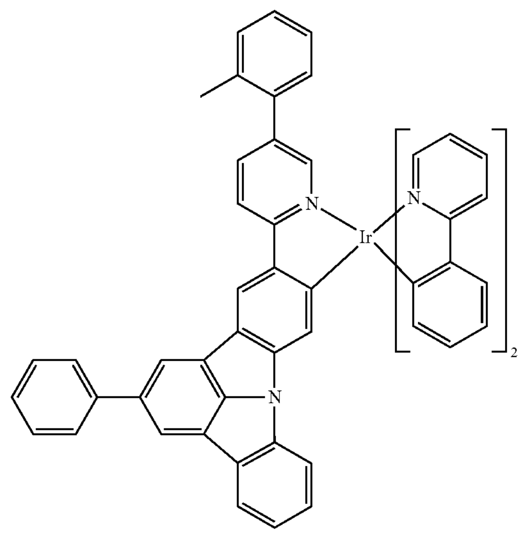
34
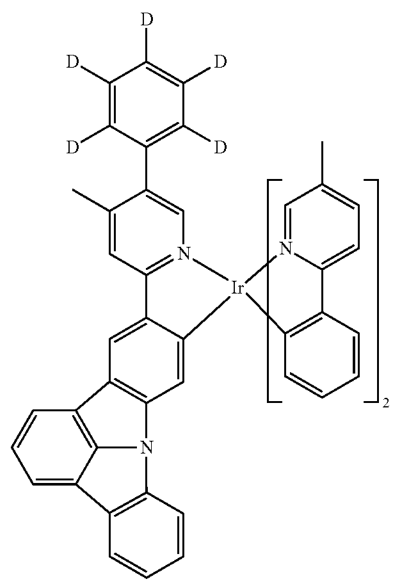
35
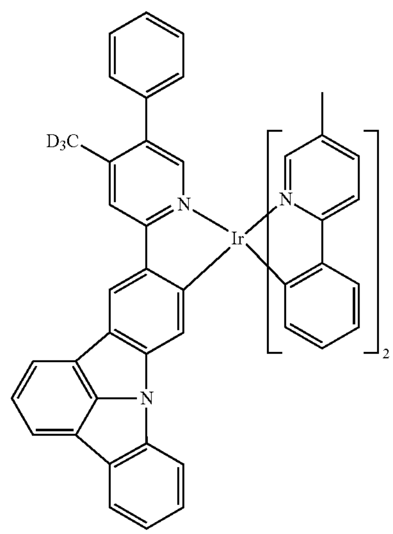

-continued
36
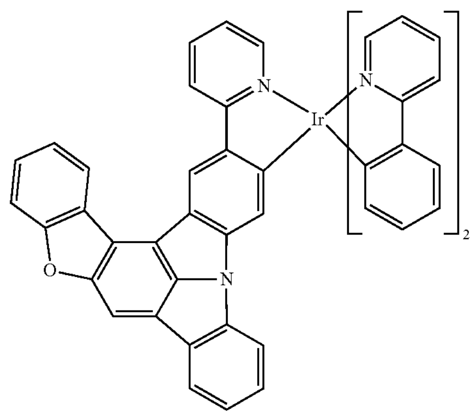
37
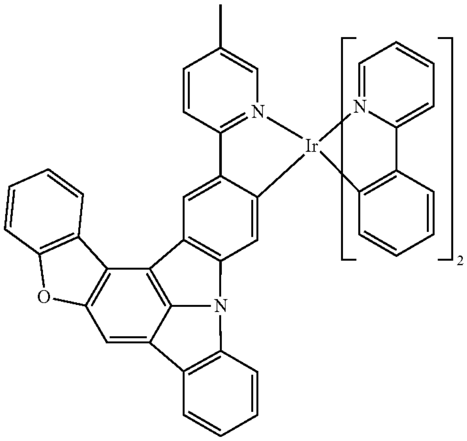
38
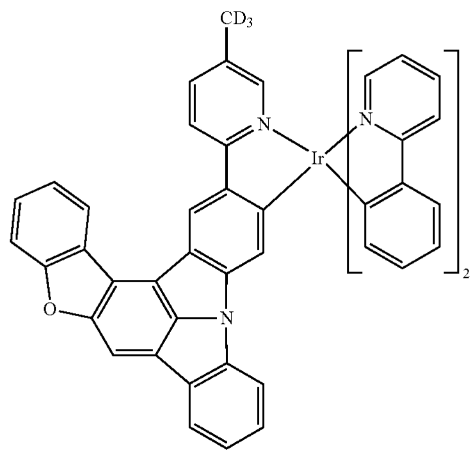
-continued
39
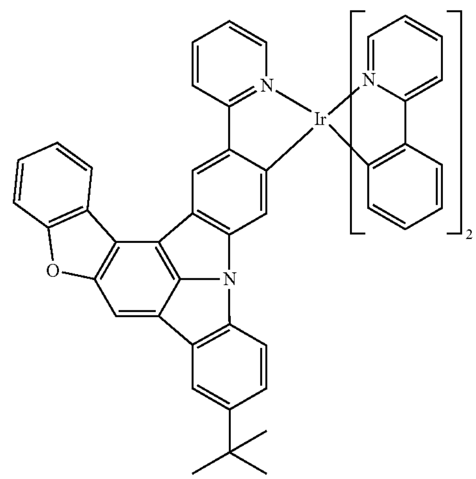
40
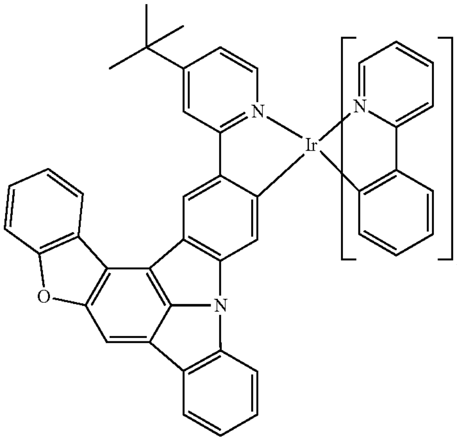
41
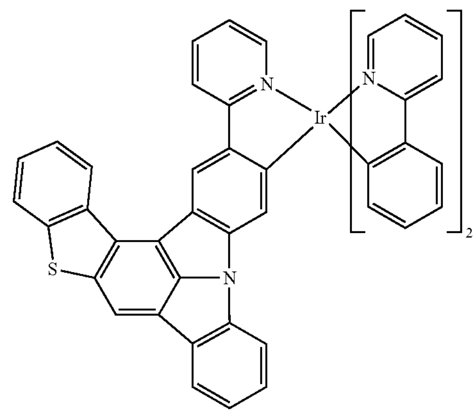

-continued
42
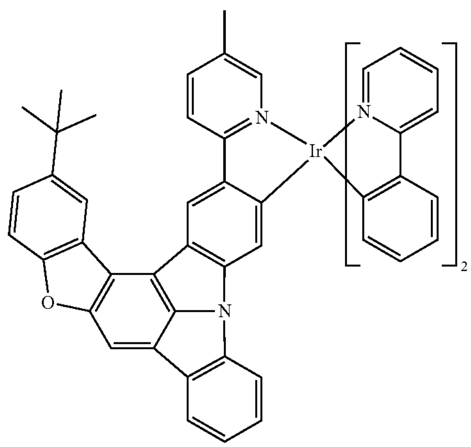
43
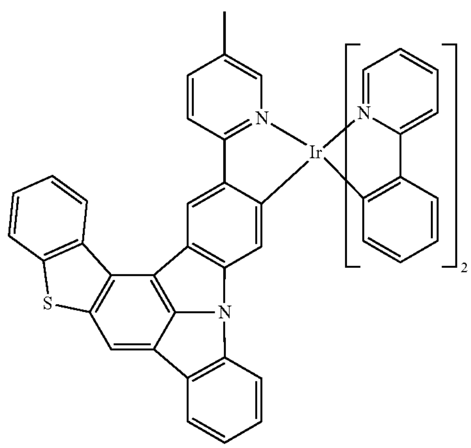
44
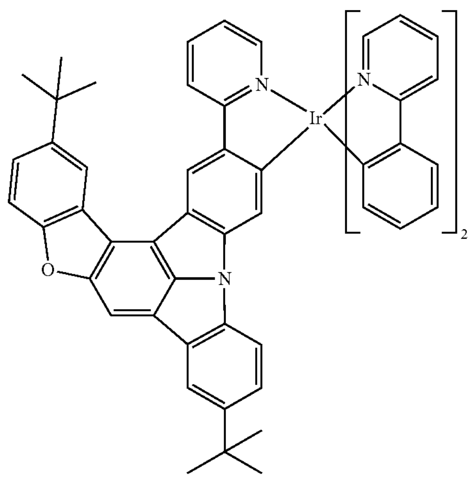
-continued
45
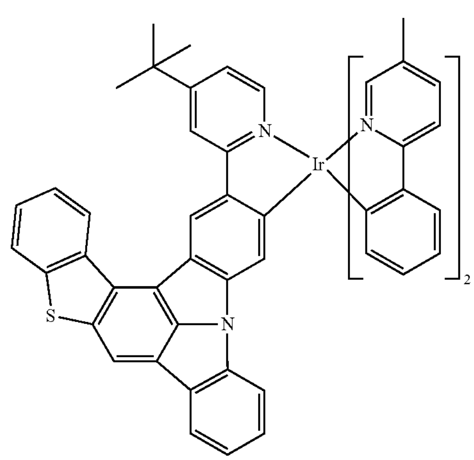
46
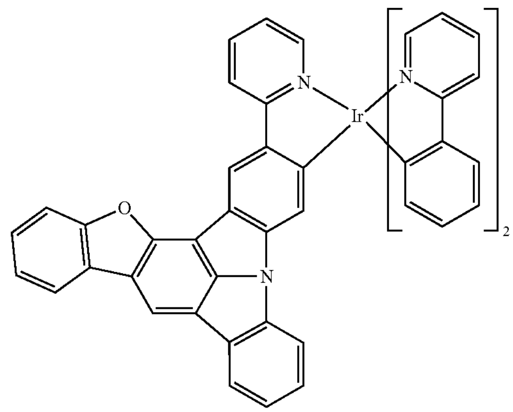
47
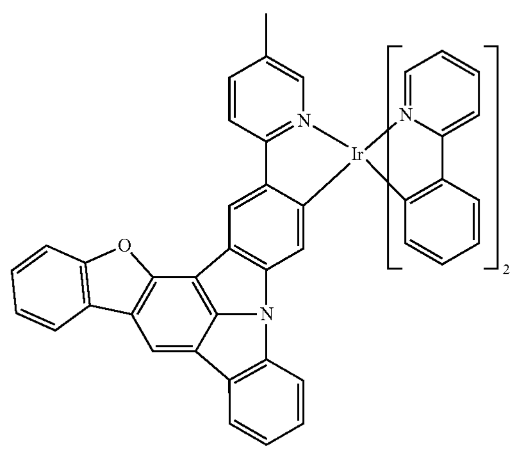

-continued
48
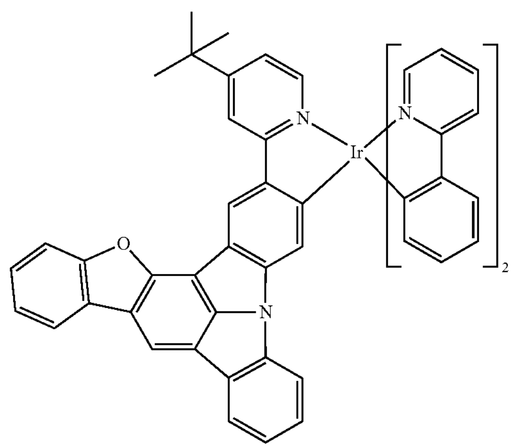
49
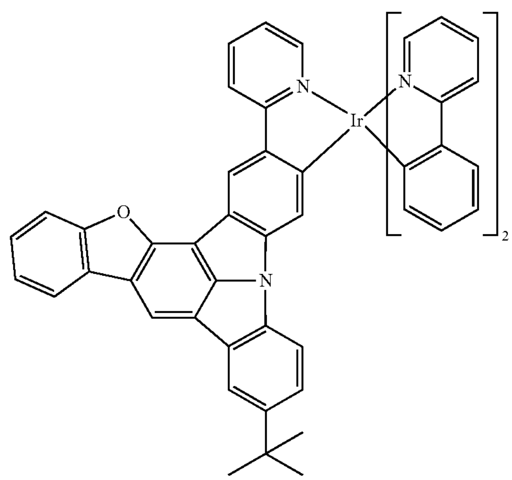
50
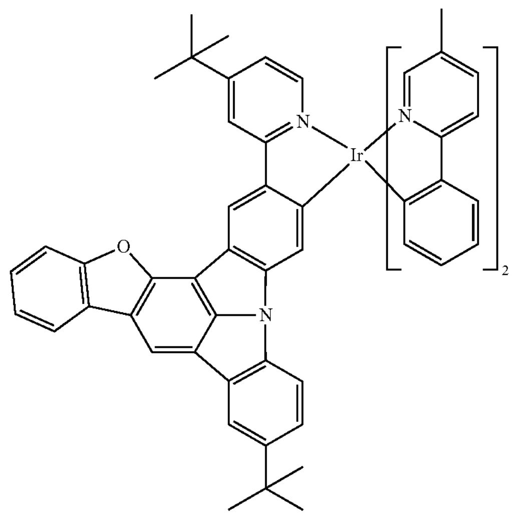
-continued
51
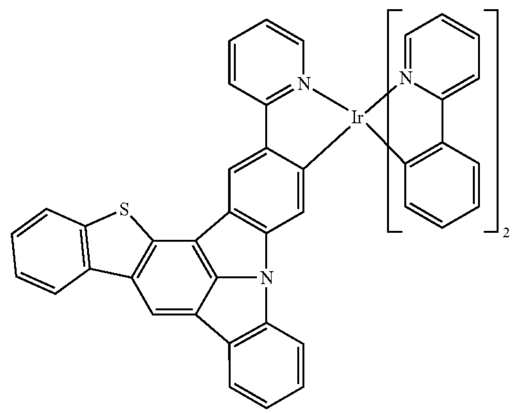
52
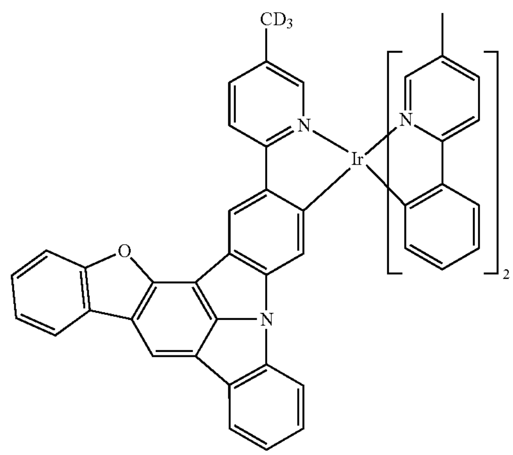
53
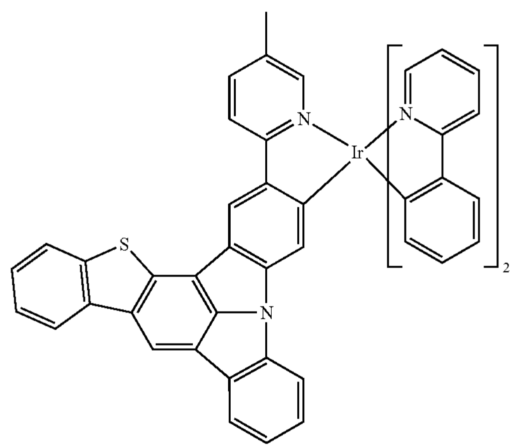

-continued
54
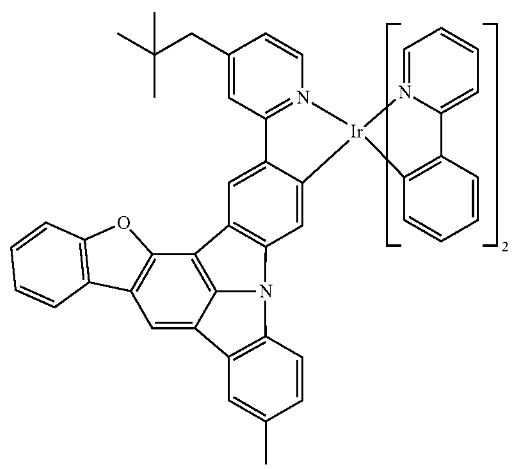
55
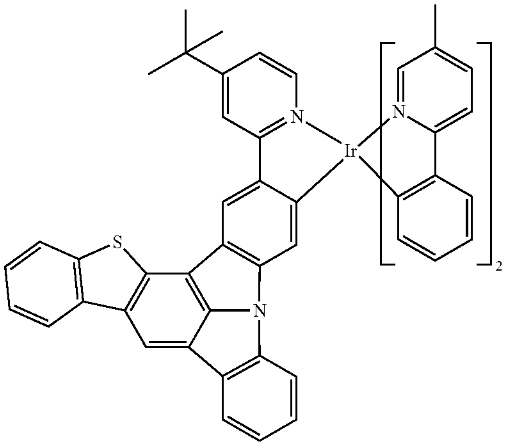
56
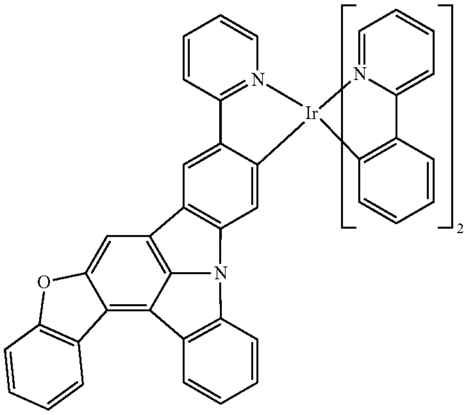
-continued
57
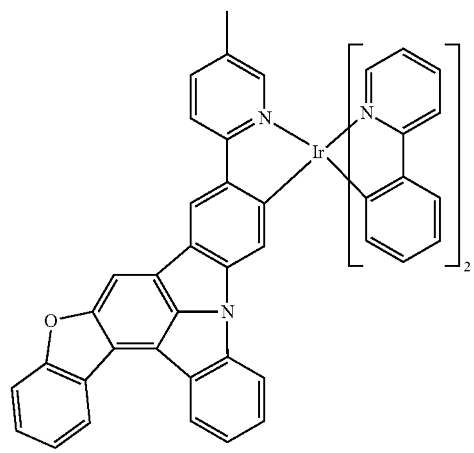
58
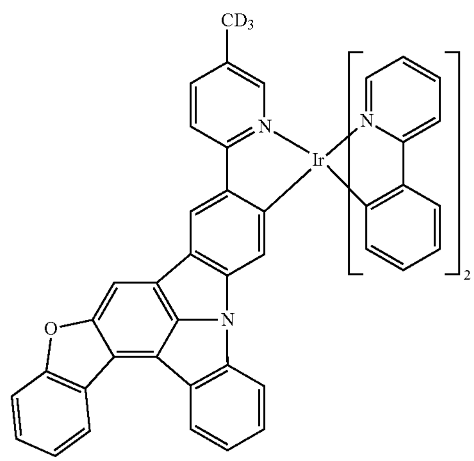
59
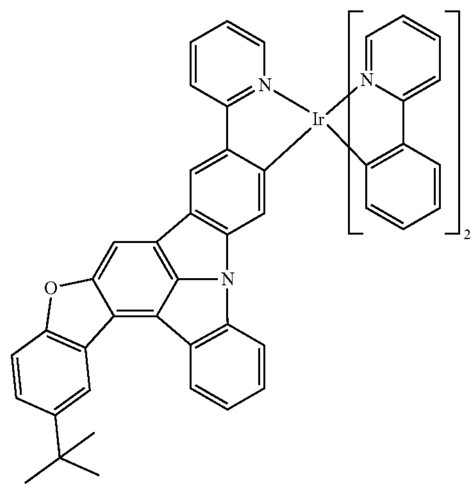

-continued
60
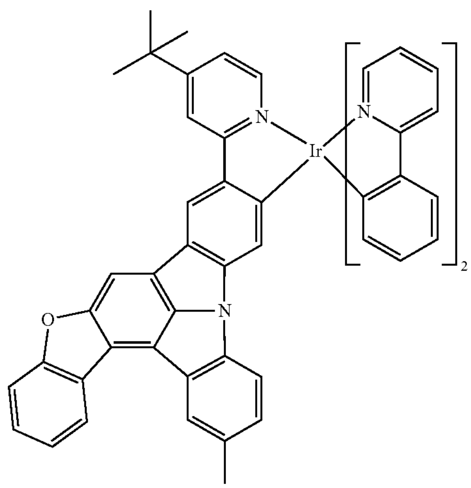
63
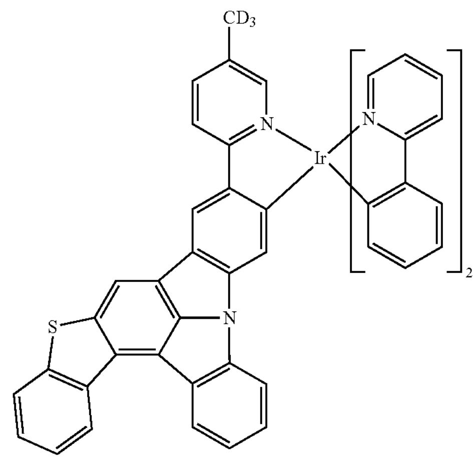
61
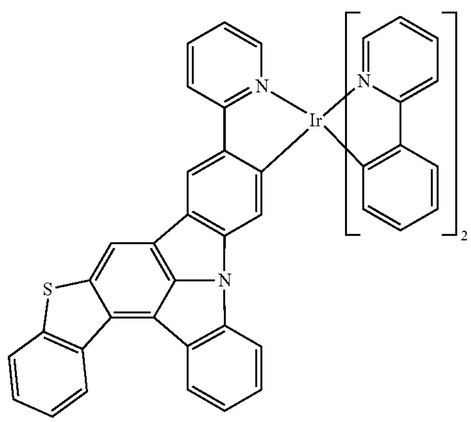
64
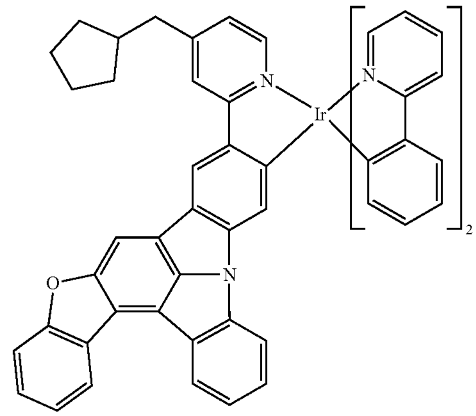
62
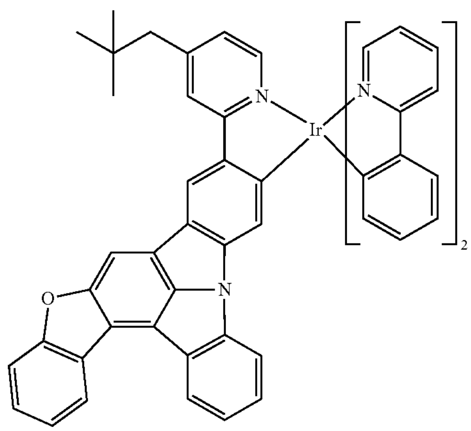
65
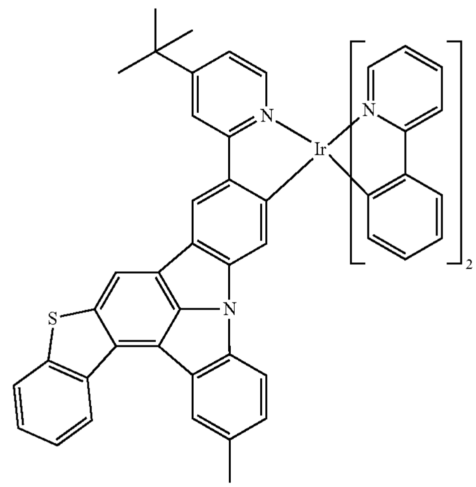

-continued
66
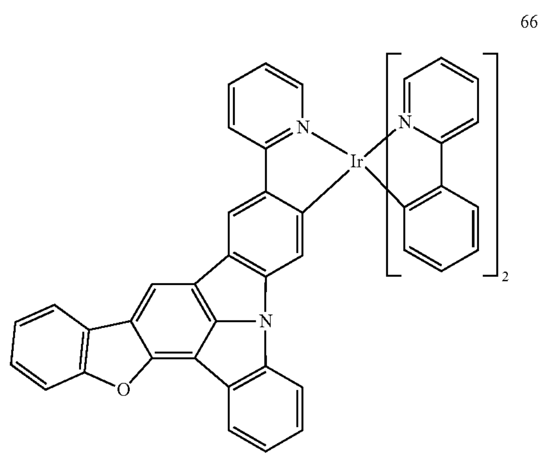
67
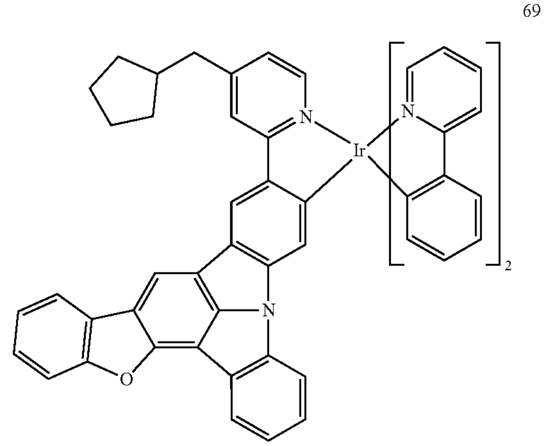
68
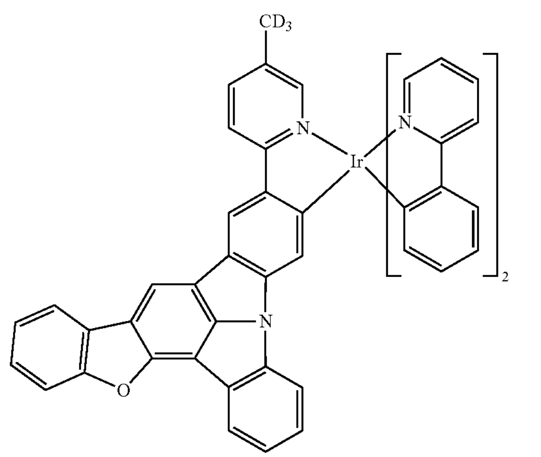
-continued
69
70
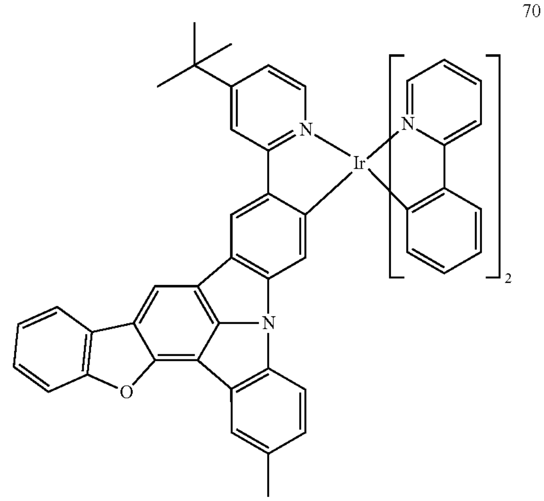
71
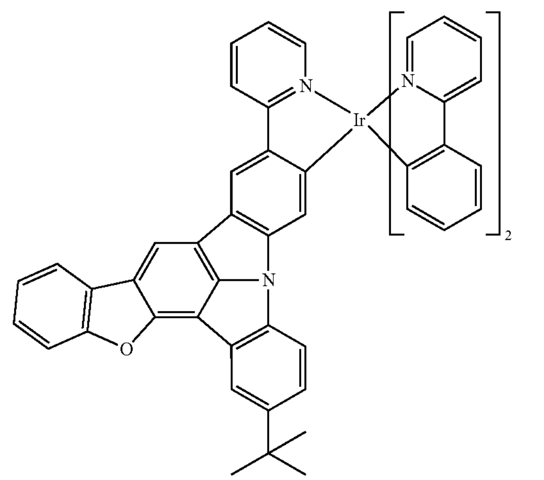

-continued
72
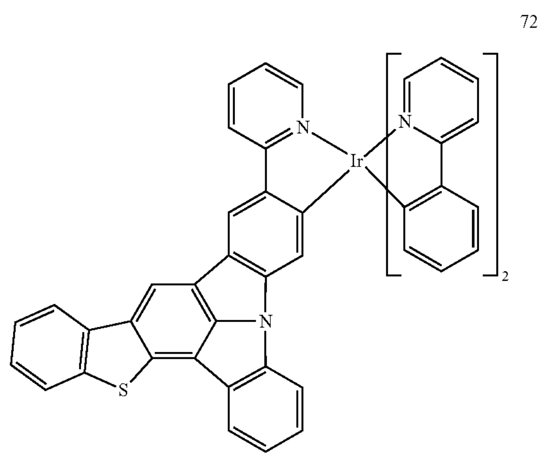
73
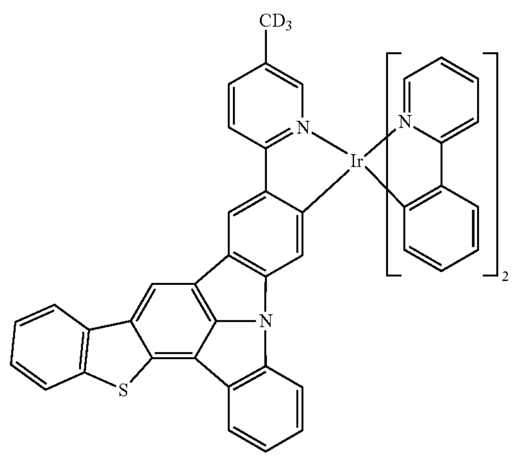
74
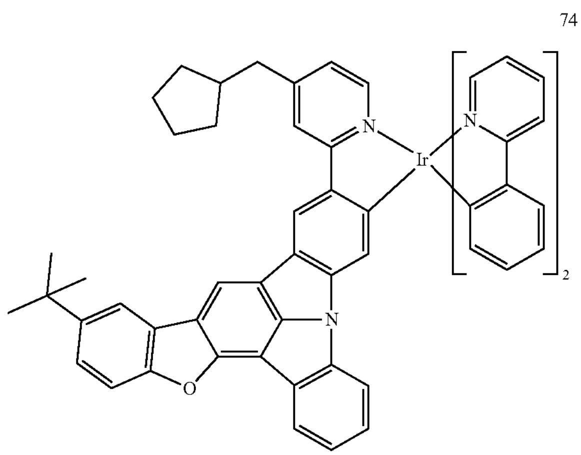
-continued
75
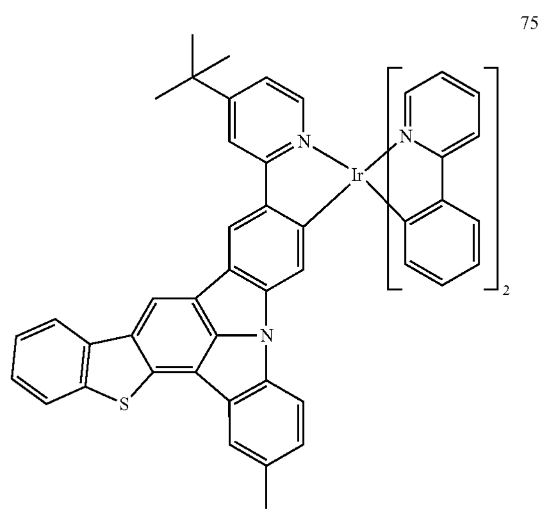
76
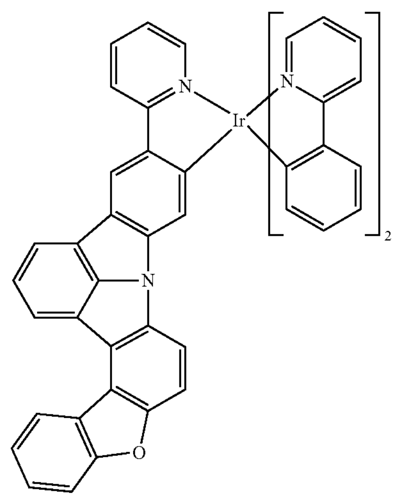
77
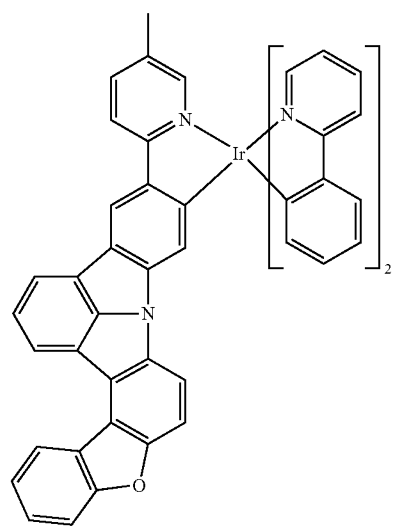

-continued
78
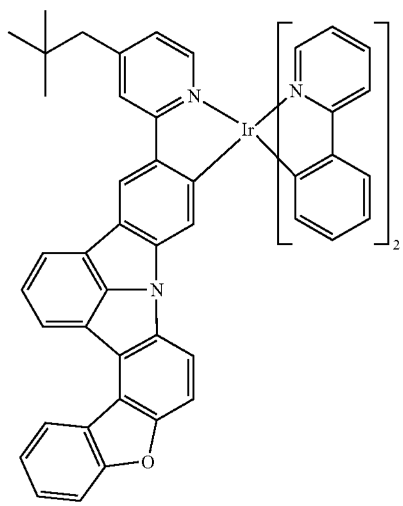
79
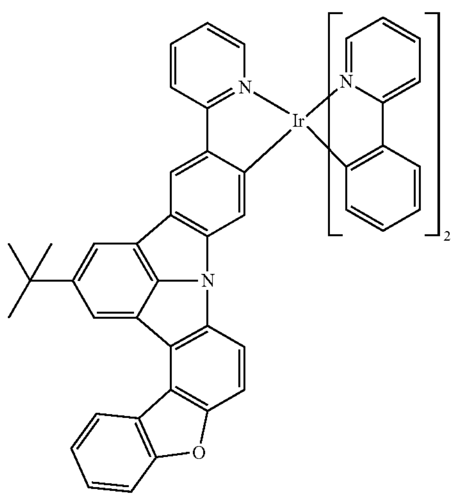
80
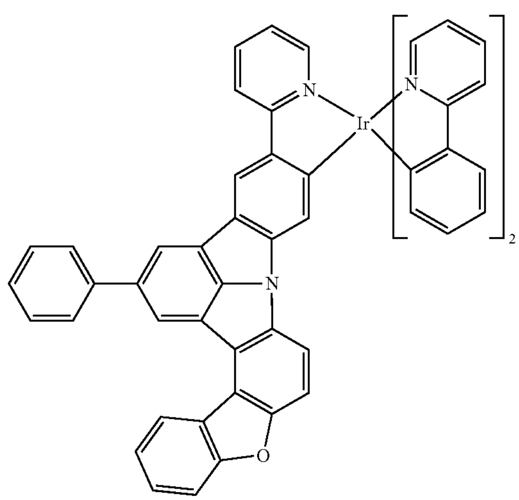
-continued
81
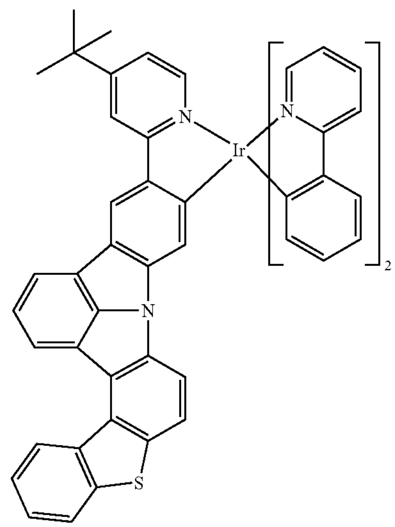
82
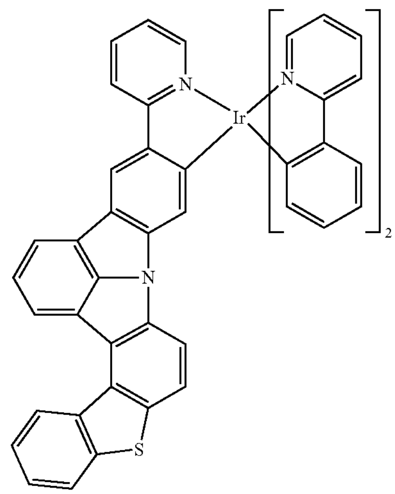
83
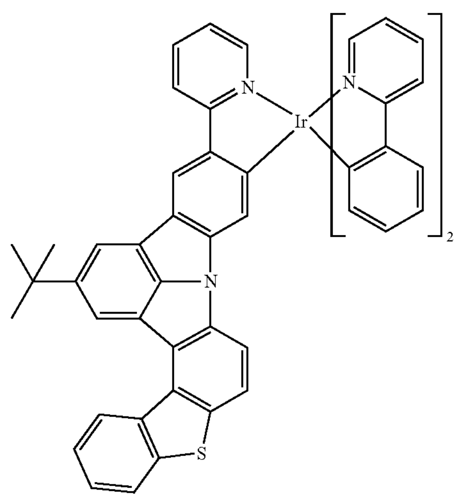

-continued
84
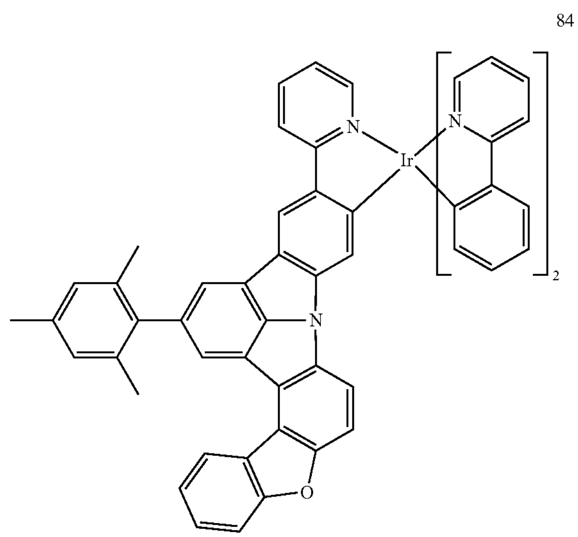
85
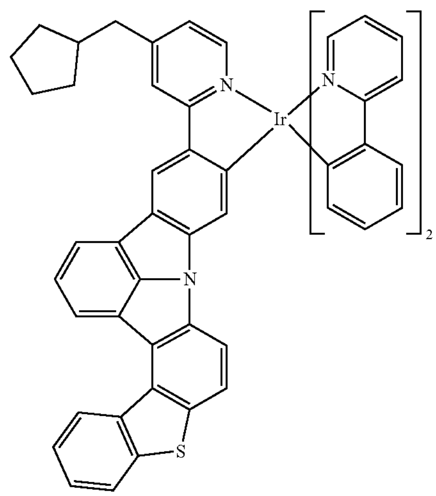
86
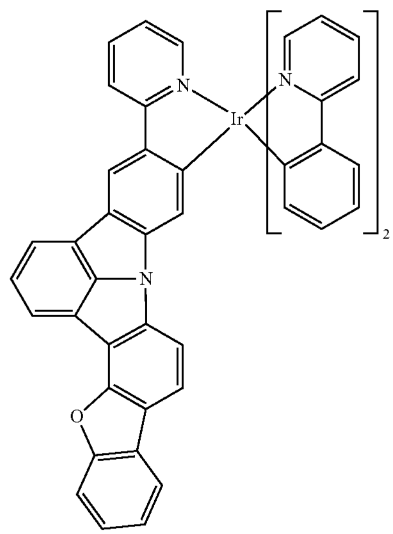
-continued
87
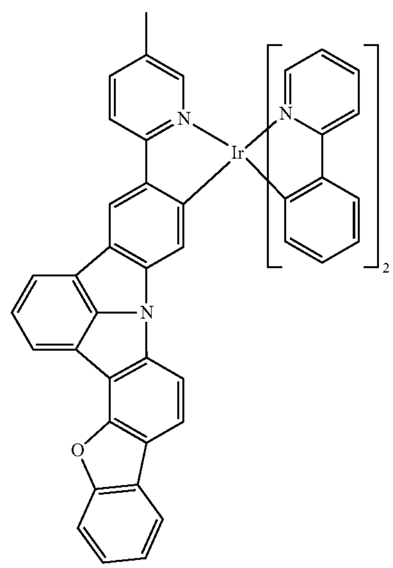
88
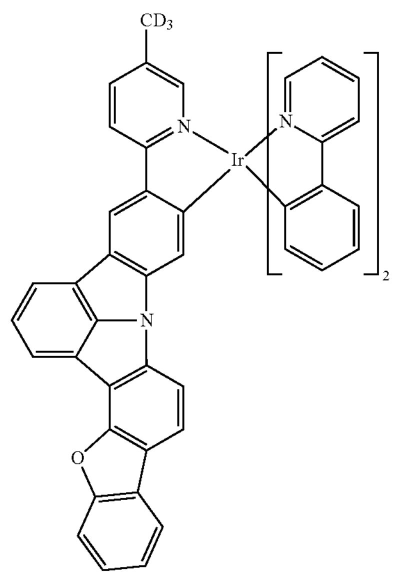

-continued
89
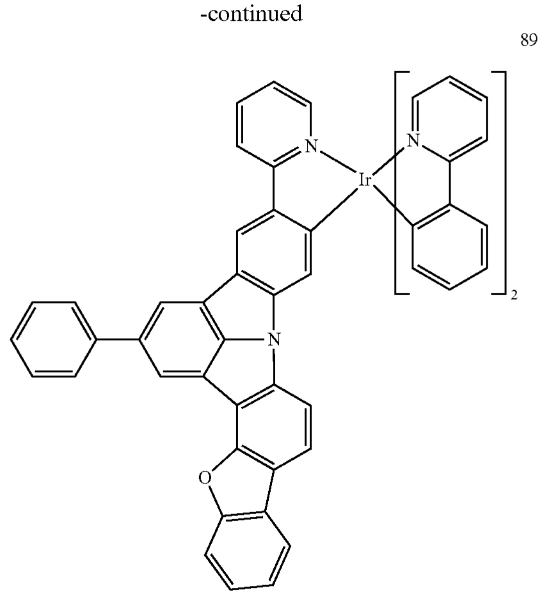
90
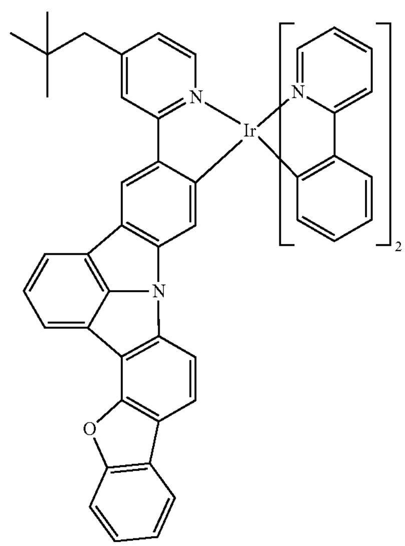
91
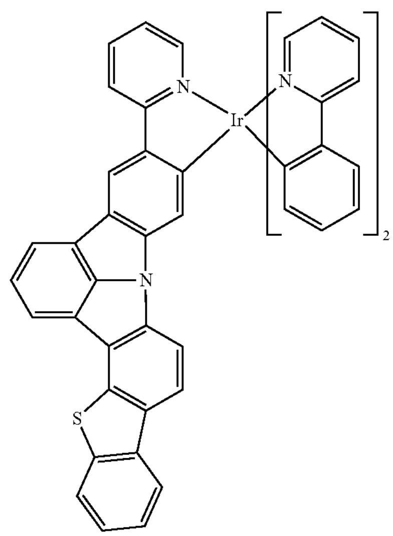
-continued
92
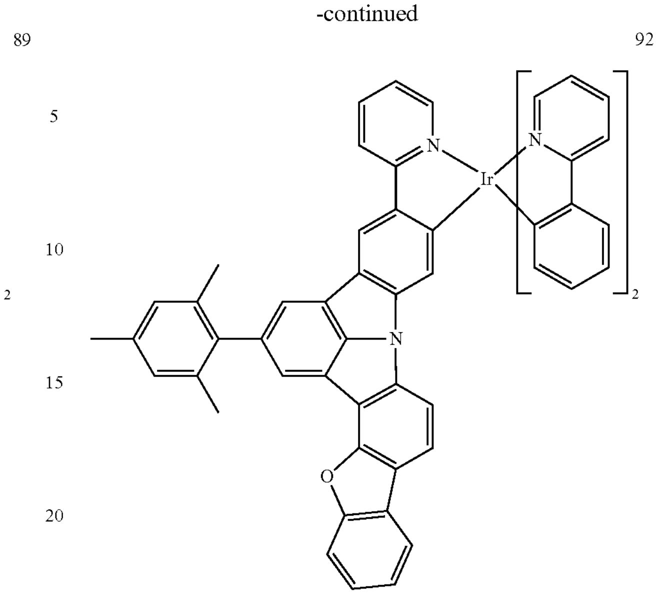
93
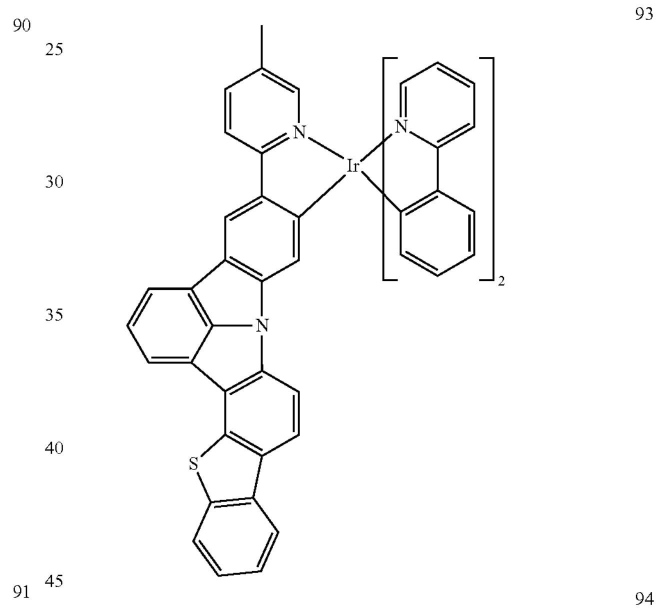
94
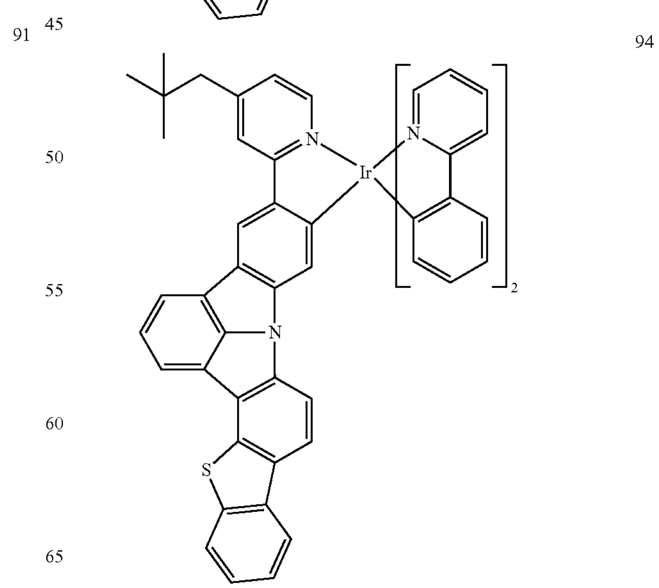

-continued
95
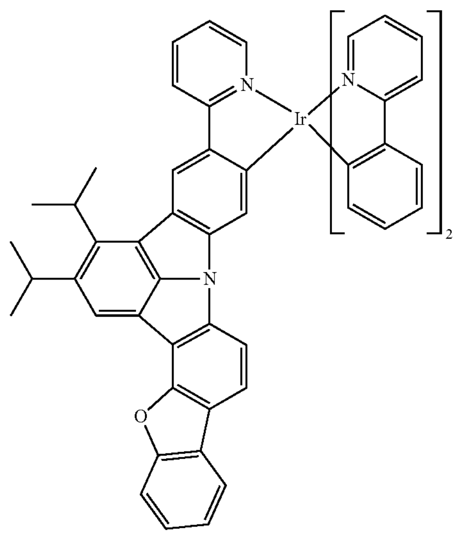
96
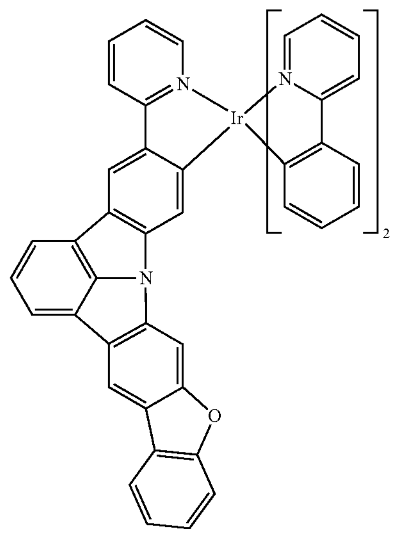
97
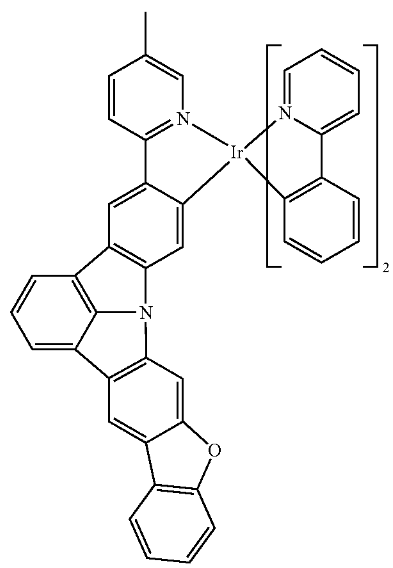
-continued
98
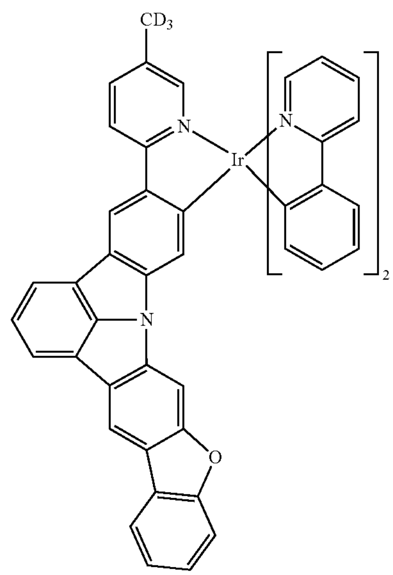
99
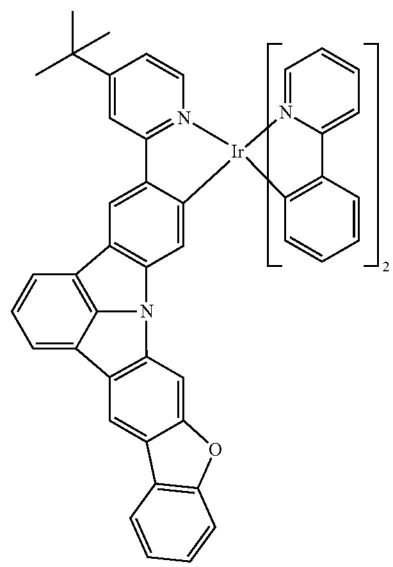

-continued
100
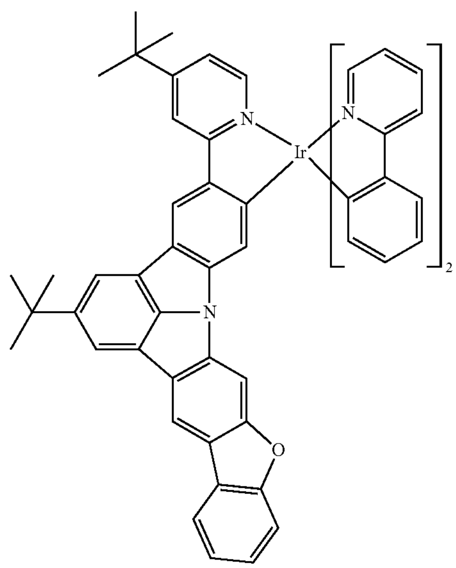
101
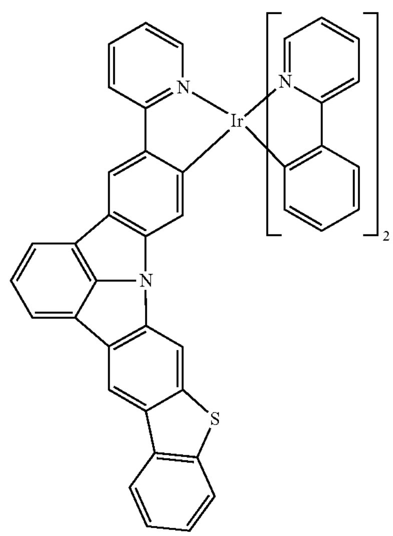
102
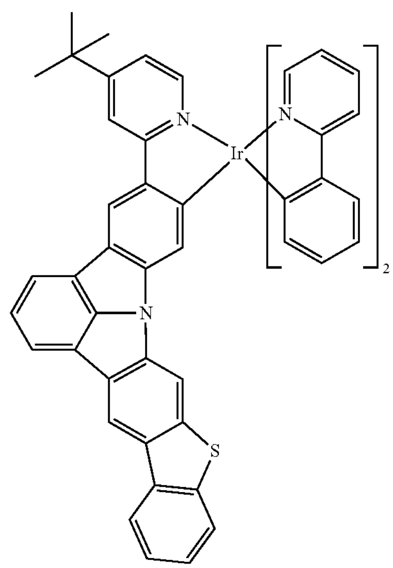
-continued
103
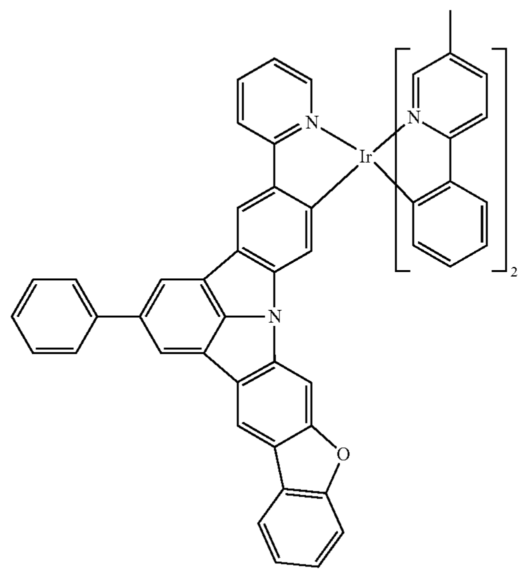
104
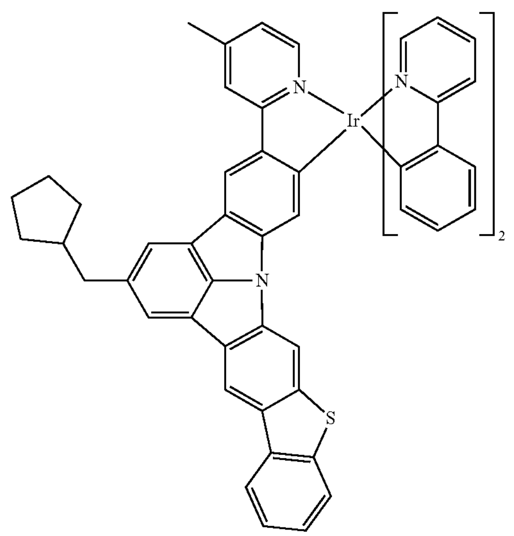
105
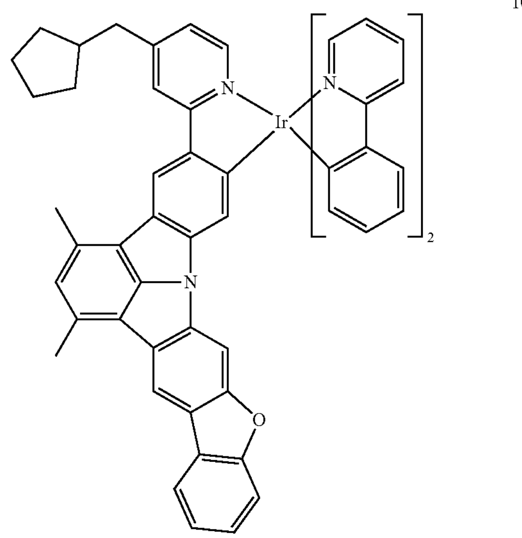

-continued
106
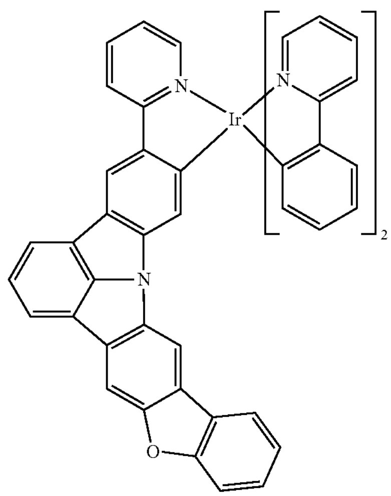
107
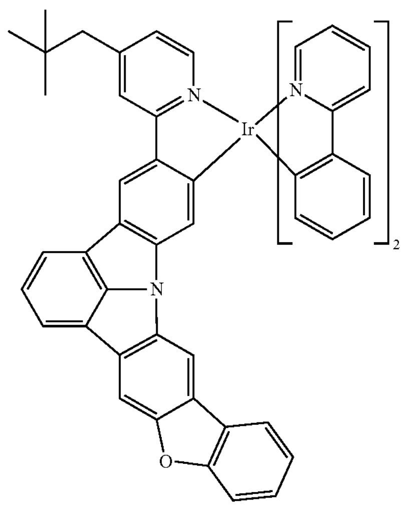
108
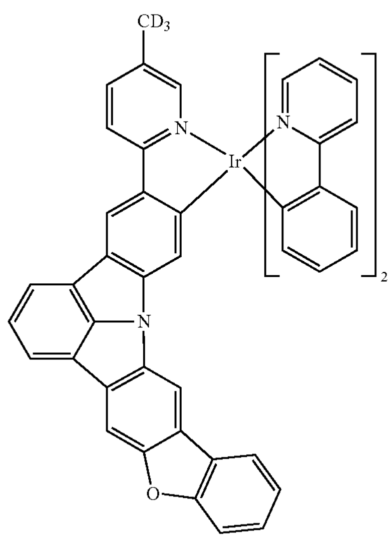
-continued
109
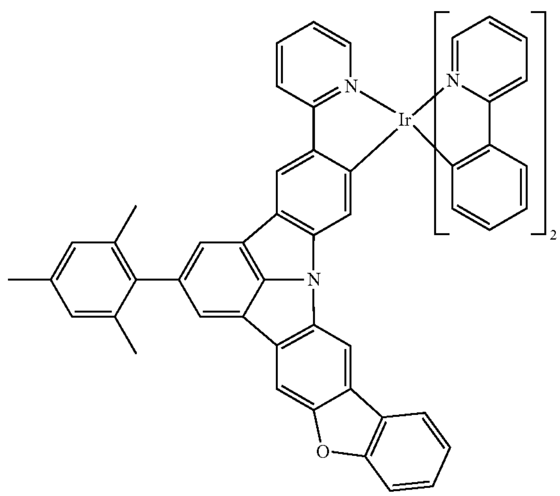
110
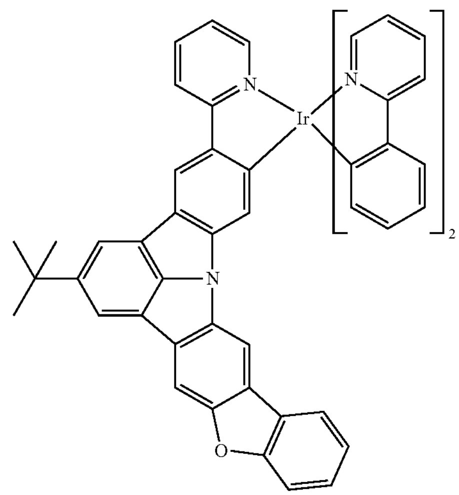
111
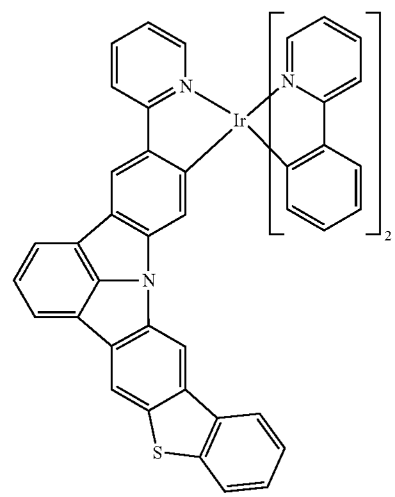

112
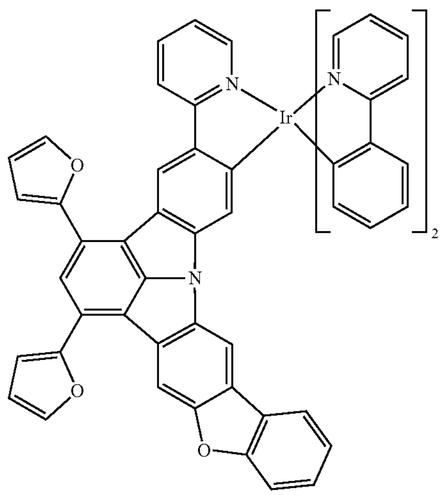
113
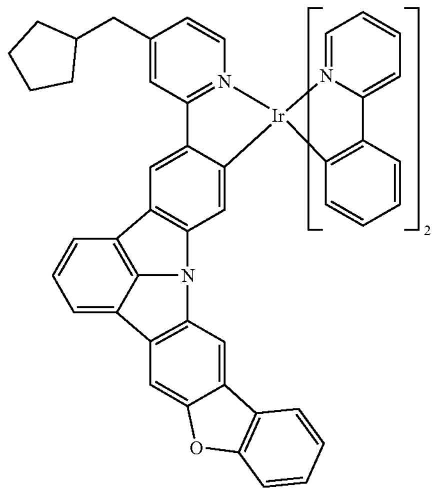
114
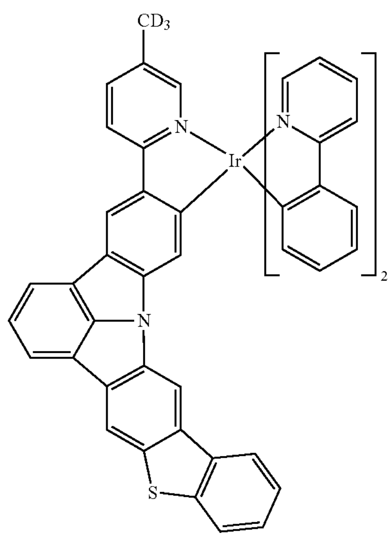
115
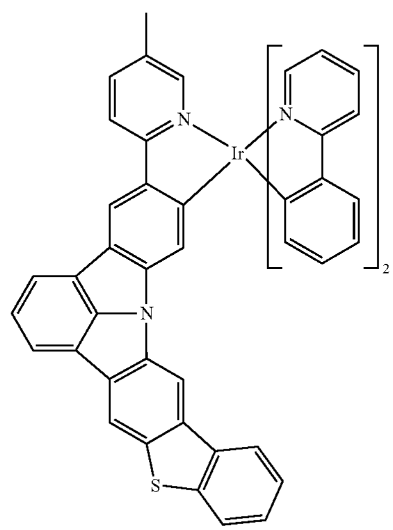
116
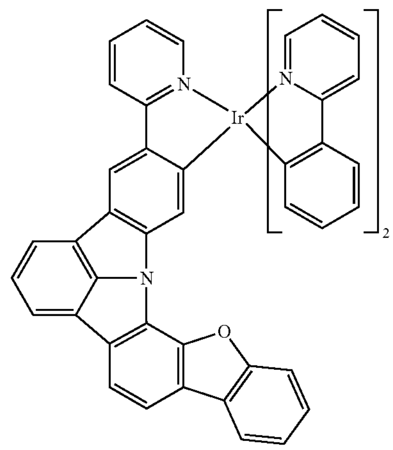
117
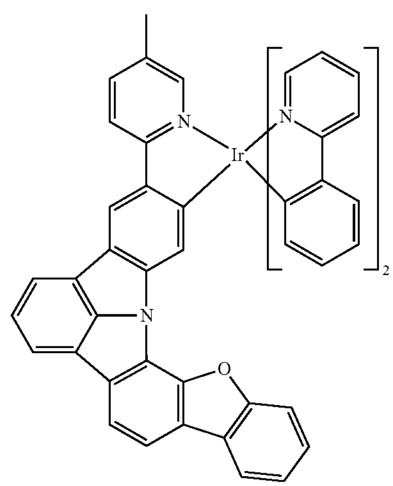

-continued
118
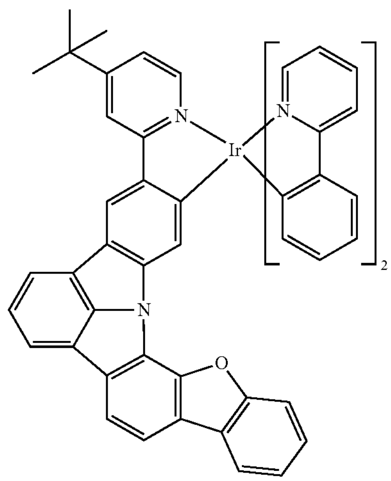
119
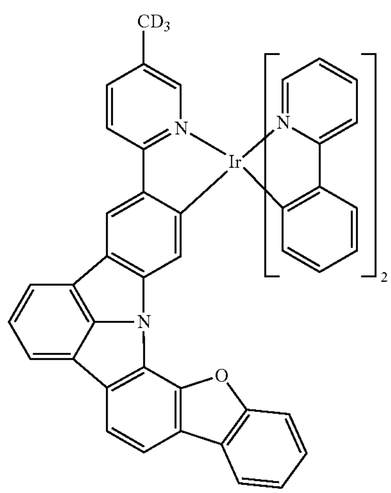
120
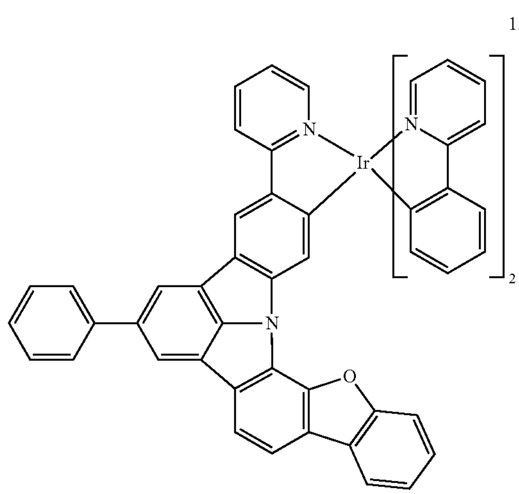
-continued
121
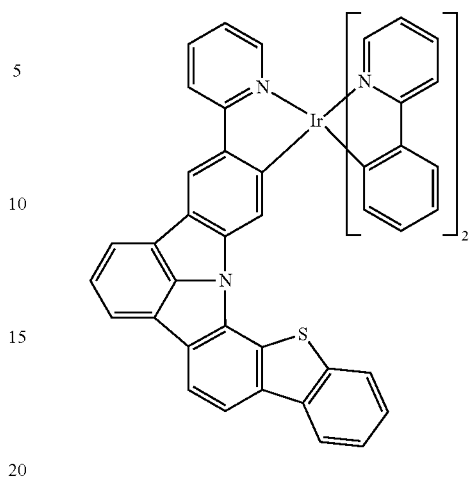
122
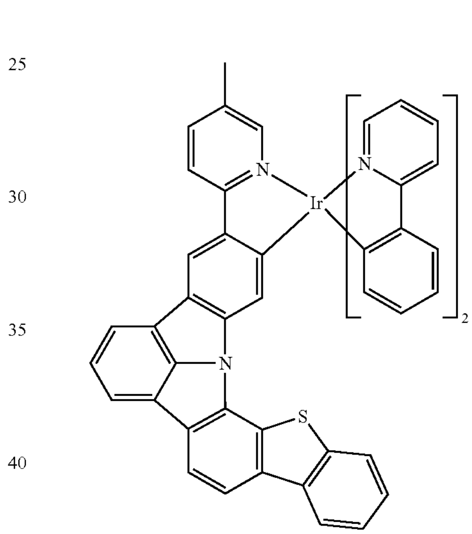
123
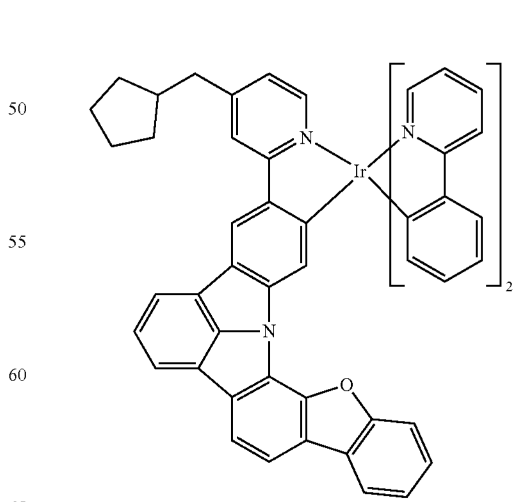

-continued
124
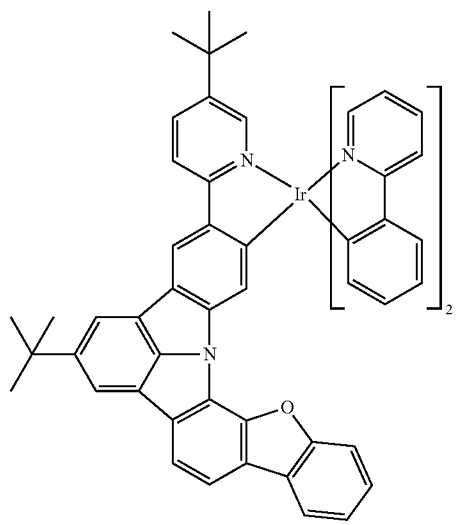
127
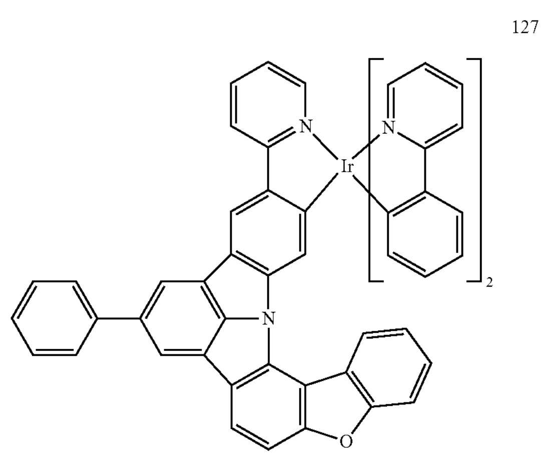
125
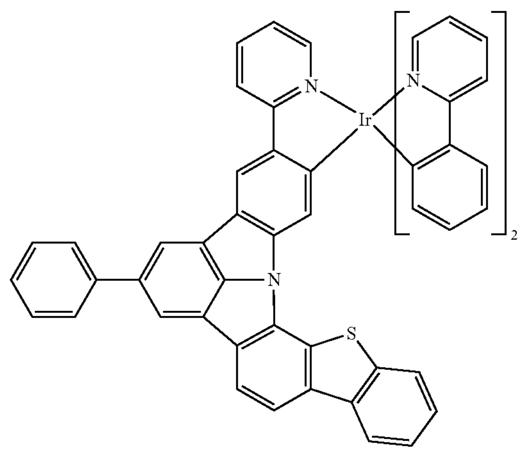
128
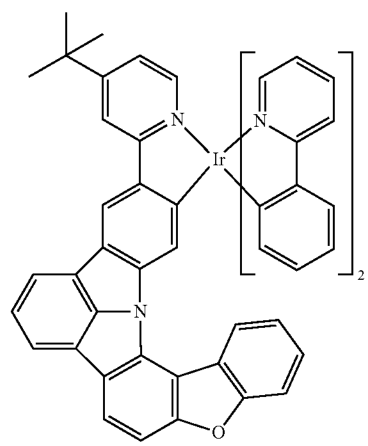
126
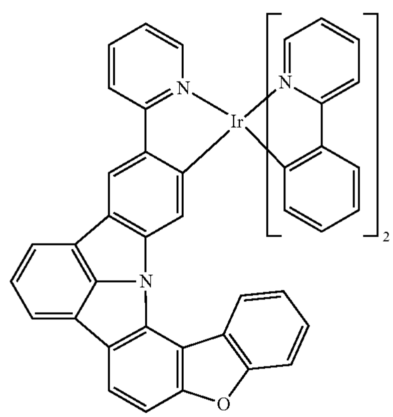
129
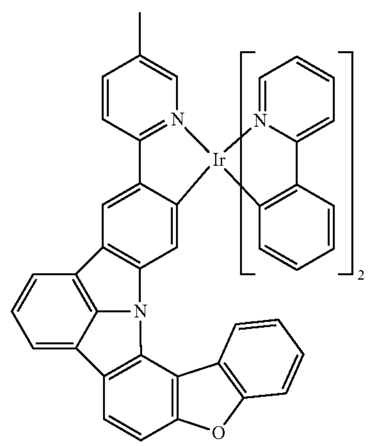

-continued
130
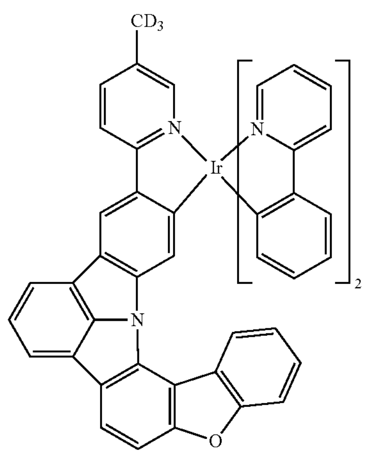
131
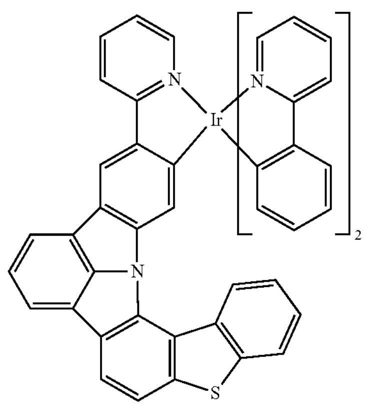
132
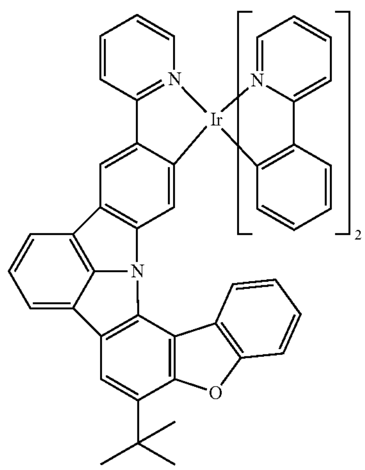
-continued
133
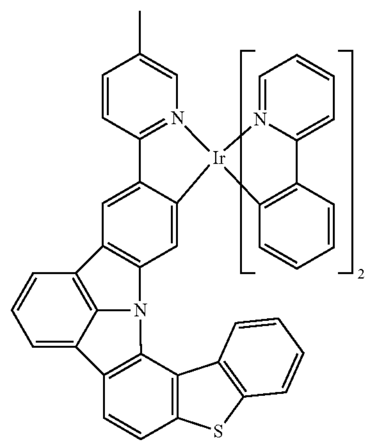
134
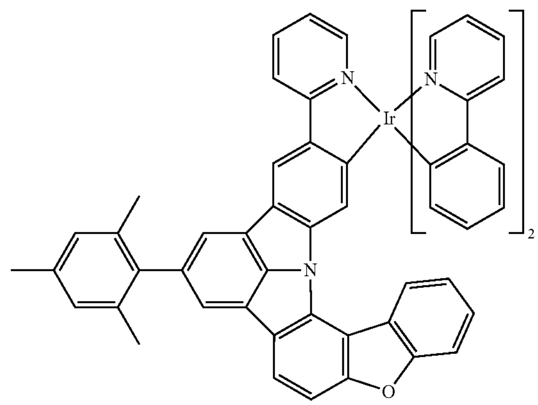
135
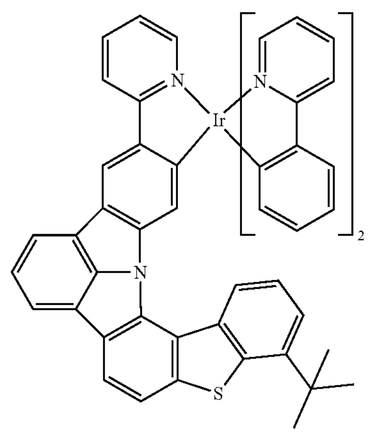

-continued
136
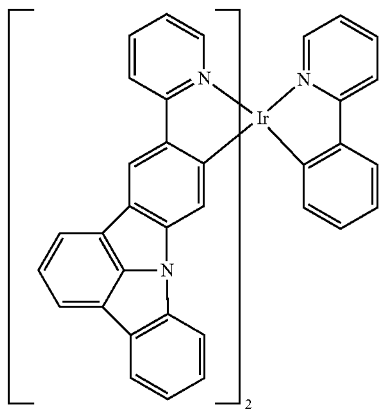
137
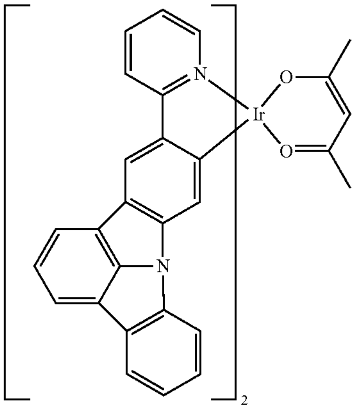
138
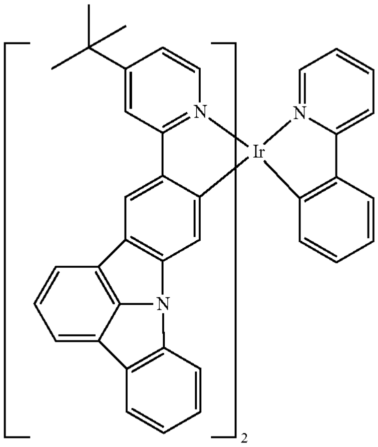
-continued
139
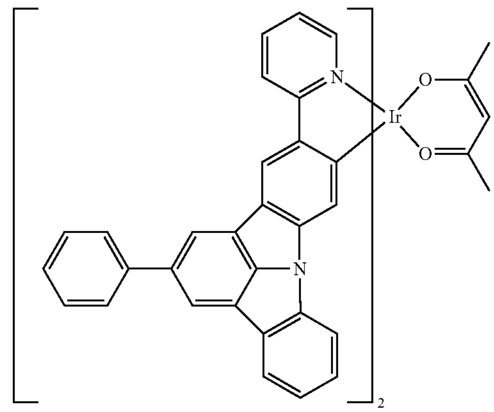
140
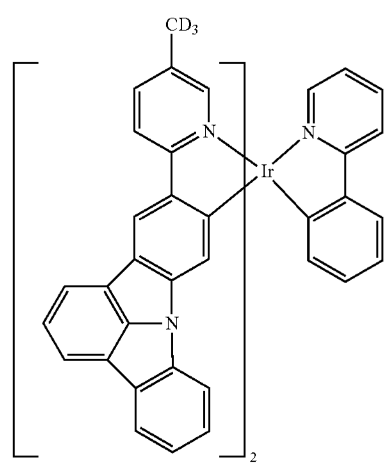
141
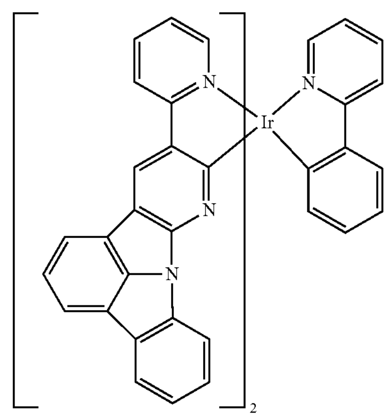

-continued
142
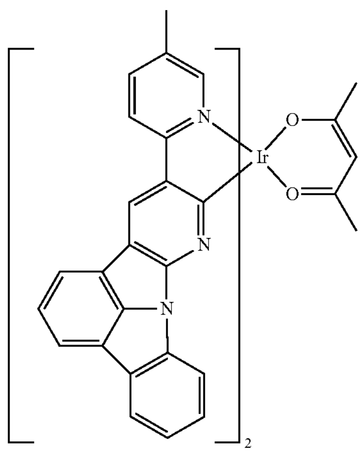
143
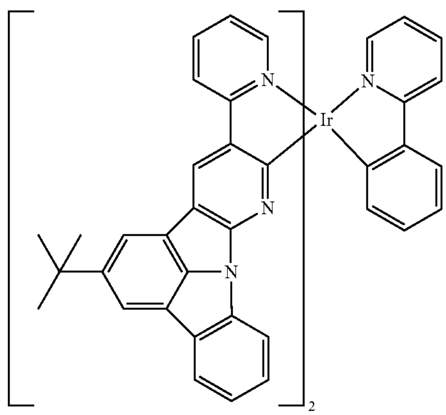
144
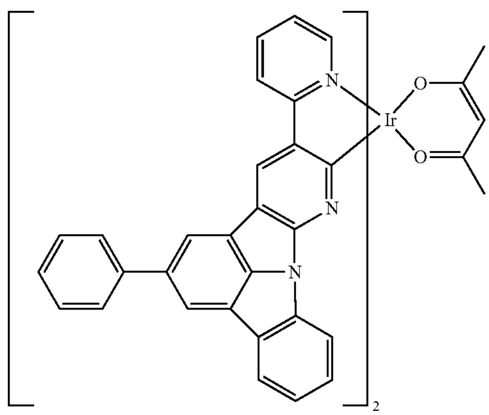
-continued
145
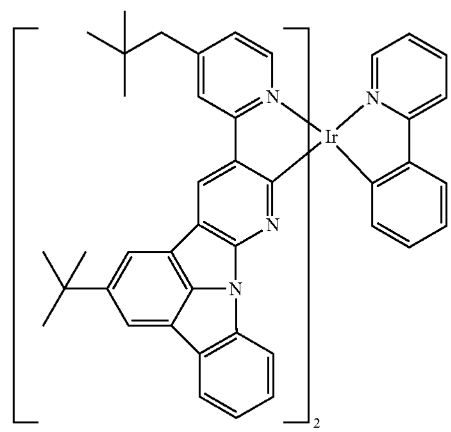
146
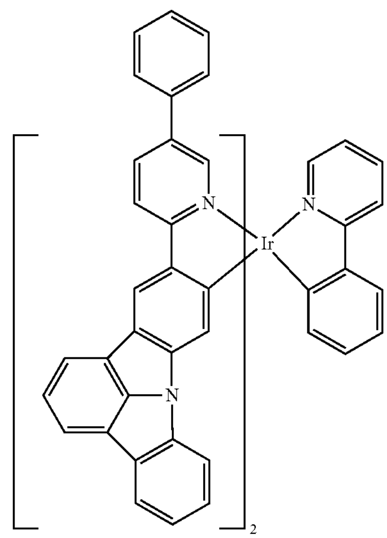
147
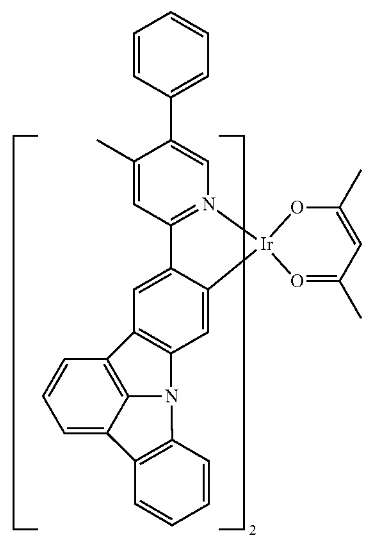

-continued
148
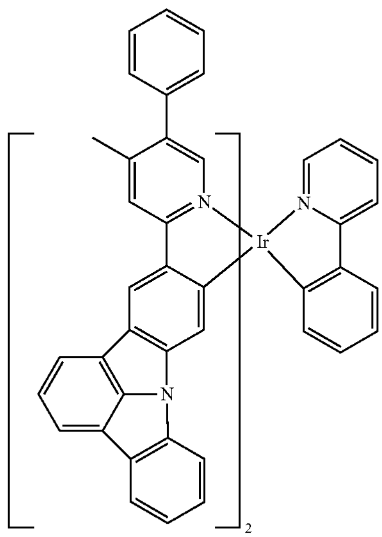
149
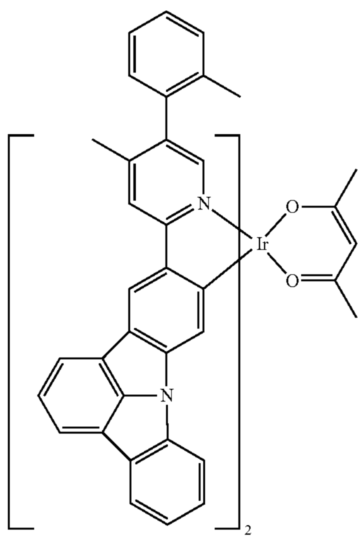
150
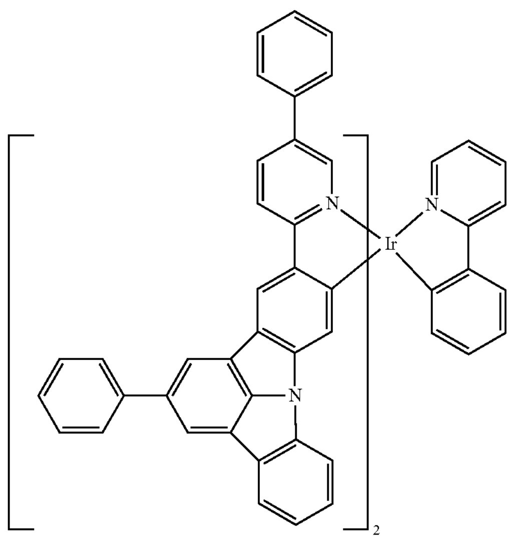
-continued
151
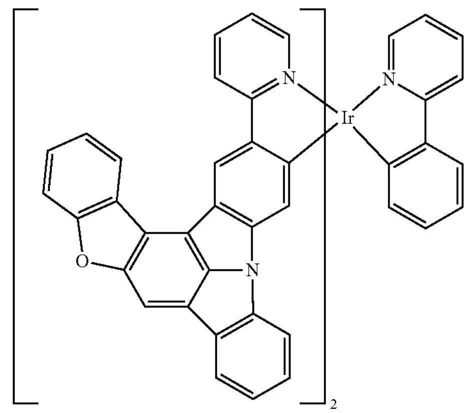
152
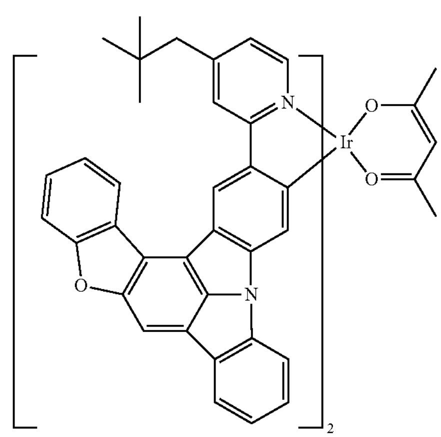
153
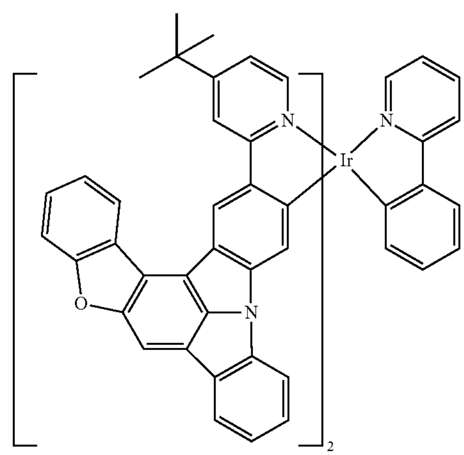

-continued
154
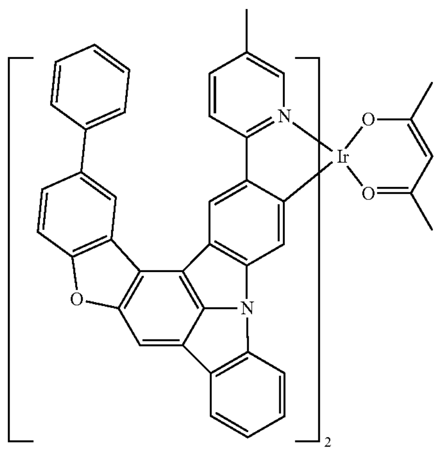
155
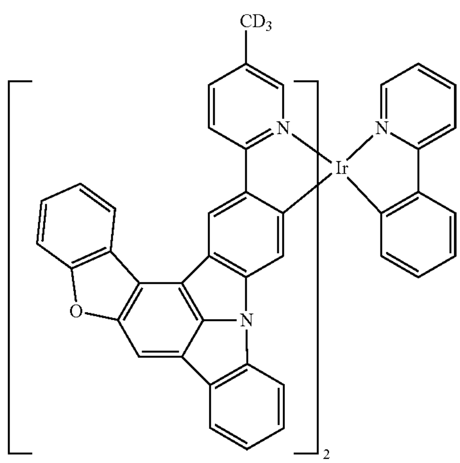
156
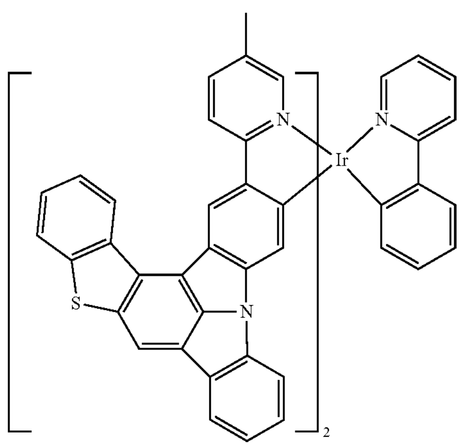
-continued
157
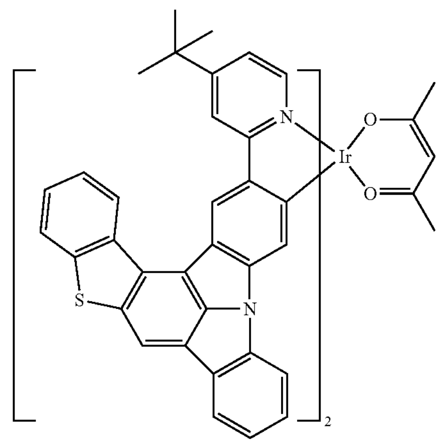
158
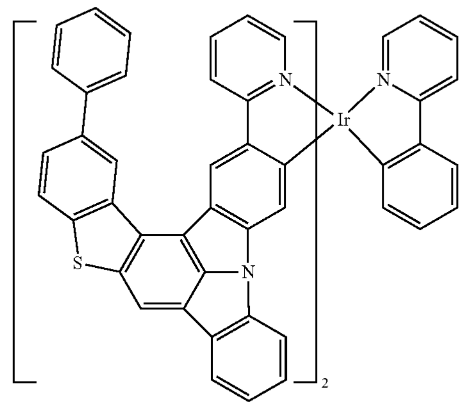
159
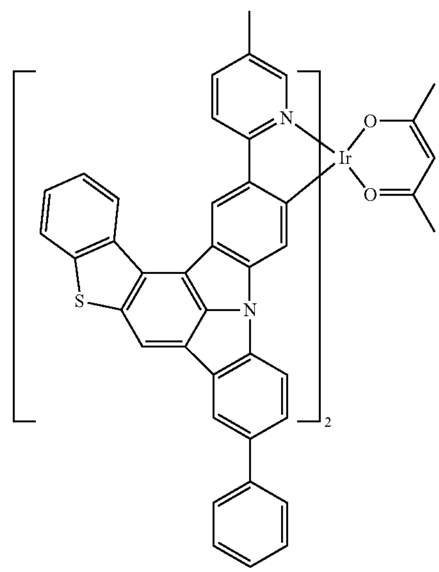

-continued
160
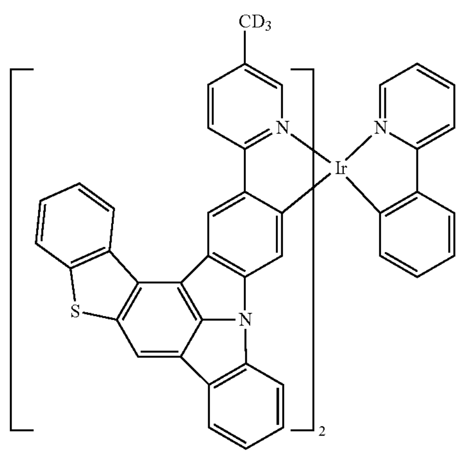
161
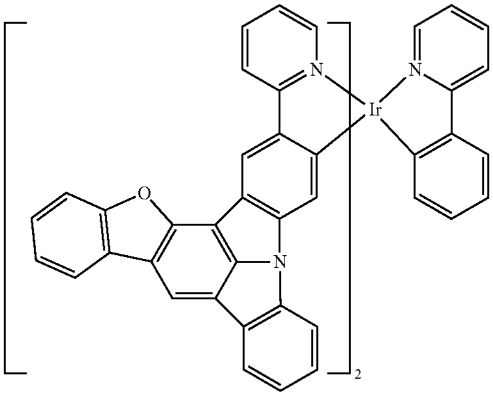
162
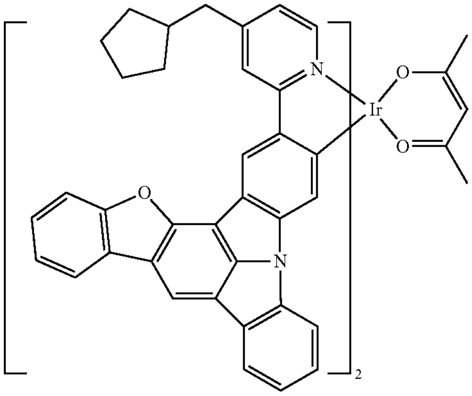
-continued
163
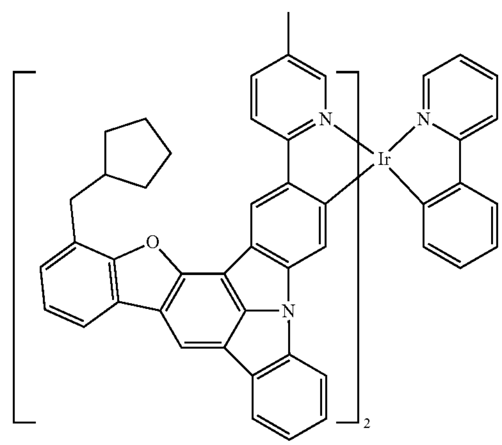
164
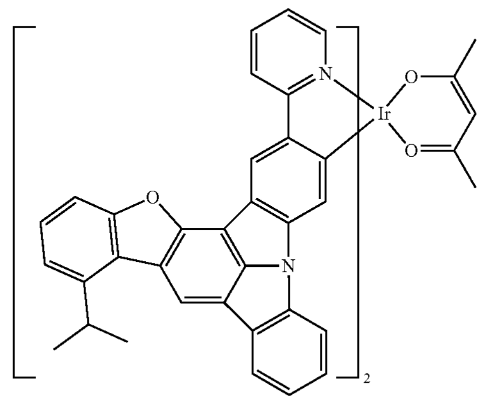
165
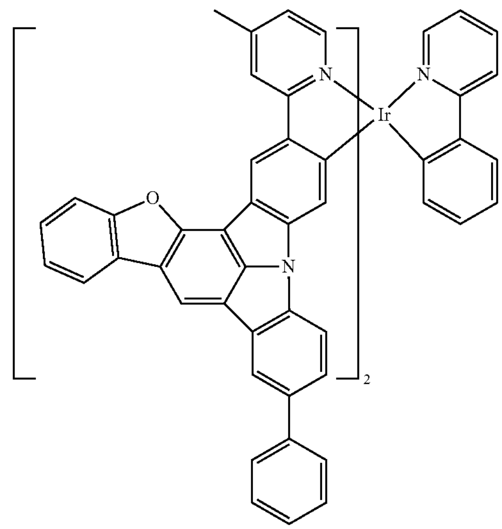

-continued
166
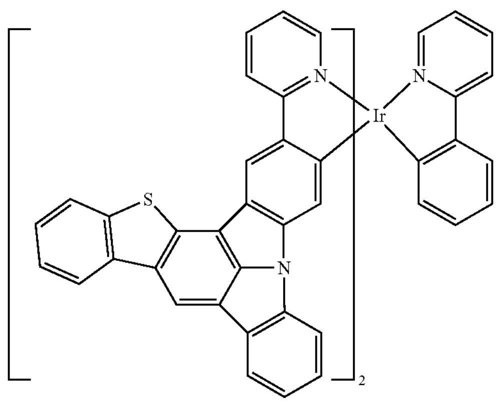
167
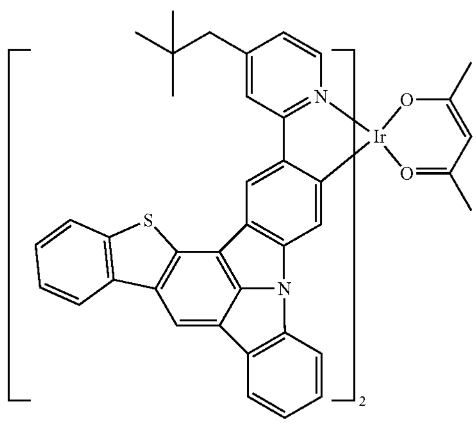
168
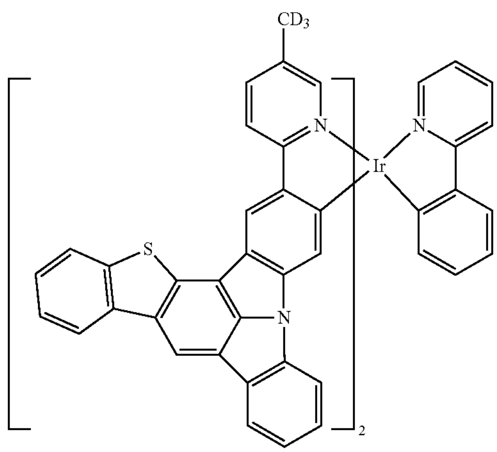
-continued
169
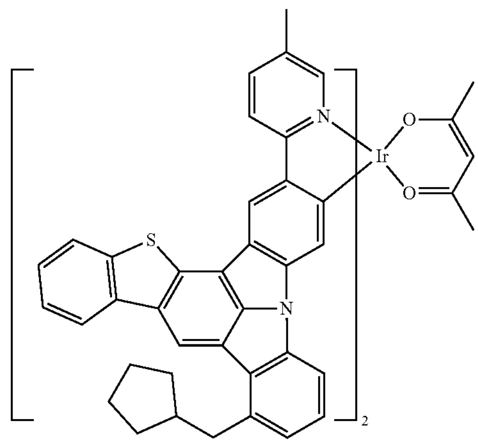
170
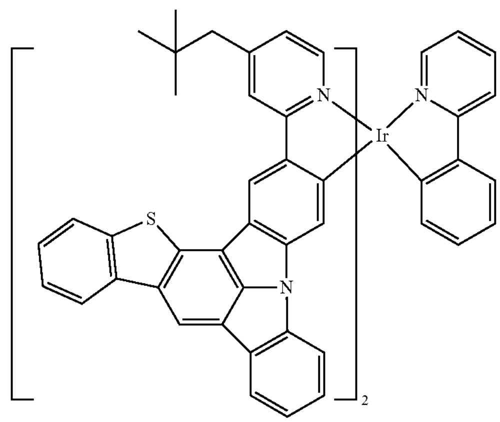
171
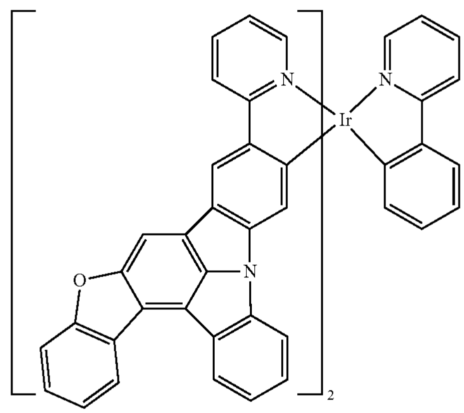

-continued
172
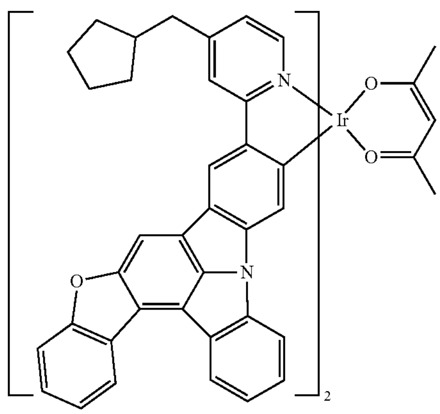
173
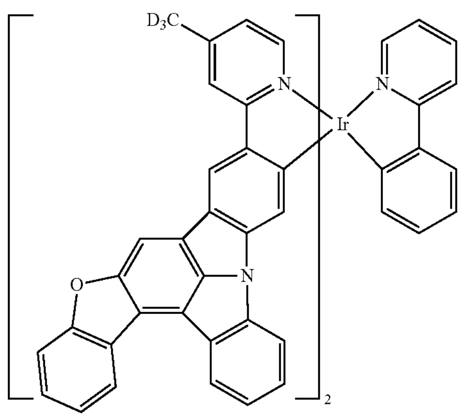
174
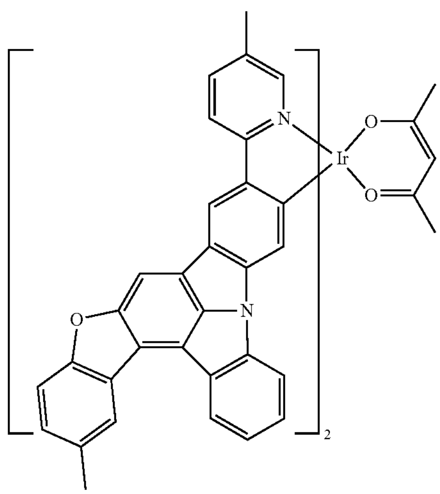
-continued
175
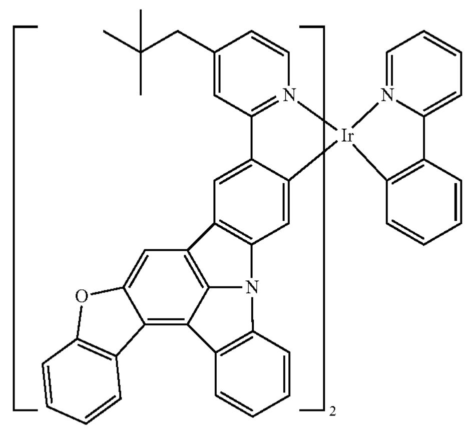
176
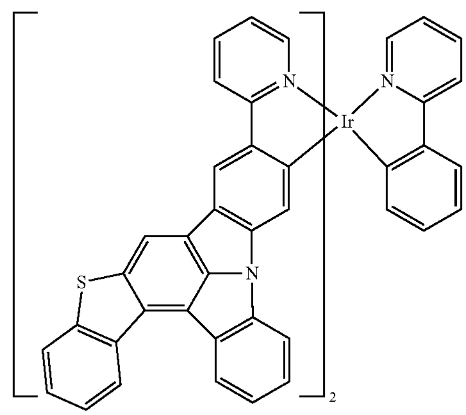
177
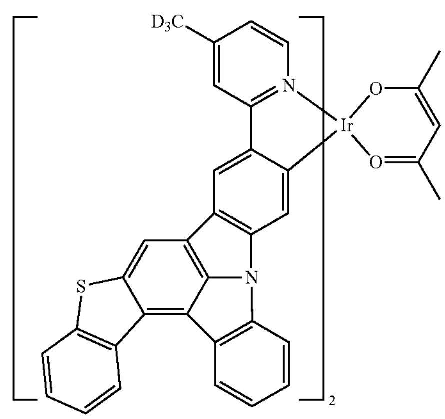

-continued
178
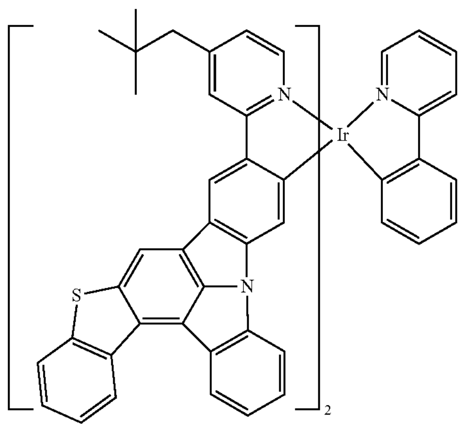
179
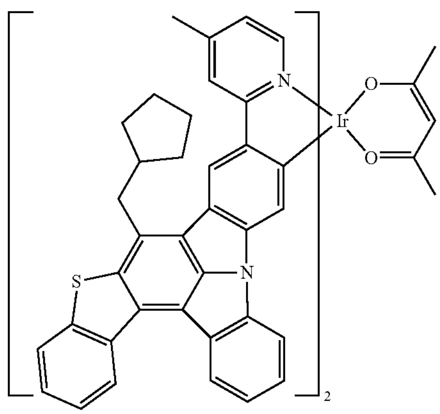
180
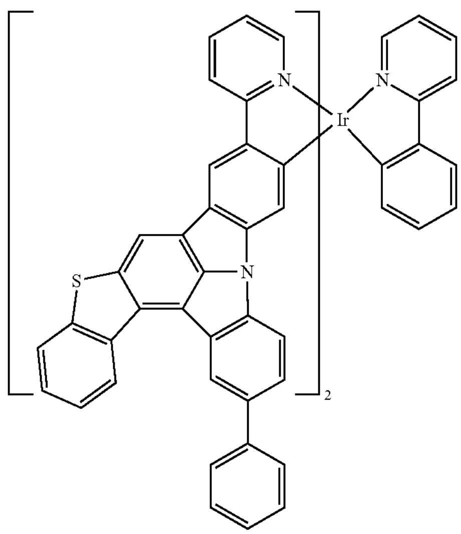
-continued
181
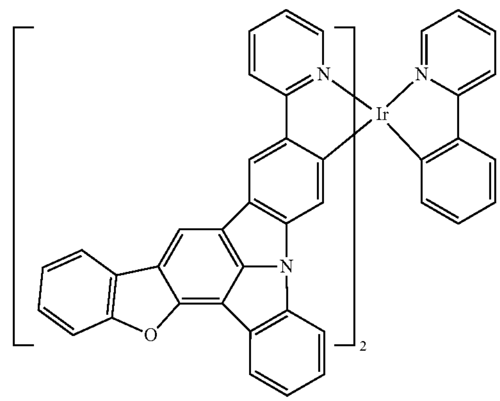
182
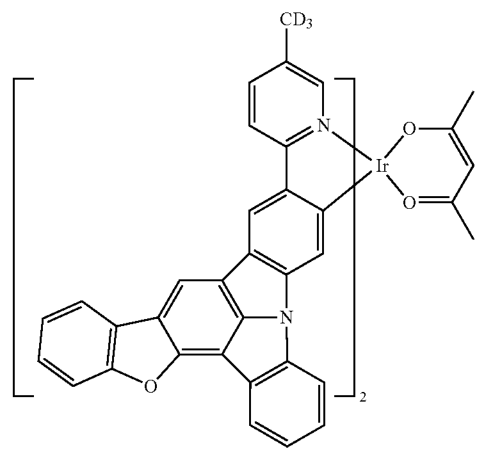
183
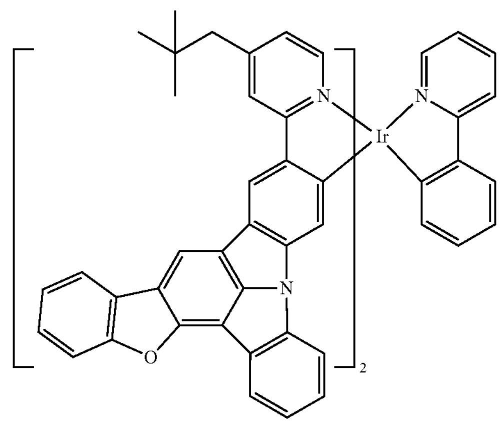

-continued
184
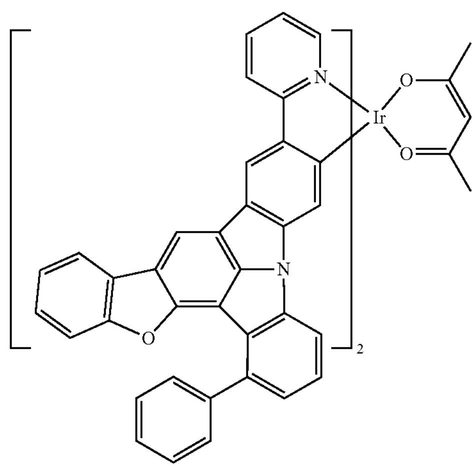
185
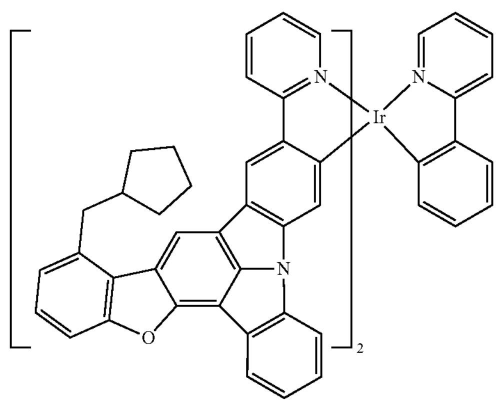
186
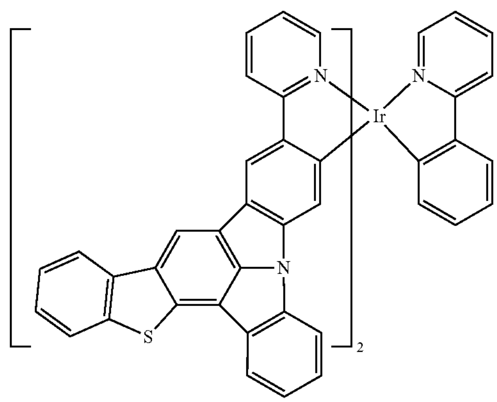
-continued
187
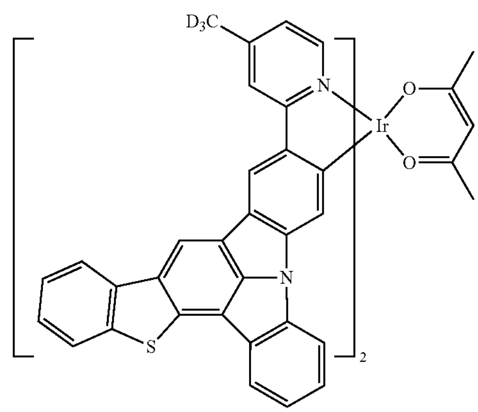
188
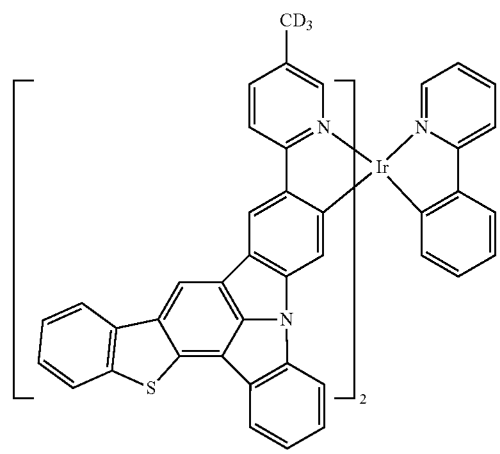
189
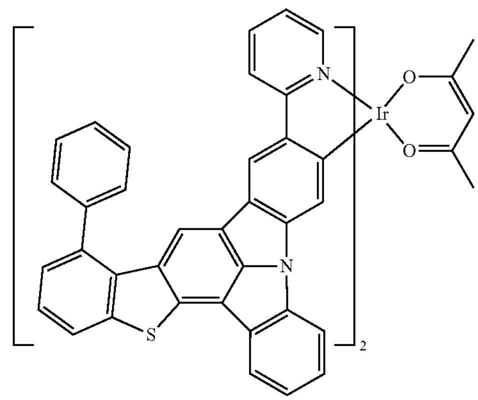

-continued
190
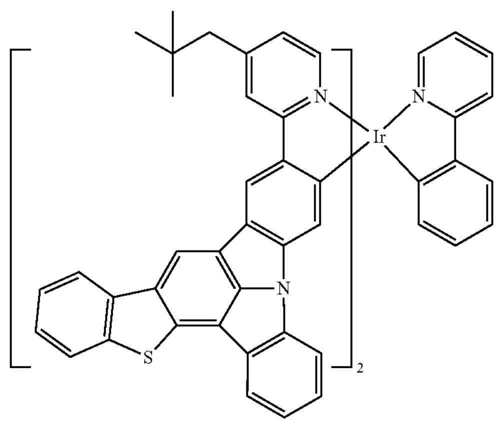
191
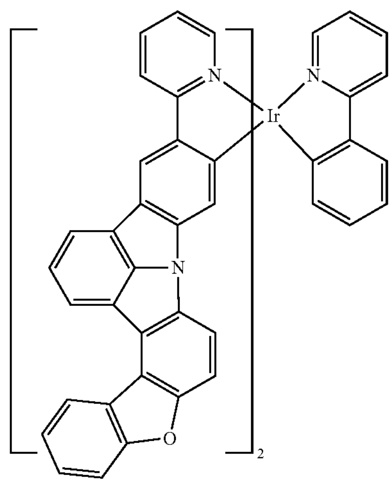
192
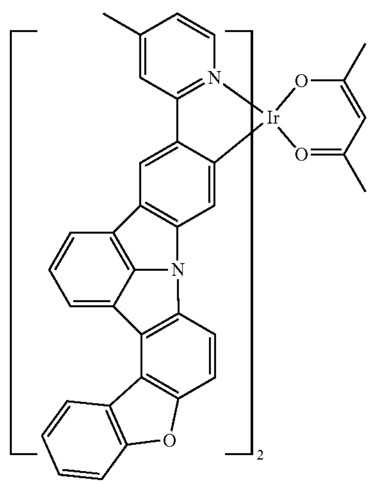
193
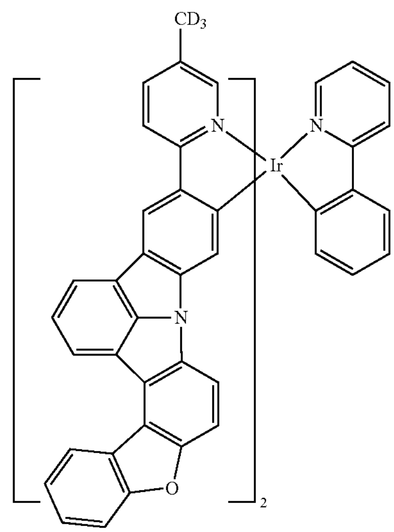
194
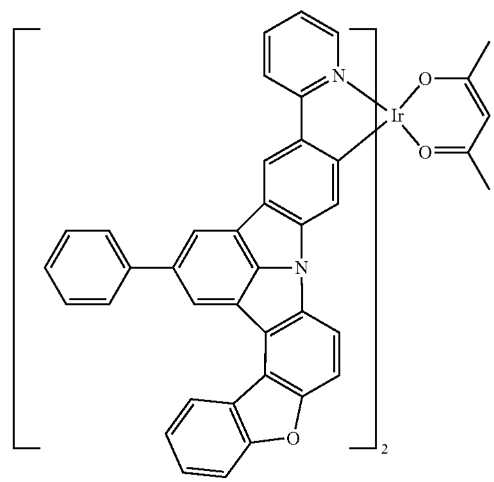
195
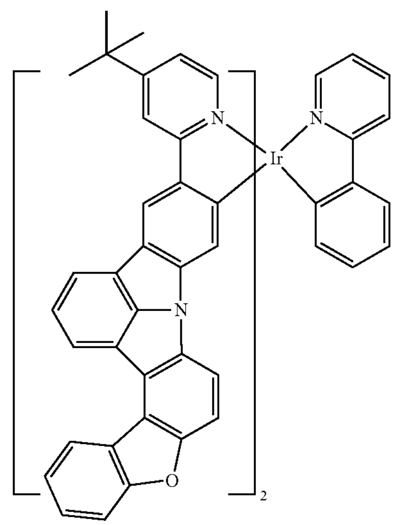

-continued
196
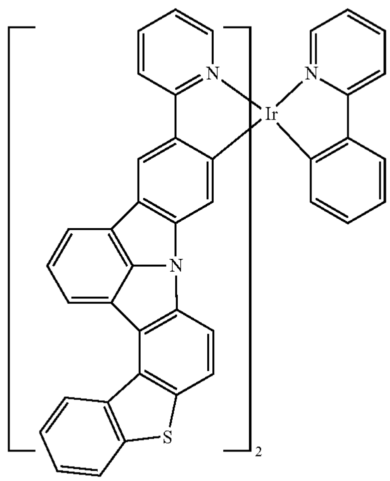
197
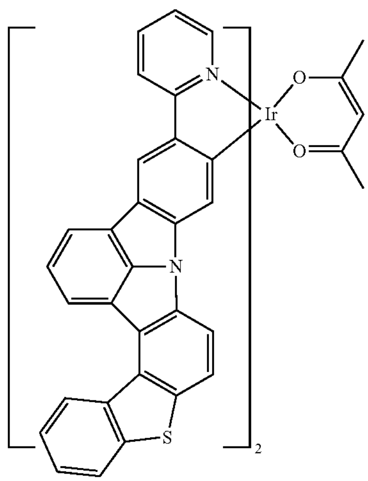
198
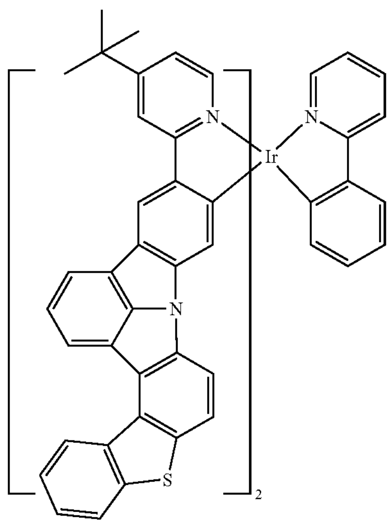
-continued
199
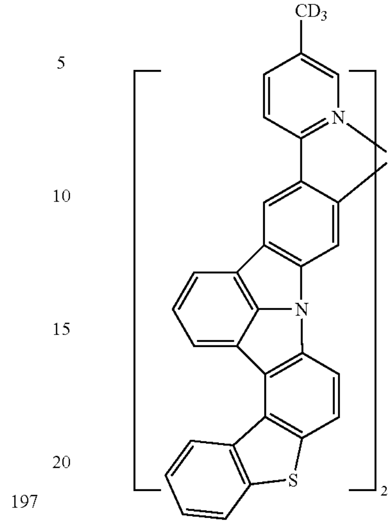
200
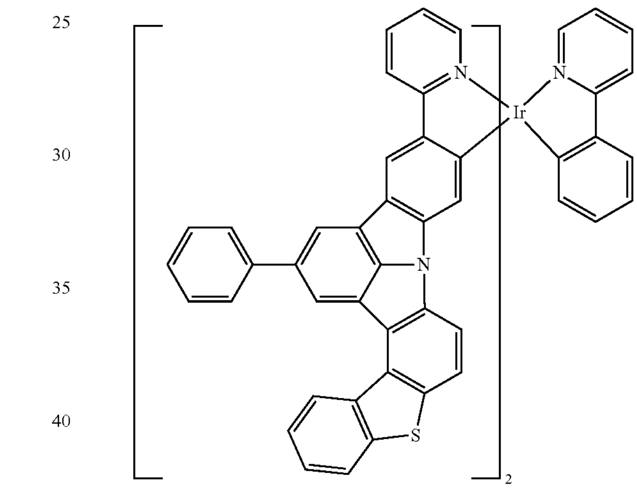
201
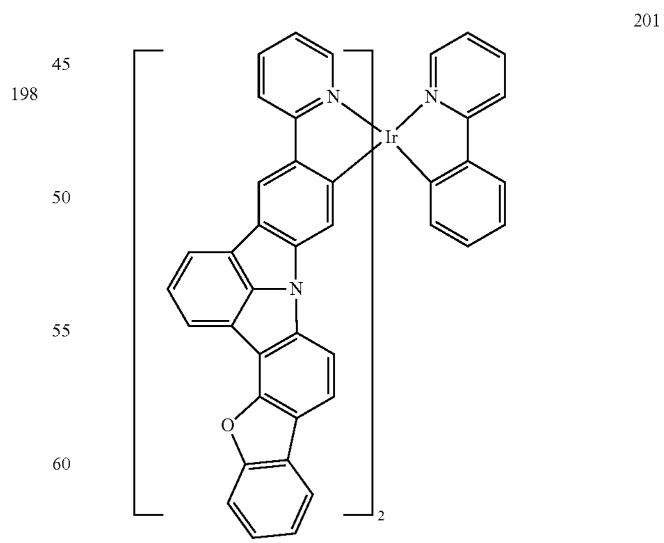
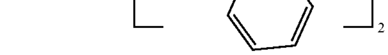

-continued
202
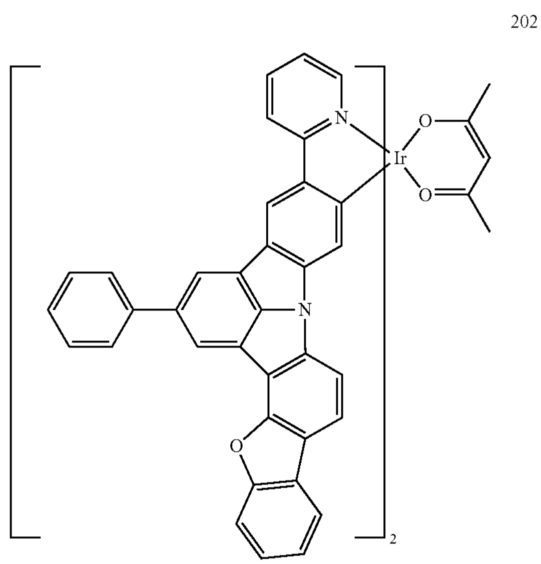
205
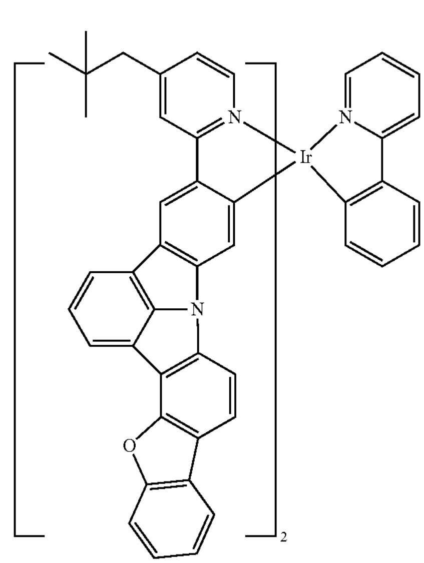
203
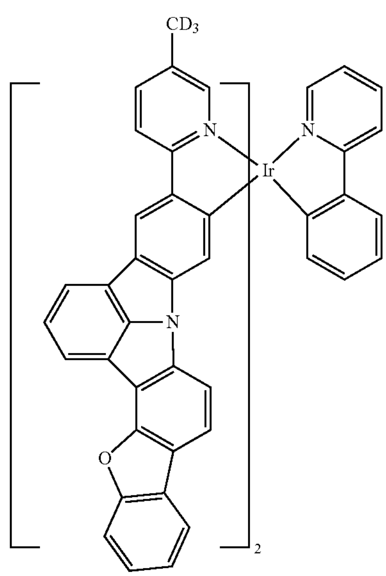
206
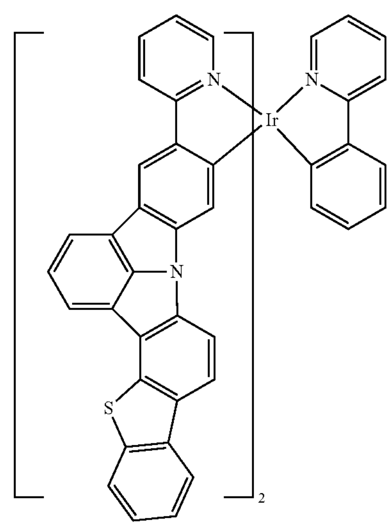
204
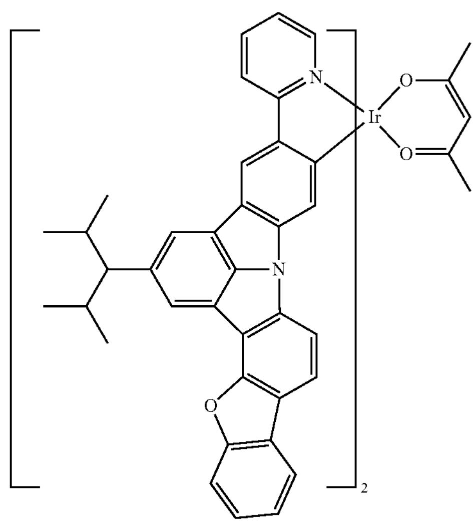
207
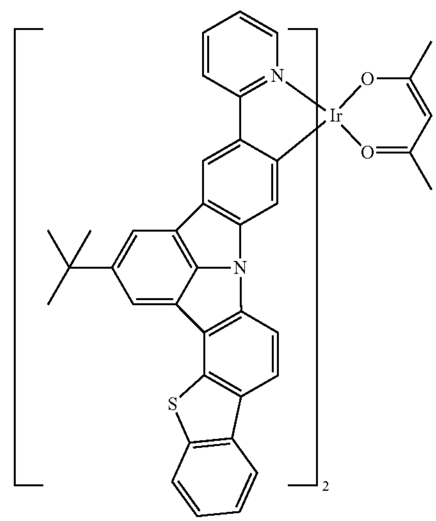

-continued
208
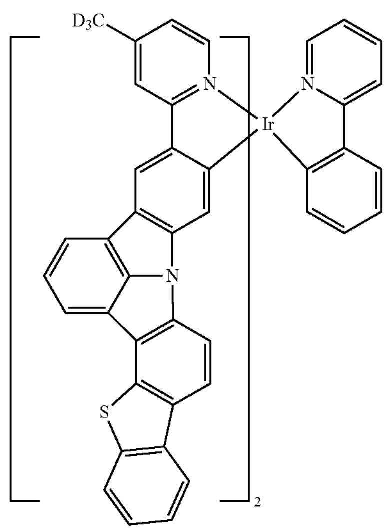
209
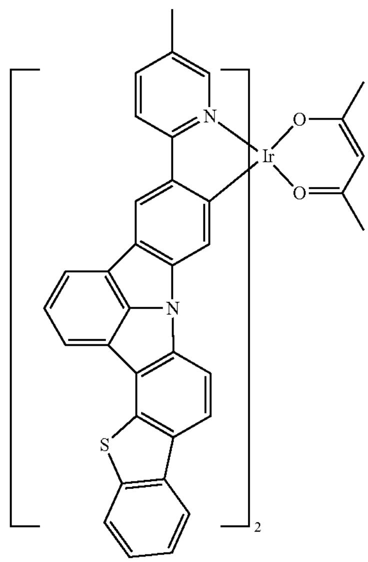
210
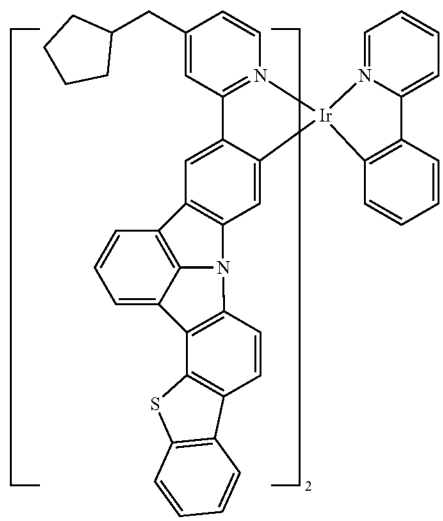
-continued
211
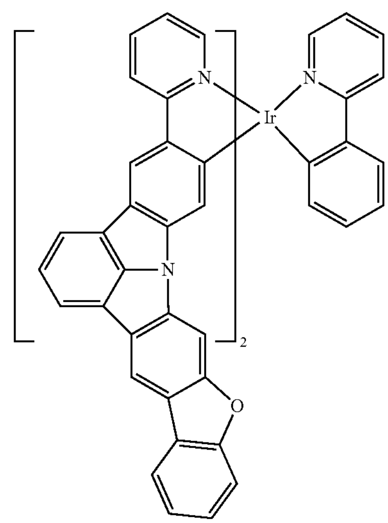
212
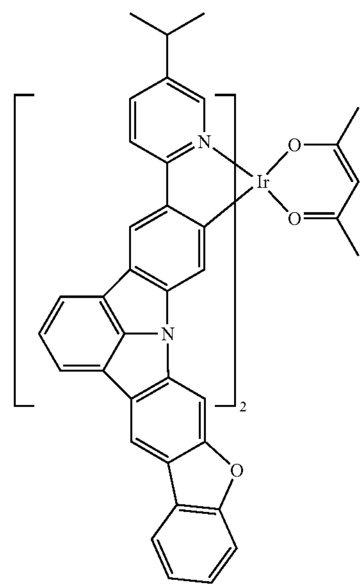
213
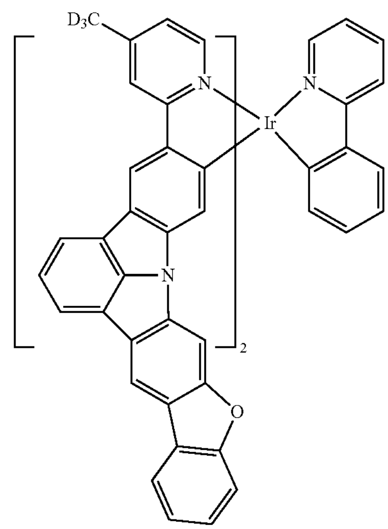

-continued
214
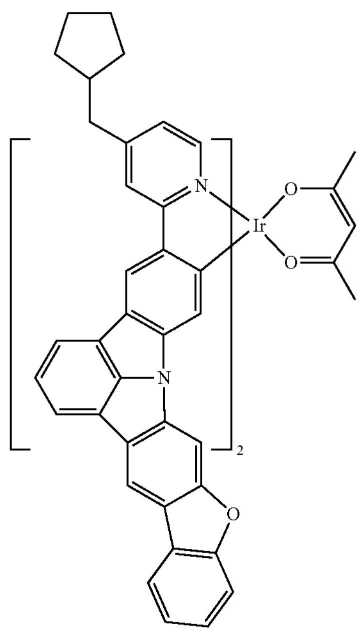
215
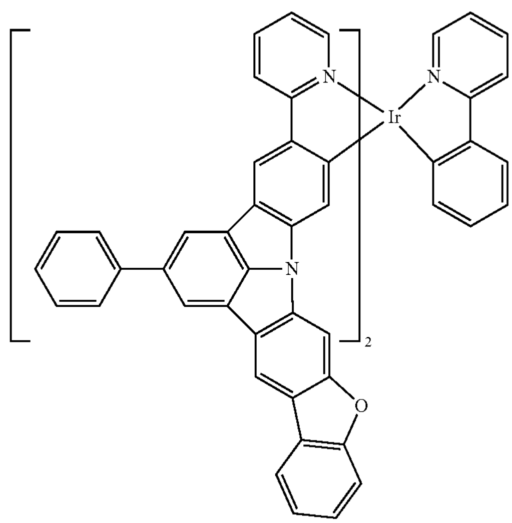
-continued
216
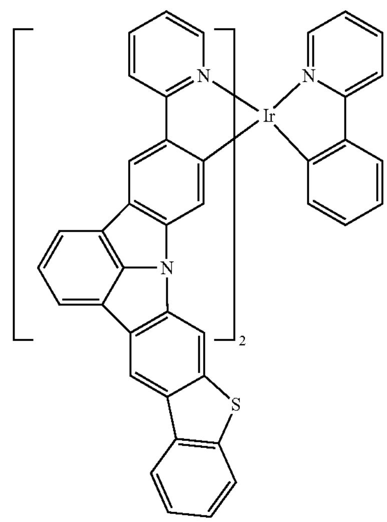
217
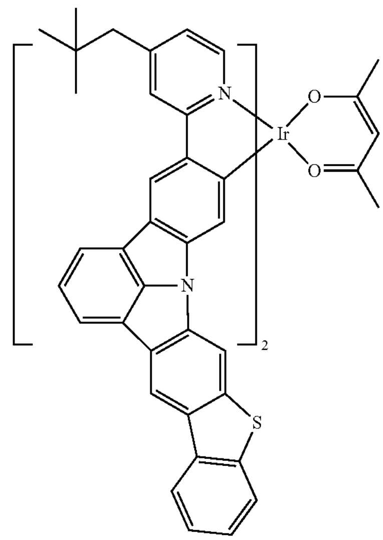
218
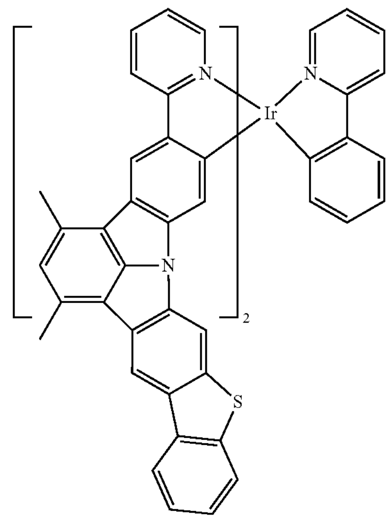

-continued
219
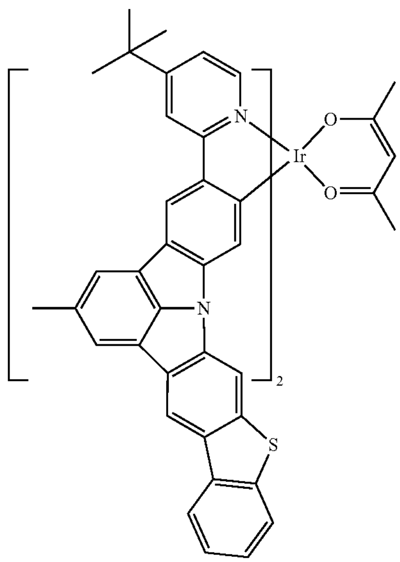
220
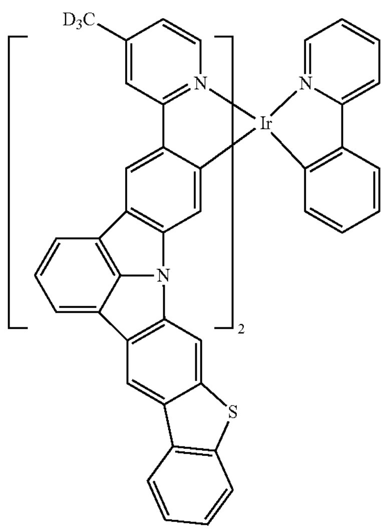
221
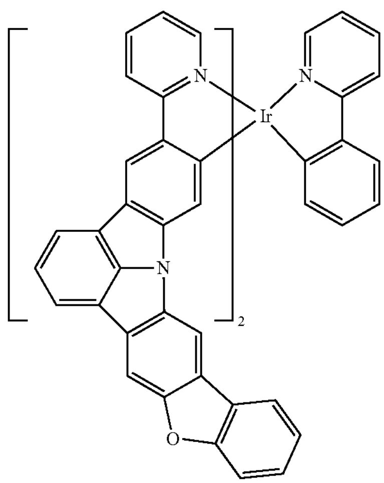
-continued
222
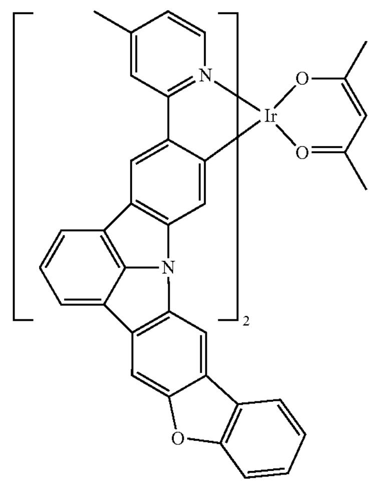
223
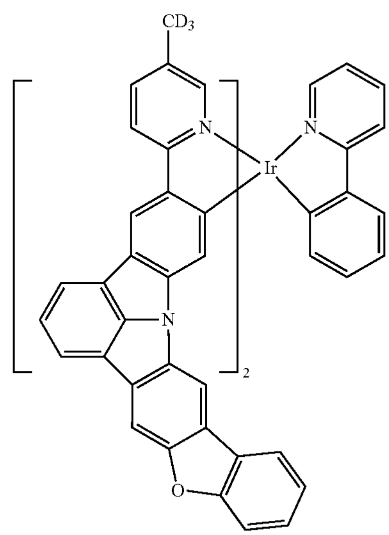
224
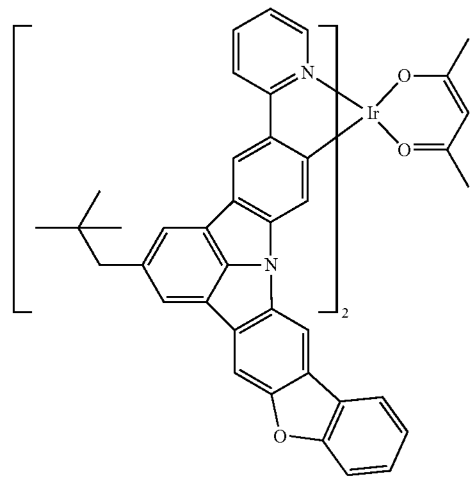

-continued
225
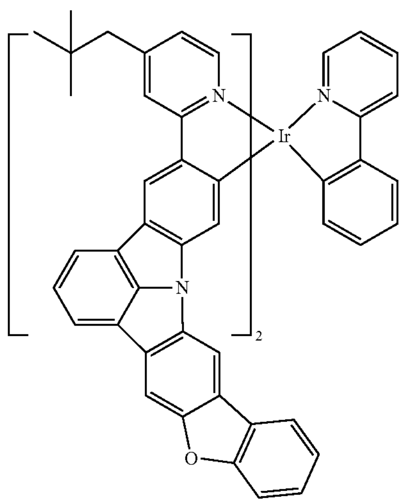
226
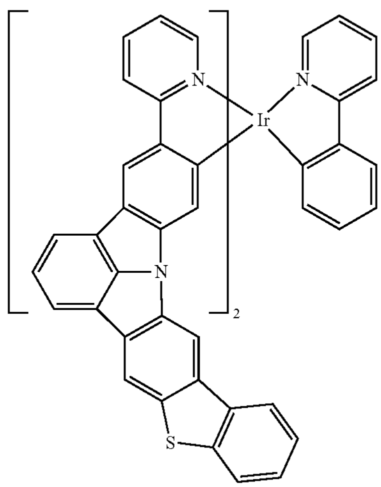
227
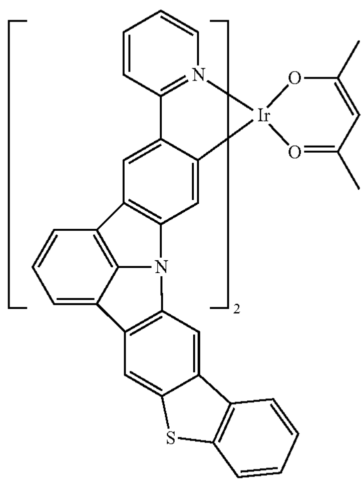
-continued
228
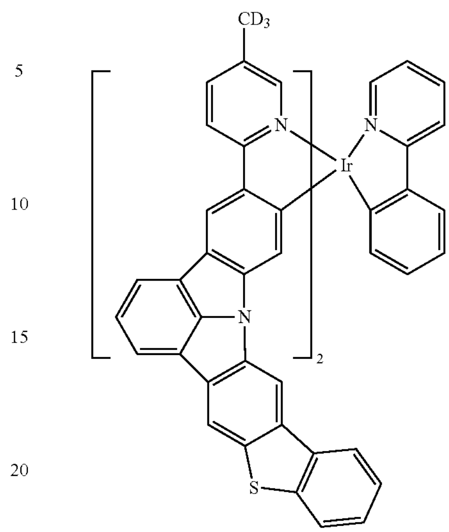
229
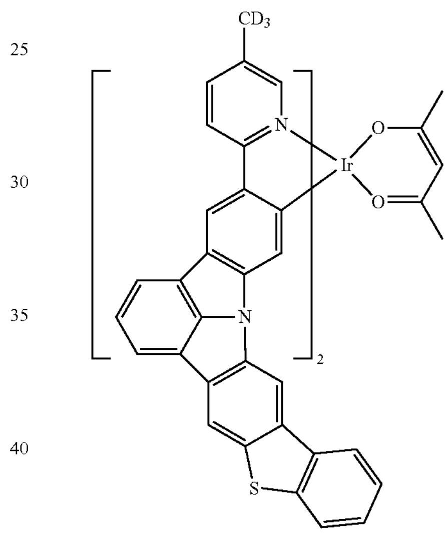
230
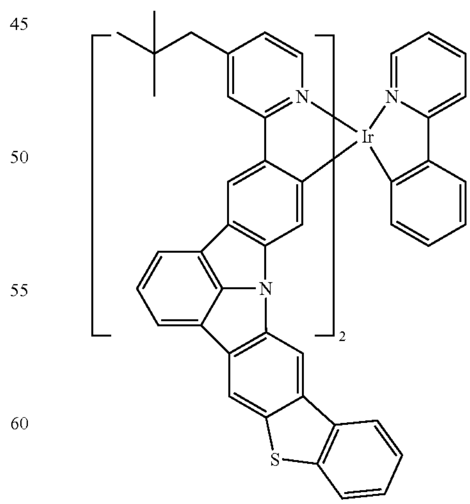

-continued
231
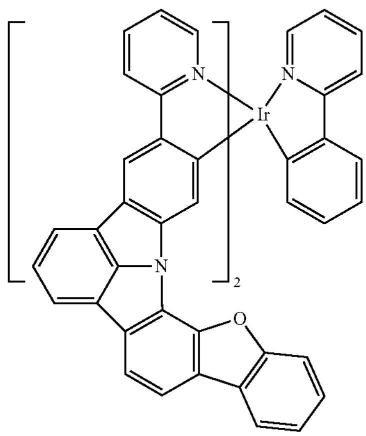
232
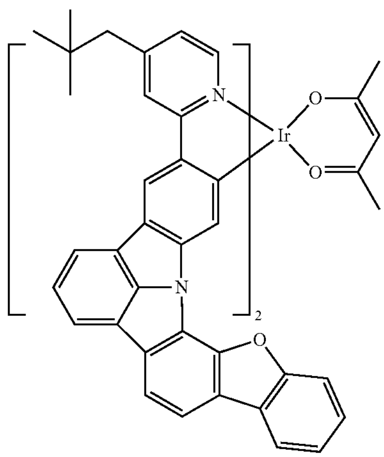
233
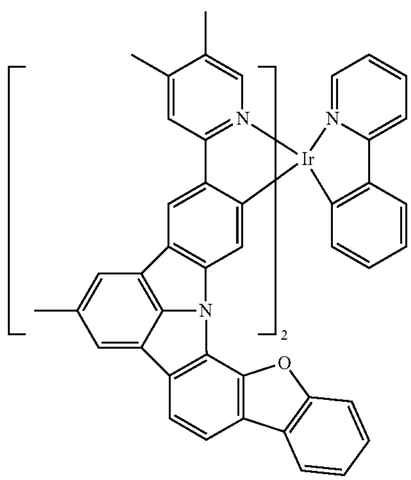
-continued
234
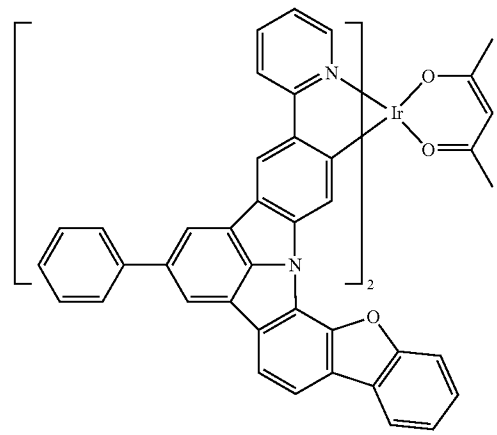
235
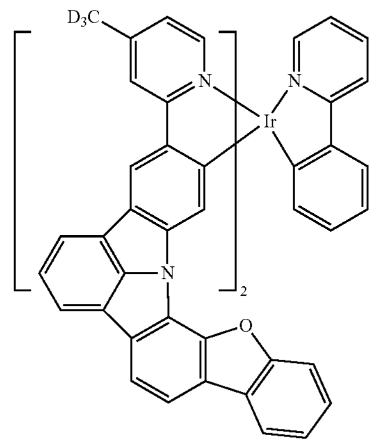
236
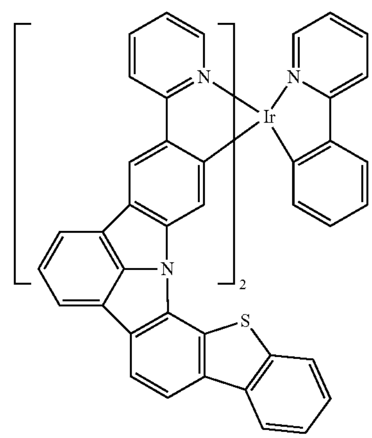

237
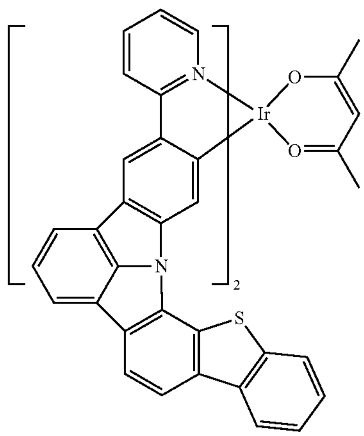
238
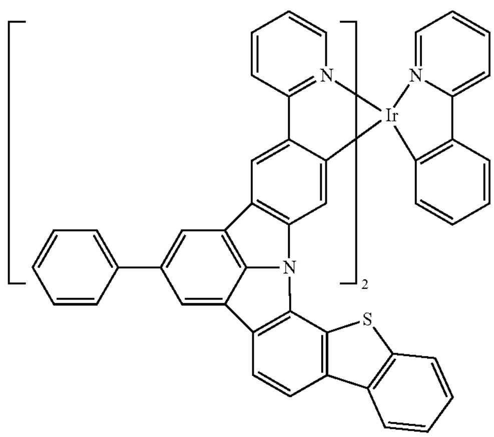
239
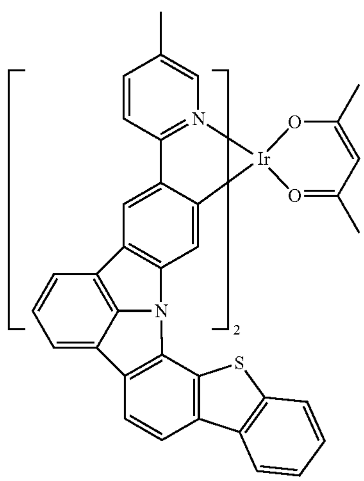
240
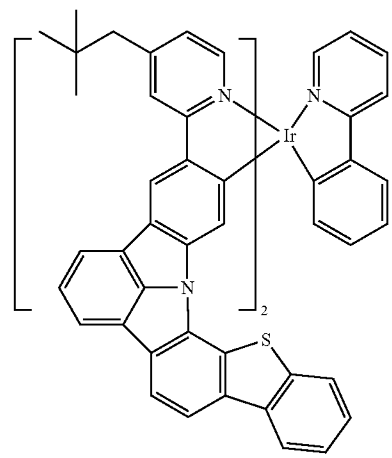
241
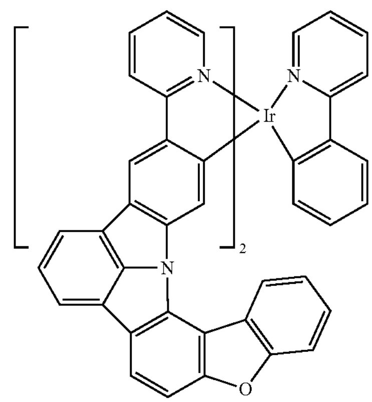
242
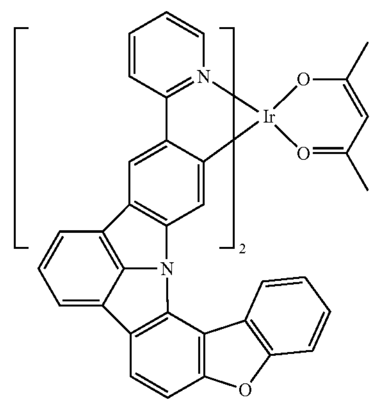

-continued
243
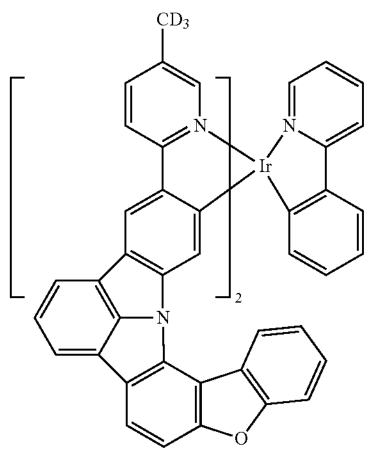
244
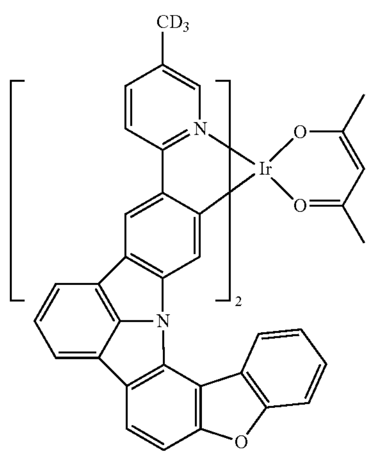
245
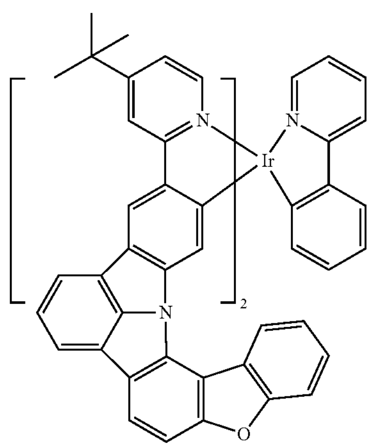
-continued
246
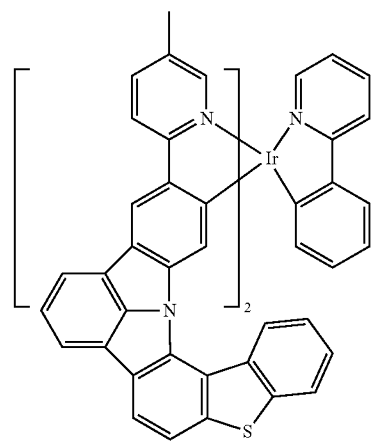
247
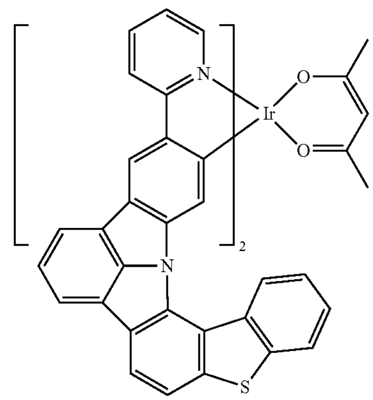
248
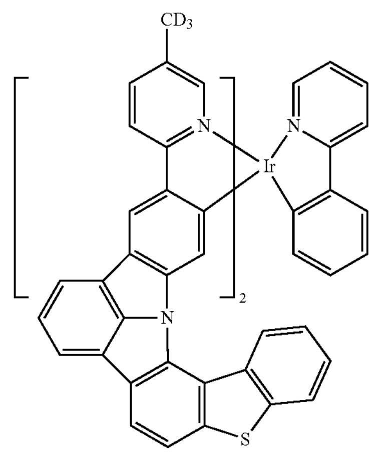

249
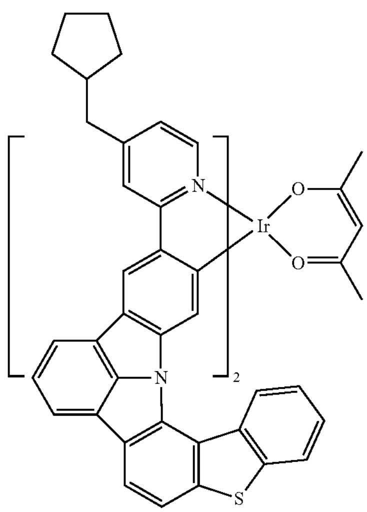
250
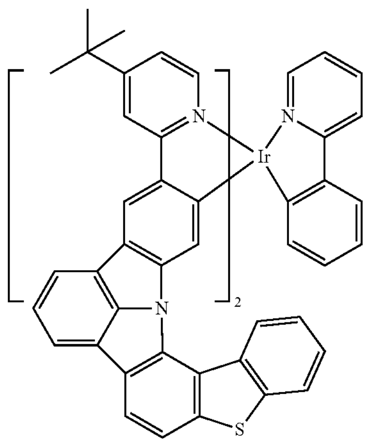
251
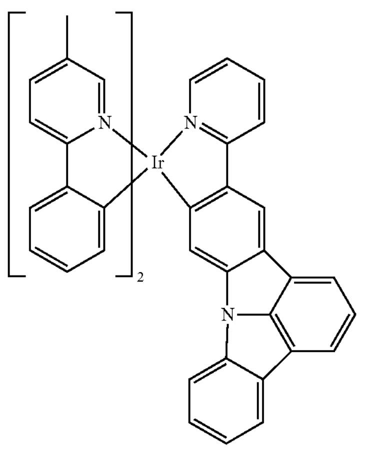
252
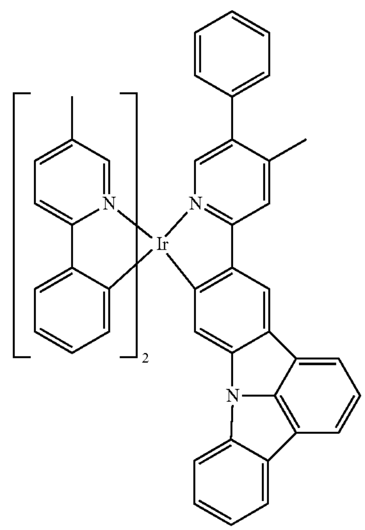
253
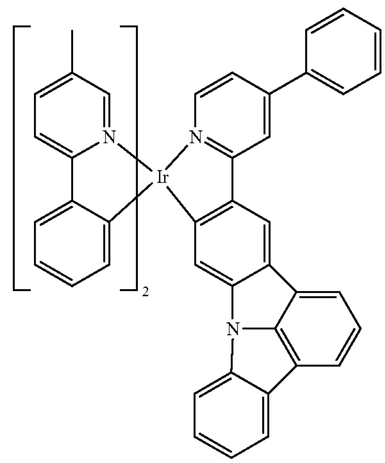
254
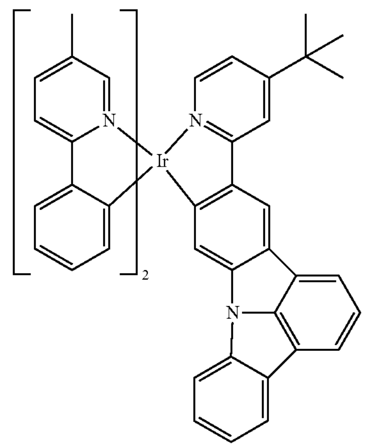

-continued

255

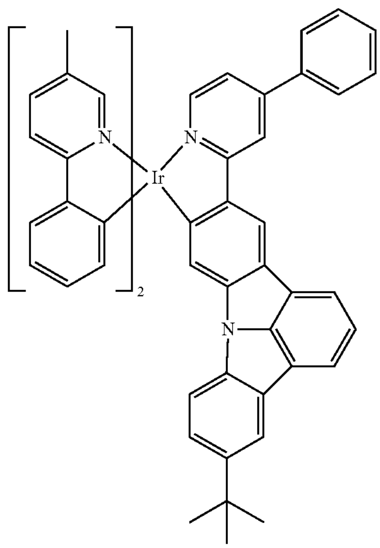

256

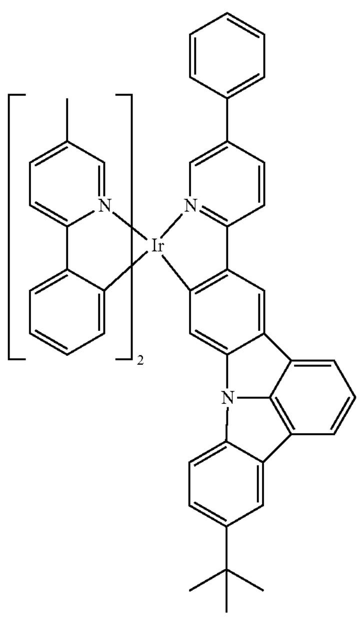

-continued

257

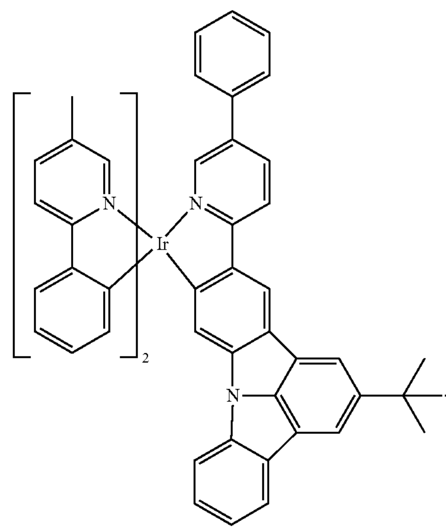

The organometallic compound having any one of the structures represented by Formula 4A to Formula 6 includes a hetero aromatic ligand consisting of at least 5 rings, so it may have a rigid chemical conformation. The organometallic compound may improve its color purity and luminous lifespan because it may maintain its stable chemical conformation in the emission process. In addition, since the organometallic compound may be a metal complex with bidentate ligands, it is possible to control the emission color purity and emission colors with ease. Accordingly, an organic light emitting diode may have beneficial luminous efficiency by applying the organometallic compound having the structure represented by Formulae 1 to 6 into an emissive layer.

The first host 344 may be a p-type host with relatively beneficial hole affinity property. The first host 344 may be a (hetero) aryl-amine-based organic compound having the following structure represented by Formula 7:

[Formula 7]

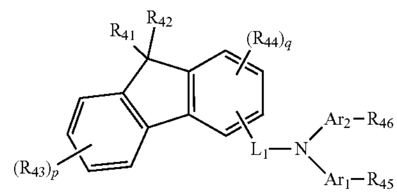

where in the Formula 7, each of $R_{41}$ and $R_{42}$ is independently hydrogen, deuterium, an unsubstituted or substituted $C_1$-$C_{20}$ alkyl, an unsubstituted or substituted $C_6$-$C_{30}$ aryl or an unsubstituted or substituted $C_3$-$C_{30}$ hetero aryl, optionally, each substituent on the substituted $C_6$-$C_{30}$ aryl and substituted $C_3$-$C_{30}$ hetero aryl is independently unsubstituted or further substituted with at least one of $C_6$-$C_{30}$ aryl and $C_3$-$C_{30}$ hetero aryl, optionally, $R_{41}$ and $R_{42}$ are further directly or indirectly linked together to form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the substituted $C_6$-$C_{30}$ aryl, substituted $C_3$-$C_{30}$ hetero aryl, substituted $C_6$-$C_{30}$ aryl amino and substituted $C_3$-$C_{30}$ hetero aryl amino is independently unsubstituted or further substituted with at least one of $C_6$-$C_{30}$ aryl and $C_3$-$C_{30}$ hetero aryl, where each $R_{43}$ is identical to or different from each other when p is 2, 3 or 4 more and each $R_{44}$ is identical to or different from each other when q is 2 or 3;

$L_1$ is a single bond, unsubstituted or substituted $C_6$-$C_{30}$ arylene or unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene forms independently a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3.

In one example embodiment, each of the aryl and the hetero aryl of $R_{41}$ to $R_{46}$, the spiro aromatic ring and the spiro hetero aromatic ring by $R_{41}$ and $R_{42}$, the arylene and the hetero arylene of $L_1$, the aromatic ring and the hetero aromatic ring of $Ar_1$ and $Ar_2$ may be independently unsubstituted or substituted with at least one of $C_1$-$C_{10}$ alkyl, $C_6$-$C_{20}$ aryl amino, $C_3$-$C_{20}$ hetero aryl amino, $C_6$-$C_{20}$ aryl and $C_3$-$C_{20}$ hetero aryl, or may form a spiro structure with a $C_6$-$C_{20}$ aromatic ring or a $C_3$-$C_{20}$ hetero aromatic ring. Optionally, each of the $C_6$-$C_{20}$ aryl amino, $C_3$-$C_{20}$ hetero aryl amino, $C_6$-$C_{20}$ aryl and $C_3$-$C_{20}$ hetero aryl may be independently unsubstituted or further substituted with other $C_6$-$C_{20}$ aryl and/or other $C_3$-$C_{20}$ hetero aryl.

As an example, each of $R_{41}$ and $R_{42}$ constituting a fluorenyl moiety may include independently, but is not limited to, methyl, phenyl unsubstituted or substituted diphenyl amino (each of two phenyl in the diphenyl amino may be independently unsubstituted or substituted other phenyl) and an unsubstituted or substituted fluorene ring having a spiro structure Each of $R_{43}$ and $R_{44}$ linked to a side benzene ring of the fluorenyl moiety may include independently, but is not limited to, hydrogen, deuterium, diphenyl amino unsubstituted or substituted with other aryl, phenyl unsubstituted or substituted with other phenyl, biphenyl, carbazolyl unsubstituted or substituted with phenyl, dibenzofuranyl, dibenzothiophenyl and diphenyl amino (each of two phenyl in the diphenyl amino may be independently unsubstituted or substituted other phenyl). In one example embodiment, each of m and n may be independently 0 or 1.

In Formula 7, the nitrogen atom or L as a bridging group (or linker) may be linked to, but is not limited to, 1 to 4-positions, for example, 1-position, 3-position or 4-position of the fluorene ring. Each of $Ar_1$ and $Ar_2$ may be independently the aryl or the hetero aryl as described in Formula 2. As an example, each of $Ar_1$ and $Ar_2$ may include independently, but is not limited to, a benzene ring, a biphenyl ring, a terphenyl ring, a naphthalene ring, an anthracene ring, a phenanthrene ring, a pyrene ring and a triphenylene ring, each of which may be independently unsubstituted or substituted.

In addition, each of $R_{45}$ and $R_{46}$ may include independently, but is not limited to, hydrogen, phenyl unsubstituted with phenyl or diphenyl amino, dibenzofuranyl, dibenzothiophenyl and carbazolyl unsubstituted or substituted with phenyl. As an example, at least one of $R_{45}$ and $R_{46}$ may be unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino. In one example embodiment, the first host 344 may be selected from, but is not limited to, the following organic compounds represented by Formula 8:

[Formula 8]

GHH1

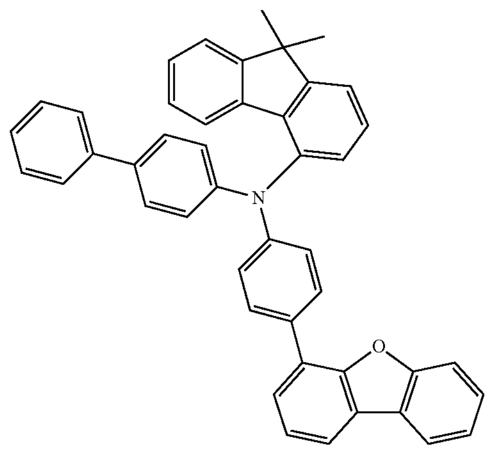

GHH2

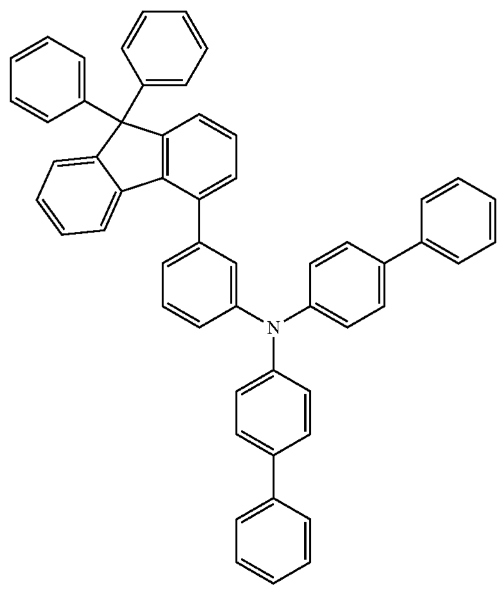

-continued
GHH3
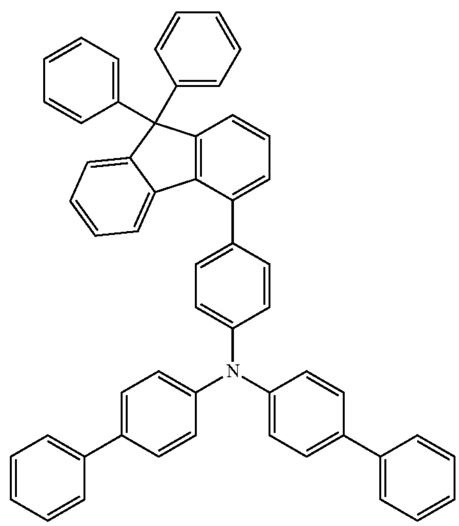
GHH4
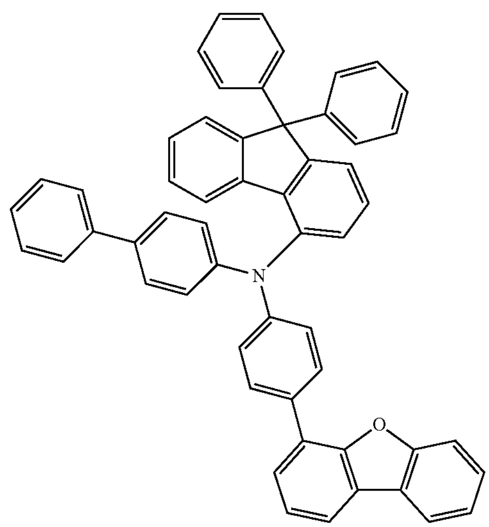
GHH5
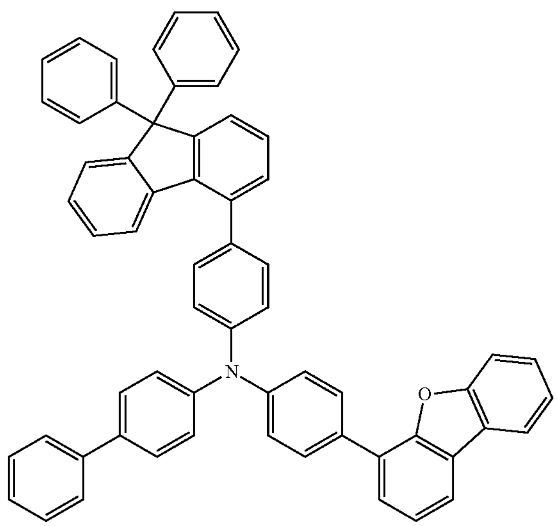
-continued
GHH6
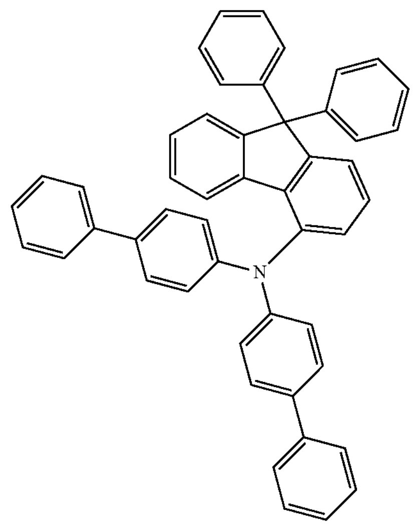
GHH7
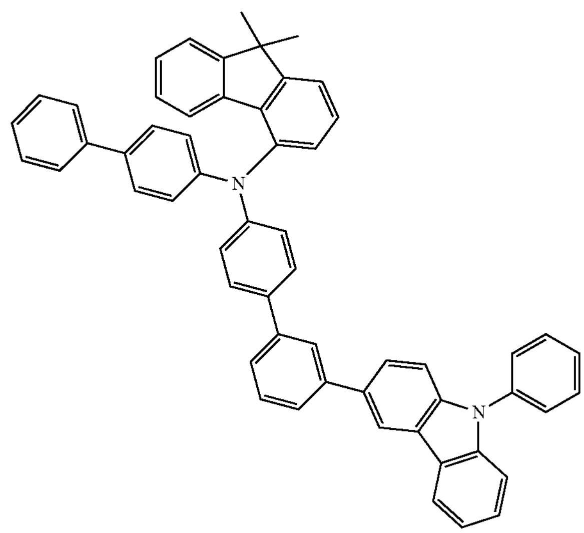
GHH8
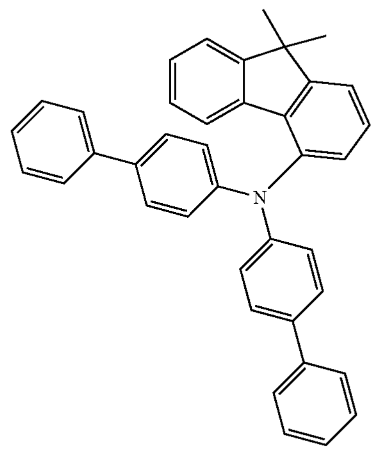

-continued
GHH9
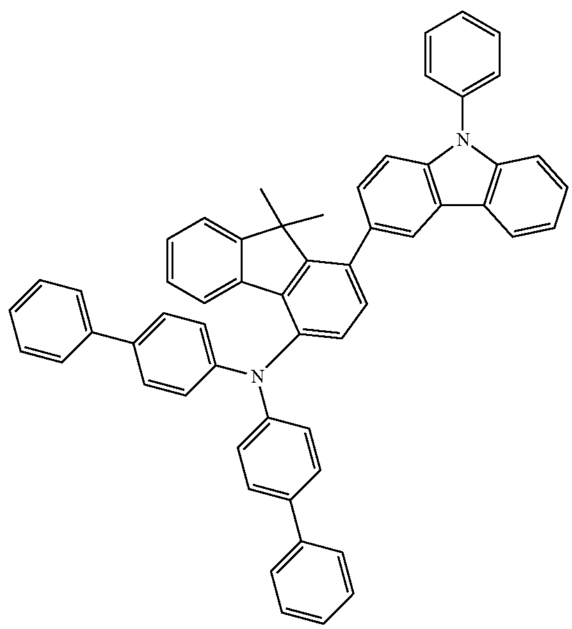
GHH10
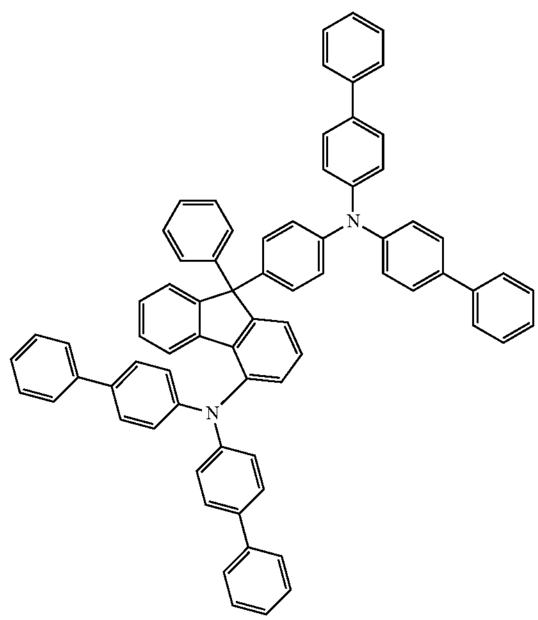
-continued
GHH11
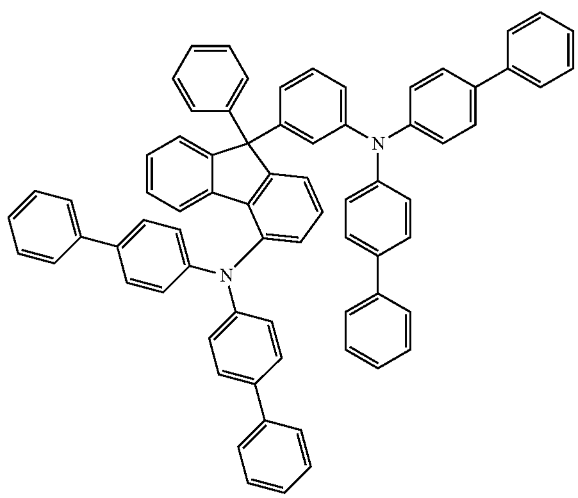
GHH12
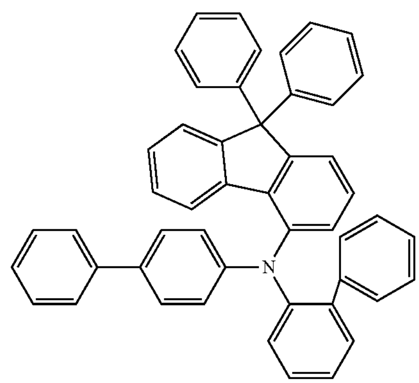
GHH13
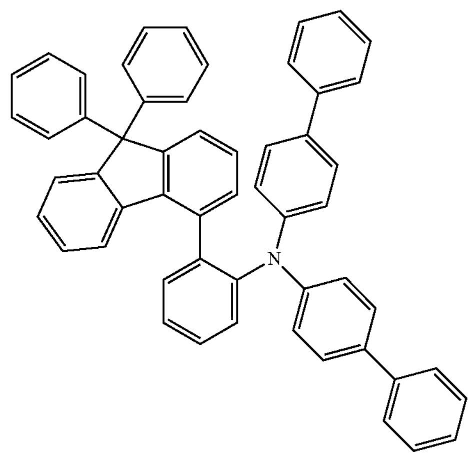

-continued
GHH14
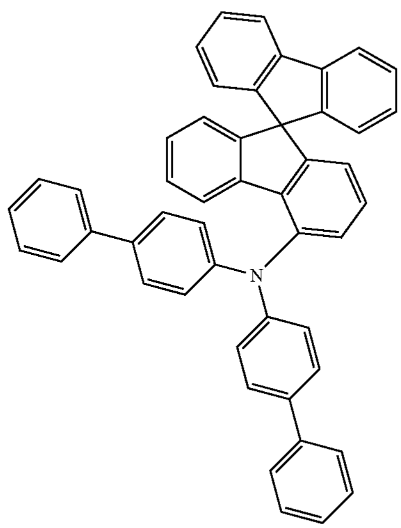
GHH15
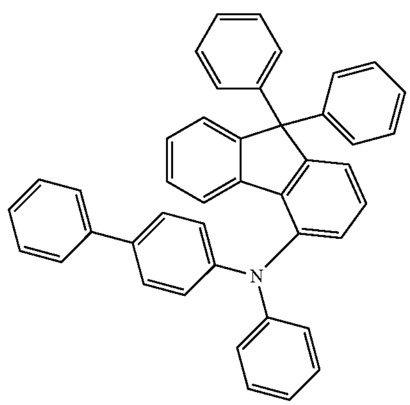
GHH16
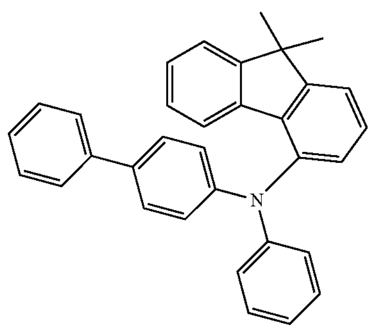
-continued
GHH17
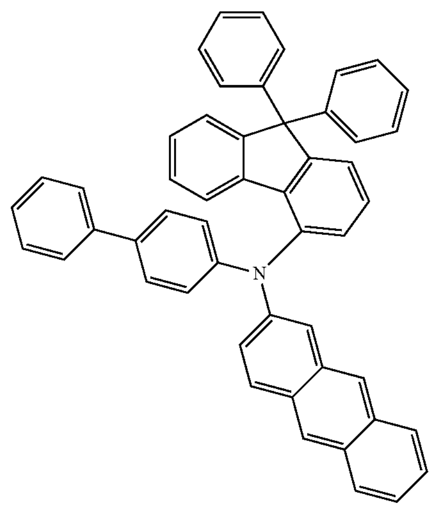
GHH18
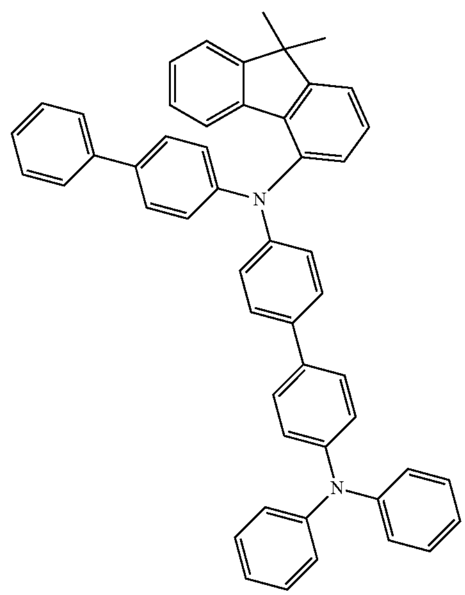
GHH19
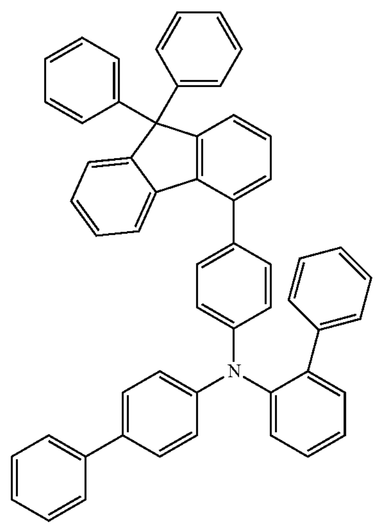

-continued
GHH20
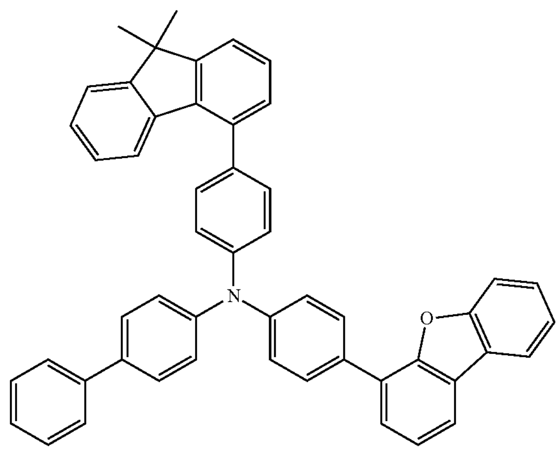
GHH21
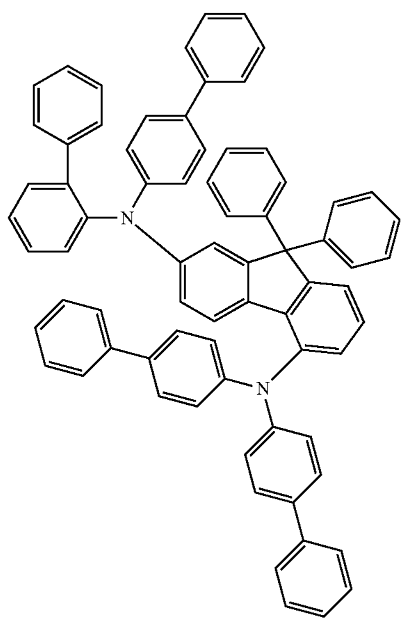
-continued
GHH22
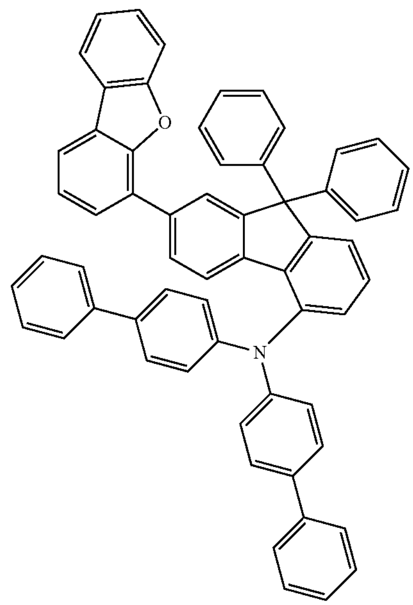
GHH23
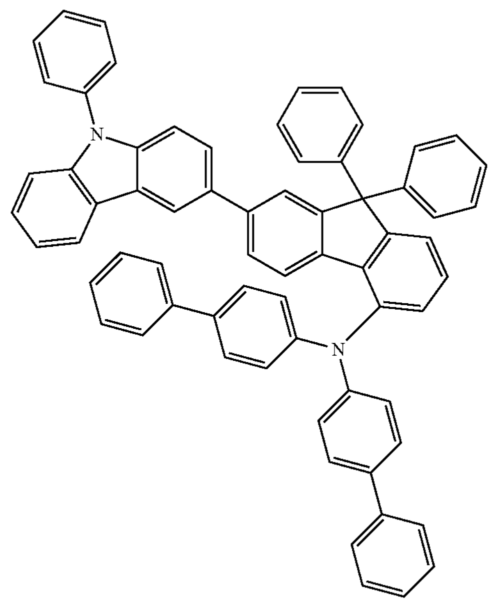

-continued
GHH24
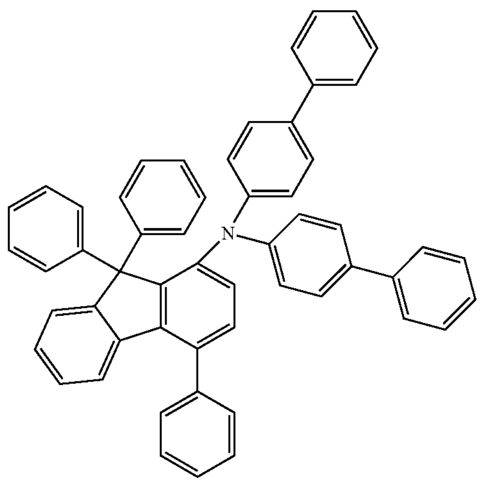
GHH25
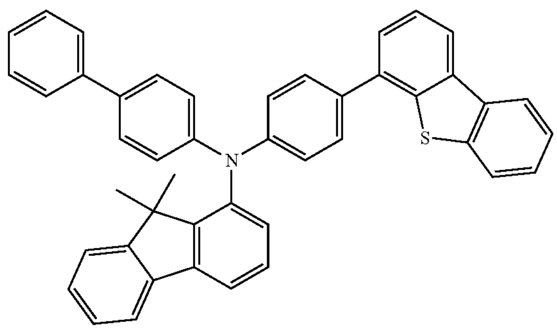
GHH26
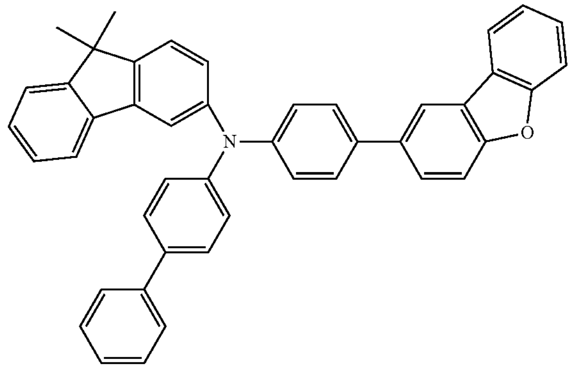
-continued
GHH27
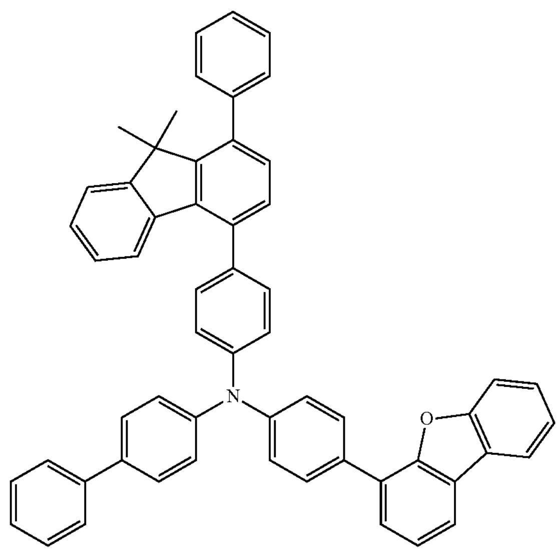
GHH28
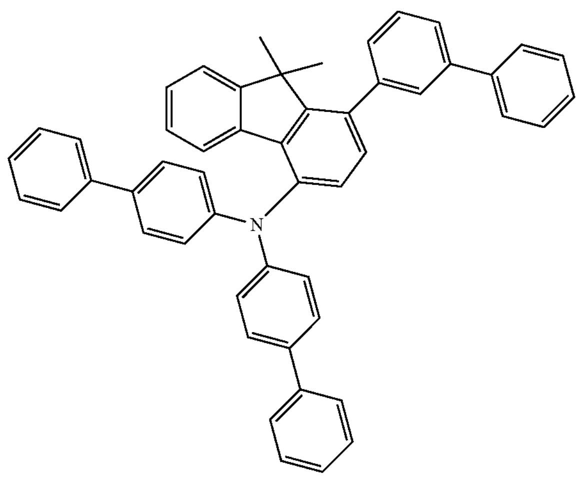

-continued

GHH29

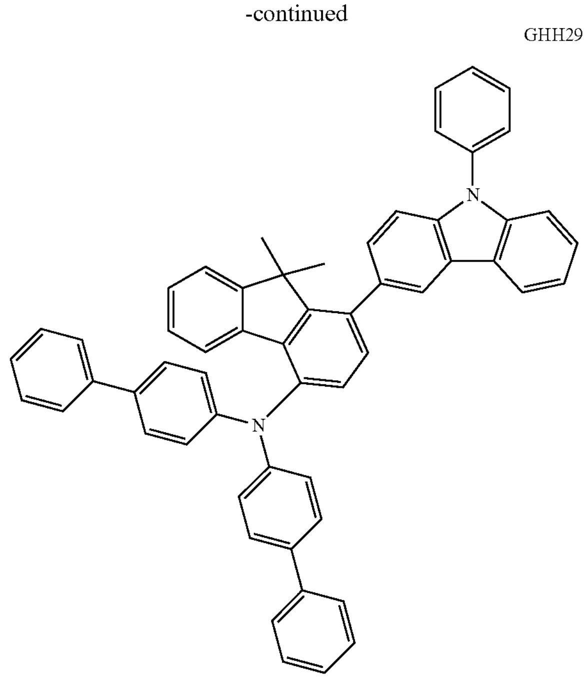

GHH30

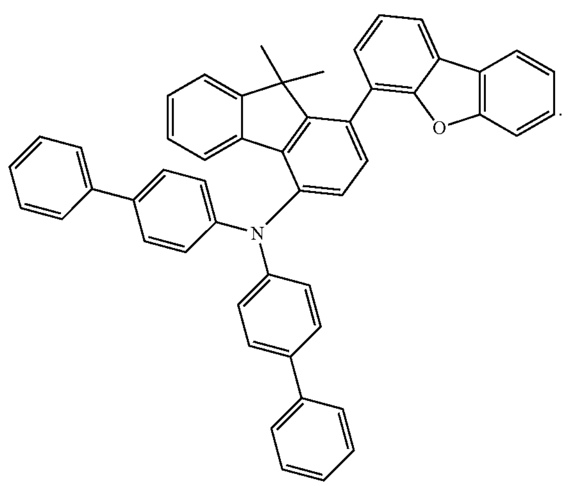

The EML 340 may further include the second host 346 as well as the first host 344. The second host 346 may be an n-type host with relatively beneficial electron affinity property. The second host 346 may include an azine-based organic compound having the following structure represented by Formula 9:

[Formula 9]

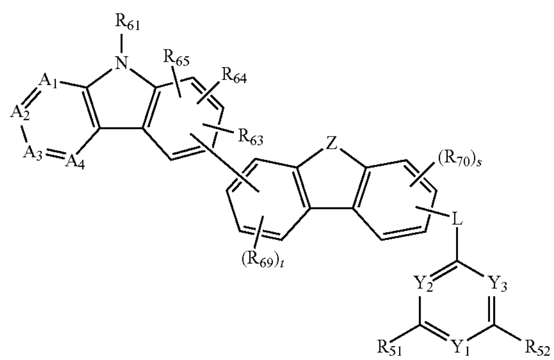

where in the Formula 9, each of $R_{51}$, $R_{52}$ and $R_{61}$ is independently an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl or the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{53}$ or N, where at least one of $Y_1$, $Y_2$ and $Y_3$ is N;

$R_{53}$ is independently a protium, a deuterium, a tritium, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $A_1$ to $A_4$ is independently $CR_{62}$ or N, where at least one of $A_1$ to $A_4$ is $CR_{62}$;

when two adjacent $R_{62}$ and/or two adjacent groups among $R_{63}$ to $R_{65}$ do not form a ring, each of $R_{62}$ to $R_{65}$ is independently a protium, a deuterium, a tritium, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, optionally, two adjacent $R_{62}$ and/or two adjacent R moieties among $R_{63}$ to $R_{65}$ are further directly or indirectly linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

when two adjacent $R_{69}$ when r is an integer of 2 or more and/or two adjacent $R_{70}$ when s is an integer of 2 or more do not form a ring, each of $R_{69}$ and $R_{70}$ is independently hydrogen, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, where each $R_{69}$ is identical to or different from each other when r is 2 or 3 and each $R_{70}$ is identical to or different from each other when s is 2 or 3, optionally, two adjacent $R_{69}$ when r is 2 or 3, and/or two adjacent $R_{70}$ when s is 2 or 3 are further directly or indirectly linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

L is a single bond, an unsubstituted or substituted $C_6$-$C_{30}$ arylene or an unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

Z is O or S; and each of r and s is independently 0, 1, 2 or 3.

In one example embodiment, each of the aryl and the hetero aryl of $R_{51}$ to $R_{53}$, $R_{61}$ to $R_{65}$, $R_{69}$ and $R_{70}$, each of the arylene and the hetero arylene of L and/or each of the aromatic ring and the hetero aromatic ring may be independently unsubstituted or substituted with at least one of $C_1$-$C_{10}$ alkyl, $C_6$-$C_{20}$ aryl and $C_3$-$C_{20}$ hetero aryl, or form a spiro structure with a $C_6$- $C_{20}$ aromatic ring or a $C_3$-$C_{20}$ hetero aromatic ring.

As an example, all of $A_1$ to $A_4$ may be $CR_{62}$. The fused ring including $A_1$ to $A_4$ may include a carbazolyl moiety. Or three of $A_1$ to $A_4$ may be $CR_{62}$ and other of $A_1$ to $A_4$ may be N. The fused ring including $A_1$ to $A_4$ may include a carbolinyl moiety. Alternatively, two of $A_1$ to $A_4$ may be $CR_{62}$ and the other two of $A_1$ to $A_4$ may be N. As an example, when the fused ring including $A_1$ to $A_4$ includes the carbazolyl moiety or the carbolinyl moiety, the carbazolyl moiety and the carbolinyl moiety may be linked to, but is not limited to, 1-position to 3-position and/or 6-position to 8-position of the dibenzo-furan ring or the dibenzo-thiophene ring.

In addition, each of the dibenzo-furan ring and the dibenzo-thiophene ring may be linked to, but is not limited to, position-1, position-2, position-3, position-6 or position-7 on the carbazolyl moiety or the carbolinyl moiety. Two adjacent R groups attached to the carbazolyl moiety or the carbolinyl moiety may form the aromatic ring or the hetero aromatic ring. For example, R groups at position-2 and positions-3 and/or position-6 and position-7 on the carbazolyl moiety or the carbolinyl moiety may form the aromatic ring or the hetero aromatic ring, but is not limited thereto.

The aromatic or the hetero aromatic ring formed by two adjacent R moieties among $R_{62}$ to $R_{70}$ in Formulae 9 may include, but is not limited to, a benzene ring, a naphthalene ring, an anthracene ring, a pyridine ring, a furan ring, a thiophene ring, an indene ring, an indole ring, a benzo-furan ring and a benzo-thiophene ring, each of which may be independently an unsubstituted or substituted with at least one of $C_1$-$C_{10}$ alkyl, $C_6$-$C_{20}$ aryl and $C_3$-$C_{20}$ hetero aryl. As an example, such aromatic or hetero aromatic ring may include an indene ring, an indole ring, a benzo-furan ring and a benzo-thiophene ring, each of which may be unsubstituted or substituted with those groups.

The aryl and the hetero aryl among $R_{51}$ to $R_{53}$ and $R_{61}$ to $R_{70}$ in Formula 9 may include the aryl and the hetero aryl as described in Formula 2. For example, each of $R_{51}$ to $R_{53}$ and $R_{61}$ to $R_{70}$ include independently phenyl, naphthyl, pyridyl, carbazolyl and fluorenyl, respectively, each of which may be unsubstituted or substituted with at least one of $C_1$-$C_{10}$ alkyl, $C_6$-$C_{20}$ aryl and $C_3$-$C_{20}$ hetero aryl.

The arylene and the hetero arylene in Formula 9 may include a divalent bridging group corresponding to the aryl and the hetero aryl described in Formula 2. For example, the arylene and the hetero arylene may include, but is not limited to, phenylene, naphthylene and pyridylene each of which may be independently unsubstituted or substituted with at least one aryl such as phenyl, naphthyl, anthracenyl and phenanthrenyl. In one example embodiment, the second host 346 may include at least one of the following organic compounds of Formula 10. In one example embodiment, the second host 346 may be selected from, but is not limited to, the following organic compounds of Formula 10:

[Formula 10]

GEH1

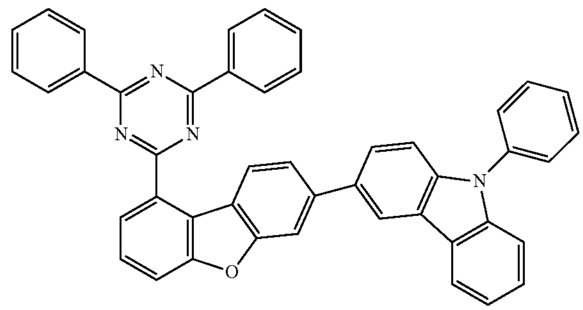

GEH2

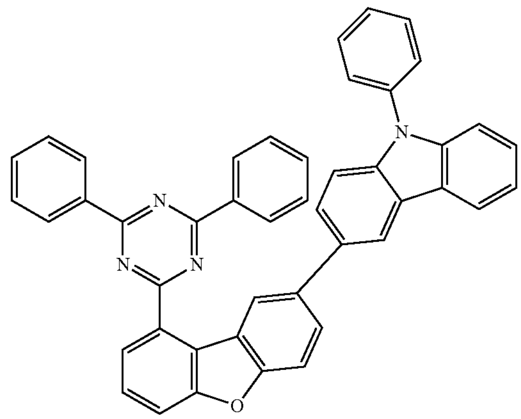

-continued
GEH3
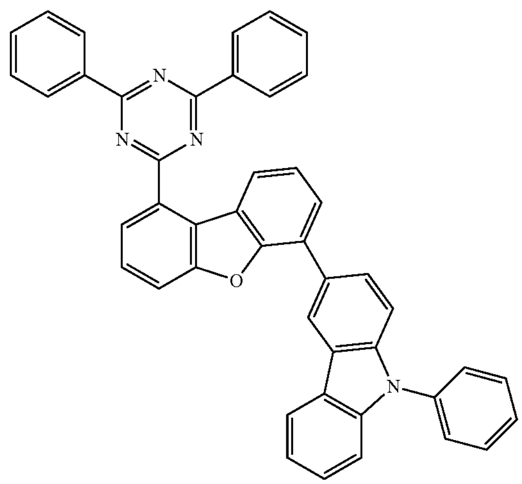
GEH4
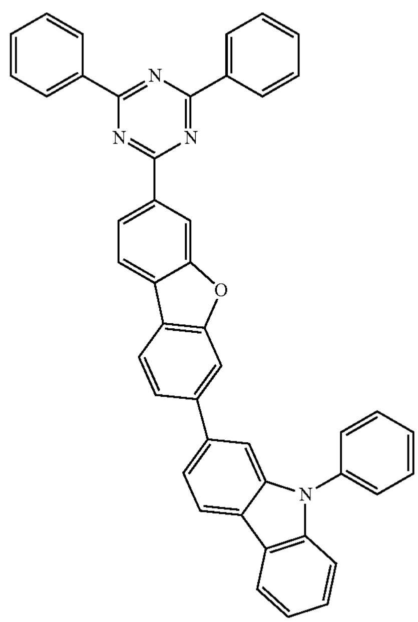
GEH5
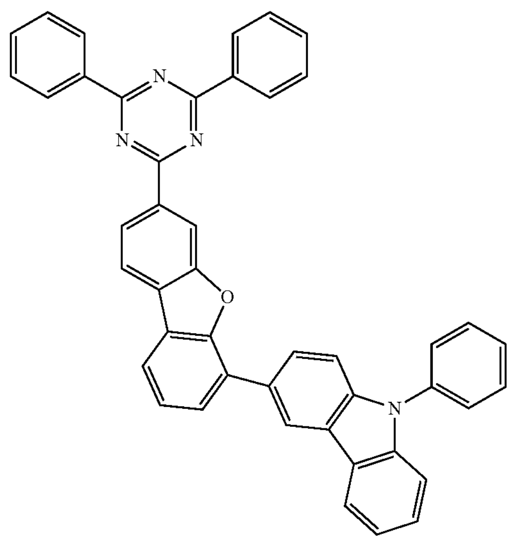
-continued
GEH6
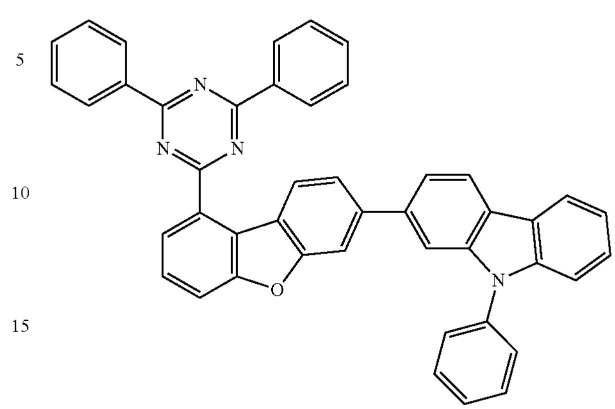
GEH7
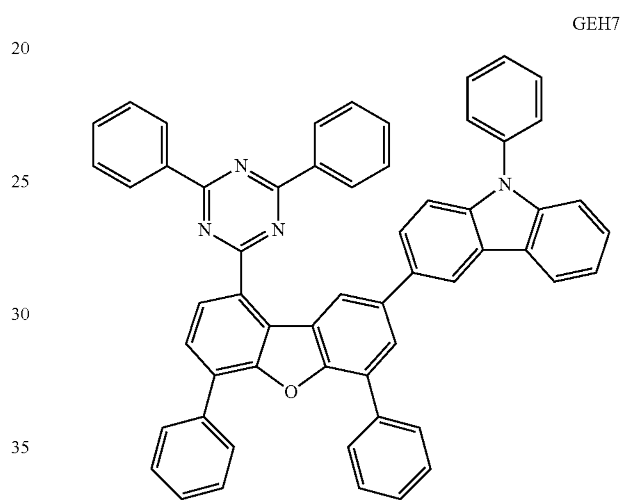
GEH8
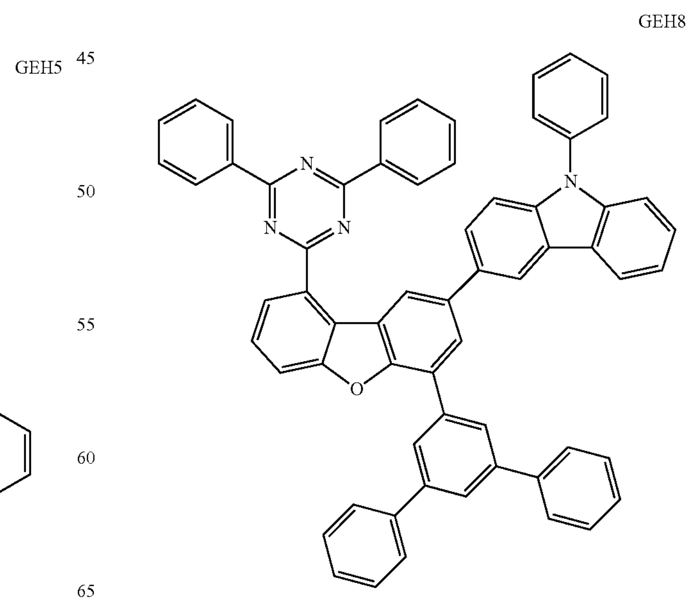

-continued
GEH9
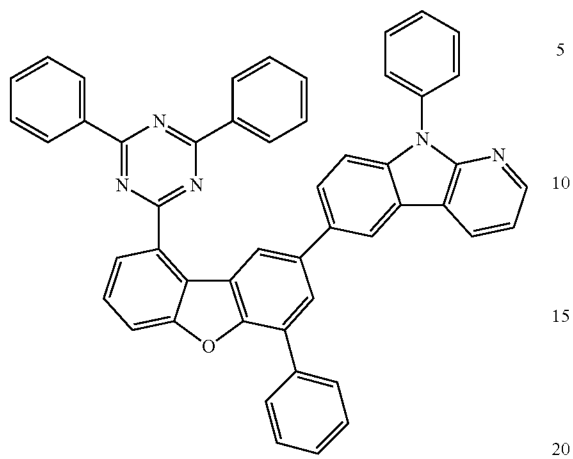
GEH10
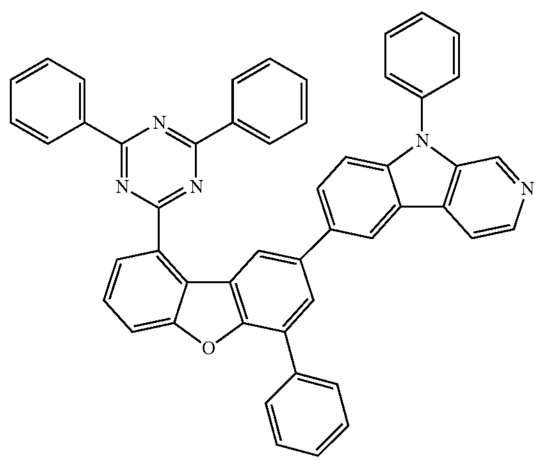
GEH11
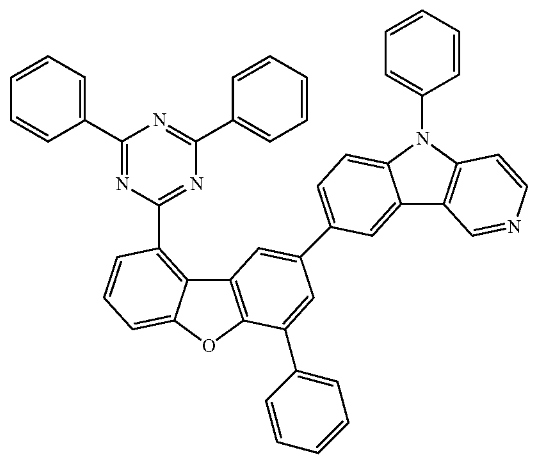
-continued
GEH12
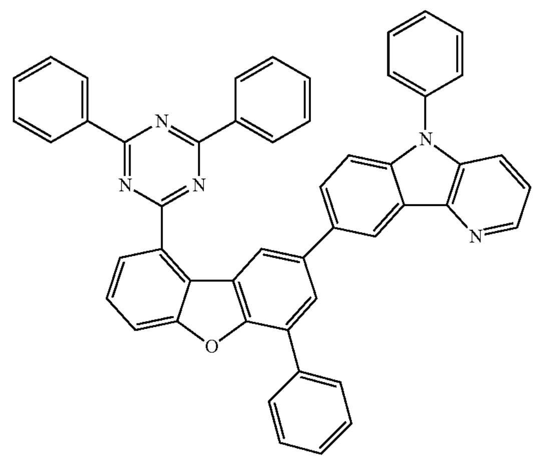
GEH13
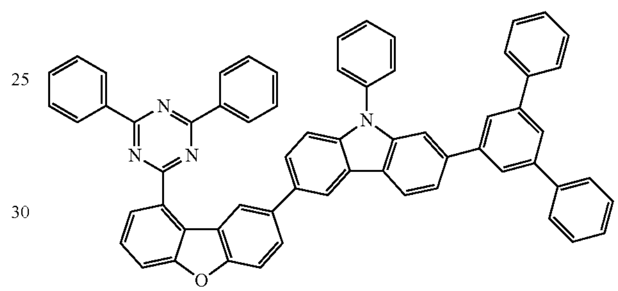
GEH14
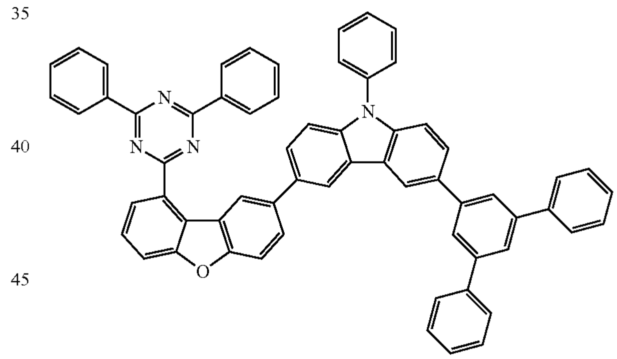
GEH15
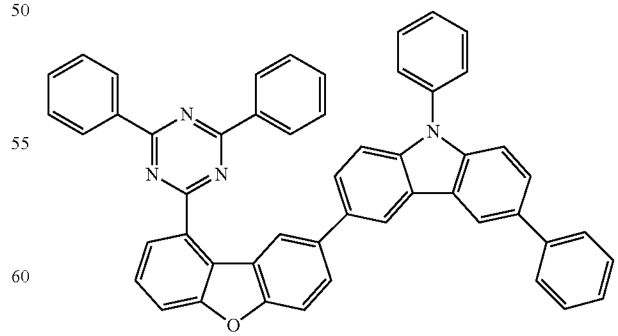

-continued
GEH16
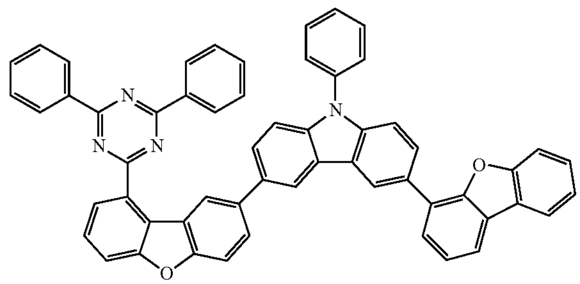
GEH17
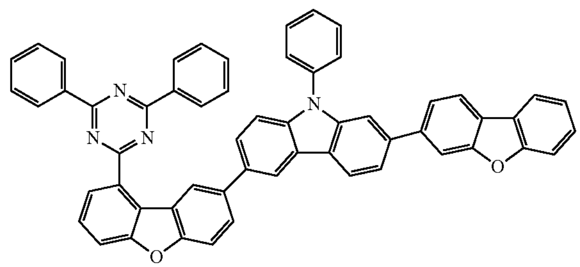
GEH18
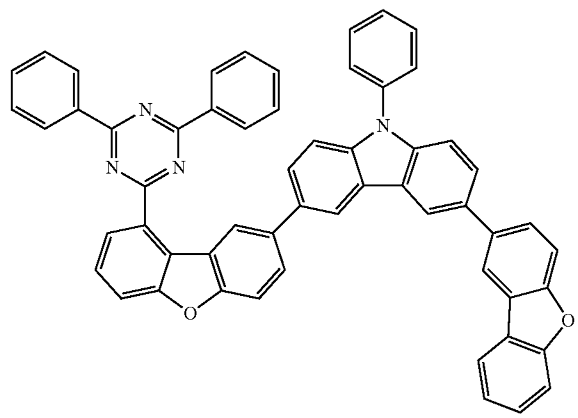
GEH19
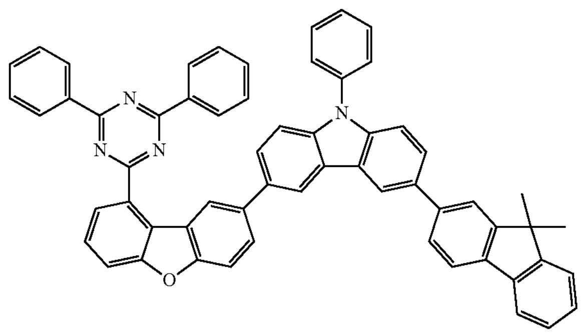
-continued
GEH20
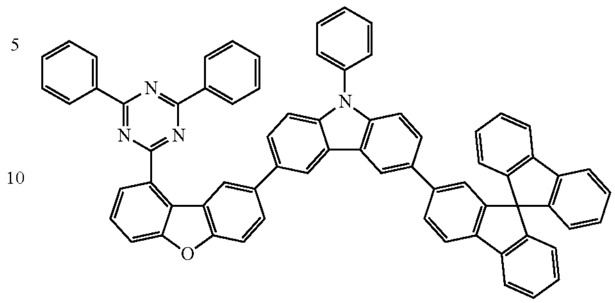
GEH21
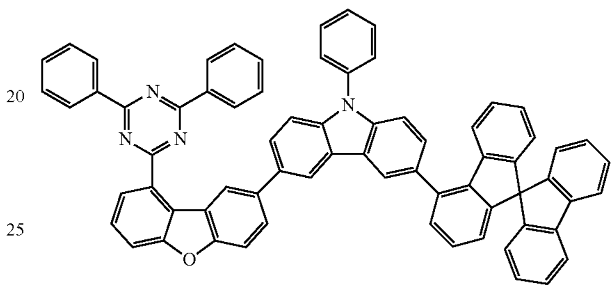
GEH22
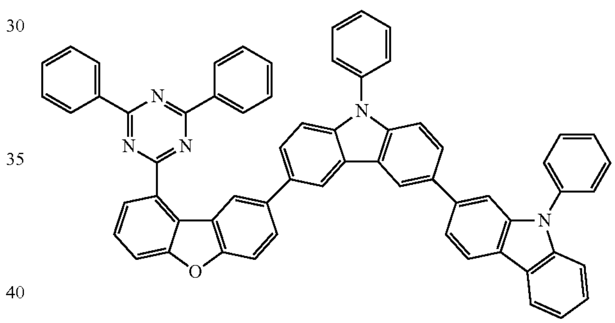
GEH23
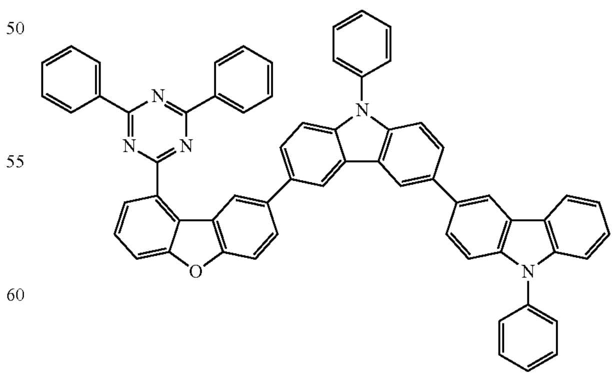

-continued

GEH24

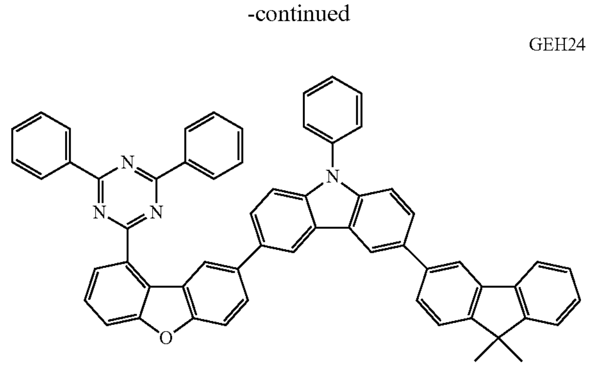

GEH25

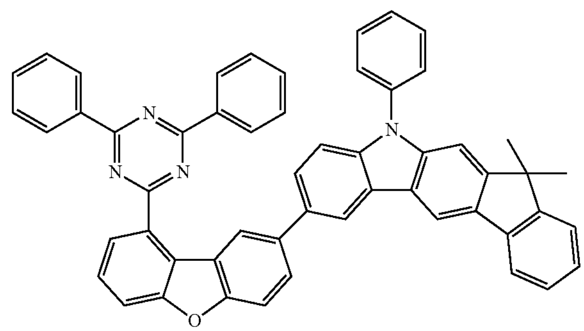

GEH26

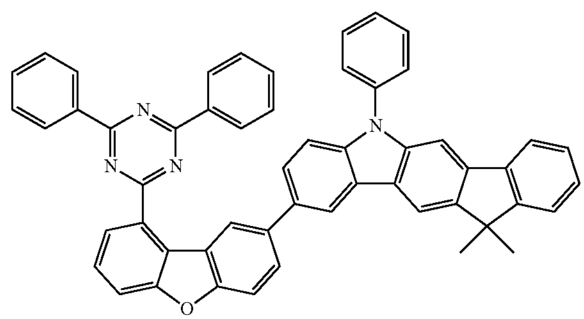

GEH27

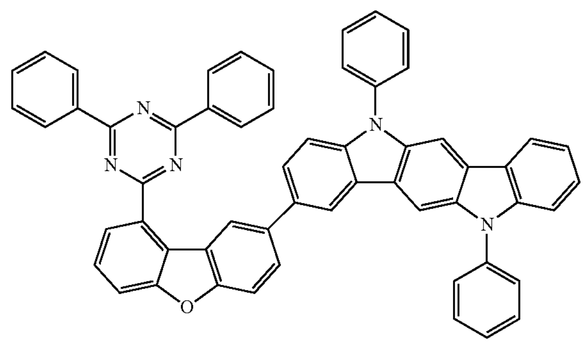

-continued

GEH28

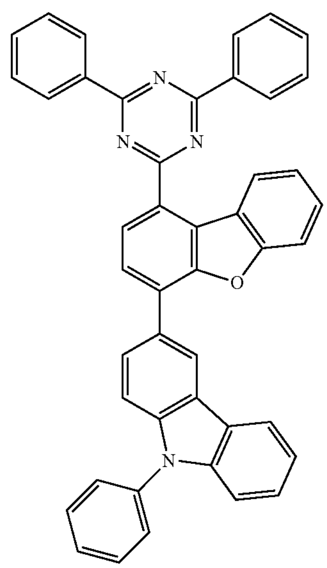

GEH29

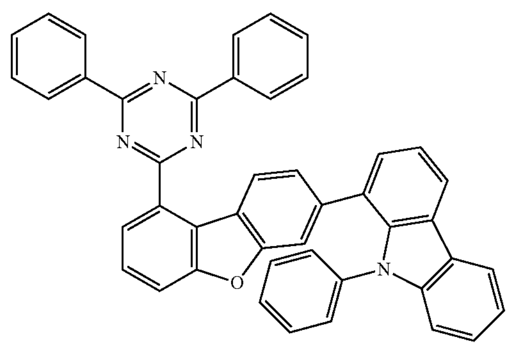

GEH30

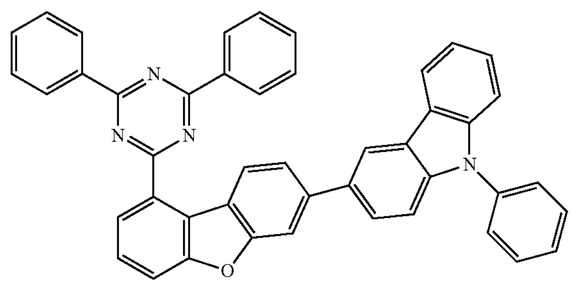

The contents of the host including the first host 344 and the second host 346 in the EML 340 may be, but is not limited to, about 50 to about 90 wt %, for example, about 80 to about 95 wt %, based on a total weight of the components in EML 340. The contents of the dopant 342 in the EML 340 may be, but is not limited to, about 1 to 10 wt %, for example, about 5 to 20 wt %, based on a total weight of the components in EML 340. When the EML 340 includes the first and second hosts 344 and 346, the first host 344 and the second host 346 may be mixed, but is not limited to, with a weight ratio between about 4:1 and about 1:4, for example, about 3:1 and about 1:3. As an example, the EML 340 may have a thickness of, but is not limited to, about 100 to about 500 nm.

The HIL 310 is disposed between the first electrode 210 and the HTL 320 and may improve an interface property between the inorganic first electrode 210 and the organic HTL 320. In one example embodiment, the HIL 310 may include, but is not limited to, 4,4',4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiophene)polystyrene sulfonate (PEDOT/PSS), 2,3,5,6-tetrafluoro-7,7,8,8-tetracyanoquinodimethane (F4TCNQ), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino)phenyl]benzidine (NPNPB) and/or combinations thereof.

As an example, the HIL 310 may have a thickness of, but is not limited to, about 50 to about 150 nm. The HIL 310 may be omitted in compliance of the OLED D1 property.

The HTL 320 is disposed adjacent to the EML 340 between the first electrode 210 and the EML 340. In one example embodiment, the HTL 320 may include, but is not limited to, N,N'-Diphenyl-N,N'-bis(3-methylphenyl)-1,1'-biphenyl-4,4'-diamine (TPD), NPB (NPD), N,N'-bis[4-[bis(3-methylphenyl)amino]phenyl]-N,N'-diphenyl-[1,1'-biphenyl]-4,4'-diamine (DNTPD), 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl) diphenylamine))] (TFB), 1,1-bis(4-(N,N'-di(p-tolyl)amino) phenyl)cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol yl)phenyl)biphenyl-4-amine, N-([1,1'-Biphenyl]-4-yl)-9,9-dimethyl-N-(4-(9-phenyl-9H-carbazol yl)phenyl)-9H-fluoren-2-amine, a spiro-fluorene compound having the following structure represented by Formula 11 and/or combinations thereof:

[Formula 11]

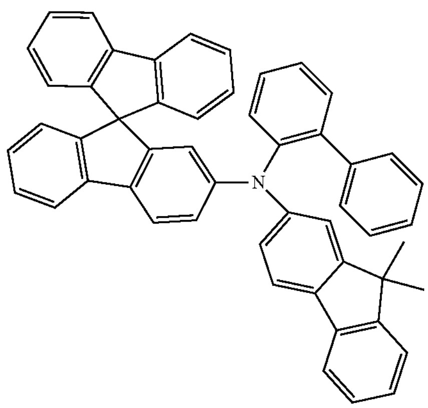

The ETL 360 and the EIL 370 may be laminated sequentially between the EML 340 and the second electrode 220. The ETL 360 includes a material having high electron mobility so it may provide electrons stably with the EML 340 by fast electron transportation.

In one example embodiment, the ETL 360 may include, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and/or the like.

As an example, the ETL 360 may include, but is not limited to, tris-(8-hydroxyquinolinato) aluminum (Alq3), Bis(2-methyl-8-quinolinolato-N1,O8)-(1,1'-biphenyl-4-olato)aluminum (BAlq), lithium quinolate (Liq), 2-biphenyl-4-yl-5-(4-t-butylphenyl)-1,3,4-oxadiazole (PBD), spiro-PBD, 1,3,5-Tris(N-phenylbenzimidazol-2-yl)benzene (TPBi), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenysilyl-phenylphosphine oxide (TSPO1), 2-[4-(9,10-di-2-naphthalen-2-yl-2-anthracen-2-yl)phenyl]1-phenyl-1H-benzimidazole (ZADN) and/or combinations thereof.

The EIL 370 is disposed between the second electrode 220 and the ETL 360, and may improve physical properties of the second electrode 220 and therefore, may enhance the lifetime of the OLED D1. In one example embodiment, the EIL 370 may include, but is not limited to, an alkali metal halide or an alkaline earth metal halide such as LiF, CsF, NaF, BaF2 and/or the like, and/or an organometallic compound such as Liq, lithium benzoate, sodium stearate, and/or the like. Each of the ETL 360 and the EIL 370 may independently have a thickness, but is not limited to, about 100 to about 400 nm. Alternatively, the EIL 370 may be omitted.

In an alternative aspect, the electron transport material and the electron injection material may be admixed to form a single ETL-EIL. The electron transport material and the electron injection material may be admixed with, but is not limited to, about 4:1 to about 1:4 by weight, for example, about 2:1 to about 1:2 by weight.

When holes are transferred to the second electrode 220 via the EML 340 and/or electrons are transferred to the first electrode 210 via the EML 340, the OLED D1 may have short lifetime and reduced luminous efficiency. In order to prevent or reduce these phenomena, the OLED D1 in accordance with this aspect of the present disclosure may have at least one exciton blocking layer adjacent to the EML 340.

For example, the OLED D1 may include the EBL 330 between the HTL 320 and the EML 340 so as to control and prevent or reduce electron transfers. In one example embodiment, the EBL 330 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-bis(carbazol-9-yl) benzene (mCP), 3,3'-bis(N-carbazolyl)-1,1'-biphenyl (mCBP), CuPc, DNTPD, TDAPB, DCDPA, 2,8-bis(9-phenyl-9H-carbazol-3-yl)dibenzo[b,d]thiophene and/or combinations thereof.

In addition, the OLED D1 may further include the HBL 350 as a second exciton blocking layer between the EML 340 and the ETL 360 so that holes cannot be transferred from the EML 340 to the ETL 360. In one example embodiment, the HBL 350 may include, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which may be used in the ETL 360.

For example, the HBL 350 may include a compound having a relatively low HOMO energy level compared to the luminescent materials in EML 340. The HBL 350 may include, but is not limited to, Alq3, BAlq, Liq, PBD, spiro-PBD, BCP, Bis-4,5-(3,5-di-3-pyridylphenyl) methylpyrimidine (B3PYMPM), bis[2-(diphenylphosphino)phenyl]ether oxide (DPEPO), 9-(6-(9H-carbazol-9-yl)pyridine-3-yl)-9H-3,9'-bicarbazole, TSPO1 and/or combinations thereof.

Since the organometallic compound having the structures represented by Formulae 1 to 6 has a rigid chemical conformation, it may show beneficial color purity and luminous lifespan with maintaining its stable chemical conformation in the luminous process. Changing the structure of the bidentate ligands and substituents to the ligand allows the organometallic compound to control its luminescent color.

In addition, the EML 340 may further include the first host 344 with beneficial hole transportation property and the second host 346 with beneficial electron transportation property. As charges and exciton energies are transferred rapidly from the first host 344 of the (hetero) aryl-amine-based compound and the second host 346 of the azine-based compound to the dopant 342, the OLED D1 may decrease its driving voltage and may improve its luminous efficiency and luminous lifespan.

In the above example embodiment, the OLED and the organic light emitting display device include a single emitting part emitting green color. Alternatively, the OLED may include multiple emitting parts (see, FIGS. 5 and 6) among which at least one includes the dopant 342, the first host 344, and optionally, the second host 346.

Figure 4:
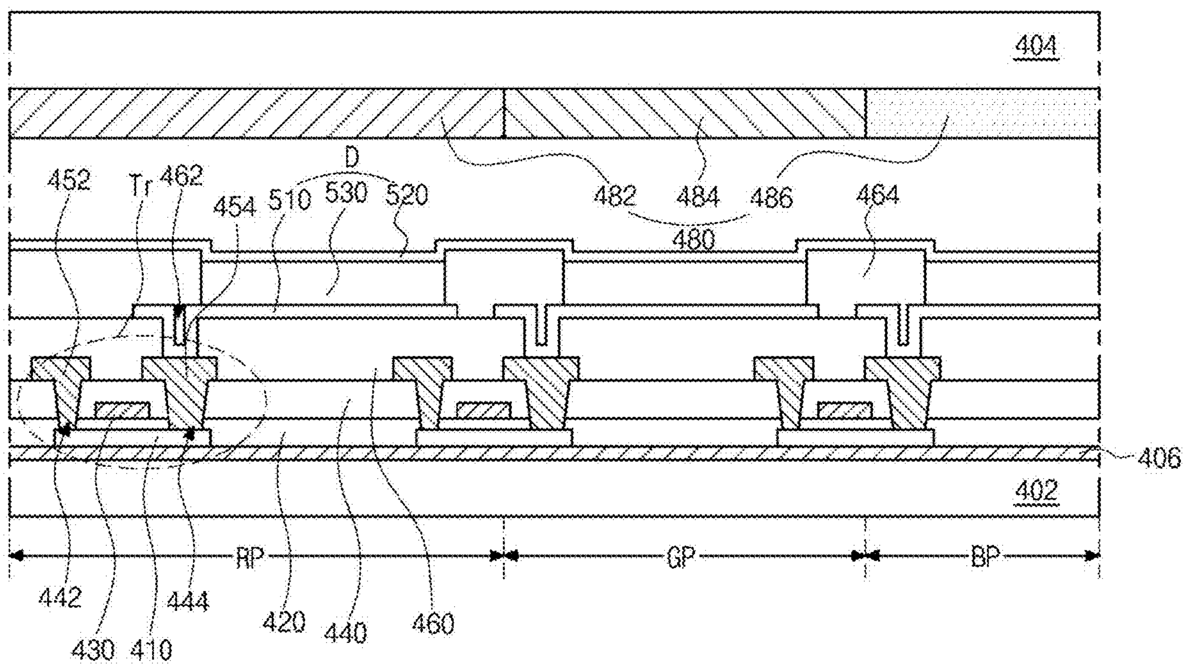
FIG. 4 illustrates a cross-sectional view of an organic light emitting display device in accordance with another example embodiment of the present disclosure.

In another example embodiment, an organic light emitting display device may implement full-color including white color. FIG. 4 illustrates a schematic cross-sectional view of an organic light emitting display device in accordance with another example embodiment of the present disclosure.

As illustrated in FIG. 4, the organic light emitting display device 400 comprises a first substrate 402 that defines each of a red pixel region RP, a green pixel region GP and a blue pixel region BP, a second substrate 404 facing the first substrate 402, a thin film transistor Tr on the first substrate 402, an OLED D disposed between the first and second substrates 402 and 404 and emitting white (W) light and a color filter layer 480 disposed between the OLED D and the second substrate 404.

Each of the first and second substrates 402 and 404 may include, but is not limited to, glass, flexible material and/or polymer plastics. For example, each of the first and second substrates 402 and 404 may be made of PI, PES, PEN, PET, PC and/or combinations thereof. The first substrate 402, on which a thin film transistor Tr and the OLED D are arranged, forms an array substrate.

A buffer layer 406 may be disposed on the first substrate 402. The thin film transistor Tr is disposed on the buffer layer 406 correspondingly to each of the red pixel region RP, the green pixel region GP and the blue pixel region BP. The buffer layer 406 may be omitted.

A semiconductor layer 410 is disposed on the buffer layer 406. The semiconductor layer 410 may be made of or include oxide semiconductor material or polycrystalline silicon.

A gate insulating layer 420 including an insulating material, for example, inorganic insulating material such as silicon oxide ($SiO_x$, wherein $0<x\leq 2$) or silicon nitride ($SiN_x$, wherein $0<x\leq 2$) is disposed on the semiconductor layer 410.

A gate electrode 430 made of a conductive material, such as a metal, is disposed on the gate insulating layer 420 so as to correspond to a center of the semiconductor layer 410. An interlayer insulating layer 440 including an insulating material, for example, inorganic insulating material such as SiOx or SiNx, or an organic insulating material such as benzocyclobutene or photo-acryl, is disposed on the gate electrode 430.

The interlayer insulating layer 440 has first and second semiconductor layer contact holes 442 and 444 that expose or do not cover a portion of the surface nearer to the opposing ends than to a center of the semiconductor layer 410. The first and second semiconductor layer contact holes 442 and 444 are disposed on opposite sides of the gate electrode 430 with spacing apart from the gate electrode 430.

A source electrode 452 and a drain electrode 454, which are made of or include a conductive material such as a metal, are disposed on the interlayer insulating layer 440. The source electrode 452 and the drain electrode 454 are spaced apart from each other with respect to the gate electrode 430. The source electrode 452 and the drain electrode 454 contact both sides of the semiconductor layer 410 through the first and second semiconductor layer contact holes 442 and 444, respectively.

The semiconductor layer 410, the gate electrode 430, the source electrode 452 and the drain electrode 454 constitute the thin film transistor Tr, which acts as a driving element.

Although not shown in FIG. 4, the gate line GL and the data line DL, which cross each other to define the pixel region P, and a switching element Ts, which is connected to the gate line GL and the data line DL, may be further formed in the pixel region P. The switching element Ts is connected to the thin film transistor Tr, which is a driving element. In addition, the power line PL is spaced apart in parallel from the gate line GL or the data line DL, and the thin film transistor Tr may further include the storage capacitor Cst configured to constantly keep a voltage of the gate electrode 430 for one frame.

A passivation layer 460 is disposed on the source and drain electrodes 452 and 454. The passivation layer 460 covers the thin film transistor Tr on the whole first substrate 402. The passivation layer 460 has a drain contact hole 462 that exposes or does not cover the drain electrode 454 of the thin film transistor Tr.

The OLED D is located on the passivation layer 460. The OLED D includes a first electrode 510 that is connected to the drain electrode 454 of the thin film transistor Tr, a second electrode 520 facing the first electrode 510 and an emissive layer 530 disposed between the first and second electrodes 510 and 520.

The first electrode 510 formed for each pixel region RP, GP or BP may be an anode and may include a conductive material having relatively high work function value. For example, the first electrode 510 may include, but is not limited to, ITO, IZO, ITZO, SnO, ZnO, ICO, AZO, and/or the like. Alternatively, a reflective electrode or a reflective layer may be disposed under the first electrode 510. For example, the reflective electrode or the reflective layer may include, but is not limited to, Ag or APC alloy.

A bank layer 464 is disposed on the passivation layer 460 in order to cover edges of the first electrode 510. The bank layer 464 exposes or does not cover a center of the first electrode 510 corresponding to each of the red pixel RP, the green pixel GP and the blue pixel BP. The bank layer 464 may be omitted.

Figure 5:
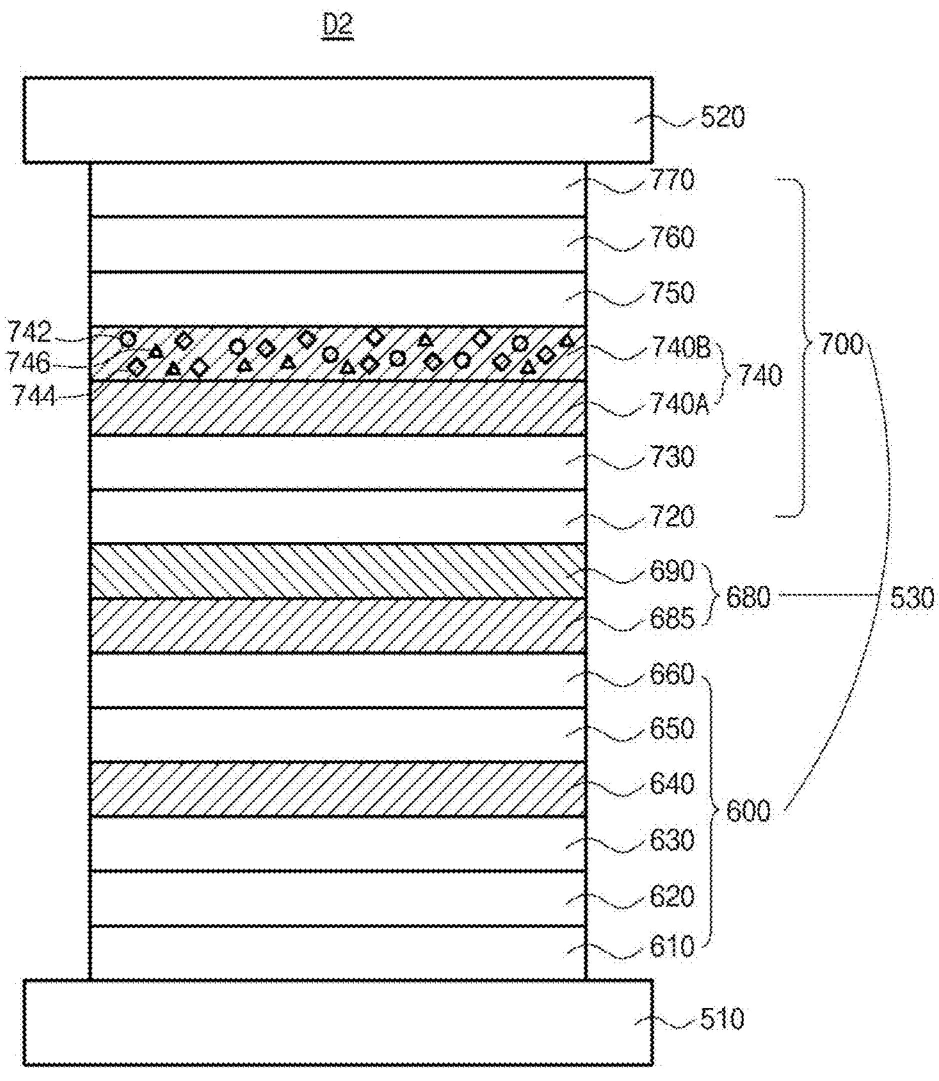
FIG. 5 illustrates a cross-sectional view of an organic light emitting diode having a double-stack structure in accordance with another example embodiment of the present disclosure.
Figure 6:
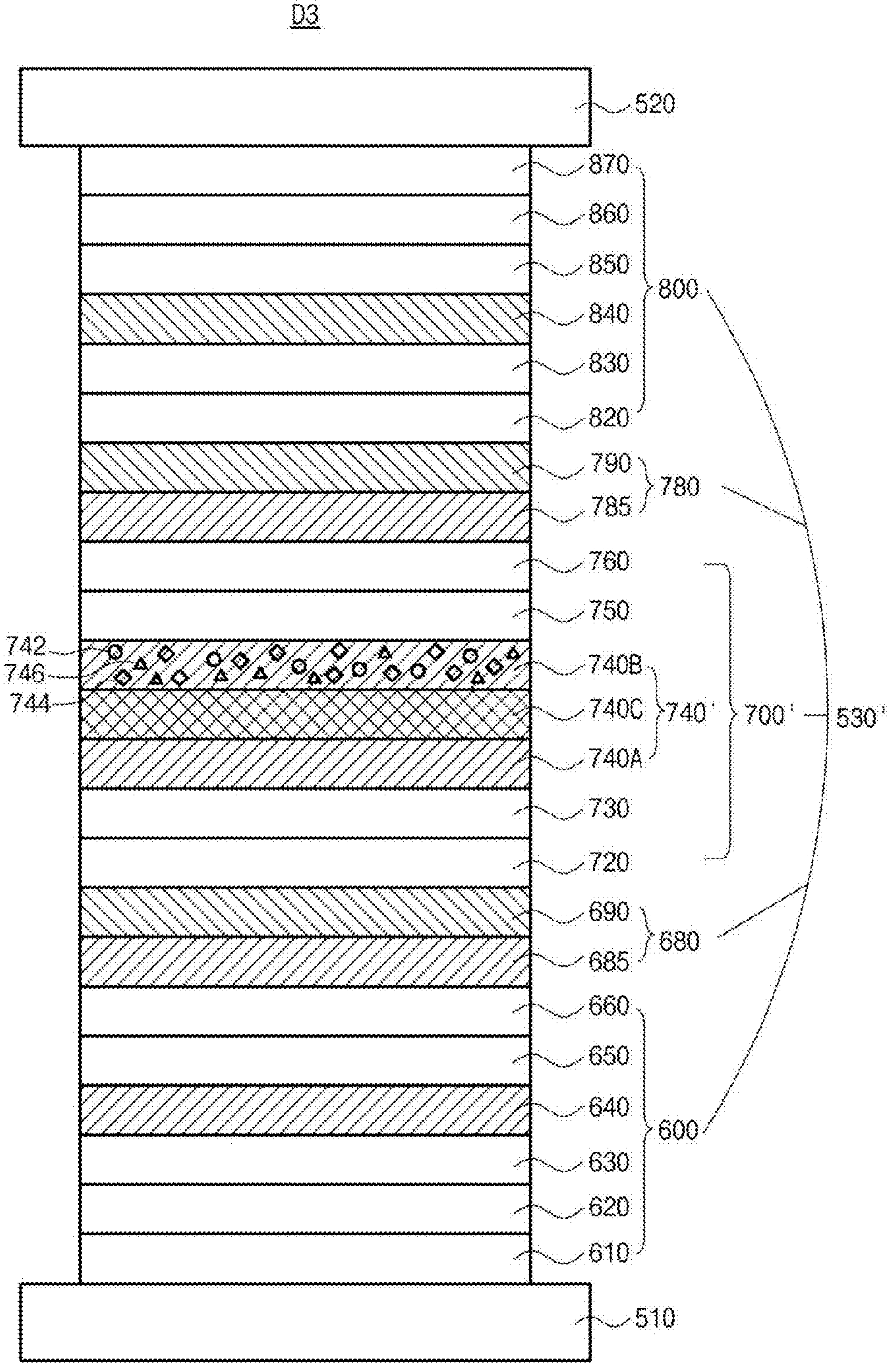
FIG. 6 illustrates a cross-sectional view of an organic light emitting diode having a triple-stack structure in accordance with another example embodiment of the present disclosure.

An emissive layer 530 that may include emitting parts is disposed on the first electrode 510. As illustrated in FIGS. 5 and 6, the emissive layer 530 may include multiple emitting parts 600, 700, 700', and 800 and at least one charge generation layer 680 and 780. Each of the emitting parts 600, 700, 700' and 800 includes at least one emitting material layer and may further include an HIL, an HTL, an EBL, an HBL, an ETL and/or an EIL.

The second electrode 520 may be disposed on the first substrate 402 above which the emissive layer 530 may be disposed. The second electrode 520 may be disposed on a whole display area, and may include a conductive material with a relatively low work function value compared to the first electrode 510, and may be a cathode. For example, the second electrode 520 may include, but is not limited to, Al, Mg, Ca, Ag, alloy thereof and/or combinations thereof such as Al—Mg.

Since the light emitted from the emissive layer 530 is incident to the color filter layer 480 through the second electrode 520 in the organic light emitting display device 400 in accordance with the second embodiment of the present disclosure, the second electrode 520 has a thin thickness so that the light may be transmitted.

The color filter layer 480 is disposed on the OLED D and includes a red color filter pattern 482, a green color filter pattern 484 and a blue color filter pattern 486 each of which is disposed correspondingly to the red pixel RP, the green pixel GP and the blue pixel BP, respectively. Although not shown in FIG. 4, the color filter layer 480 may be attached to the OLED D through an adhesive layer. Alternatively, the color filter layer 480 may be disposed directly on the OLED D.

In addition, an encapsulation film may be disposed on the second electrode 520 in order to prevent or reduce outer moisture from penetrating into the OLED D. The encapsulation film may have, but is not limited to, a laminated structure including a first inorganic insulating film, an organic insulating film and a second inorganic insulating film (176 in FIG. 2). In addition, a polarizing plate may be attached onto the second substrate 404 to reduce reflection of external light. For example, the polarizing plate may be a circular polarizing plate.

In FIG. 4, the light emitted from the OLED D is transmitted through the second electrode 520 and the color filter layer 480 is disposed on the OLED D. Alternatively, the light emitted from the OLED D is transmitted through the first electrode 510 and the color filter layer 480 may be disposed between the OLED D and the first substrate 402. In addition, a color conversion layer may be formed or disposed between the OLED D and the color filter layer 480. The color conversion layer may include a red color conversion layer, a green color conversion layer and a blue color conversion layer each of which is disposed correspondingly to each pixel (RP, GP and BP), respectively, so as to convert the white (W) color light to each of a red, green and blue color lights, respectively. Alternatively, the organic light emitting display device 400 may comprise the color conversion film instead of the color filter layer 480.

As described above, the white (W) color light emitted from the OLED D is transmitted through the red color filter pattern 482, the green color filter pattern 484 and the blue color filter pattern 486 each of which is disposed correspondingly to the red pixel region RP, the green pixel region GP and the blue pixel region BP, respectively, so that red, green and blue color lights are displayed in the red pixel region RP, the green pixel region GP and the blue pixel region BP.

FIG. 5 illustrates a schematic cross-sectional view of an organic light emitting diode having a tandem structure of two emitting parts. As illustrated in FIG. 5, the OLED D2 in accordance with the example embodiment of the present disclosure includes first and second electrodes 510 and 520 and an emissive layer 530 disposed between the first and second electrodes 510 and 520. The emissive layer 530 includes a first emitting part 600 disposed between the first and second electrodes 510 and 520, a second emitting part 700 disposed between the first emitting part 600 and the second electrode 520 and a charge generation layer (CGL) 680 disposed between the first and second emitting parts 600 and 700.

The first electrode 510 may be an anode and may include a conductive material having relatively high work function value such as TCO. For example, the first electrode 510 may include, but is not limited to, ITO, IZO, ITZO, SnO, ZnO, ICO, AZO, and/or the like. The second electrode 520 may be a cathode and may include a conductive material with a relatively low work function value. For example, the second electrode 520 may include, but is not limited to, Al, Mg, Ca, Ag, alloy thereof and/or combinations thereof such as Al—Mg.

The first emitting part 600 comprise a first EML (EML1) 640. The first emitting part 600 may further include at least one of an HIL 610 disposed between the first electrode 510 and the EML1 640, a first HTL (HTL1) 620 disposed between the HIL 610 and the EML1 640, a first ETL (ETL1) 660 disposed between the EML1 640 and the CGL 680. Alternatively, the first emitting part 600 may further include a first EBL (EBL1) 630 disposed between the HTL1 620 and the EML1 640 and/or a first HBL (HBL1) 650 disposed between the EML1 640 and the ETL1 660.

The second emitting part 700 includes a second EML (EML2) 740. The second emitting part 700 may further include at least one of a second HTL (HTL2) 720 disposed between the CGL 680 and the EML2 740, a second ETL (ETL2) 760 disposed between the second electrode 520 and the EML2 740 and an EIL 770 disposed between the second electrode 520 and the ETL2 760. Alternatively, the second emitting part 700 may further include a second EBL (EBL2) 730 disposed between the HTL2 720 and the EML2 740 and/or a second HBL (HBL2) 750 disposed between the EML2 740 and the ETL2 760.

At least one of the EML1 640 and the EML2 740 may include a dopant 742, a first host 744 and/or a second host 746 to emit green color or yellow green color. The other of the EML1 640 and the EML2 740 may emit a blue color so that the OLED D2 may realize white (W) emission. Hereinafter, the OLED D2 where the EML2 740 emits green or yellow green color will be described in detail.

The HIL 610 is disposed between the first electrode 510 and the HTL1 620 and may improve an interface property between the inorganic first electrode 510 and the organic HTL1 620. In one example embodiment, the HIL 610 may include, but is not limited to, MTDATA, NATA, 1T-NATA, 2T-NATA, CuPc, TCTA, NPB (NPD), HAT-CN, TDAPB, PEDOT/PSS, F4TCNQ, N-(biphenyl-4-yl)-9,9-dimethyl-N-

(4-(9-phenyl-9H-carbazol-3-yl)phenyl)-9H-fluoren-2-amine, NPNPB and/or combinations thereof. The HIL 610 may be omitted in compliance of the OLED D2 property.

Each of the HTL1 620 and the HTL2 720 may include, but is not limited to, TPD, NPB (NPD), DNTPD, CBP, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine, the spiro-fluorene compound represented by Formula 11 and/or combinations thereof, respectively.

Each of the ETL1 660 and the ETL2 760 facilitates electron transportation in each of the first emitting part 600 and the second emitting part 700, respectively. As an example, each of the ETL1 660 and the ETL2 760 may independently include, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and/or the like. For example, each of the ETL1 660 and the ETL2 770 may include, but is not limited to, Alq3, BAlq, Liq, PBD, spiro-PBD, TPBi, Bphen, NBphen, BCP, TAZ, NTAZ, TpPyPB, TmPPPyTz, PFNBr, TPQ, TSPO1, ZADN and/or combinations thereof, respectively.

The EIL 770 is disposed between the second electrode 520 and the ETL2 760, and may improve physical properties of the second electrode 520 and therefore, may enhance the lifetime of the OLED D2. In one example embodiment, the EIL 770 may include, but is not limited to, an alkali metal halide or an alkaline earth metal halide such as LiF, CsF, NaF, BaF2 and/or the like, and/or an organometallic compound such as Liq, lithium benzoate, sodium stearate, and/or the like.

Each of the EBL1 630 and the EBL2 730 may independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl)dibenzo[b,d]thiophene and/or combinations thereof, respectively.

Each of the HBL1 650 and the HBL2 750 may include, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which may be used in the ETL1 660 and the ETL2 760. For example, each of the HBL1 650 and the HBL2 750 may independently include, but is not limited to, Alq3, BAlq, Liq, PBD, spiro-PBD, BCP, B3PYMPM, DPEPO, 9-(6-(9H-carbazol-9-yl)pyridine-3-yl)-9H-3,9'-bicarbazole, TSPO1 and/or combinations thereof, respectively.

The CGL 680 is disposed between the first emitting part 600 and the second emitting part 700. The CGL 680 includes an N-type CGL (N-CGL) 685 disposed adjacent to the first emitting part 600 and a P-type CGL (P-CGL) 690 disposed adjacent to the second emitting part 700. The N-CGL 685 injects electrons to the EML1 640 of the first emitting part 600 and the P-CGL 690 injects holes to the EML2 740 of the second emitting part 700.

The N-CGL 685 may be an organic layer doped with an alkali metal such as Li, Na, K and Cs and/or an alkaline earth metal such as Mg, Sr, Ba and Ra. The host in the N-CGL 685 may include, but is not limited to, Bphen and/or MTDATA. The contents of the alkali metal or the alkaline earth metal in the N-CGL 685 may be between about 0.01 wt % and about 30 wt %, based on a total weight of the components in N-CGL 685.

The P-CGL 690 may include, but is not limited to, an inorganic material selected from the group consisting of WOx, MoOx, V2O5 and combinations thereof and/or an organic material selected from the group consisting of NPD, HAT-CN, F4TCNQ, TPD, N,N,N',N'-tetranaphthalenyl-benzidine (TNB), TCTA, N,N'-dioctyl-3,4,9,10-perylenedicarboximide (PTCDI-C8) and/or combinations thereof.

The EML1 640 may be a blue EML. In this case, the EML1 640 may be a blue EML, a sky-blue EML or a deep-blue EML. The EML1 640 may include a blue host and a blue dopant.

For example, the blue host may include, but is not limited to, mCP, 9-(3-(9H-carbazol yl)phenyl)-9H-carbazole-3-carbonitrile (mCP-CN), mCBP, CBP-CN, 9-(3-(9H-Carbazol yl)phenyl)-3-(diphenylphosphoryl)-9H-carbazole (mCPPO1) 3,5-Di(9H-carbazol-9-yl)biphenyl (Ph-mCP), TSPO1,9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenylsilyl)benzene (UGH-2), 1,3-Bis(triphenylsilyl)benzene (UGH-3), 9,9-Spirobifluoren-2-yl-diphenyl-phosphine oxide (SPPO1), 9,9'-(5-(Triphenylsilyl)-1,3-phenylene)bis(9H-carbazole) (SimCP) and/or combinations thereof.

The blue dopant may include at least one of blue phosphorescent material, blue fluorescent material and blue delayed fluorescent material. As an example, the blue dopant may include, but is not limited to, perylene, 4,4'-Bis[4-(di-p-tolylamino)styryl]biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,7-Bis(4-diphenylamino)styryl)-9,9-spirofluorene (spiro-DPVBi), [1,4-bis[2-[4-[N,N-di(p-tolyl)amino]phenyl]vinyl]benzene (DSB), 1-4-di-[4-(N,N-diphenyl)amino]styryl-benzene (DSA), 2,5,8,11-Tetra-tert-butylperylene (TBPe), Bis(2-hydroxylphenyl)-pyridine)beryllium ($Bepp_2$), 9-(9-Phenylcarbazole-3-yl)-10-(naphthalene-1-yl)anthracene (PCAN), mer-Tris(1-phenyl-3-methylimidazolin-2-ylidene-C,C(2)'iridium(III) (mer-$Ir(pmi)_3$), fac-Tris(1,3-diphenyl-benzimidazolin-2-ylidene-C,C(2)'iridium(III) (fac-$Ir(dpbic)_3$), Bis(3,4,5-trifluoro-2-(2-pyridyl)phenyl-(2-carboxypyridyl)iridium(III) ($Ir(tfpd)_2pic$), tris(2-(4,6-difluorophenyl)pyridine))iridium(III) ($Ir(Fppy)_3$), Bis[2-(4,6-difluorophenyl)pyridinato-$C^2$,N](picolinato)iridium(III) (FIrpic) and/or combinations thereof.

The EML2 740 may comprise a lower EML (first layer) 740A disposed between the EBL2 730 and the HBL2 750 and an upper EML (second layer) 740B disposed between the lower EML 740A and the HBL2 750. One of the lower EML 740A and the upper EML 740B may emit red color and the other of the lower EML 740A and the upper EML 740B may emit green color. Hereinafter, the EML2 740 where the lower EML 740A emits a red color and the upper EML 740B emits a green color will be described in detail.

The lower EML 740A may include a red host and a red dopant. The red host may include, but is not limited to, mCP-CN, CBP, mCBP, mCP, DPEPO, 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-biphenyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol- 9-yl)biphenyl-3,5-dicarbonitrile (mCzB-2CN), TSPP1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicarbazole), 9,9'-Diphenyl-9H, 9'H-3,3'-bicarbazole (BCzPh), 1,3,5-Tris(carbazole-9-yl) benzene (TCP), TCTA, 4,4'-Bis(carbazole-9-yl)-2,2'-dimethylbiphenyl (CDBP), 2,7-Bis(carbazole-9-yl)-9,9-dimethylfluorene (DMFL-CBP), 2,2',7,7'-Tetrakis (carbazole-9-yl)-9,9-spirofluorene (Spiro-CBP), 3,6-Bis (carbazole-9-yl)-9-(2-ethyl-hexyl)-9H-carbazole (TCz1) and/or combinations thereof.

The red dopant may include at least one of red phosphorescent material, red fluorescent material and red delayed fluorescent material. As an example, the red dopant may include, but is not limited to, [Bis(2-(4,6-dimethyl)phenylquinoline)](2,2,6,6-tetramethylheptane-3,5-dionate) iridium(III), Bis[2-(4-n-hexylphenyl)quinoline](acetylacetonate)iridium(III) (Hex-Ir(phq)$_2$(acac)), Tris[2-(4-n-hexylphenyl)quinoline]iridium(III) (Hex-Ir(phq)$_3$), Tris[2-phenyl-4-methylquinoline]iridium(III) (Ir(Mphq)$_3$), Bis(2-phenylquinoline)(2,2,6,6-tetramethylheptene-3,5-dionate) iridium(III) (Ir(dpm)PQ$_2$), Bis(phenylisoquinoline)(2,2,6,6-tetramethylheptene-3,5-dionate)iridium(III) (Ir(dpm)(piq)$_2$), Bis[(4-n-hexylphenyl)isoquinoline](acetylacetonate)iridium(III) (Hex-Ir(piq)$_2$(acac)), Tris[2-(4-n-hexylphenyl)quinoline]iridium(III) (Hex-Ir(piq)$_3$), Tris(2-(3-methylphenyl)-7-methyl-quinolato)iridium (Ir(dmpq)$_3$), Bis[2-(2-methylphenyl)-7-methyl-quinoline](acetylacetonate) iridium(III) (Ir(dmpq)$_2$(acac)), Bis[2-(3,5-dimethylphenyl)-4-methyl-quinoline](acetylacetonate)iridium(III) (Ir(mphmq)$_2$(acac)), Tris(dibenzoylmethane)mono(1,10-phenanthroline)europium(III) (Eu(dbm)$_3$(pben)) and/or combinations thereof.

The upper EML 740B may include the dopant 742, the first host 744 and/or the second host 746. The dopant 742 is the organometallic compound of green phosphorescent material having the structures represented by Formulae 1 to 6. The first host 744 is the (hetero) aryl-amine-based organic compound of the p-type host having the structures represented by Formulae 7 to 8. The second host 746 is the azine-based organic compound of the n-type host having the structures represented by Formulae 9 to 10.

As an example, the contents of the host including the first and second hosts 744 and 746 in the upper EML 740B may be, but is not limited to, between about 50 and about 99 wt %, for example, about 80 and about 95 wt %, based on a total weight of the components in the upper EML 740B. The contents of the dopant in the upper EML 740B may be, but is not limited to, between about 1 and about 50 wt %, for example, about 5 and about 20 wt %, based on a total weight of the components in the upper EML 740B. When the upper EML 740B includes both the first and second hosts 744 and 746, the first host 744 and the second host 746 may be admixed, but is not limited to, with a weight ratio from about 4:1 to about 1:4, for example, about 3:1 to about 1:3.

Alternatively, the EML2 740 may further include a middle emitting material layer (third layer, 740C in FIG. 6) of yellow green EML disposed between the lower EML 740A of the red EML and the upper EML 740B of the green EML.

The OLED D2 in accordance with an example embodiment of the present disclosure has a tandem structure. At least one EML includes the dopant 742 with beneficial luminous properties, and the first host 744 and/or the second host 746 with beneficial charge and energy transfer properties. By combining the dopant 742, which have rigid chemical conformation and may facilitate the adjustment of luminous colors, and the first and/or second hosts 744 and/or 746 with beneficial luminous properties, the OLED D2 may reduce its driving voltage and may enhance its luminous efficiency and luminous lifespan.

The OLED may have three or more emitting parts to form a tandem structure. FIG. 6 illustrates a schematic cross-sectional view of an organic light emitting diode in accordance with yet another example embodiment of the present disclosure. As illustrated in FIG. 6, the OLED D3 includes first and second electrodes 510 and 520 facing each other and an emissive layer 530' disposed between the first and second electrodes 510 and 520. The emissive layer 530' includes a first emitting part 600 disposed between the first and second electrodes 510 and 520, a second emitting part 700' disposed between the first emitting part 600 and the second electrode 520, a third emitting part 800 disposed between the second emitting part 700' and the second electrode 520, a first charge generation layer (CGL1) 680 disposed between the first and second emitting parts 600 and 700', and a second charge generation layer (CGL2) 780 disposed between the second and third emitting parts 700' and 800.

The first emitting part 600 includes a first EML (EML1) 640. The first emitting part 600 may further include at least one of an HIL 610 disposed between the first electrode 510 and the EML1 640, a first HTL (HTL1) 620 disposed between the HIL 610 and the EML1 640, a first ETL (ETL1) 660 disposed between the EML1 640 and the CGL 680. Alternatively, the first emitting part 600 may further comprise a first EBL (EBL1) 630 disposed between the HTL1 620 and the EML1 640 and/or a first HBL (HBL1) 650 disposed between the EML1 640 and the ETL1 660.

The second emitting part 700' comprise a second EML (EML2) 740'. The second emitting part 700' may further include at least one of a second HTL (HTL2) 720 disposed between the CGL1 680 and the EML2 740' and a second ETL (ETL2) 760 disposed between the second electrode 520 and the EML2 740'. Alternatively, the second emitting part 700' may further include a second EBL (EBL2) 730 disposed between the HTL2 720 and the EML2 740' and/or a second HBL (HBL2) 750 disposed between the EML2 740' and the ETL2 760.

The third emitting part 800 includes a third EML (EML3) 840. The third emitting part 800 may further comprise at least one of a third HTL (HTL3) 820 disposed between the CGL2 780 and the EML3 840, a third ETL (ETL3) 860 disposed between the second electrode 520 and the EML3 840 and an EIL 870 disposed between the second electrode 520 and the ETL3 860. Alternatively, the third emitting part 800 may further comprise a third EBL (EBL3) 830 disposed between the HTL3 820 and the EML3 840 and/or a third HBL (HBL3) 850 disposed between the EML3 840 and the ETL3 860.

At least one of the EML1 640, the EML2 740' and the EML3 840 may include the dopant 742, the first host 744 and/or the second host 746 to emit green or yellow green color. In addition, another of the EML1 640, the EML2 740' and the EML3 840 emit a blue color so that the OLED D3 may realize white emission. Hereinafter, the OLED where the EML2 740' emits green or yellow green color will be described in detail.

The CGL1 680 is disposed between the first emitting part 600 and the second emitting part 700' and the CGL2 780 is disposed between the second emitting part 700' and the third emitting part 800. The CGL1 680 includes a first N-type CGL (N-CGL1) 685 disposed adjacent to the first emitting part 600 and a first P-type CGL (P-CGL1) 690 disposed adjacent to the second emitting part 700'. The CGL2 780 includes a second N-type CGL (N-CGL2) 785 disposed adjacent to the second emitting part 700' and a second P-type CGL (P-CGL2) 790 disposed adjacent to the third emitting part 800. Each of the N-CGL1 685 and the N-CGL2 785 injects electrons to the EML1 640 of the first emitting part 600 and the EML2 740' of the second emitting part 700', respectively. Each of the P-CGL1 690 and the P-CGL2 790 injects holes to the EML2 740' of the second emitting part 700' and the EML3 840 of the third emitting part 800, respectively.

Each of the EML1 640 and the EML3 840 may be independently a blue EML. In this case, each of the EML1 640 and the EML3 840 may be independently a blue EML, a sky-blue EML or a deep-blue EML. Each of the EML1 640 and the EML3 840 may include independently a blue host and a blue dopant. Each of the blue host and the blue dopant may be identical to each of the blue host and the blue dopant as shown in FIG. 5. For example, the blue dopant may include at least one of the blue phosphorescent materials, the blue fluorescent materials and the blue delayed fluorescent materials. Alternatively, the blue dopant in the EML1 640 may be identical to or different from the blue dopant in the EML3 840 in terms of color and/or luminous efficiency.

The EML2 740' may include a lower EML (first layer) 740A disposed between the EBL2 730 and the HBL2 750, an upper EML (second layer) 740B disposed between the lower EML 740A and the HBL2 750. Optionally, a middle EML (third layer) 740C disposed between the lower EML 740A and the upper EML 740B. One of the lower EML 740A and the upper EML 740B may emit red color and the other of the lower EML 740A and the upper EML 740B may emit green color. Hereinafter, the EML2 740' in which the lower EML 740A emits a red color and the upper EML 740B emits a green color will be described in detail.

The lower EML 740A may include the red host and the red dopant. Each of the red host and the red dopant may be identical to each of the red host and the red dopant as shown in FIG. 5. For example, the red dopant may include at least one of the red phosphorescent materials, the red fluorescent materials and the red delayed fluorescent materials.

The upper EML 740B may include the dopant 742, the first host 744 and/or the second host 746. The dopant 742 is the organometallic compound of green phosphorescent material having the structures represented by Formulae 1 to 6. The first host 744 is the (hetero) aryl-amine-based organic compound of the p-type host having the structures represented by Formulae 7 to 8. The second host 746 is the azine-based organic compound of the n-type host having the structures represented by Formulae 9 to 10.

As an example, the contents of the host including the first and second hosts 744 and 746 in the upper EML 740B may be, but is not limited to, between about 50 and about 99 wt %, for example, about 80 and about 95 wt %, based on a total weight of the components in the upper EML 740B. The contents of the dopant in the upper EML 740B may be, but is not limited to, between about 1 and about 50 wt %, for example, about 5 and about 20 wt %, based on a total weight of the components in the upper EML 740B. When the upper EML 740B includes both the first and second hosts 744 and 746, the first host 744 and the second host 746 may be admixed, but is not limited to, with a weight ratio from about 4:1 to about 1:4, for example, about 3:1 to about 1:3.

The middle EML 740C may be a yellow green EML and may include a yellow green host and a yellow green dopant. As an example, the yellow green host may be identical to the red host. The yellow green dopant may include at least one of yellow green phosphorescent materials, yellow green fluorescent material and yellow green delayed fluorescent material. The middle EML 740C may be omitted.

In the OLED D3, at least one EML includes the dopant 742, the first host 744 and/or the second host 746 with beneficial luminous properties. The dopant 742 may maintain its stable chemical conformation during the luminescent process. The OLED D3 including the dopant 742 as well as the first and second hosts 744 and/or 746 with beneficial luminous properties may realize white luminescence with improved luminous efficiency and luminous lifespan.

Synthesis Example 1: Synthesis of Compound 1

(1) Synthesis of Intermediate A-1

[Reaction Formula 1-1]

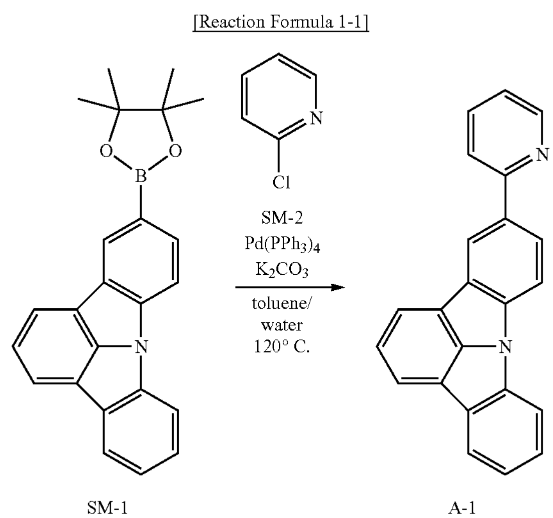

SM-1

A-1

Compound SM-1 (7.34 g, 20 mmol), Compound SM-2 (2.27 g, 20 mmol), Tetrakis(triphenylphosphine)palladium (0) ($Pd(PPh_3)_4$, 1.2 g, 1 mmol), $K_2CO_3$(8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate A-1 (6.05 g, yield: 95%).

(2) Synthesis of Intermediate I-1

[Reaction Formula 1-2]

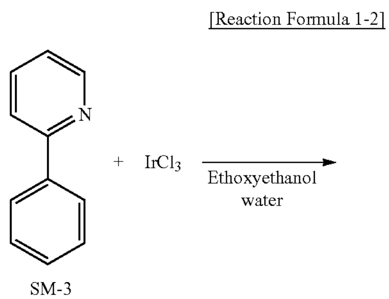

SM-3

-continued

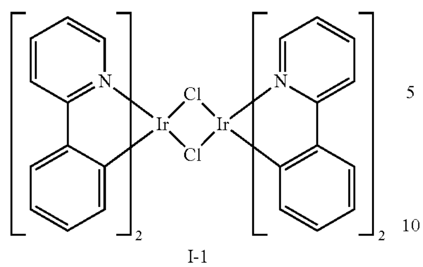

I-1

Compound SM-3 (3.10 g, 20 mmol), $IrCl_3$ (2.39 g, 8.0 mmol) and a mixed solvent of ethoxyethanol (90 mL) and water (30 mL) were added to a 250 mL round bottom flask. Then the solution was stirred at 130° C. for 16 hours. After the reaction was completed, the solution was cooled to room temperature, methanol was added into the solution to facilitate the filtration of the produced solid under reduced pressure and to give the Intermediate I-1 in a solid form (9.56 g, yield: 89%).

(3) Synthesis of Intermediate I-2

[Reaction Formula 1-3]

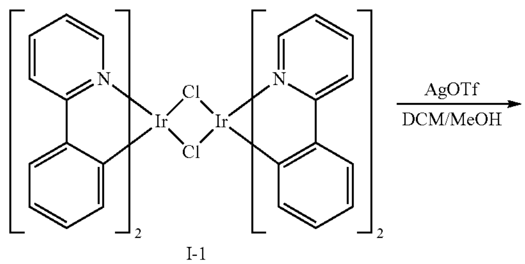

I-1

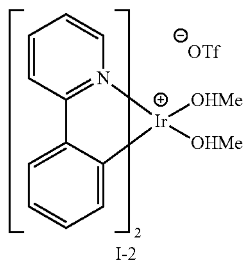

I-2

The Intermediate I-1 (5.16 g, 4.8 mmol), silver trifluoromethanesulfonate (AgOTf, 3.6 g, 14.3 mmol) and dichloromethane were added to a 1000 mL round bottom flask. Then the solution was stirred at room temperature for 16 hours. After the reaction was completed, the solution was filtered with celite to remove the solids. The solvent was removed by distillation under reduced pressure to give the Intermediate I-2 in a solid form (6.03 g, yield: 88%).

(4) Synthesis of Compound 1

[Reaction Formula 1-4]

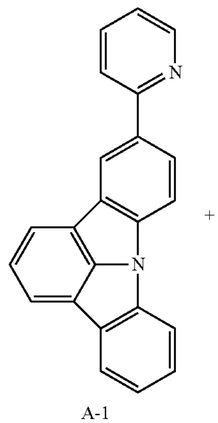

A-1

+

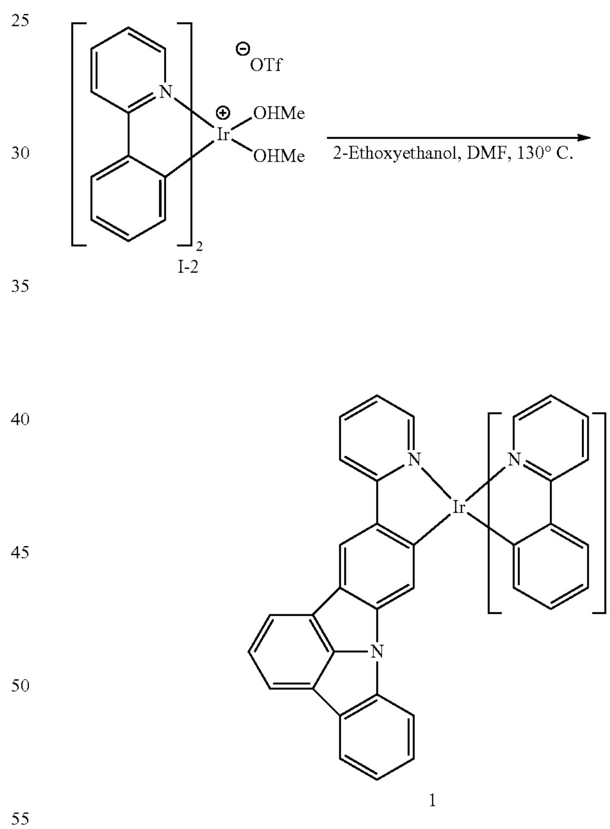

I-2

1

The Intermediate A-1 (1.11 g, 3.5 mmol), the Intermediate I-2 (2.15 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 1 (2.01 g, yield: 82%).

Synthesis Example 2: Synthesis of Compound 2

(1) Synthesis of Intermediate B-1

[Reaction Formula 2-1]

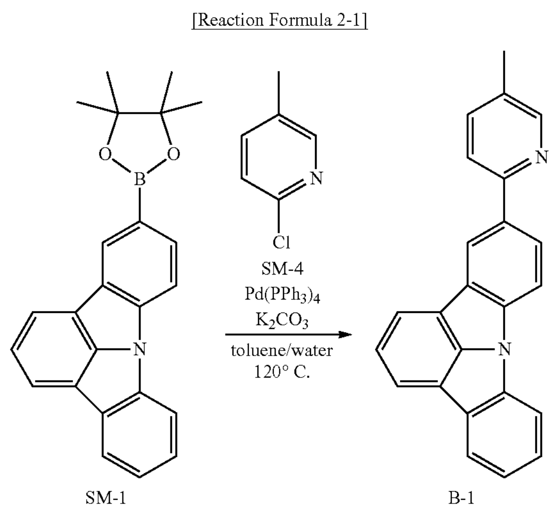

SM-1 B-1

Compound SM-1 (7.34 g, 20 mmol), Compound SM-4 (2.54 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate B-1 (6.17 g, yield: 93%).

(2) Synthesis of Compound 2

[Reaction Formula 2-2]

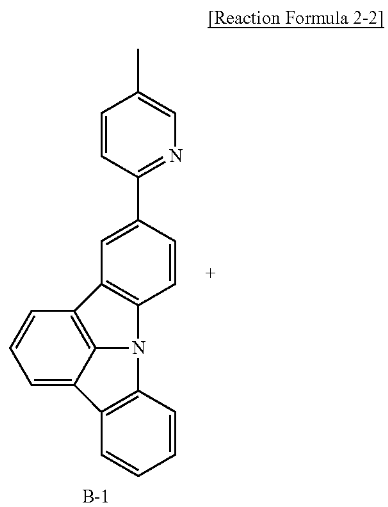

B-1

-continued

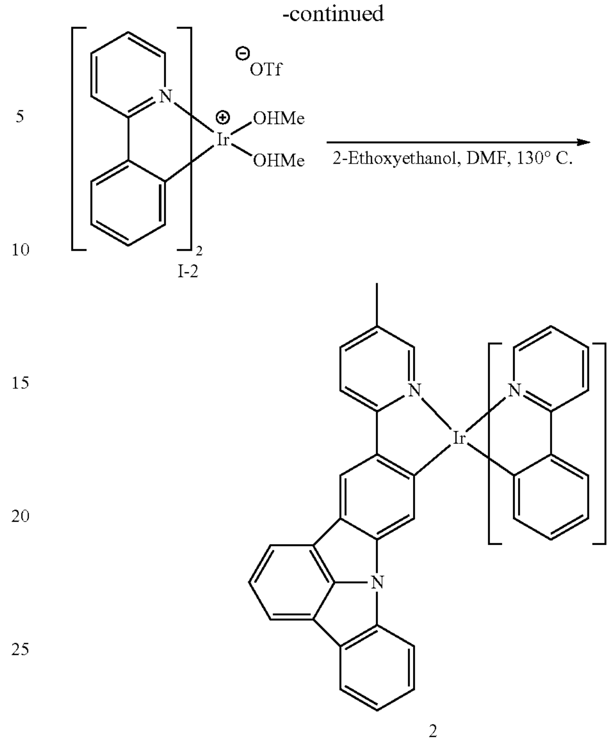

I-2

2

The Intermediate B-1 (1.16 g, 3.5 mmol), the Intermediate I-2 (2.15 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 2 (2.02 g, yield: 81%).

Synthesis Example 3: Synthesis of Compound 16

(1) Synthesis of Intermediate C-1

[Reaction Formula 3-1]

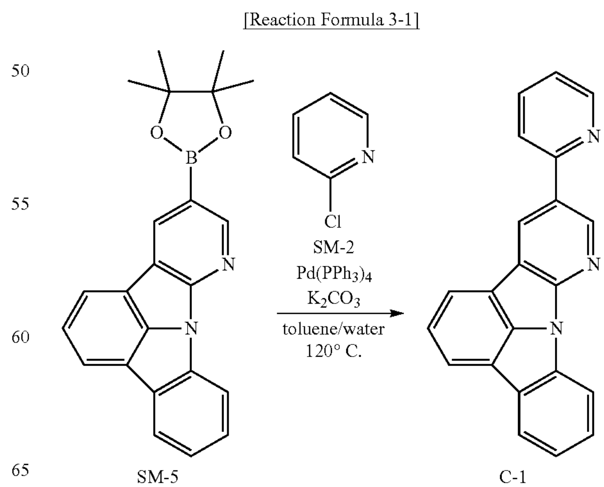

SM-5 C-1

Compound SM-5 (7.34 g, 20 mmol), Compound SM-2 (2.27 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate C-1 (5.66 g, yield: 93%)

(2) Synthesis of Compound 16

[Reaction Formula 3-2]

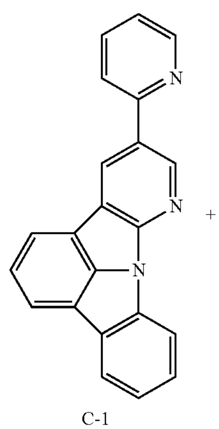

C-1

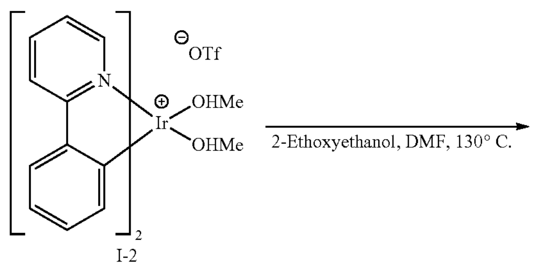

I-2

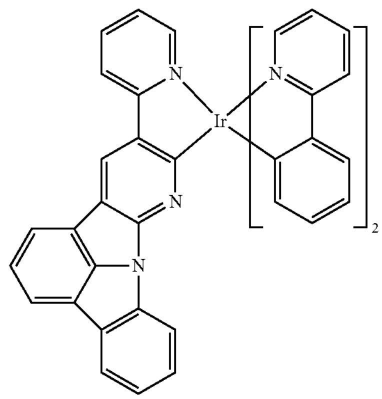

16

The Intermediate C-1 (1.12 g, 3.5 mmol), the Intermediate I-2 (2.15 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 16 (2.02 g, yield: 81%).

Synthesis Example 4: Synthesis of Compound 17

(1) Synthesis of Intermediate D-1

[Reaction Formula 4-1]

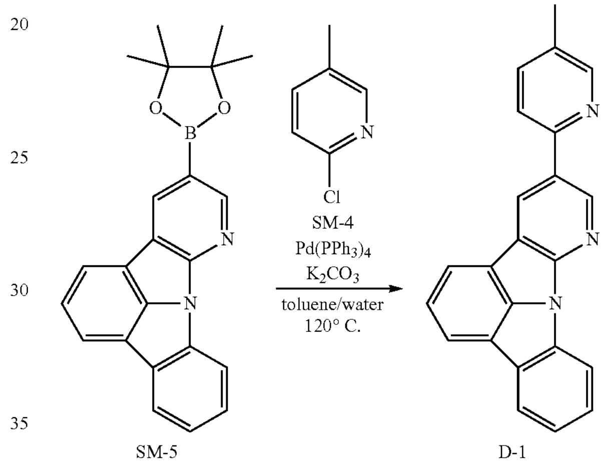

SM-5 D-1

Compound SM-5 (7.34 g, 20 mmol), Compound SM-4 (2.54 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate D-1 (5.86 g, yield: 88%).

(2) Synthesis of Compound 17

[Reaction Formula 4-2]

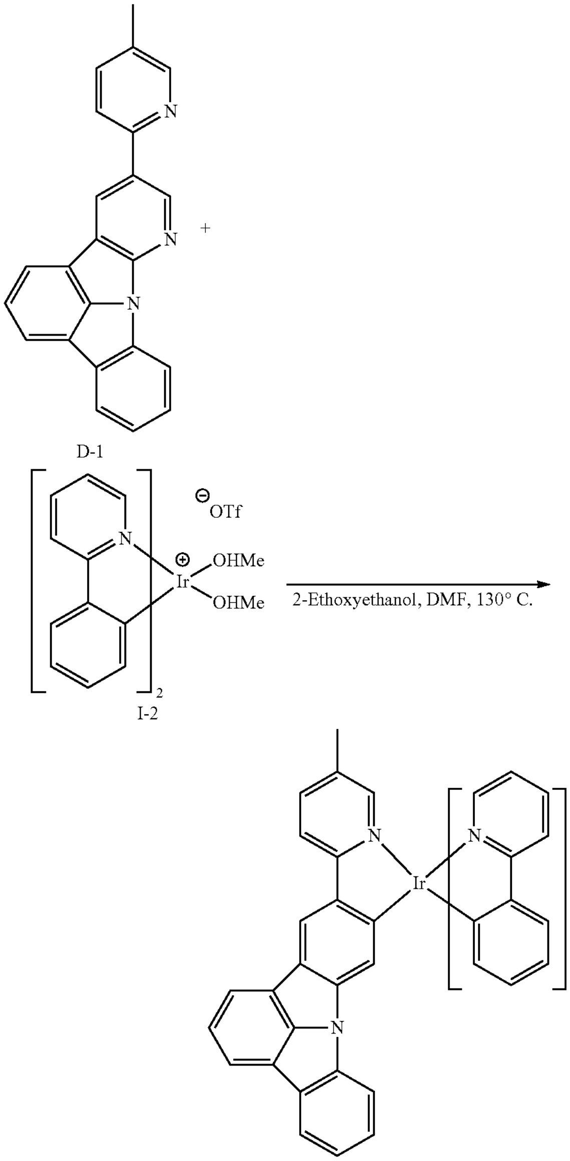

D-1

I-2

17

The Intermediate D-1 (1.17 g, 3.5 mmol), the Intermediate I-2 (2.15 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 17 (2.25 g, yield: 90%).

Synthesis Example 5: Synthesis of Compound 27

(1) Synthesis of Intermediate E-1

[Reaction Formula 5-1]

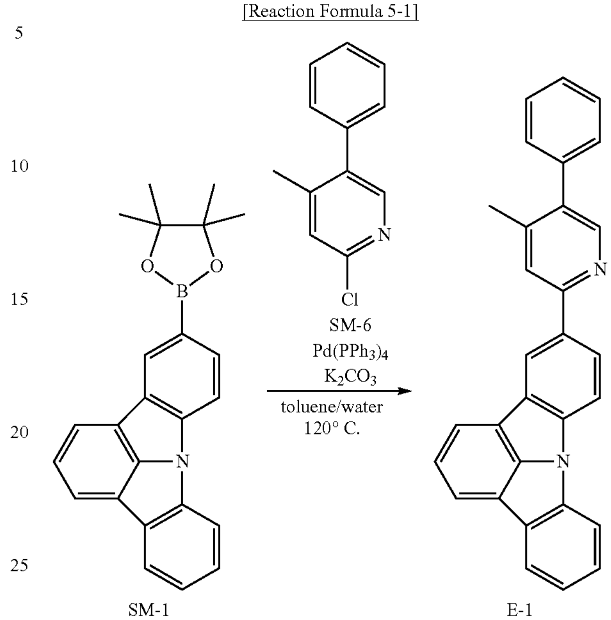

SM-1

E-1

Compound SM-1 (7.34 g, 20 mmol), Compound SM-6 (4.08 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate E-1 (7.34 g, yield: 90%)

(2) Synthesis of Compound 27

[Reaction Formula 5-2]

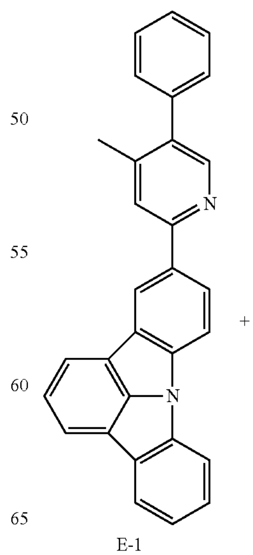

E-1

-continued

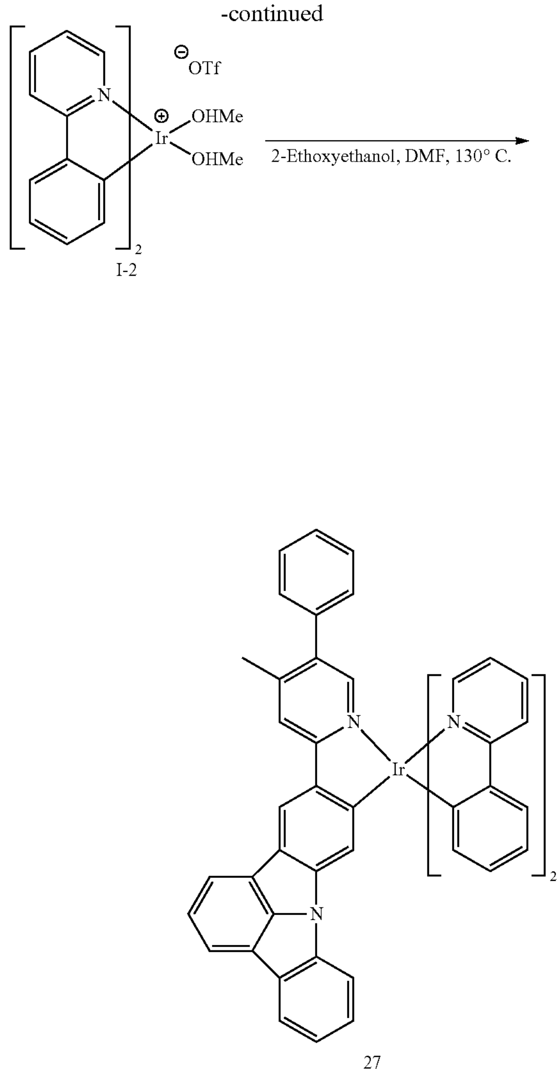

I-2

27

The Intermediate E-1 (1.43 g, 3.5 mmol), the Intermediate I-2 (2.15 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 27 (2.45 g, yield: 90%).

Synthesis Example 6: Synthesis of Compound 32

(1) Synthesis of Intermediate F-1

[Reaction Formula 6-1]

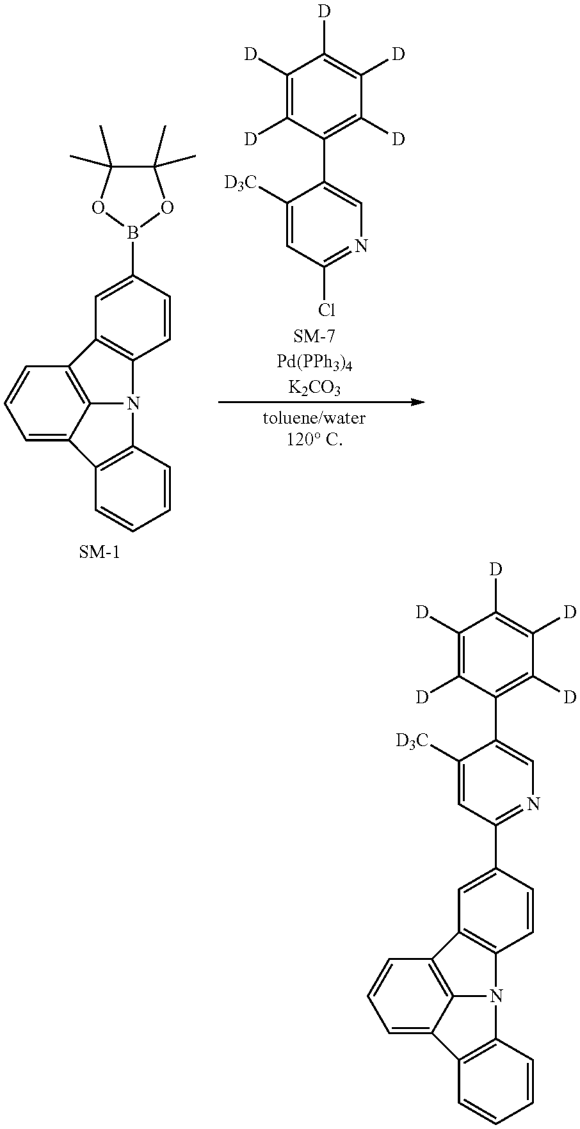

SM-1

F-1

Compound SM-1 (7.34 g, 20 mmol), Compound SM-7 (4.24 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate F-1 (7.67 g, yield: 92%).

(2) Synthesis of Intermediate J-1

[Reaction Formula 6-2]

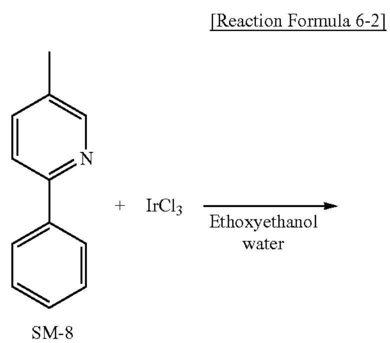

SM-8

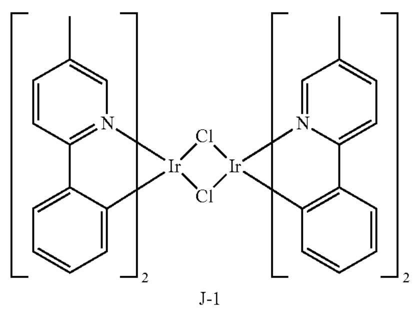

J-1

Compound SM-8 (3.38 g, 20 mmol), $IrCl_3$ (2.39 g, 8.0 mmol) and a mixed solvent of ethoxyethanol (90 mL) and water (30 mL) were added to a 250 mL round bottom flask. Then the solution was stirred at 130° C. for 16 hours. After the reaction was completed, the solution was cooled to room temperature, methanol was added into the solution to facilitate the filtration of the produced solid under reduced pressure and to give the Intermediate J-1 in a solid form (4.07 g, yield: 90%).

(3) Synthesis of Intermediate J-2

[Reaction Formula 6-3]

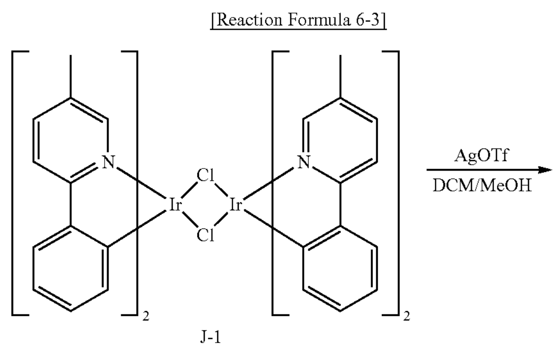

J-1

-continued

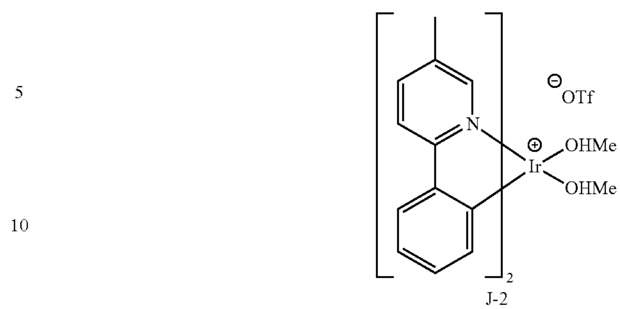

J-2

The Intermediate J-1 (5.16 g, 4.8 mmol), silver trifluoromethanesulfonate (AgOTf, 3.6 g, 14.3 mmol) and dichloromethane were added to a 1000 mL round bottom flask. Then the solution was stirred at room temperature for 16 hours. After the reaction was completed, the solution was filtered with celite to remove the solids. The solvent was removed by distillation under reduced pressure to give the Intermediate J-2 in a solid form (6.03 g, yield: 88%).

(4) Synthesis of Compound 32

[Reaction Formula 6-4]

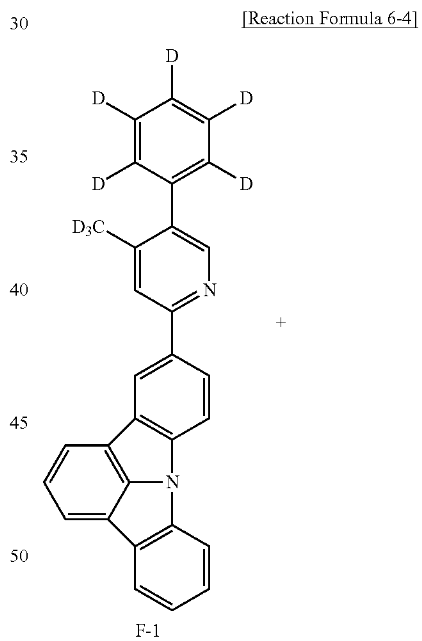

F-1

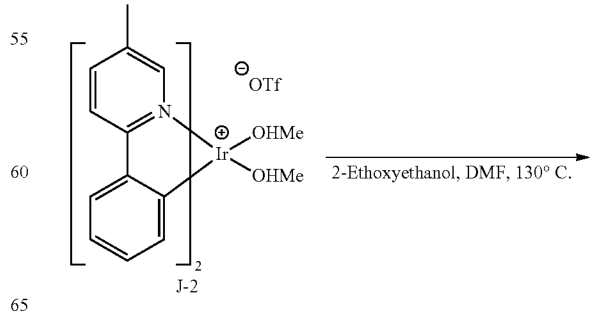

J-2

-continued

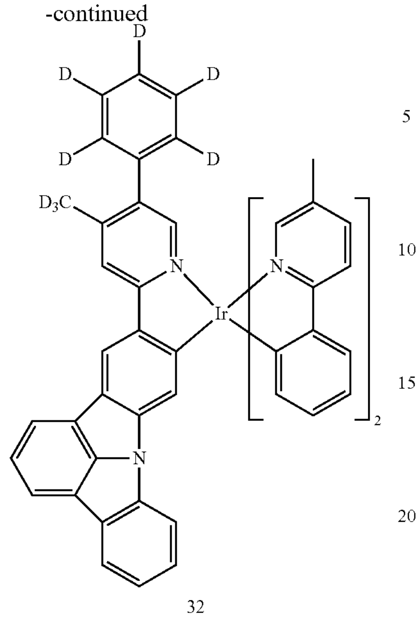

32

-continued

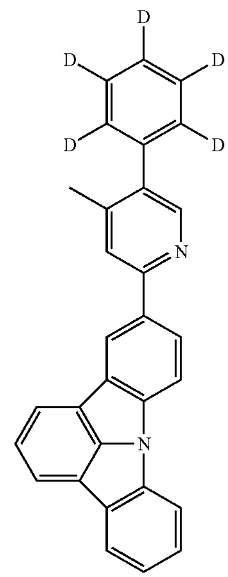

G-1

The Intermediate F-1 (1.46 g, 3.5 mmol), the Intermediate J-2 (2.23 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 32 (2.47 g, yield: 87%).

Synthesis Example 7: Synthesis of Compound 34

(1) Synthesis of Intermediate G-1

[Reaction Formula 7-1]

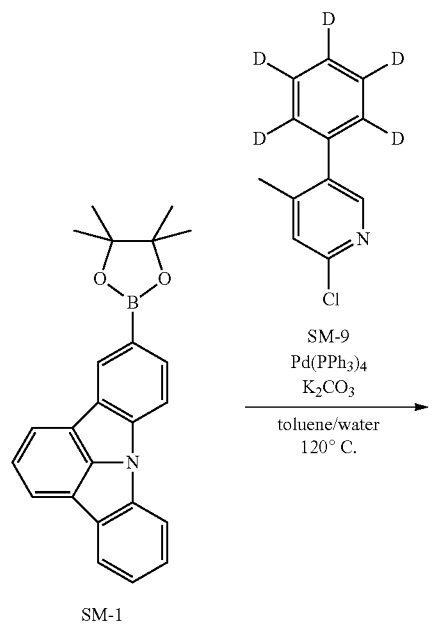

SM-1

Compound SM-1 (7.34 g, 20 mmol), Compound SM-9 (4.24 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate G-1 (7.53 g, yield: 91%).

(2) Synthesis of Compound 34

[Reaction Formula 7-2]

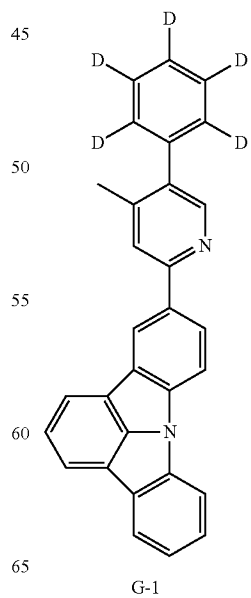

+

G-1

-continued

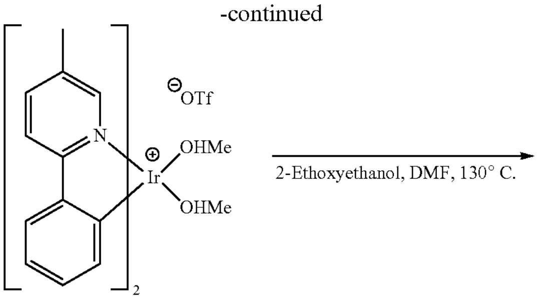

J-2

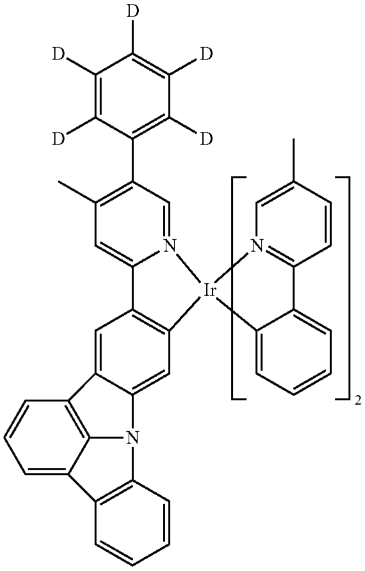

34

The Intermediate G-1 (1.45 g, 3.5 mmol), the Intermediate J-2 (2.23 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 34 (2.26 g, yield: 80%).

Synthesis Example 8: Synthesis of Compound 35

(1) Synthesis of Intermediate H-1

[Reaction Formula 8-1]

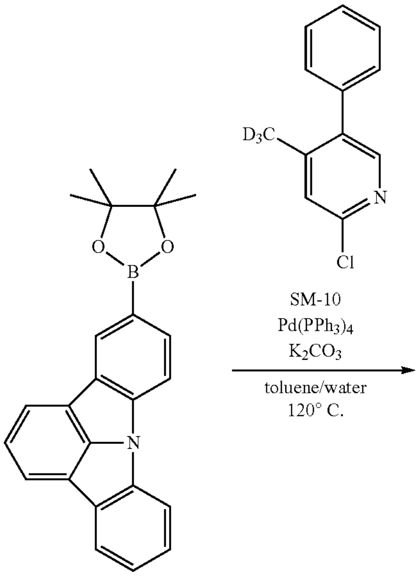

SM-1

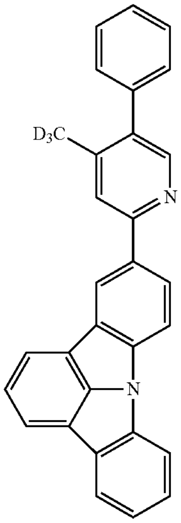

H-1

Compound SM-1 (7.34 g, 20 mmol), Compound SM-10 (4.14 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. An organic layer was extracted with chloroform and washed with water. Water was removed with anhydrous $MgSO_4$, the dried organic layer was filtered, and the organic solvent was removed under reduced pressure. Then a crude product was purified with column chromatography to give the Intermediate H-1 (7.83 g, yield: 95%).

(2) Synthesis of Compound 35

[Reaction Formula 8-2]

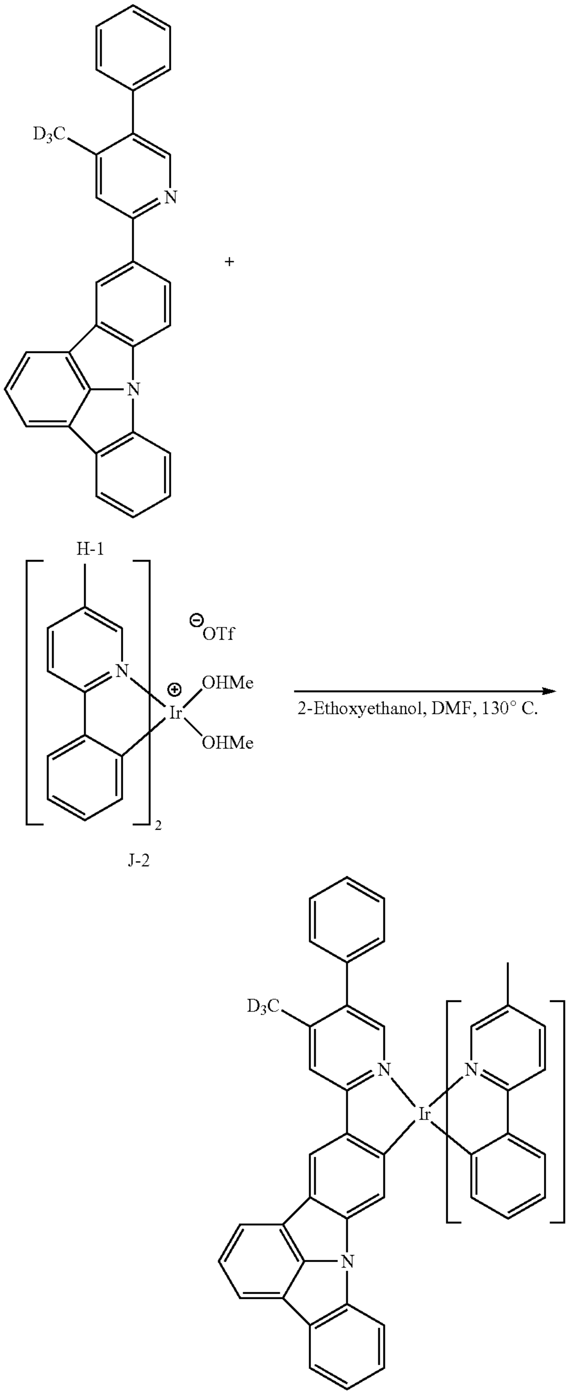

H-1

J-2

35

The Intermediate H-1 (1.44 g, 3.5 mmol), the Intermediate J-2 (2.23 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 35 (2.28 g, yield: 81%).

Synthesis Example 9: Synthesis of Compound 136

(1) Synthesis of Intermediate A-2

[Reaction Formula 9-1]

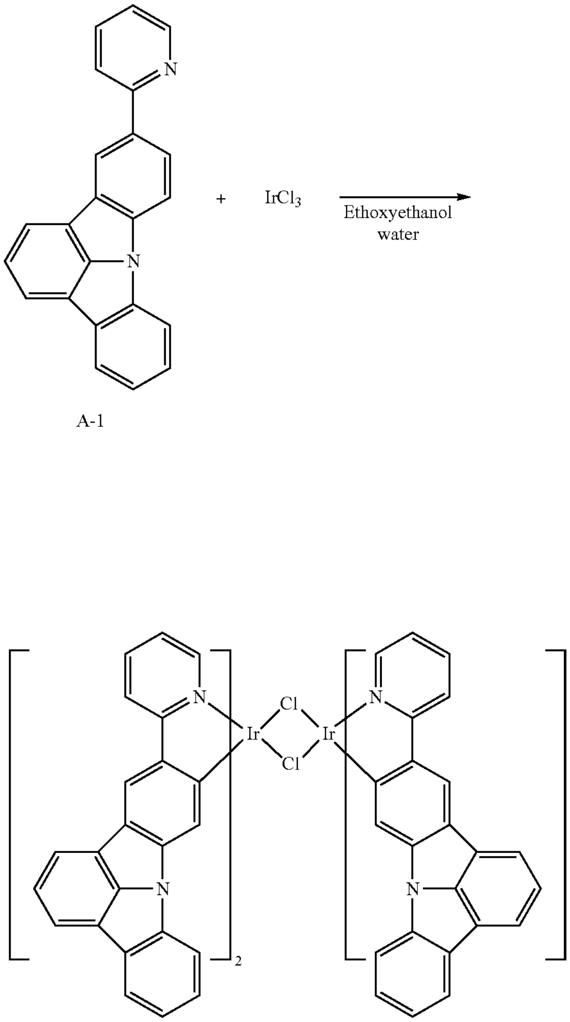

A-1

A-2

The Intermediate A-1 (6.36 g, 20 mmol), $IrCl_3$ (2.39 g, 8.0 mmol) and a mixed solvent of ethoxyethanol (90 mL) and water (30 mL) were added to a 250 mL round bottom flask. Then the solution was stirred at 130° C. for 16 hours. After the reaction was completed, the solution was cooled to room temperature, methanol was added into the solution to facilitate the filtration of the produced solid under reduced pressure and to give the Intermediate A-2 in a solid form (5.53 g, yield: 80%).

(2) Synthesis of Intermediate A-3

[Reaction Formula 9-2]

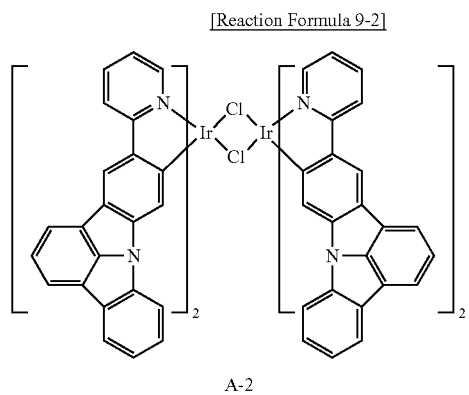

A-2

AgOTf
DCM/
MeOH

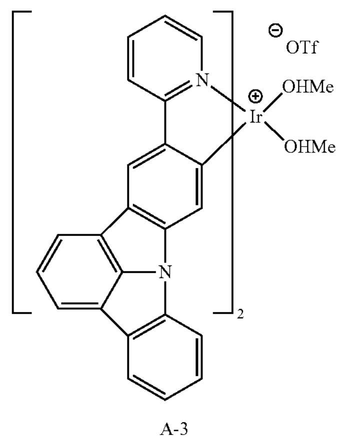

A-3

The Intermediate A-2 (8.29 g, 4.8 mmol), silver trifluoromethanesulfonate (AgOTf, 3.6 g, 14.3 mmol) and dichloromethane were added to a 1000 mL round bottom flask. Then the solution was stirred at room temperature for 16 hours. After the reaction was completed, the solution was filtered with celite to remove the solids. The solvent was removed by distillation under reduced pressure to give the Intermediate A-3 in a solid form (7.99 g, yield: 80%).

(3) Synthesis of Compound 136

[Reaction Formula 9-3]

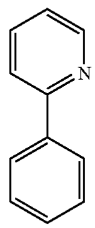

+

L-1

-continued

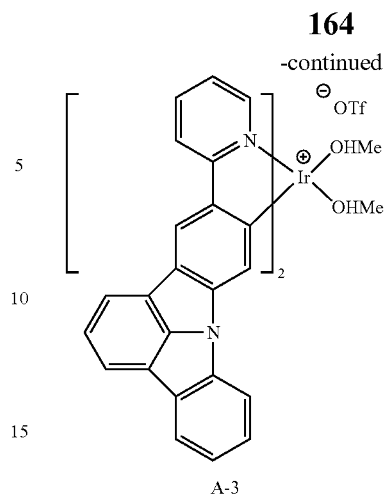

A-3

2-Ethoxyethanol,
DMF, 130° C.

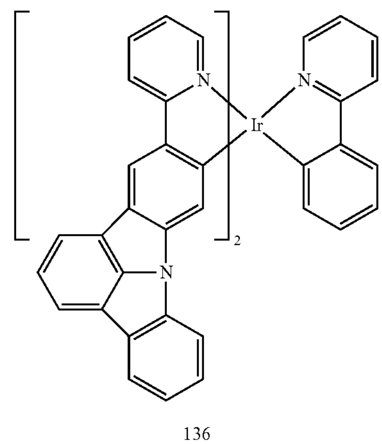

136

Compound L-1 (0.54 g, 3.5 mmol), the Intermediate A-3 (3.12 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 136 (2.46 g, yield: 80%).

Synthesis Example 10: Synthesis of Compound 137

[Reaction Formula 10]

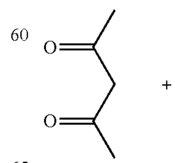

+

L-2

-continued

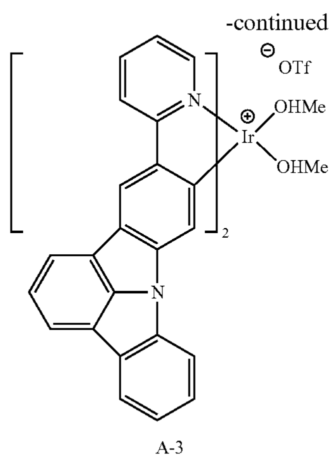

A-3

2-Ethoxyethanol, DMF, 130° C.

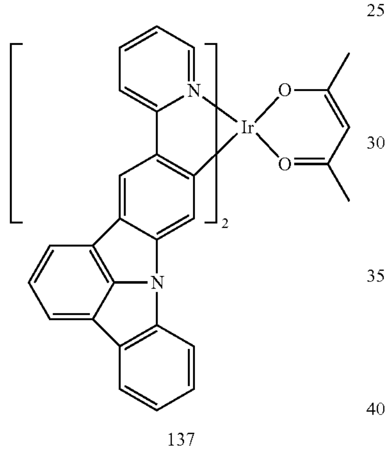

137

Compound L-2 (0.35 g, 3.5 mmol), the Intermediate A-3 (3.12 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 137 (2.22 g, yield: 80%).

Synthesis Example 11: Synthesis of Compound 141

(1) Synthesis of Intermediate C-2

[Reaction Formula 11-1]

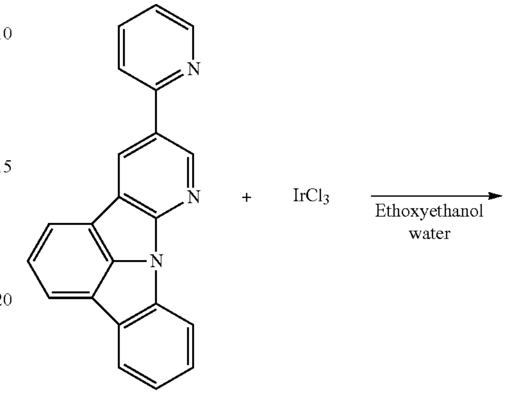

C-1

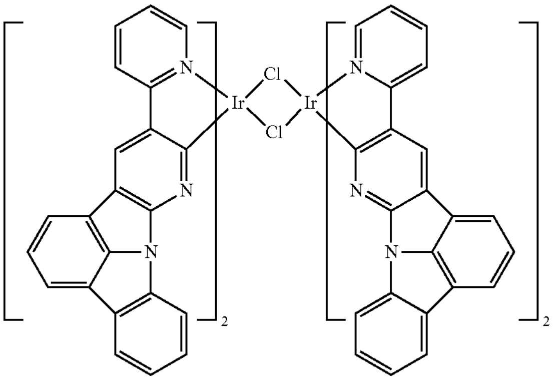

C-2

The Intermediate C-1 (6.36 g, 20 mmol), $IrCl_3$ (2.39 g, 8.0 mmol) and a mixed solvent of ethoxyethanol (90 mL) and water (30 mL) were added to a 250 mL round bottom flask. Then the solution was stirred at 130° C. for 16 hours. After the reaction was completed, the solution was cooled to room temperature, methanol was added into the solution to facilitate the filtration of the produced solid under reduced pressure and to give the Intermediate C-2 in a solid form (5.32 g, yield: 77%).

(2) Synthesis of Intermediate C-3

[Reaction Formula 11-2]

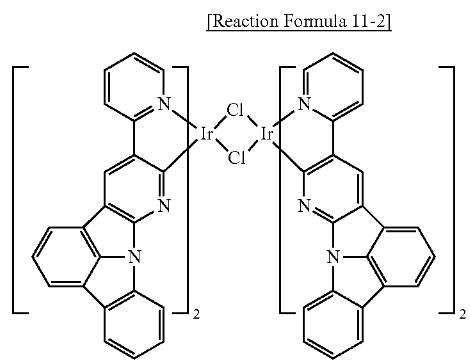

C-2

AgOTf
DCM/
MeOH

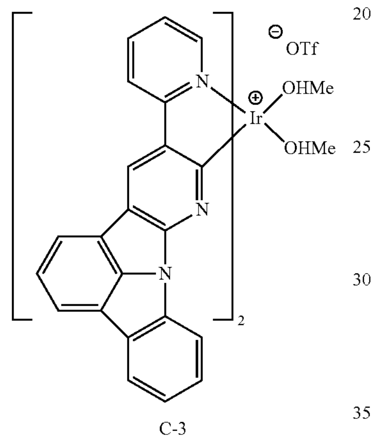

C-3

The Intermediate C-2 (8.29 g, 4.8 mmol), silver trifluoromethanesulfonate (AgOTf, 3.6 g, 14.3 mmol) and dichloromethane were added to a 1000 mL round bottom flask. Then the solution was stirred at room temperature for 16 hours. After the reaction was completed, the solution was filtered with celite to remove the solids. The solvent was removed by distillation under reduced pressure to give the Intermediate C-3 in a solid form (7.29 g, yield: 72%).

(3) Synthesis of Compound 141

[Reaction Formula 11-3]

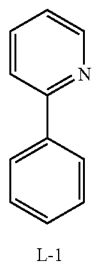

L-1

+

-continued

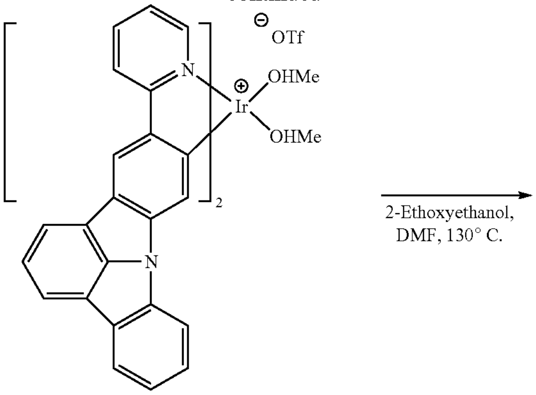

C-2

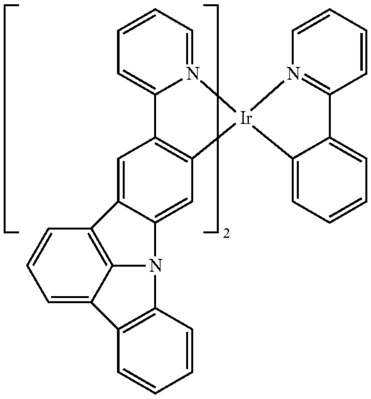

141

Compound L-1 (0.54 g, 3.5 mmol), the Intermediate C-3 (3.13 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 141 (2.45 g, yield: 83%).

Synthesis Example 12: Synthesis of Compound 142

(1) Synthesis of Intermediate D-2

[Reaction Formula 12-1]

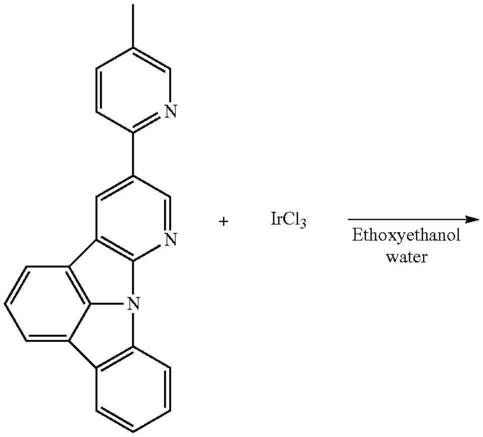

D-1

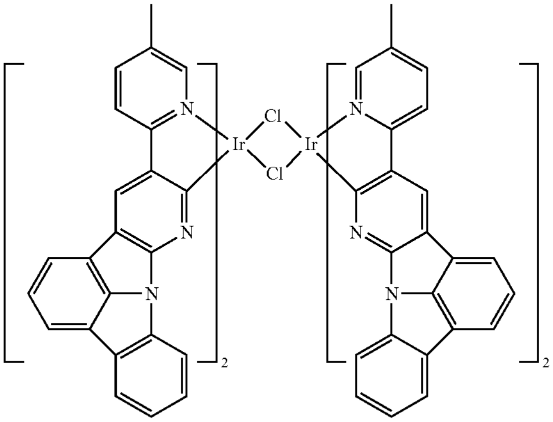

D-2

The Intermediate D-1 (6.64 g, 20 mmol), $IrCl_3$ (2.39 g, 8.0 mmol) and a mixed solvent of ethoxyethanol (90 mL) and water (30 mL) were added to a 250 mL round bottom flask. Then the solution was stirred at 130° C. for 16 hours. After the reaction was completed, the solution was cooled to room temperature, methanol was added into the solution to facilitate the filtration of the produced solid under reduced pressure and to give the Intermediate D-2 in a solid form (5.71 g, yield: 80%).

(2) Synthesis of Intermediate D-3

[Reaction Formula 12-2]

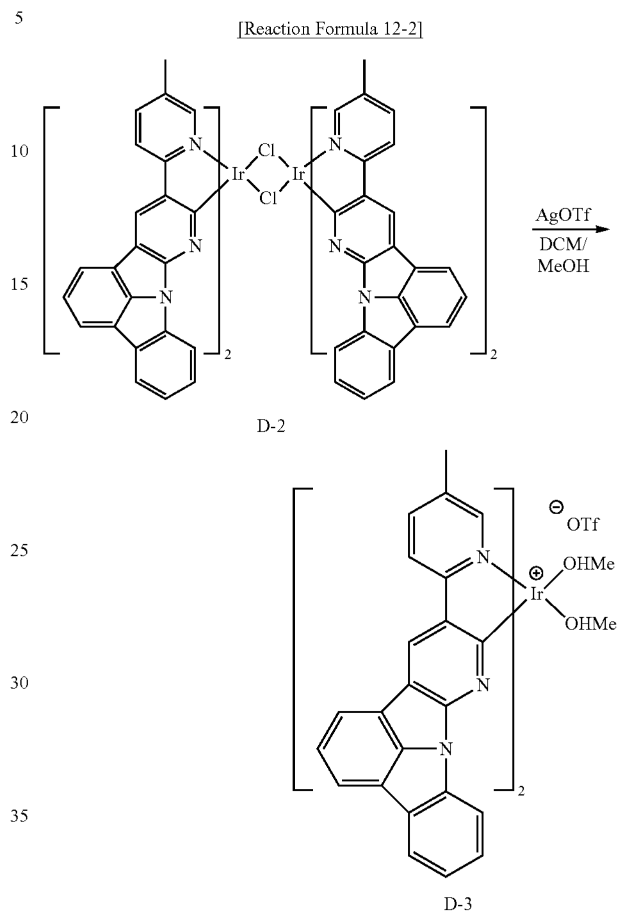

D-2

D-3

The Intermediate D-2 (8.58 g, 4.8 mmol), silver trifluoromethanesulfonate (AgOTf, 3.6 g, 14.3 mmol) and dichloromethane were added to a 1000 mL round bottom flask. Then the solution was stirred at room temperature for 16 hours. After the reaction was completed, the solution was filtered with celite to remove the solids. The solvent was removed by distillation under reduced pressure to give the Intermediate D-3 in a solid form (7.09 g, yield: 69%).

(3) Synthesis of Compound 142

[Reaction Formula 12-3]

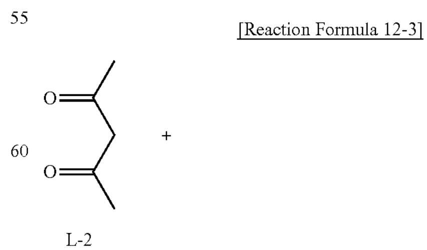

L-2

-continued

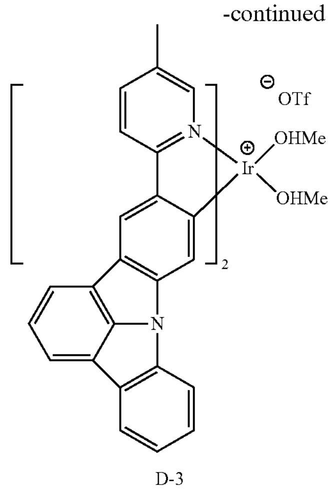

D-3

2-Ethoxyethanol,
DMF, 130° C.

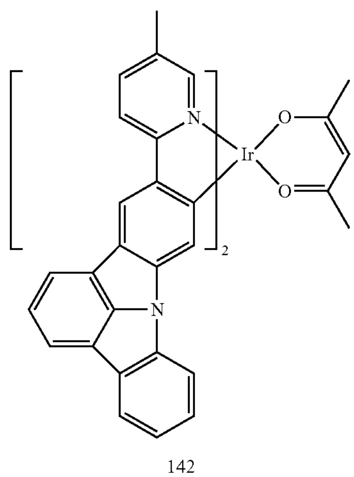

142

Compound L-2 (0.35 g, 3.5 mmol), the Intermediate D-3 (3.21 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 142 (2.12 g, yield: 74%).

Synthesis Example 13: Synthesis of Compound 147

(1) Synthesis of Intermediate E-2

[Reaction Formula 13-1]

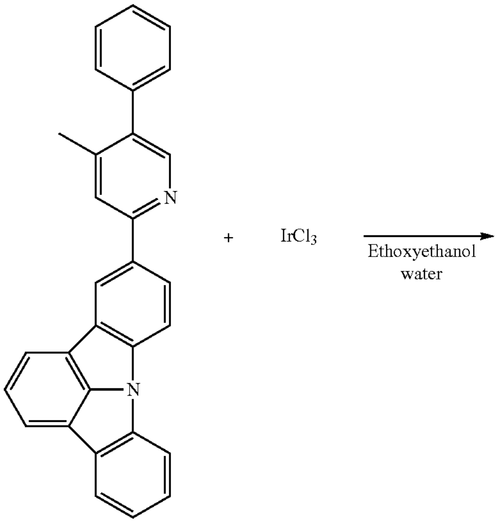

E-1

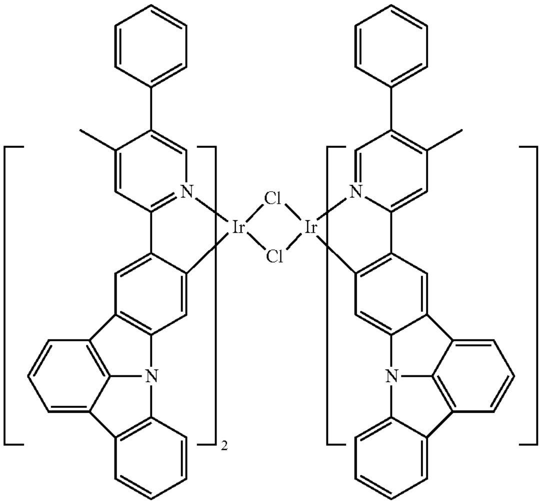

E-2

The Intermediate E-1 (8.16 g, 20 mmol), $IrCl_3$ (2.39 g, 8.0 mmol) and a mixed solvent of ethoxyethanol (90 mL) and water (30 mL) were added to a 250 mL round bottom flask. Then the solution was stirred at 130° C. for 16 hours. After the reaction was completed, the solution was cooled to room temperature, methanol was added into the solution to facilitate the filtration of the produced solid under reduced pressure and to give the Intermediate E-2 in a solid form (7.26 g, yield: 87%).

(2) Synthesis of Intermediate E-3

[Reaction Formula 13-1]

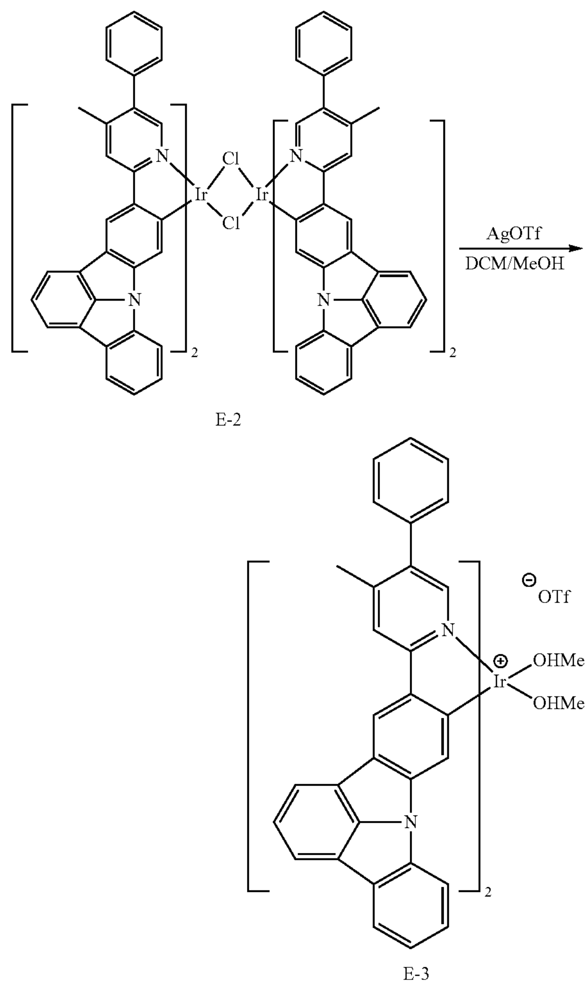

E-2

E-3

The Intermediate E-2 (10.0 g, 4.8 mmol), silver trifluoromethanesulfonate (AgOTf, 3.6 g, 14.3 mmol) and dichloromethane were added to a 1000 mL round bottom flask. Then the solution was stirred at room temperature for 16 hours. After the reaction was completed, the solution was filtered with celite to remove the solids. The solvent was removed by distillation under reduced pressure to give the Intermediate E-3 in a solid form (8.91 g, yield: 76%).

(3) Synthesis of Compound 147

[Reaction Formula 13-3]

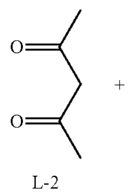

L-2

+

-continued

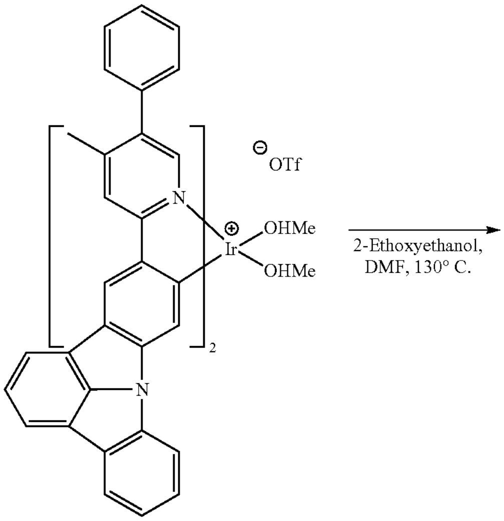

E-3

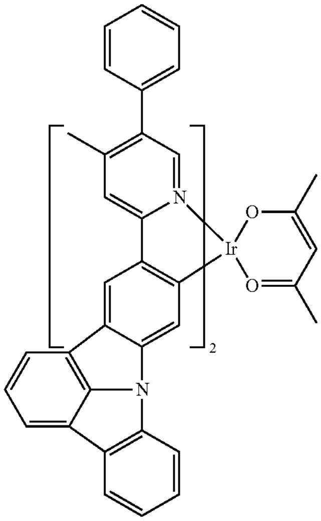

147

Compound L-2 (0.35 g, 3.5 mmol), the Intermediate E-3 (3.36 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 147 (2.59 g, yield: 78%).

Synthesis Example 14: Synthesis of Compound 148

[Reaction Formula 14]

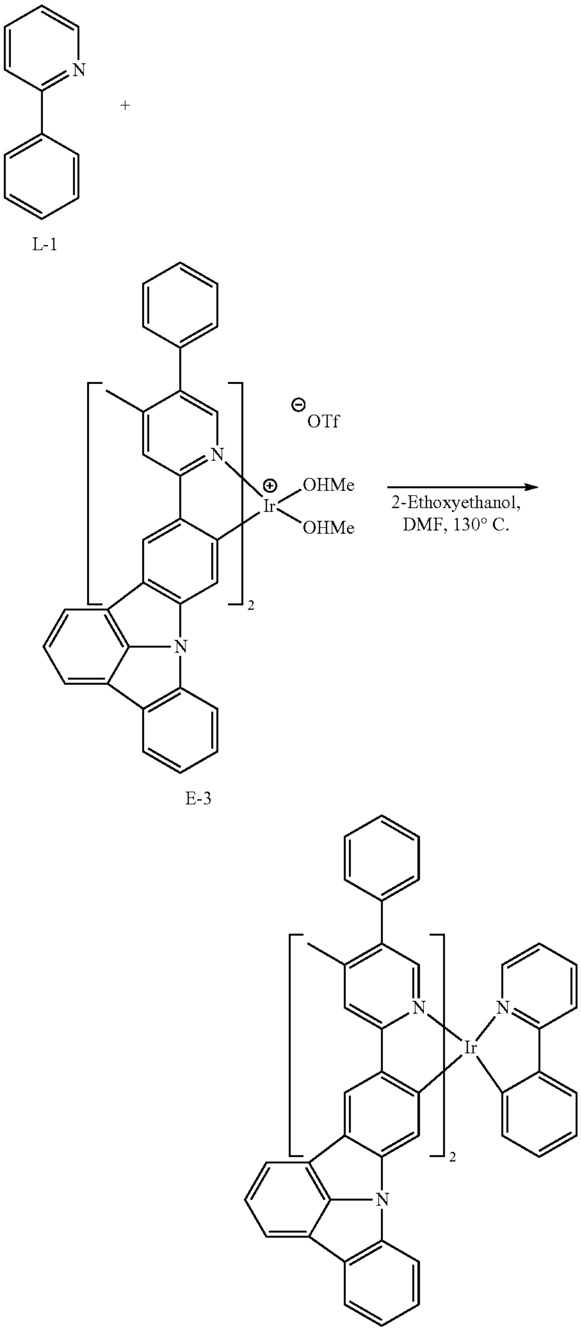

L-1

E-3

148

Compound L-1 (0.54 g, 3.5 mmol), the Intermediate E-3 (3.36 g, 3.0 mmol) and a mixed solvent of 2-ethoxyethanol (40 mL) and DMF (40 mL) were added to a 100 mL round bottom flask under nitrogen atmosphere. Then the solution was stirred at 130° C. for 48 hours. After the reaction was completed, the organic layer was extracted with dichloromethane and washed with distilled water and the solvent was removed by distillation under reduced pressure. A crude product was purified with column chromatography (eluent: toluene and hexane) to give the Compound 148 (2.96 g, yield: 85%).

Synthesis Example 15: Synthesis of Compound 251

[Reaction Formula 15]

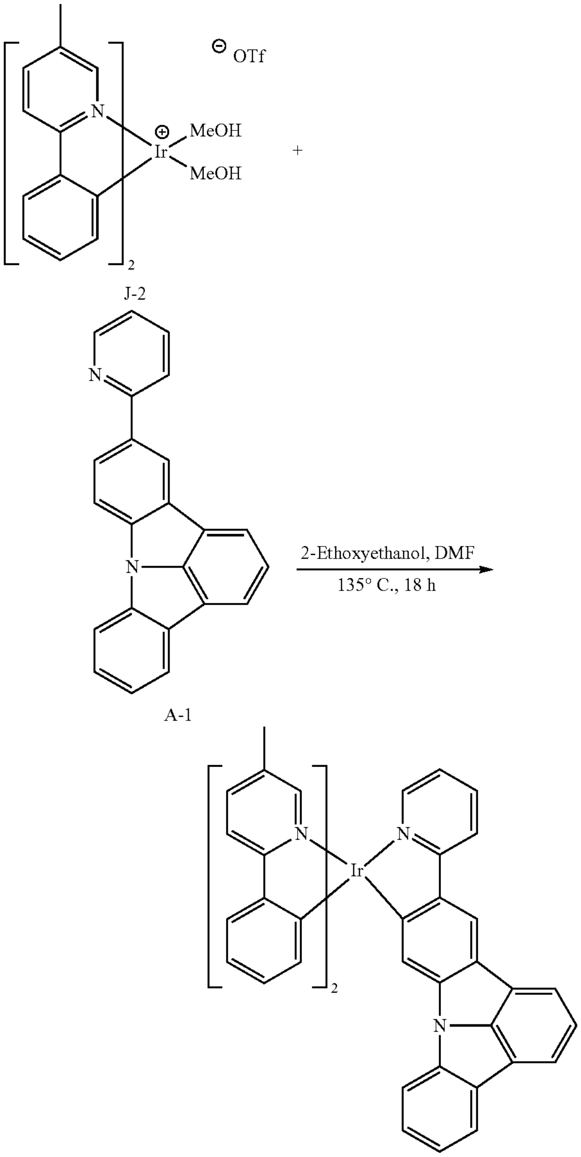

J-2

A-1

251

The Intermediate J-2 (2.23 g, 3.0 mmol), the Intermediate A-1 (1.11 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 251 (2.31 g, yield: 91%)

Synthesis Example 16: Synthesis of Compound 252

[Reaction Formula 16]

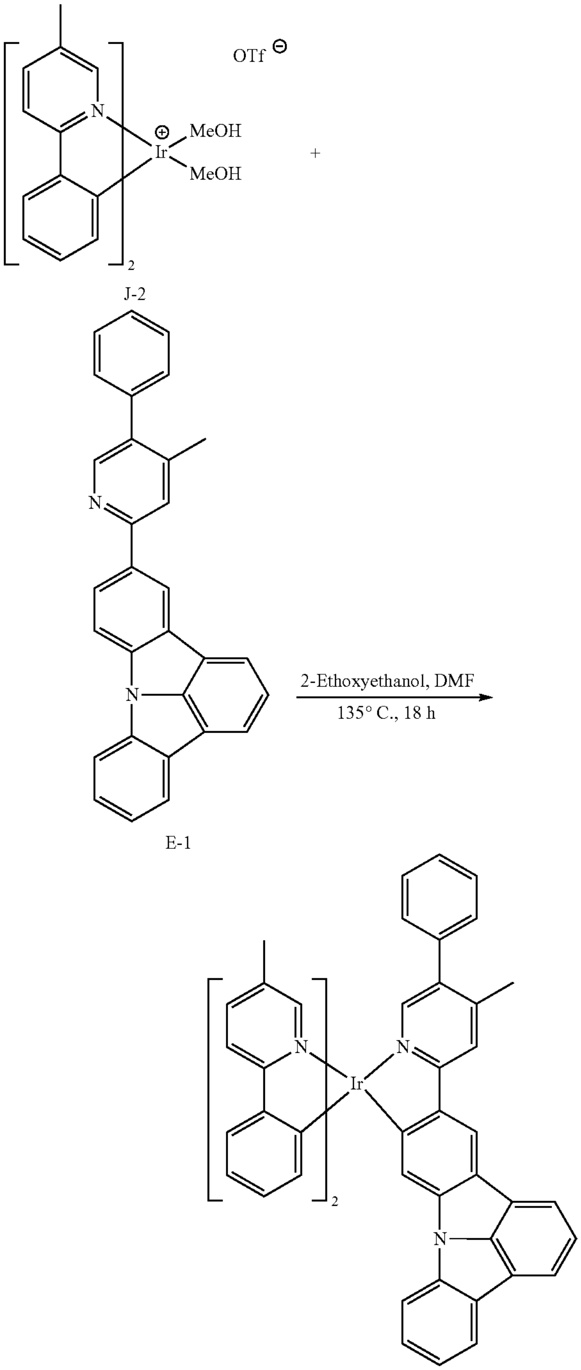

J-2

E-1

252

The Intermediate J-2 (2.23 g, 3.0 mmol), the Intermediate E-1 (1.43 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 252 (2.61 g, yield: 93%).

Synthesis Example 17: Synthesis of Compound 253

(1) Synthesis of Intermediate K-1

[Reaction Formula 17-1]

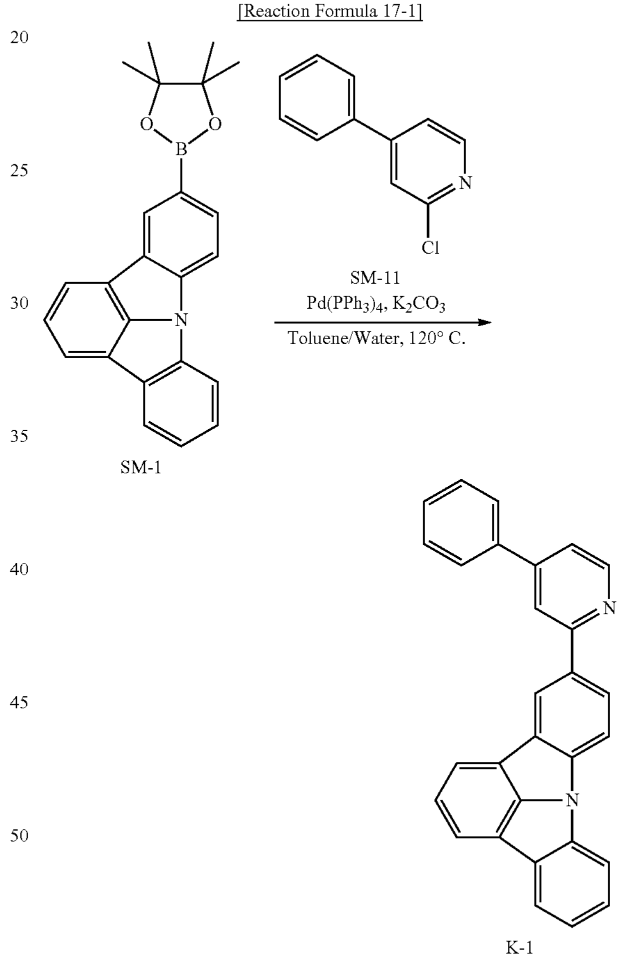

SM-1

K-1

Compound SM-1 (7.34 g, 20 mmol), Compound SM-11 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. After the reaction was completed, the solution was cooled to a room temperature, and an organic layer was extracted with dichloromethane and washed with excessive water. The moisture was removed with anhydrous magnesium sulfate, the dried organic layer was filtered, and the filtrate was concentrated under reduced pressure. Then the concentrate was purified with column chromatography to give the Intermediate K-1 (7.26 g, yield: 92%).

(2) Synthesis of Compound 253

[Reaction Formula 17-2]

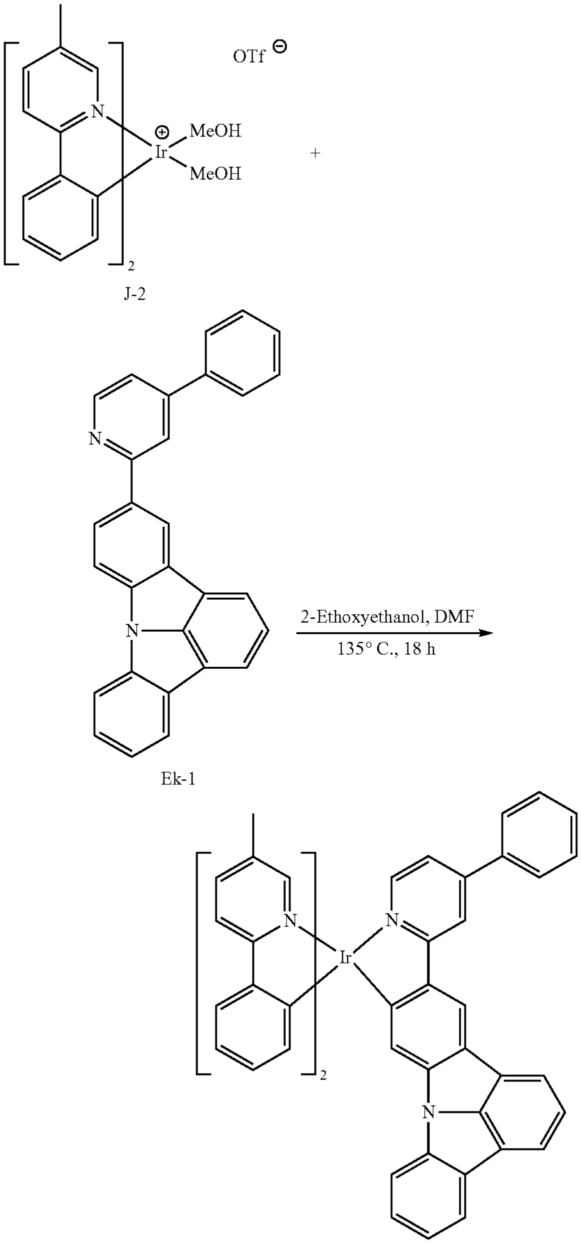

J-2

Ek-1

253

The Intermediate J-2 (2.23 g, 3.0 mmol), the Intermediate K-1 (1.38 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 253 (2.55 g, yield: 92%).

Synthesis Example 18: Synthesis of Compound 254

(1) Synthesis of Intermediate M-1

[Reaction Formula 18-1]

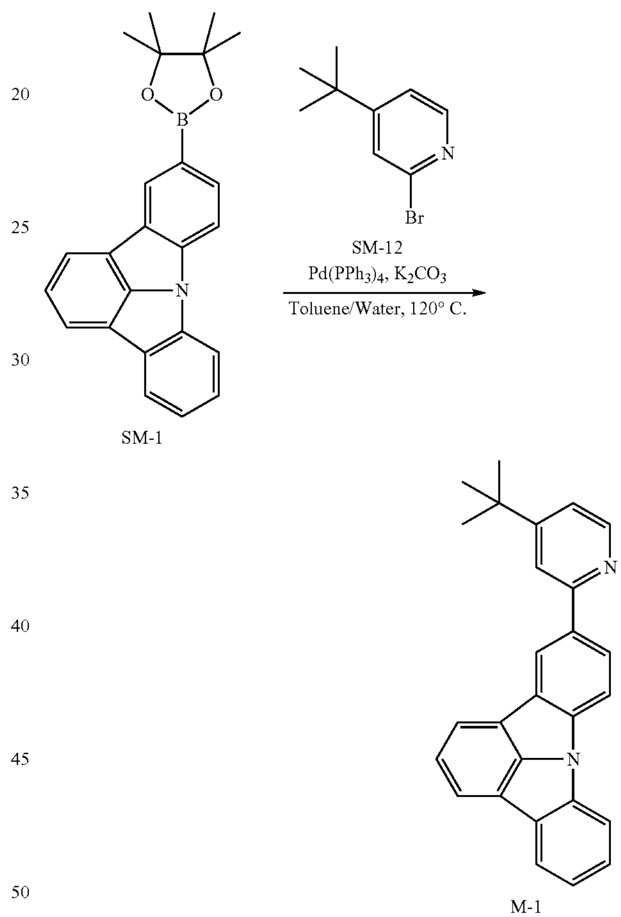

SM-1

M-1

Compound SM-1 (7.34 g, 20 mmol), Compound SM-12 (4.26 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. After the reaction was completed, the solution was cooled to a room temperature, and an organic layer was extracted with dichloromethane and washed with excessive water. The moisture was removed with anhydrous magnesium sulfate, the dried organic layer was filtered, and the filtrate was concentrated under reduced pressure. Then the concentrate was purified with column chromatography to give the Intermediate M-1 (7.04 g, yield: 94%).

(2) Synthesis of Compound 254

[Reaction Formula 17-2]

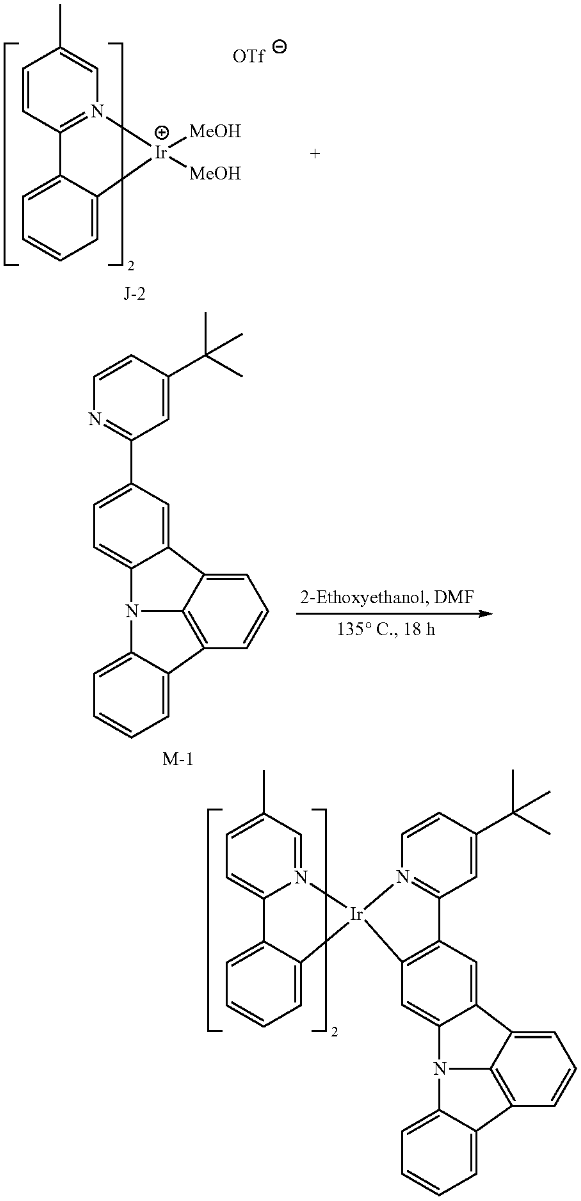

254

The Intermediate J-2 (2.23 g, 3.0 mmol), the Intermediate M-1 (1.43 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 254 (2.55 g, yield: 89%).

Synthesis Example 19: Synthesis of Compound 255

(1) Synthesis of Intermediate N-1

[Reaction Formula 19-1]

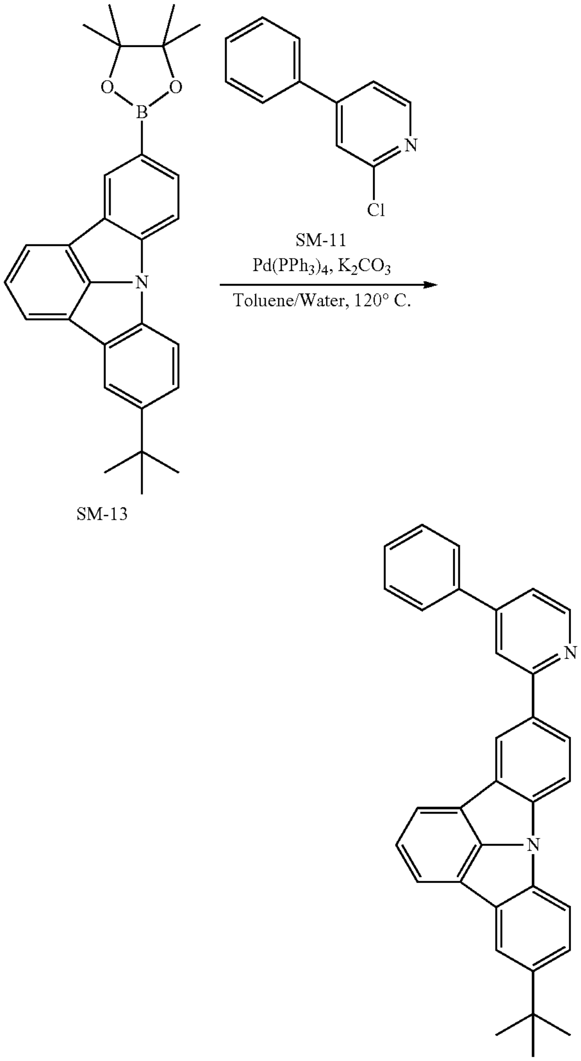

N-1

Compound SM-13 (8.47 g, 20 mmol), Compound SM-11 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. After the reaction was completed, the solution was cooled to a room temperature, and an organic layer was extracted with dichloromethane and washed with excessive water. The moisture was removed with anhydrous magnesium sulfate, the dried organic layer was filtered, and the filtrate was concentrated under reduced pressure. Then the concentrate was purified with column chromatography to give the Intermediate N-1 (8.11 g, yield: 90%).

(2) Synthesis of Compound 255

[Reaction Formula 19-2]

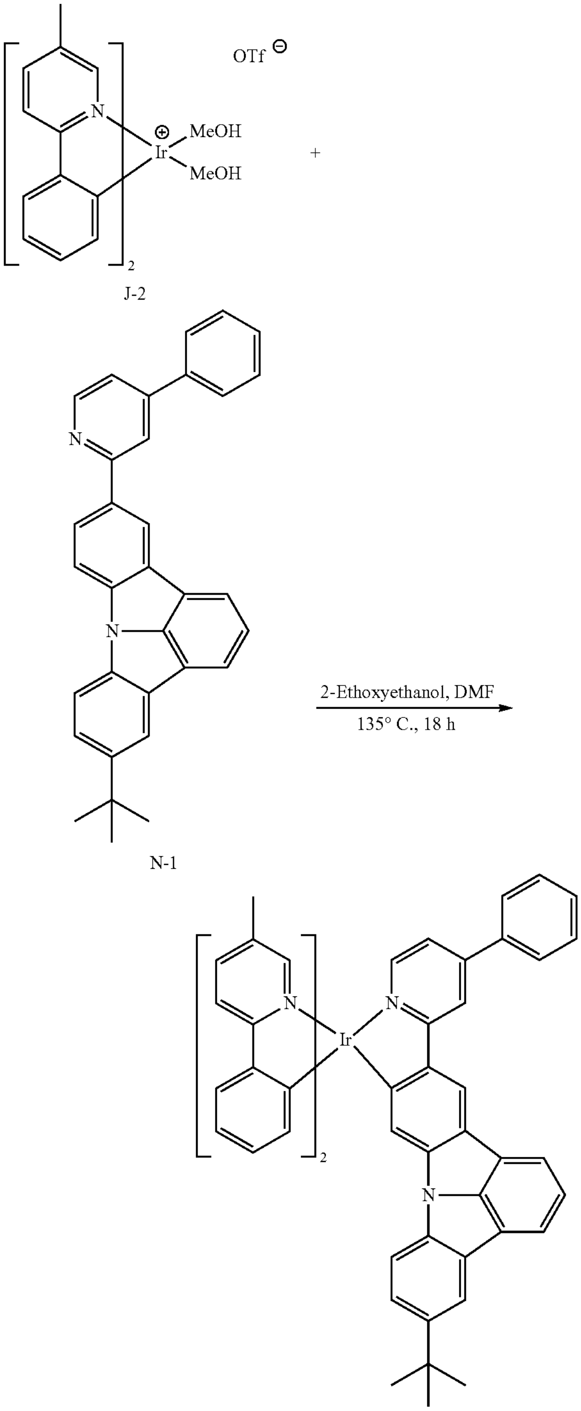

J-2

N-1

255

The Intermediate J-2 (2.23 g, 3.0 mmol), the Intermediate N-1 (1.58 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 255 (2.55 g, yield: 87%).

Synthesis Example 20: Synthesis of Compound 256

(1) Synthesis of Intermediate O-1

[Reaction Formula 20-1]

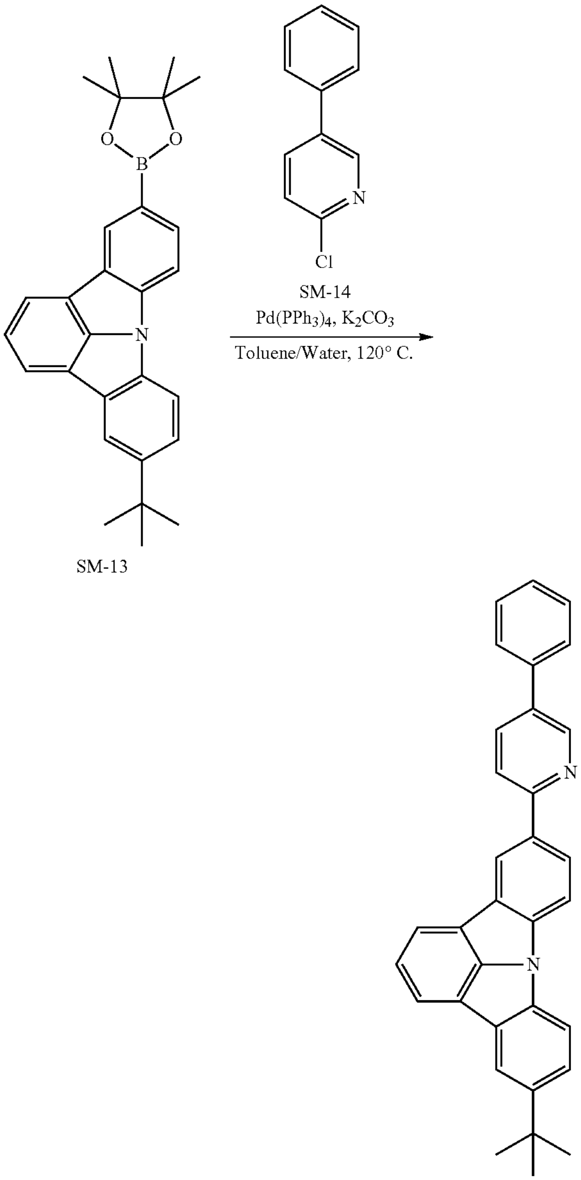

SM-13

O-1

Compound SM-13 (8.47 g, 20 mmol), Compound SM-14 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. After the reaction was completed, the solution was cooled to a room temperature, and an organic layer was extracted with dichloromethane and washed with excessive water. The moisture was removed with anhydrous magnesium sulfate, the dried organic layer was filtered, and the filtrate was concentrated under reduced pressure. Then the concentrate was purified with column chromatography to give the Intermediate O-1 (8.20 g, yield: 91%).

(2) Synthesis of Compound 256

[Reaction Formula 20-2]

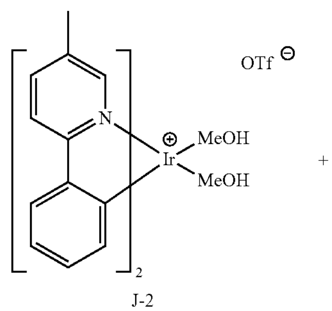

J-2

+

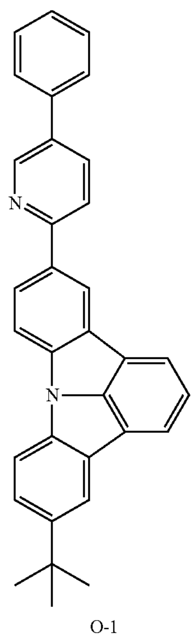

O-1

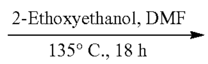

-continued

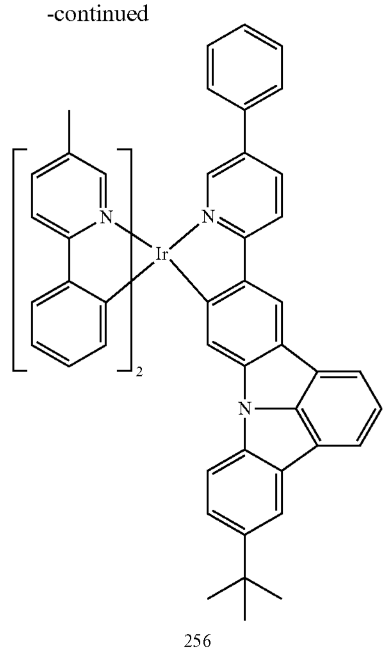

256

The Intermediate J-2 (2.23 g, 3.0 mmol), the Intermediate K-1 (1.38 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 256 (2.55 g, yield: 92%).

Synthesis Example 21: Synthesis of Compound 257

(1) Synthesis of Intermediate P-1

[Reaction Formula 21-1]

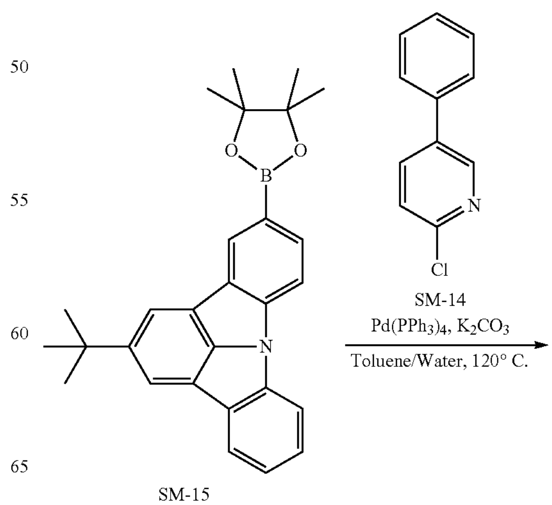

SM-15

-continued

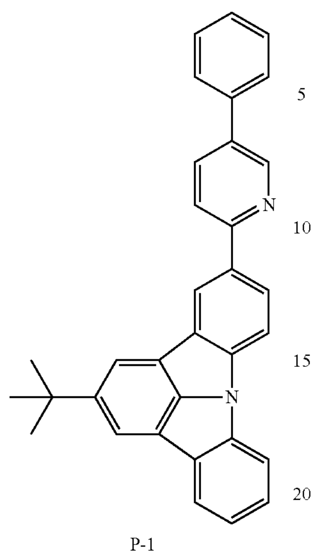

P-1

Compound SM-15 (9.47 g, 20 mmol), Compound SM-14 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were added to a 500 mL round bottom flask under nitrogen atmosphere. Then the solution was heated and refluxed with stirring for 12 hours. After the reaction was completed, the solution was cooled to a room temperature, and an organic layer was extracted with dichloromethane and washed with excessive water. The moisture was removed with anhydrous magnesium sulfate, the dried organic layer was filtered, and the filtrate was concentrated under reduced pressure. Then the concentrate was purified with column chromatography to give the Intermediate P-1 (7.84 g, yield: 87%).

(2) Synthesis of Compound 257

[Reaction Formula 21-2]

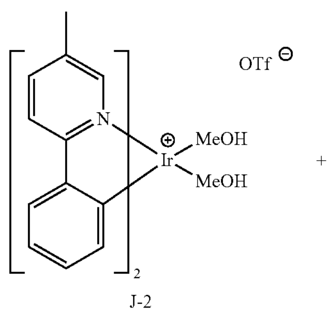

J-2

-continued

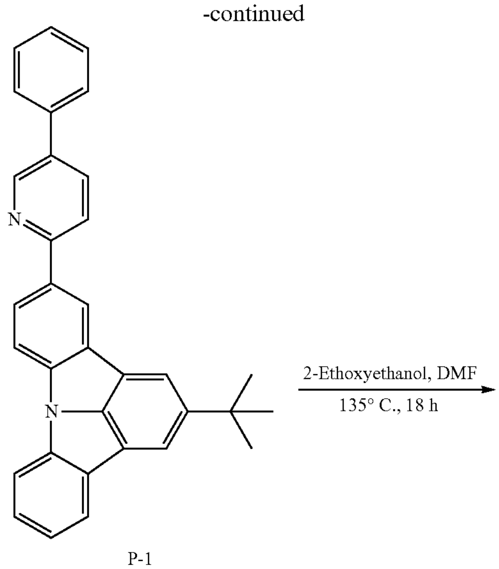

P-1

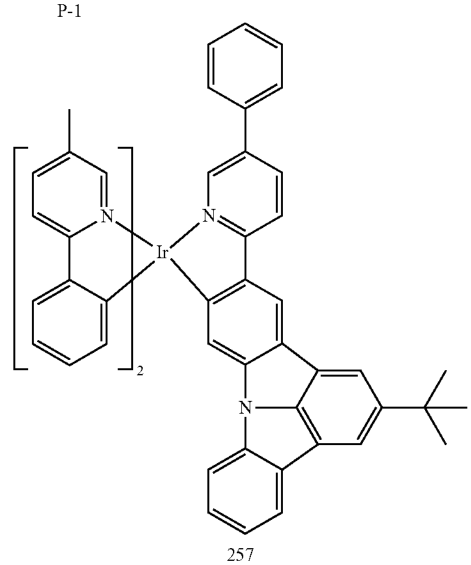

257

The Intermediate J-2 (2.23 g, 3.0 mmol), the Intermediate P-1 (1.58 g, 3.5 mmol) and a mixed solvent of 2-ethoxyethanol (40 mL) and DMF (40 mL) were added to a 150 mL round bottom flask under nitrogen atmosphere. Then the solution was stirred at 135° C. for 18 hours. After the reaction was completed, the solution was cooled to a room temperature, the organic layer was extracted with dichloromethane and washed with distilled water and moisture was removed with anhydrous magnesium sulfate. The filtrate was treated under reduced pressure to obtain a crude product. Then the crude product was purified with column chromatography (eluent: ethyleneacetate:hexane, 25:75 by volume ratio) to give the Compound 257 (2.67 g, yield: 91%).

Example 1 (Ex.1): Fabrication of OLED

An organic light emitting diode was fabricated by incorporating GHH1 of Formula 8 as a first host, GEH1 of Formula 10 as a second host and the Compound 251 in Synthesis Example 15 as a dopant into an emitting material layer (EML). A glass substrate onto which ITO (100 nm) was coated as a thin film was washed and ultrasonically cleaned by solvent such as isopropyl alcohol, acetone and dried at 100° C. oven. The substrate was transferred to a vacuum chamber for depositing an emissive layer. Subsequently, the emissive layer and a cathode were deposited by evaporation from a heating boat under about 5-7×$10^{-7}$ Torr with setting deposition rate of 1 Å/s in the following order:

A hole injection layer (HIL) (HI-1 below (NPNPB), 100 nm thickness); a hole transport layer (HTL) (HT-1 below, 350 nm thickness); an EML (Host (first host:second host=7:3 weight ratio, 90 wt %), Dopant (Compound 251, 10 wt %), 30 nm); an ETL (ET-1 below (ZADN), 350 nm thickness); EIL (Liq, 200 nm thickness); and a cathode (Al, 100 nm thickness).

Examples 2-12 (Ex. 2-12): Fabrication of OLED

An OLED was fabricated using the same procedure and the same material as Example 1, except that GEH2 (for Ex. 2), GEH3 (for Ex. 3), GEH4 (for Ex. 4), GEH5 (for Ex. 5), GEH6 (for Ex. 6), GEH7 (for Ex. 7), GEH8 (for Ex. 8), GEH9 (for Ex. 9), GEH10 (for Ex. 10), GEH11 (for Ex. 11) and GEH12 (for Ex. 12) of Formula 10 were used as the second host in the EML instead of GEH1.

Comparative Example 1 (Ref. 1): Fabrication of OLED

An OLED was fabricated using the same procedure and the same material as Example 1, except 4,4'-bis(N-carbazolyl)-1,1'-biphenyl (CBP, 90 wt %) as a sole host was used in the EML instead of GHH1 and GEH1.

The HIL material (HI-1), the HTL material (HT-1), CBP, the ETL material (ET-1) and the EIL material (Liq) are illustrated as follows:

HI-1

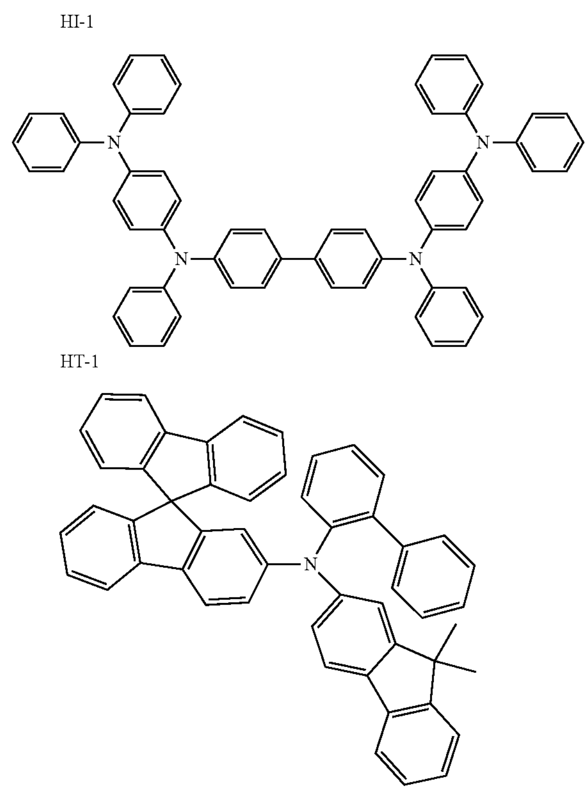

HT-1

-continued

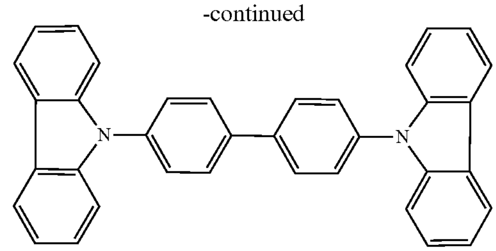

CBP

ET-1

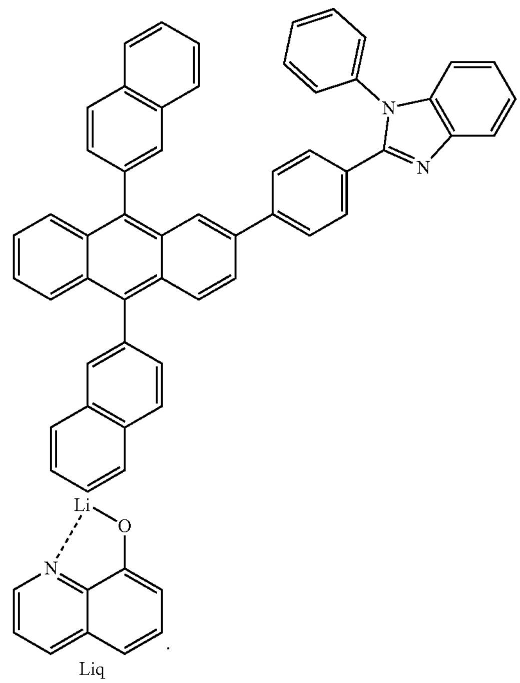

Liq

Experimental Example 1: Measurement of Luminous Properties of OLEDs

Each of the OLEDs, having a 9 $mm^2$ of emission area, fabricated in Examples 1 to 12 and Comparative Example 1 was connected to an external power source. Then luminous properties for all the OLEDs were evaluated using a constant current source (KEITHLEY) and a photometer PR650 at room temperature. In particular, driving voltage (V), External quantum efficiency (EQE, relative value) and time period ($LT_{95}$, relative value) at which the luminance was reduced to 95% from initial luminance was measured at a current density 10 mA/$cm^2$. The measurement results are indicated in the following Table 1.

TABLE 1

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 1 | 251 | GHH1 | GEH1 | 4.14 | 129 | 128 |
| Ex. 2 | 251 | GHH1 | GEH2 | 4.04 | 135 | 128 |
| Ex. 3 | 251 | GHH1 | GEH3 | 4.03 | 131 | 128 |
| Ex. 4 | 251 | GHH1 | GEH4 | 4.11 | 131 | 127 |

TABLE 1-continued

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ex. 5 | 251 | GHH1 | GEH5 | 4.03 | 133 | 124 |
| Ex. 6 | 251 | GHH1 | GEH6 | 4.18 | 130 | 126 |
| Ex. 7 | 251 | GHH1 | GEH7 | 4.16 | 128 | 122 |
| Ex. 8 | 251 | GHH1 | GEH8 | 4.04 | 131 | 129 |
| Ex. 9 | 251 | GHH1 | GEH9 | 4.03 | 126 | 123 |
| Ex. 10 | 251 | GHH1 | GEH10 | 4.11 | 130 | 128 |
| Ex. 11 | 251 | GHH1 | GEH11 | 4.06 | 129 | 122 |
| Ex. 12 | 251 | GHH1 | GEH12 | 4.07 | 127 | 125 |

As indicated in Table 1, in the OLEDs in which the EML included the host and the dopant of the present disclosure, the driving voltage was reduced and EQE and luminous lifespan ($LT_{95}$) were greatly improved.

Example 13 (Ex. 13): Fabrication of OLED

An OLED was fabricated using the same procedure and the same material as Example 1, except that GHH2 of Formula 8 was used as the first host in the EML instead of GHH1.

Examples 14-24 (Ex. 14-24): Fabrication of OLED

An OLED was fabricated using the same procedure and the same material as Example 13, except that GEH2 (for Ex. 14), GEH3 (for Ex. 15), GEH4 (for Ex. 16), GEH5 (for Ex. 17), GEH6 (for Ex. 18), GEH7 (for Ex. 19), GEH8 (for Ex. 20), GEH9 (for Ex. 21), GEH10 (for Ex. 22), GEH11 (for Ex. 23) and GEH12 (for Ex. 24) of Formula 10 were used as the second host in the EML instead of GEH1.

Experimental Example 2: Measurement of Luminous Properties OLED

Optical properties for each of the OLED fabricated in Examples 13 to 24 were measured using the same procedures as Experimental Example 1. The measurement results are indicated in the following Table 2.

TABLE 2

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 1 | 251 | CBP | | 4.30 | 100 | 100 |
| Ex. 13 | 251 | GHH2 | GEH1 | 4.16 | 125 | 122 |
| Ex. 14 | 251 | GHH2 | GEH2 | 4.21 | 130 | 128 |
| Ex. 15 | 251 | GHH2 | GEH3 | 4.22 | 121 | 123 |
| Ex. 16 | 251 | GHH2 | GEH4 | 4.14 | 126 | 126 |
| Ex. 17 | 251 | GHH2 | GEH5 | 4.21 | 123 | 124 |
| Ex. 18 | 251 | GHH2 | GEH6 | 4.23 | 121 | 119 |
| Ex. 19 | 251 | GHH2 | GEH7 | 4.16 | 126 | 118 |
| Ex. 20 | 251 | GHH2 | GEH8 | 4.23 | 128 | 124 |
| Ex. 21 | 251 | GHH2 | GEH9 | 4.27 | 120 | 116 |
| Ex. 22 | 251 | GHH2 | GEH10 | 4.17 | 123 | 120 |
| Ex. 23 | 251 | GHH2 | GEH11 | 4.22 | 122 | 118 |
| Ex. 24 | 251 | GHH2 | GEH12 | 4.24 | 120 | 123 |

As indicated in Table 2, in the OLEDs in which the EML included the host and the dopant of the present disclosure, the driving voltage was reduced and EQE and luminous lifespan ($LT_{95}$) were greatly improved.

Example 25 (Ex. 25): Fabrication of OLED

An OLED was fabricated using the same procedure and the same material as Example 1, except that GHH3 of Formula 8 was used as the first host in the EML instead of GHH1.

Examples 26-36 (Ex. 26-36): Fabrication of OLED

An OLED was fabricated using the same procedure and the same material as Example 25, except that GEH2 (for Ex. 26), GEH3 (for Ex. 27), GEH4 (for Ex. 28), GEH5 (for Ex. 29), GEH6 (for Ex. 30), GEH7 (for Ex. 31), GEH8 (for Ex. 32), GEH9 (for Ex. 33), GEH10 (for Ex. 34), GEH11 (for Ex. 35) and GEH12 (for Ex. 36) of Formula 10 were used as the second host in the EML instead of GEH1.

Experimental Example 3: Measurement of Luminous Properties OLED

Optical properties for each of the OLED fabricated in Examples 25 to 36 were measured using the same procedures as Experimental Example 1. The measurement results are indicated in the following Table 3.

TABLE 3

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 1 | 251 | CBP | | 4.30 | 100 | 100 |
| Ex. 25 | 251 | GHH3 | GEH1 | 4.26 | 124 | 121 |
| Ex. 26 | 251 | GHH3 | GEH2 | 4.15 | 132 | 121 |
| Ex. 27 | 251 | GHH3 | GEH3 | 4.23 | 122 | 121 |
| Ex. 28 | 251 | GHH3 | GEH4 | 4.16 | 126 | 122 |
| Ex. 29 | 251 | GHH3 | GEH5 | 4.08 | 126 | 121 |
| Ex. 30 | 251 | GHH3 | GEH6 | 4.27 | 125 | 118 |
| Ex. 31 | 251 | GHH3 | GEH7 | 4.27 | 127 | 119 |
| Ex. 32 | 251 | GHH3 | GEH8 | 4.24 | 127 | 123 |
| Ex. 33 | 251 | GHH3 | GEH9 | 4.25 | 121 | 119 |
| Ex. 34 | 251 | GHH3 | GEH10 | 4.23 | 122 | 119 |
| Ex. 35 | 251 | GHH3 | GEH11 | 4.12 | 120 | 119 |
| Ex. 36 | 251 | GHH3 | GEH12 | 4.16 | 121 | 118 |

As indicated in Table 3, in the OLEDs in which the EML included the host and the dopant of the present disclosure, the driving voltage was reduced and EQE and luminous lifespan ($LT_{95}$) were greatly improved.

Example 37 (Ex. 37): Fabrication of OLED

An OLED was fabricated using the same procedure and the same material as Example 1, except that GHH4 of Formula 8 was used as the first host in the EML instead of GHH1.

Examples 38-48 (Ex. 38-48): Fabrication of OLED

An OLED was fabricated using the same procedure and the same material as Example 37, except that GEH2 (for Ex. 38), GEH3 (for Ex. 39), GEH4 (for Ex. 40), GEH5 (for Ex. 41), GEH6 (for Ex. 42), GEH7 (for Ex. 43), GEH8 (for Ex. 44), GEH9 (for Ex. 45), GEH10 (for Ex. 46), GEH11 (for Ex. 47) and GEH12 (for Ex. 48) of Formula 10 were used as the second host in the EML instead of GEH1.

Experimental Example 4: Measurement of Luminous Properties OLED

Optical properties for each of the OLED fabricated in Examples 37 to 48 were measured using the same procedures as Experimental Example 1. The measurement results are indicated in the following Table 4.

TABLE 4

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 37 | 251 | GHH4 | GEH1 | 4.18 | 129 | 120 |
| Ex. 38 | 251 | GHH4 | GEH2 | 4.15 | 132 | 122 |
| Ex. 39 | 251 | GHH4 | GEH3 | 4.01 | 126 | 117 |
| Ex. 40 | 251 | GHH4 | GEH4 | 4.19 | 130 | 119 |
| Ex. 41 | 251 | GHH4 | GEH5 | 4.17 | 130 | 121 |
| Ex. 42 | 251 | GHH4 | GEH6 | 4.18 | 127 | 118 |
| Ex. 43 | 251 | GHH4 | GEH7 | 4.09 | 121 | 116 |
| Ex. 44 | 251 | GHH4 | GEH8 | 4.19 | 129 | 120 |
| Ex. 45 | 251 | GHH4 | GEH9 | 4.22 | 122 | 114 |
| Ex. 46 | 251 | GHH4 | GEH10 | 4.15 | 124 | 115 |
| Ex. 47 | 251 | GHH4 | GEH11 | 4.24 | 122 | 114 |
| Ex. 48 | 251 | GHH4 | GEH12 | 4.12 | 121 | 116 |

As indicated in Table 4, in the OLEDs in which the EML included the host and the dopant of the present disclosure, the driving voltage was reduced and EQE and luminous lifespan ($LT_{95}$) were greatly improved.

Example 49 (Ex. 49): Fabrication of OLED

An OLED was fabricated using the same procedure and the same material as Example 1, except that GHH5 of Formula 8 was used as the first host in the EML instead of GHH1.

Examples 50-60 (Ex. 50-60): Fabrication of OLED

An OLED was fabricated using the same procedure and the same material as Example 49, except that GEH2 (for Ex. 50), GEH3 (for Ex. 51), GEH4 (for Ex. 52), GEH5 (for Ex. 53), GEH6 (for Ex. 54), GEH7 (for Ex. 55), GEH8 (for Ex. 56), GEH9 (for Ex. 57), GEH10 (for Ex. 58), GEH11 (for Ex. 59) and GEH12 (for Ex. 60) of Formula 10 were used as the second host in the EML instead of GEH1.

Experimental Example 5: Measurement of Luminous Properties OLED

Optical properties for each of the OLED fabricated in Examples 49 to 60 were measured using the same procedures as Experimental Example 1. The measurement results are indicated in the following Table 5.

TABLE 5

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 49 | 251 | GHH5 | GEH1 | 4.16 | 126 | 126 |
| Ex. 50 | 251 | GHH5 | GEH2 | 4.26 | 128 | 128 |
| Ex. 51 | 251 | GHH5 | GEH3 | 4.18 | 127 | 126 |

TABLE 5-continued

Luminous Properties of OLED

| Sample | EML Dopant | EML Host | | Voltage (V) | EQE (%) | $LT_{95}$ (%) |
|---|---|---|---|---|---|---|
| Ex. 52 | 251 | GHH5 | GEH4 | 4.19 | 128 | 125 |
| Ex. 53 | 251 | GHH5 | GEH5 | 4.19 | 125 | 125 |
| Ex. 54 | 251 | GHH5 | GEH6 | 4.18 | 125 | 122 |
| Ex. 55 | 251 | GHH5 | GEH7 | 4.19 | 121 | 124 |
| Ex. 56 | 251 | GHH5 | GEH8 | 4.15 | 126 | 127 |
| Ex. 57 | 251 | GHH5 | GEH9 | 4.18 | 123 | 119 |
| Ex. 58 | 251 | GHH5 | GEH10 | 4.17 | 122 | 123 |
| Ex. 59 | 251 | GHH5 | GEH11 | 4.24 | 119 | 120 |
| Ex. 60 | 251 | GHH5 | GEH12 | 4.23 | 119 | 118 |

As indicated in Table 5, in the OLEDs in which the EML included the host and the dopant of the present disclosure, the driving voltage was reduced and EQE and luminous lifespan ($LT_{95}$) were greatly improved.

Example 61 (Ex. 61): Fabrication of OLED

An OLED was fabricated using the same procedure and the same material as Example 1, except that GHH6 of Formula 8 was used as the first host in the EML instead of GHH1.

Examples 62-72 (Ex. 62-72): Fabrication of OLED

An OLED was fabricated using the same procedure and the same material as Example 61, except that GEH2 (for Ex. 62), GEH3 (for Ex. 63), GEH4 (for Ex. 64), GEH5 (for Ex. 65), GEH6 (for Ex. 66), GEH7 (for Ex. 67), GEH8 (for Ex. 68), GEH9 (for Ex. 69), GEH10 (for Ex. 70), GEH11 (for Ex. 71) and GEH12 (for Ex. 72) of Formula 10 were used as the second host in the EML instead of GEH1.

Experimental Example 6: Measurement of Luminous Properties OLED

Optical properties for each of the OLED fabricated in Examples 61 to 72 were measured using the same procedures as Experimental Example 1. The measurement results are indicated in the following Table 6.

TABLE 6

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 61 | 251 | GHH6 | GEH1 | 4.19 | 124 | 126 |
| Ex. 62 | 251 | GHH6 | GEH2 | 4.30 | 129 | 133 |
| Ex. 63 | 251 | GHH6 | GEH3 | 4.23 | 122 | 122 |
| Ex. 64 | 251 | GHH6 | GEH4 | 4.21 | 124 | 124 |
| Ex. 65 | 251 | GHH6 | GEH5 | 4.19 | 125 | 124 |
| Ex. 66 | 251 | GHH6 | GEH6 | 4.19 | 119 | 122 |
| Ex. 67 | 251 | GHH6 | GEH7 | 4.27 | 119 | 122 |
| Ex. 68 | 251 | GHH6 | GEH8 | 4.24 | 122 | 121 |
| Ex. 69 | 251 | GHH6 | GEH9 | 4.26 | 116 | 117 |
| Ex. 70 | 251 | GHH6 | GEH10 | 4.27 | 122 | 124 |
| Ex. 71 | 251 | GHH6 | GEH11 | 4.11 | 119 | 117 |
| Ex. 72 | 251 | GHH6 | GEH12 | 4.27 | 119 | 120 |

As indicated in Table 6, in the OLEDs in which the EML included the host and the dopant of the present disclosure, the driving voltage was reduced and EQE and luminous lifespan ($LT_{95}$) were greatly improved.

Example 73 (Ex. 73): Fabrication of OLED

An OLED was fabricated using the same procedure and the same material as Example 1, except that GHH7 of Formula 8 was used as the first host in the EML instead of GHH1.

Examples 74-84 (Ex. 74-84): Fabrication of OLED

An OLED was fabricated using the same procedure and the same material as Example 73, except that GEH2 (for Ex. 74), GEH3 (for Ex. 75), GEH4 (for Ex. 76), GEH5 (for Ex. 77), GEH6 (for Ex. 78), GEH7 (for Ex. 79), GEH8 (for Ex. 80), GEH9 (for Ex. 81), GEH10 (for Ex. 82), GEH11 (for Ex. 83) and GEH12 (for Ex. 84) of Formula 10 were used as the second host in the EML instead of GEH1.

Experimental Example 7: Measurement of Luminous Properties OLED

Optical properties for each of the OLED fabricated in Examples 73 to 84 were measured using the same procedures as Experimental Example 1. The measurement results are indicated in the following Table 7.

TABLE 7

Luminous Properties of OLED

| Sample | EML | | | Voltage | EQE | $LT_{95}$ |
|---|---|---|---|---|---|---|
| | Dopant | Host | | (V) | (%) | (%) |
| Ref. 1 | 251 | CBP | | 4.30 | 100 | 100 |
| Ex. 73 | 251 | GHH7 | GEH1 | 4.21 | 120 | 114 |
| Ex. 74 | 251 | GHH7 | GEH2 | 4.19 | 124 | 116 |
| Ex. 75 | 251 | GHH7 | GEH3 | 4.15 | 118 | 115 |
| Ex. 76 | 251 | GHH7 | GEH4 | 4.21 | 123 | 118 |
| Ex. 77 | 251 | GHH7 | GEH5 | 4.20 | 120 | 115 |
| Ex. 78 | 251 | GHH7 | GEH6 | 4.04 | 117 | 116 |
| Ex. 79 | 251 | GHH7 | GEH7 | 4.19 | 116 | 111 |
| Ex. 80 | 251 | GHH7 | GEH8 | 4.15 | 119 | 116 |
| Ex. 81 | 251 | GHH7 | GEH9 | 4.23 | 118 | 110 |
| Ex. 82 | 251 | GHH7 | GEH10 | 4.14 | 117 | 113 |
| Ex. 83 | 251 | GHH7 | GEH11 | 4.19 | 118 | 112 |
| Ex. 84 | 251 | GHH7 | GEH12 | 4.23 | 111 | 110 |

As indicated in Table 7, in the OLEDs in which the EML included the host and the dopant of the present disclosure, the driving voltage was reduced and EQE and luminous lifespan ($LT_{95}$) were greatly improved.

Example 85 (Ex. 85): Fabrication of OLED

An OLED was fabricated using the same procedure and the same material as Example 1, except that GHH8 of Formula 8 was used as the first host in the EML instead of GHH1.

Examples 86-96 (Ex. 86-96): Fabrication of OLED

An OLED was fabricated using the same procedure and the same material as Example 85, except that GEH2 (for Ex. 86), GEH3 (for Ex. 87), GEH4 (for Ex. 88), GEH5 (for Ex. 89), GEH6 (for Ex. 90), GEH7 (for Ex. 91), GEH8 (for Ex. 92), GEH9 (for Ex. 93), GEH10 (for Ex. 94), GEH11 (for Ex. 95) and GEH12 (for Ex. 96) of Formula 10 were used as the second host in the EML instead of GEH1.

Experimental Example 8: Measurement of Luminous Properties OLED

Optical properties for each of the OLED fabricated in Examples 85 to 96 were measured using the same procedures as Experimental Example 1. The measurement results are indicated in the following Table 8.

TABLE 8

Luminous Properties of OLED

| Sample | EML | | | Voltage | EQE | $LT_{95}$ |
|---|---|---|---|---|---|---|
| | Dopant | Host | | (V) | (%) | (%) |
| Ref. 1 | 251 | CBP | | 4.30 | 100 | 100 |
| Ex. 85 | 251 | GHH8 | GEH1 | 4.19 | 125 | 124 |
| Ex. 86 | 251 | GHH8 | GEH2 | 4.16 | 126 | 125 |
| Ex. 87 | 251 | GHH8 | GEH3 | 4.14 | 124 | 122 |
| Ex. 88 | 251 | GHH8 | GEH4 | 4.08 | 126 | 121 |
| Ex. 89 | 251 | GHH8 | GEH5 | 4.25 | 121 | 123 |
| Ex. 90 | 251 | GHH8 | GEH6 | 4.15 | 118 | 123 |
| Ex. 91 | 251 | GHH8 | GEH7 | 4.19 | 120 | 125 |
| Ex. 92 | 251 | GHH8 | GEH8 | 4.14 | 127 | 120 |
| Ex. 93 | 251 | GHH8 | GEH9 | 4.20 | 122 | 117 |
| Ex. 94 | 251 | GHH8 | GEH10 | 4.04 | 119 | 119 |
| Ex. 95 | 251 | GHH8 | GEH11 | 4.10 | 120 | 118 |
| Ex. 96 | 251 | GHH8 | GEH12 | 4.10 | 119 | 118 |

As indicated in Table 8, in the OLEDs in which the EML included the host and the dopant of the present disclosure, the driving voltage was reduced and EQE and luminous lifespan ($LT_{95}$) were greatly improved.

Example 97 (Ex. 97): Fabrication of OLED

An OLED was fabricated using the same procedure and the same material as Example 1, except that GHH9 of Formula 8 was used as the first host in the EML instead of GHH1.

Examples 98-108 (Ex. 98-108): Fabrication of OLED

An OLED was fabricated using the same procedure and the same material as Example 97, except that GEH2 (for Ex. 98), GEH3 (for Ex. 99), GEH4 (for Ex. 100), GEH5 (for Ex. 101), GEH6 (for Ex. 102), GEH7 (for Ex. 103), GEH8 (for Ex. 104), GEH9 (for Ex. 105), GEH10 (for Ex. 106), GEH11 (for Ex. 107) and GEH12 (for Ex. 108) of Formula 10 were used as the second host in the EML instead of GEH1.

Experimental Example 9: Measurement of Luminous Properties OLED

Optical properties for each of the OLED fabricated in Examples 97 to 108 were measured using the same procedures as Experimental Example 1. The measurement results are indicated in the following Table 9.

TABLE 9

Luminous Properties of OLED

| Sample | EML | | | Voltage | EQE | $LT_{95}$ |
|---|---|---|---|---|---|---|
| | Dopant | Host | | (V) | (%) | (%) |
| Ref. 1 | 251 | CBP | | 4.30 | 100 | 100 |
| Ex 97 | 251 | GHH9 | GEH1 | 4.25 | 118 | 119 |

TABLE 9-continued

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ex 98 | 251 | GHH9 | GEH2 | 4.08 | 121 | 121 |
| Ex 99 | 251 | GHH9 | GEH3 | 4.12 | 119 | 118 |
| Ex. 100 | 251 | GHH9 | GEH4 | 4.12 | 117 | 121 |
| Ex. 101 | 251 | GHH9 | GEH5 | 4.11 | 118 | 117 |
| Ex. 102 | 251 | GHH9 | GEH6 | 4.14 | 115 | 122 |
| Ex. 103 | 251 | GHH9 | GEH7 | 4.16 | 116 | 113 |
| Ex. 104 | 251 | GHH9 | GEH8 | 4.11 | 118 | 117 |
| Ex. 105 | 251 | GHH9 | GEH9 | 4.29 | 111 | 115 |
| Ex. 106 | 251 | GHH9 | GEH10 | 4.22 | 115 | 119 |
| Ex. 107 | 251 | GHH9 | GEH11 | 4.05 | 113 | 118 |
| Ex. 108 | 251 | GHH9 | GEH12 | 4.17 | 112 | 113 |

As indicated in Table 9, in the OLEDs in which the EML included the host and the dopant of the present disclosure, the driving voltage was reduced and EQE and luminous lifespan ($LT_{95}$) were greatly improved.

Example 109 (Ex. 109): Fabrication of OLED

An OLED was fabricated using the same procedure and the same material as Example 1, except that GHH10 of Formula 8 was used as the first host in the EML instead of GHH1.

Examples 110-120 (Ex. 110-120): Fabrication of OLED

An OLED was fabricated using the same procedure and the same material as Example 109, except that GEH2 (for Ex. 110), GEH3 (for Ex. 111), GEH4 (for Ex. 112), GEH5 (for Ex. 113), GEH6 (for Ex. 114), GEH7 (for Ex. 115), GEH8 (for Ex. 116), GEH9 (for Ex. 117), GEH10 (for Ex. 118), GEH11 (for Ex. 119) and GEH12 (for Ex. 120) of Formula 10 were used as the second host in the EML instead of GEH1.

Experimental Example 10: Measurement of Luminous Properties OLED

Optical properties for each of the OLED fabricated in Examples 109 to 120 were measured using the same procedures as Experimental Example 1. The measurement results are indicated in the following Table 10.

TABLE 10

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 1 | 251 | CBP | | 4.30 | 100 | 100 |
| Ex. 109 | 251 | GHH10 | GEH1 | 4.17 | 123 | 118 |
| Ex. 110 | 251 | GHH10 | GEH2 | 4.18 | 124 | 119 |
| Ex. Ill | 251 | GHH10 | GEH3 | 4.21 | 119 | 115 |
| Ex. 112 | 251 | GHH10 | GEH4 | 4.26 | 124 | 115 |
| Ex. 113 | 251 | GHH10 | GEH5 | 4.10 | 122 | 118 |
| Ex. 114 | 251 | GHH10 | GEH6 | 4.29 | 117 | 117 |
| Ex. 115 | 251 | GHH10 | GEH7 | 4.24 | 116 | 115 |
| Ex. 116 | 251 | GHH10 | GEH8 | 4.09 | 122 | 114 |

TABLE 10-continued

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ex. 117 | 251 | GHH10 | GEH9 | 4.20 | 117 | 115 |
| Ex. 118 | 251 | GHH10 | GEH10 | 4.32 | 116 | 112 |
| Ex. 119 | 251 | GHH10 | GEH11 | 4.13 | 118 | 113 |
| Ex. 120 | 251 | GHH10 | GEH12 | 4.30 | 119 | 111 |

As indicated in Table 10, in the OLEDs in which the EML included the host and the dopant of the present disclosure, the driving voltage was reduced and EQE and luminous lifespan ($LT_{95}$) were greatly improved.

Example 121 (Ex. 121): Fabrication of OLED

An OLED was fabricated using the same procedure and the same material as Example 1, except that GHH11 of Formula 8 was used as the first host in the EML instead of GHH1.

Examples 122-132 (Ex. 122-132): Fabrication of OLED

An OLED was fabricated using the same procedure and the same material as Example 121, except that GEH2 (for Ex. 122), GEH3 (for Ex. 123), GEH4 (for Ex. 124), GEH5 (for Ex. 125), GEH6 (for Ex. 126), GEH7 (for Ex. 127), GEH8 (for Ex. 128), GEH9 (for Ex. 129), GEH10 (for Ex. 130), GEH11 (for Ex. 131) and GEH12 (for Ex. 132) of Formula 10 were used as the second host in the EML instead of GEH1.

Experimental Example 11: Measurement of Luminous Properties OLED

Optical properties for each of the OLED fabricated in Examples 121 to 132 were measured using the same procedures as Experimental Example 1. The measurement results are indicated in the following Table 11.

TABLE 11

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 1 | 251 | CBP | | 4.30 | 100 | 100 |
| Ex. 121 | 251 | GHH11 | GEH1 | 4.17 | 122 | 117 |
| Ex. 122 | 251 | GHH11 | GEH2 | 4.17 | 126 | 119 |
| Ex. 123 | 251 | GHH11 | GEH3 | 4.02 | 118 | 117 |
| Ex. 124 | 251 | GHH11 | GEH4 | 4.02 | 121 | 116 |
| Ex. 125 | 251 | GHH11 | GEH5 | 4.13 | 123 | 116 |
| Ex. 126 | 251 | GHH11 | GEH6 | 4.17 | 120 | 114 |
| Ex. 127 | 251 | GHH11 | GEH7 | 4.10 | 118 | 113 |
| Ex. 128 | 251 | GHH11 | GEH8 | 4.19 | 123 | 115 |
| Ex. 129 | 251 | GHH11 | GEH9 | 4.12 | 115 | 112 |
| Ex. 130 | 251 | GHH11 | GEH10 | 4.02 | 118 | 115 |
| Ex. 131 | 251 | GHH11 | GEH11 | 4.18 | 116 | 113 |
| Ex. 132 | 251 | GHH11 | GEH12 | 4.24 | 121 | 112 |

As indicated in Table 11, in the OLEDs in which the EML included the host and the dopant of the present disclosure, the driving voltage was reduced and EQE and luminous lifespan ($LT_{95}$) were greatly improved.

Example 133 (Ex. 133): Fabrication of OLED

An OLED was fabricated using the same procedure and the same material as Example 1, except that GHH12 of Formula 8 was used as the first host in the EML instead of GHH1.

Examples 134-144 (Ex. 134-144): Fabrication of OLED

An OLED was fabricated using the same procedure and the same material as Example 133, except that GEH2 (for Ex. 134), GEH3 (for Ex. 135), GEH4 (for Ex. 136), GEH5 (for Ex. 137), GEH6 (for Ex. 138), GEH7 (for Ex. 139), GEH8 (for Ex. 140), GEH9 (for Ex. 141), GEH10 (for Ex. 142), GEH11 (for Ex. 143) and GEH12 (for Ex. 144) of Formula 10 were used as the second host in the EML instead of GEH1.

Experimental Example 12: Measurement of Luminous Properties OLED

Optical properties for each of the OLED fabricated in Examples 133 to 144 were measured using the same procedures as Experimental Example 1. The measurement results are indicated in the following Table 12.

TABLE 12

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 133 | GDI | GHH12 | GEH1 | 4.33 | 125 | 123 |
| Ex. 134 | GDI | GHH12 | GEH2 | 4.19 | 127 | 124 |
| Ex. 135 | GDI | GHH12 | GEH3 | 4.12 | 122 | 120 |
| Ex. 136 | GDI | GHH12 | GEH4 | 4.17 | 124 | 120 |
| Ex. 137 | GDI | GHH12 | GEH5 | 4.08 | 127 | 123 |
| Ex. 138 | GDI | GHH12 | GEH6 | 4.14 | 119 | 122 |
| Ex. 139 | GDI | GHH12 | GEH7 | 4.21 | 119 | 117 |
| Ex. 140 | GDI | GHH12 | GEH8 | 4.20 | 122 | 120 |
| Ex. 141 | GDI | GHH12 | GEH9 | 4.24 | 118 | 114 |
| Ex. 142 | GDI | GHH12 | GEH10 | 4.28 | 122 | 119 |
| Ex. 143 | GDI | GHH12 | GEH11 | 4.12 | 119 | 120 |
| Ex. 144 | GDI | GHH12 | GEH12 | 4.30 | 121 | 117 |

As indicated in Table 12, in the OLEDs in which the EML included the host and the dopant of the present disclosure, the driving voltage was reduced and EQE and luminous lifespan ($LT_{95}$) were greatly improved.

Example 145 (Ex. 145): Fabrication of OLED

An OLED was fabricated using the same procedure and the same material as Example 1, except that Compound 252 synthesized in Synthesis Example 16 was used as the dopant in the EML instead of Compound 251.

Examples 146-150 (Ex. 146-150): Fabrication of OLED

An OLED was fabricated using the same procedure and the same material as Example 145, except that GEH2 (for Ex. 146), GEH3 (for Ex. 147), GEH4 (for Ex. 148), GEH5 (for Ex. 149) and GEH6 (for Ex. 150) of Formula 10 were used as the second host in the EML instead of GEH1.

Example 151 (Ex. 151): Fabrication of OLED

An OLED was fabricated using the same procedure and the same material as Example 145, except that GHH2 of Formula 8 was used as the first host in the EML instead of GHH1.

Examples 152-156 (Ex. 152-156): Fabrication of OLED

An OLED was fabricated using the same procedure and the same material as Example 151, except that GEH2 (for Ex. 152), GEH3 (for Ex. 153), GEH4 (for Ex. 154), GEH5 (for Ex. 155) and GEH6 (for Ex. 156) of Formula 10 were used as the second host in the EML instead of GEH1.

Comparative Example 2 (Ref. 2): Fabrication of OLED

An OLED was fabricated using the same procedure and the same material as Example 145, except CBP (90 wt %) as a sole host was used in the EML instead of GHH1 and GEH1.

Experimental Example 13: Measurement of Luminous Properties OLED

Optical properties for each of the OLED fabricated in Examples 145 to 156 and Comparative Example 2 were measured using the same procedures as Experimental Example 1. The measurement results are indicated in the following Table 13.

TABLE 13

Luminous Properties of OLED

| Sample | EML Dopant | EML Host | | Voltage (V) | EQE (%) | $LT_{95}$ (%) |
|---|---|---|---|---|---|---|
| Ref. 2 | 252 | CBP | | 4.36 | 100 | 100 |
| Ex. 145 | 252 | GHH1 | GEH1 | 4.03 | 134 | 123 |
| Ex. 146 | 252 | GHH1 | GEH2 | 4.11 | 138 | 129 |
| Ex. 147 | 252 | GHH1 | GEH3 | 4.13 | 131 | 126 |
| Ex. 148 | 252 | GHH1 | GEH4 | 4.20 | 134 | 125 |
| Ex. 149 | 252 | GHH1 | GEH5 | 4.03 | 132 | 124 |
| Ex. 150 | 252 | GHH1 | GEH6 | 4.35 | 126 | 126 |
| Ex. 151 | 252 | GHH2 | GEH1 | 4.29 | 123 | 124 |
| Ex. 152 | 252 | GHH2 | GEH2 | 4.36 | 130 | 130 |
| Ex. 153 | 252 | GHH2 | GEH3 | 4.23 | 125 | 125 |
| Ex. 154 | 252 | GHH2 | GEH4 | 4.28 | 127 | 125 |
| Ex. 155 | 252 | GHH2 | GEH5 | 4.23 | 126 | 125 |
| Ex. 156 | 252 | GHH2 | GEH6 | 4.22 | 123 | 123 |

As indicated in Table 13, in the OLEDs in which the EML included the host and the dopant of the present disclosure, the driving voltage was reduced and EQE and luminous lifespan ($LT_{95}$) were greatly improved.

Example 157 (Ex. 157): Fabrication of OLED

An OLED was fabricated using the same procedure and the same material as Example 145, except that GHH3 of Formula 8 was used as the first host in the EML instead of GHH1.

Examples 158-162 (Ex. 158-162): Fabrication of OLED

An OLED was fabricated using the same procedure and the same material as Example 157, except that GEH2 (for Ex. 158), GEH3 (for Ex. 159), GEH4 (for Ex. 160), GEH5 (for Ex. 161) and GEH6 (for Ex. 162) of Formula 10 were used as the second host in the EML instead of GEH1.

Example 163 (Ex. 163): Fabrication of OLED

An OLED was fabricated using the same procedure and the same material as Example 145, except that GHH4 of Formula 8 was used as the first host in the EML instead of GHH1.

Examples 164-168 (Ex. 164-168): Fabrication of OLED

An OLED was fabricated using the same procedure and the same material as Example 163, except that GEH2 (for Ex. 164), GEH3 (for Ex. 165), GEH4 (for Ex. 166), GEH5 (for Ex. 167) and GEH6 (for Ex. 168) of Formula 10 were used as the second host in the EML instead of GEH1.

Experimental Example 14: Measurement of Luminous Properties OLED

Optical properties for each of the OLED fabricated in Examples 157 to 168 were measured using the same procedures as Experimental Example 1. The measurement results are indicated in the following Table 14.

TABLE 14

Luminous Properties of OLED

| Sample | EML Dopant | EML Host | | Voltage (V) | EQE (%) | $LT_{95}$ (%) |
|---|---|---|---|---|---|---|
| Ref. 2 | 252 | CBP | | 4.36 | 100 | 100 |
| Ex. 157 | 252 | GHH3 | GEH1 | 4.36 | 128 | 123 |
| Ex. 158 | 252 | GHH3 | GEH2 | 4.26 | 130 | 127 |
| Ex. 159 | 252 | GHH3 | GEH3 | 4.27 | 125 | 118 |
| Ex. 160 | 252 | GHH3 | GEH4 | 4.27 | 130 | 120 |
| Ex. 161 | 252 | GHH3 | GEH5 | 4.30 | 121 | 119 |
| Ex. 162 | 252 | GHH3 | GEH6 | 4.32 | 123 | 120 |
| Ex. 163 | 252 | GHH4 | GEH1 | 4.09 | 132 | 122 |
| Ex. 164 | 252 | GHH4 | GEH2 | 4.03 | 131 | 122 |
| Ex. 165 | 252 | GHH4 | GEH3 | 4.20 | 126 | 120 |
| Ex. 166 | 252 | GHH4 | GEH4 | 4.19 | 130 | 116 |
| Ex. 167 | 252 | GHH4 | GEH5 | 4.19 | 125 | 116 |
| Ex. 168 | 252 | GHH4 | GEH6 | 4.20 | 126 | 115 |

As indicated in Table 14, in the OLEDs in which the EML included the host and the dopant of the present disclosure, the driving voltage was reduced and EQE and luminous lifespan ($LT_{95}$) were greatly improved.

Example 169 (Ex. 169): Fabrication of OLED

An OLED was fabricated using the same procedure and the same material as Example 145, except that GHH5 of Formula 8 was used as the first host in the EML instead of GHH1.

Examples 170-174 (Ex. 170-174): Fabrication of OLED

An OLED was fabricated using the same procedure and the same material as Example 169, except that GEH2 (for Ex. 170), GEH3 (for Ex. 171), GEH4 (for Ex. 172), GEH5 (for Ex. 173) and GEH6 (for Ex. 174) of Formula 10 were used as the second host in the EML instead of GEH1.

Example 175 (Ex. 175): Fabrication of OLED

An OLED was fabricated using the same procedure and the same material as Example 145, except that GHH6 of Formula 8 was used as the first host in the EML instead of GHH1.

Examples 176-180 (Ex. 176-180): Fabrication of OLED

An OLED was fabricated using the same procedure and the same material as Example 175, except that GEH2 (for Ex. 176), GEH3 (for Ex. 177), GEH4 (for Ex. 178), GEH5 (for Ex. 179) and GEH6 (for Ex. 180) of Formula 10 were used as the second host in the EML instead of GEH1.

Experimental Example 15: Measurement of Luminous Properties OLED

Optical properties for each of the OLED fabricated in Examples 169 to 180 were measured using the same procedures as Experimental Example 1. The measurement results are indicated in the following Table 15.

TABLE 15

Luminous Properties of OLED

| Sample | EML Dopant | EML Host | | Voltage (V) | EQE (%) | $LT_{95}$ (%) |
|---|---|---|---|---|---|---|
| Ref. 2 | 252 | CBP | | 4.36 | 100 | 100 |
| Ex. 169 | 252 | GHH5 | GEH1 | 4.29 | 124 | 127 |
| Ex. 170 | 252 | GHH5 | GEH2 | 4.28 | 128 | 128 |
| Ex. 171 | 252 | GHH5 | GEH3 | 4.22 | 122 | 129 |
| Ex. 172 | 252 | GHH5 | GEH4 | 4.25 | 125 | 126 |
| Ex. 173 | 252 | GHH5 | GEH5 | 4.22 | 125 | 125 |
| Ex. 174 | 252 | GHH5 | GEH6 | 4.20 | 118 | 126 |
| Ex. 175 | 252 | GHH6 | GEH1 | 4.39 | 124 | 123 |
| Ex. 176 | 252 | GHH6 | GEH2 | 4.19 | 128 | 125 |
| Ex. 177 | 252 | GHH6 | GEH3 | 4.30 | 126 | 123 |
| Ex. 178 | 252 | GHH6 | GEH4 | 4.30 | 127 | 125 |
| Ex. 179 | 252 | GHH6 | GEH5 | 4.30 | 124 | 125 |
| Ex. 180 | 252 | GHH6 | GEH6 | 4.25 | 122 | 123 |

As indicated in Table 15, in the OLEDs in which the EML included the host and the dopant of the present disclosure, the driving voltage was reduced and EQE and luminous lifespan ($LT_{95}$) were greatly improved.

Example 181 (Ex. 181): Fabrication of OLED

An OLED was fabricated using the same procedure and the same material as Example 1, except that Compound 253 synthesized in Synthesis Example 17 was used as the dopant in the EML instead of Compound 251.

Examples 182-186 (Ex. 182-186): Fabrication of OLED

An OLED was fabricated using the same procedure and the same material as Example 181, except that GEH2 (for Ex. 182), GEH3 (for Ex. 183), GEH4 (for Ex. 184), GEH5 (for Ex. 185) and GEH6 (for Ex. 186) of Formula 10 were used as the second host in the EML instead of GEH1.

Example 187 (Ex. 187): Fabrication of OLED

An OLED was fabricated using the same procedure and the same material as Example 181, except that GHH2 of Formula 8 was used as the first host in the EML instead of GHH1.

Examples 188-192 (Ex. 188-192): Fabrication of OLED

An OLED was fabricated using the same procedure and the same material as Example 187, except that GEH2 (for Ex. 188), GEH3 (for Ex. 189), GEH4 (for Ex. 190), GEH5 (for Ex. 191) and GEH6 (for Ex. 192) of Formula 10 were used as the second host in the EML instead of GEH1.

Comparative Example 3 (Ref. 3): Fabrication of OLED

An OLED was fabricated using the same procedure and the same material as Example 181, except CBP (90 wt %) as a sole host was used in the EML instead of GHH1 and GEH1.

Experimental Example 16: Measurement of Luminous Properties OLED

Optical properties for each of the OLED fabricated in Examples 181 to 192 and Comparative Example 3 were measured using the same procedures as Experimental Example 1. The measurement results are indicated in the following Table 16.

TABLE 16

Luminous Properties of OLED

| Sample | EML Dopant | EML Host | | Voltage (V) | EQE (%) | $LT_{95}$ (%) |
|---|---|---|---|---|---|---|
| Ref. 3 | 253 | CBP | | 4.34 | 100 | 100 |
| Ex. 181 | 253 | GHH1 | GEH1 | 4.24 | 135 | 126 |
| Ex. 182 | 253 | GHH1 | GEH2 | 4.13 | 134 | 131 |
| Ex. 183 | 253 | GHH1 | GEH3 | 4.14 | 131 | 128 |
| Ex. 184 | 253 | GHH1 | GEH4 | 4.14 | 131 | 124 |
| Ex. 185 | 253 | GHH1 | GEH5 | 4.04 | 130 | 126 |
| Ex. 186 | 253 | GHH1 | GEH6 | 4.13 | 127 | 126 |
| Ex. 187 | 253 | GHH2 | GEH1 | 4.27 | 129 | 125 |
| Ex. 188 | 253 | GHH2 | GEH2 | 4.18 | 130 | 127 |
| Ex. 189 | 253 | GHH2 | GEH3 | 4.26 | 124 | 124 |
| Ex. 190 | 253 | GHH2 | GEH4 | 4.19 | 125 | 123 |
| Ex. 191 | 253 | GHH2 | GEH5 | 4.27 | 123 | 121 |
| Ex. 192 | 253 | GHH2 | GEH6 | 4.27 | 126 | 125 |

As indicated in Table 16, in the OLEDs in which the EML included the host and the dopant of the present disclosure, the driving voltage was reduced and EQE and luminous lifespan ($LT_{95}$) were greatly improved.

Example 193 (Ex. 193): Fabrication of OLED

An OLED was fabricated using the same procedure and the same material as Example 181, except that GHH3 of Formula 8 was used as the first host in the EML instead of GHH1.

Examples 194-198 (Ex. 194-198): Fabrication of OLED

An OLED was fabricated using the same procedure and the same material as Example 193, except that GEH2 (for Ex. 194), GEH3 (for Ex. 195), GEH4 (for Ex. 196), GEH5 (for Ex. 197) and GEH6 (for Ex. 198) of Formula 10 were used as the second host in the EML instead of GEH1.

Example 199 (Ex. 199): Fabrication of OLED

An OLED was fabricated using the same procedure and the same material as Example 181, except that GHH4 of Formula 8 was used as the first host in the EML instead of GHH1.

Examples 200-204 (Ex. 200-204): Fabrication of OLED

An OLED was fabricated using the same procedure and the same material as Example 199, except that GEH2 (for Ex. 200), GEH3 (for Ex. 201), GEH4 (for Ex. 202), GEH5 (for Ex. 203) and GEH6 (for Ex. 204) of Formula 10 were used as the second host in the EML instead of GEH1.

Experimental Example 17: Measurement of Luminous Properties OLED

Optical properties for each of the OLED fabricated in Examples 193 to 204 were measured using the same procedures as Experimental Example 1. The measurement results are indicated in the following Table 17.

TABLE 17

Luminous Properties of OLED

| Sample | EML Dopant | EML Host | | Voltage (V) | EQE (%) | $LT_{95}$ (%) |
|---|---|---|---|---|---|---|
| Ref. 3 | 253 | CBP | | 4.34 | 100 | 100 |
| Ex. 193 | 253 | GHH3 | GEH1 | 4.17 | 129 | 124 |
| Ex. 194 | 253 | GHH3 | GEH2 | 4.26 | 134 | 126 |
| Ex. 195 | 253 | GHH3 | GEH3 | 4.14 | 126 | 121 |
| Ex. 196 | 253 | GHH3 | GEH4 | 4.33 | 128 | 121 |
| Ex. 197 | 253 | GHH3 | GEH5 | 4.22 | 124 | 122 |
| Ex. 198 | 253 | GHH3 | GEH6 | 4.08 | 126 | 121 |
| Ex. 199 | 253 | GHH4 | GEH1 | 4.16 | 128 | 120 |
| Ex. 200 | 253 | GHH4 | GEH2 | 4.04 | 132 | 124 |
| Ex. 201 | 253 | GHH4 | GEH3 | 4.10 | 127 | 118 |
| Ex. 202 | 253 | GHH4 | GEH4 | 4.10 | 130 | 121 |
| Ex. 203 | 253 | GHH4 | GEH5 | 4.22 | 129 | 121 |
| Ex. 204 | 253 | GHH4 | GEH6 | 4.13 | 126 | 119 |

As indicated in Table 17, in the OLEDs in which the EML included the host and the dopant of the present disclosure, the driving voltage was reduced and EQE and luminous lifespan ($LT_{95}$) were greatly improved.

Example 205 (Ex. 205): Fabrication of OLED

An OLED was fabricated using the same procedure and the same material as Example 181, except that GHH5 of Formula 8 was used as the first host in the EML instead of GHH1.

Examples 206-210 (Ex. 206-210): Fabrication of OLED

An OLED was fabricated using the same procedure and the same material as Example 205, except that GEH2 (for Ex. 206), GEH3 (for Ex. 207), GEH4 (for Ex. 208), GEH5 (for Ex. 209) and GEH6 (for Ex. 210) of Formula 10 were used as the second host in the EML instead of GEH1.

Example 211 (Ex. 211): Fabrication of OLED

An OLED was fabricated using the same procedure and the same material as Example 181, except that GHH6 of Formula 8 was used as the first host in the EML instead of GHH1.

Examples 212-216 (Ex. 212-216): Fabrication of OLED

An OLED was fabricated using the same procedure and the same material as Example 211, except that GEH2 (for Ex. 212), GEH3 (for Ex. 213), GEH4 (for Ex. 214), GEH5 (for Ex. 215) and GEH6 (for Ex. 216) of Formula 10 were used as the second host in the EML instead of GEH1.

Experimental Example 18: Measurement of Luminous Properties OLED

Optical properties for each of the OLED fabricated in Examples 205 to 216 were measured using the same procedures as Experimental Example 1. The measurement results are indicated in the following Table 18.

TABLE 18

Luminous Properties of OLED

| Sample | EML Dopant | EML Host | | Voltage (V) | EQE (%) | $LT_{95}$ (%) |
|---|---|---|---|---|---|---|
| Ref. 3 | 253 | CBP | | 4.34 | 100 | 100 |
| Ex. 205 | 253 | GHH5 | GEH1 | 4.25 | 126 | 128 |
| Ex. 206 | 253 | GHH5 | GEH2 | 4.22 | 131 | 131 |
| Ex. 207 | 253 | GHH5 | GEH3 | 4.27 | 124 | 126 |
| Ex. 208 | 253 | GHH5 | GEH4 | 4.22 | 124 | 124 |
| Ex. 209 | 253 | GHH5 | GEH5 | 4.20 | 122 | 123 |
| Ex. 210 | 253 | GHH5 | GEH6 | 4.26 | 124 | 126 |
| Ex. 211 | 253 | GHH6 | GEH1 | 4.33 | 123 | 126 |
| Ex. 212 | 253 | GHH6 | GEH2 | 4.29 | 132 | 129 |
| Ex. 213 | 253 | GHH6 | GEH3 | 4.33 | 120 | 126 |
| Ex. 214 | 253 | GHH6 | GEH4 | 4.18 | 122 | 124 |
| Ex. 215 | 253 | GHH6 | GEH5 | 4.35 | 127 | 122 |
| Ex. 216 | 253 | GHH6 | GEH6 | 4.25 | 119 | 121 |

As indicated in Table 18, in the OLEDs in which the EML included the host and the dopant of the present disclosure, the driving voltage was reduced and EQE and luminous lifespan ($LT_{95}$) were greatly improved.

Example 217 (Ex. 217): Fabrication of OLED

An OLED was fabricated using the same procedure and the same material as Example 1, except that Compound 254 synthesized in Synthesis Example 18 as the dopant was used in the EML instead of Compound 251.

Examples 218-222 (Ex. 218-222): Fabrication of OLED

An OLED was fabricated using the same procedure and the same material as Example 217, except that GEH2 (for Ex. 218), GEH3 (for Ex. 219), GEH4 (for Ex. 220), GEH5 (for Ex. 221) and GEH6 (for Ex. 222) of Formula 10 were used as the second host in the EML instead of GEH1.

Example 223 (Ex. 223): Fabrication of OLED

An OLED was fabricated using the same procedure and the same material as Example 217, except that GHH2 of Formula 8 was used as the first host in the EML instead of GHH1.

Examples 224-228 (Ex. 224-228): Fabrication of OLED

An OLED was fabricated using the same procedure and the same material as Example 223, except that GEH2 (for Ex. 224), GEH3 (for Ex. 225), GEH4 (for Ex. 226), GEH5 (for Ex. 227) and GEH6 (for Ex. 228) of Formula 10 were used as the second host in the EML instead of GEH1.

Comparative Example 4 (Ref. 4): Fabrication of OLED

An OLED was fabricated using the same procedure and the same material as Example 217, except CBP (90 wt %) as a sole host was used in the EML instead of GHH1 and GEH1.

Experimental Example 19: Measurement of Luminous Properties OLED

Optical properties for each of the OLED fabricated in Examples 217 to 228 and Comparative Example 4 were measured using the same procedures as Experimental Example 1. The measurement results are indicated in the following Table 19.

TABLE 19

Luminous Properties of OLED

| Sample | EML Dopant | EML Host | | Voltage (V) | EQE (%) | $LT_{95}$ (%) |
|---|---|---|---|---|---|---|
| Ref. 4 | 254 | CBP | | 4.32 | 100 | 100 |
| Ex. 217 | 254 | GHH1 | GEH1 | 4.13 | 132 | 126 |
| Ex. 218 | 254 | GHH1 | GEH2 | 4.09 | 135 | 129 |
| Ex. 219 | 254 | GHH1 | GEH3 | 4.13 | 133 | 125 |
| Ex. 220 | 254 | GHH1 | GEH4 | 4.15 | 130 | 123 |
| Ex. 221 | 254 | GHH1 | GEH5 | 4.22 | 128 | 128 |
| Ex. 222 | 254 | GHH1 | GEH6 | 4.13 | 125 | 127 |
| Ex. 223 | 254 | GHH2 | GEH1 | 4.28 | 127 | 125 |
| Ex. 224 | 254 | GHH2 | GEH2 | 4.17 | 128 | 127 |
| Ex. 225 | 254 | GHH2 | GEH3 | 4.22 | 120 | 124 |
| Ex. 226 | 254 | GHH2 | GEH4 | 4.30 | 126 | 123 |
| Ex. 227 | 254 | GHH2 | GEH5 | 4.35 | 128 | 122 |
| Ex. 228 | 254 | GHH2 | GEH6 | 4.16 | 119 | 126 |

As indicated in Table 19, in the OLEDs in which the EML included the host and the dopant of the present disclosure, the driving voltage was reduced and EQE and luminous lifespan ($LT_{95}$) were greatly improved.

Example 229 (Ex. 229): Fabrication of OLED

An OLED was fabricated using the same procedure and the same material as Example 217, except that GHH3 of Formula 8 was used as the first host in the EML instead of GHH1.

Examples 230-234 (Ex. 230-234): Fabrication of OLED

An OLED was fabricated using the same procedure and the same material as Example 229, except that GEH2 (for Ex. 230), GEH3 (for Ex. 231), GEH4 (for Ex. 232), GEH5 (for Ex. 233) and GEH6 (for Ex. 234) of Formula 10 were used as the second host in the EML instead of GEH1.

Example 235 (Ex. 235): Fabrication of OLED

An OLED was fabricated using the same procedure and the same material as Example 217, except that GHH4 of Formula 8 was used as the first host in the EML instead of GHH1.

Examples 236-240 (Ex. 236-240): Fabrication of OLED

An OLED was fabricated using the same procedure and the same material as Example 235, except that GEH2 (for Ex. 236), GEH3 (for Ex. 237), GEH4 (for Ex. 238), GEH5 (for Ex. 239) and GEH6 (for Ex. 240) of Formula 10 were used as the second host in the EML instead of GEH1.

Experimental Example 20: Measurement of Luminous Properties OLED

Optical properties for each of the OLED fabricated in Examples 229 to 240 were measured using the same procedures as Experimental Example 1. The measurement results are indicated in the following Table 20.

TABLE 20

Luminous Properties of OLED

| Sample | EML Dopant | EML Host | | Voltage (V) | EQE (%) | $LT_{95}$ (%) |
|---|---|---|---|---|---|---|
| Ref. 4 | 254 | CBP | | 4.32 | 100 | 100 |
| Ex. 229 | 254 | GHH3 | GEH1 | 4.16 | 124 | 124 |
| Ex. 230 | 254 | GHH3 | GEH2 | 4.29 | 130 | 127 |
| Ex. 231 | 254 | GHH3 | GEH3 | 4.21 | 126 | 124 |
| Ex. 232 | 254 | GHH3 | GEH4 | 4.27 | 127 | 122 |
| Ex. 233 | 254 | GHH3 | GEH5 | 4.16 | 126 | 123 |
| Ex. 234 | 254 | GHH3 | GEH6 | 4.21 | 124 | 121 |
| Ex. 235 | 254 | GHH4 | GEH1 | 4.11 | 123 | 122 |
| Ex. 236 | 254 | GHH4 | GEH2 | 4.06 | 129 | 123 |
| Ex. 237 | 254 | GHH4 | GEH3 | 4.14 | 126 | 115 |
| Ex. 238 | 254 | GHH4 | GEH4 | 4.19 | 128 | 122 |
| Ex. 239 | 254 | GHH4 | GEH5 | 4.19 | 127 | 117 |
| Ex. 240 | 254 | GHH4 | GEH6 | 4.15 | 127 | 115 |

As indicated in Table 20, in the OLEDs in which the EML included the host and the dopant of the present disclosure, the driving voltage was reduced and EQE and luminous lifespan ($LT_{95}$) were greatly improved.

Example 241 (Ex. 241): Fabrication of OLED

An OLED was fabricated using the same procedure and the same material as Example 217, except that GHH5 of Formula 8 was used as the first host in the EML instead of GHH1.

Examples 242-246 (Ex. 242-246): Fabrication of OLED

An OLED was fabricated using the same procedure and the same material as Example 241, except that GEH2 (for Ex. 242), GEH3 (for Ex. 243), GEH4 (for Ex. 244), GEH5 (for Ex. 245) and GEH6 (for Ex. 246) of Formula 10 were used as the second host in the EML instead of GEH1.

Example 247 (Ex. 247): Fabrication of OLED

An OLED was fabricated using the same procedure and the same material as Example 217, except that GHH6 of Formula 8 was used as the first host in the EML instead of GHH1.

Examples 248-252 (Ex. 248-252): Fabrication of OLED

An OLED was fabricated using the same procedure and the same material as Example 247, except that GEH2 (for Ex. 248), GEH3 (for Ex. 249), GEH4 (for Ex. 250), GEH5 (for Ex. 251) and GEH6 (for Ex. 252) of Formula 10 were used as the second host in the EML instead of GEH1.

Experimental Example 21: Measurement of Luminous Properties OLED

Optical properties for each of the OLED fabricated in Examples 241 to 252 were measured using the same procedures as Experimental Example 1. The measurement results are indicated in the following Table 21.

TABLE 21

Luminous Properties of OLED

| Sample | EML Dopant | EML Host | | Voltage (V) | EQE (%) | $LT_{95}$ (%) |
|---|---|---|---|---|---|---|
| Ref. 4 | 254 | CBP | | 4.32 | 100 | 100 |
| Ex. 241 | 254 | GHH5 | GEH1 | 4.19 | 122 | 125 |
| Ex. 242 | 254 | GHH5 | GEH2 | 4.18 | 126 | 132 |
| Ex. 243 | 254 | GHH5 | GEH3 | 4.24 | 121 | 128 |
| Ex. 244 | 254 | GHH5 | GEH4 | 4.21 | 121 | 128 |
| Ex. 245 | 254 | GHH5 | GEH5 | 4.33 | 125 | 127 |
| Ex. 246 | 254 | GHH5 | GEH6 | 4.25 | 123 | 123 |
| Ex. 247 | 254 | GHH6 | GEH1 | 4.19 | 125 | 128 |
| Ex. 248 | 254 | GHH6 | GEH2 | 4.25 | 130 | 128 |
| Ex. 249 | 254 | GHH6 | GEH3 | 4.24 | 126 | 123 |
| Ex. 250 | 254 | GHH6 | GEH4 | 4.21 | 122 | 125 |
| Ex. 251 | 254 | GHH6 | GEH5 | 4.11 | 124 | 125 |
| Ex. 252 | 254 | GHH6 | GEH6 | 4.19 | 120 | 124 |

As indicated in Table 21, in the OLEDs in which the EML included the host and the dopant of the present disclosure, the driving voltage was reduced and EQE and luminous lifespan ($LT_{95}$) were greatly improved.

Example 253 (Ex. 253): Fabrication of OLED

An OLED was fabricated using the same procedure and the same material as Example 1, except that Compound 255 synthesized in Synthesis Example 19 as the dopant was used in the EML instead of Compound 251.

Examples 254-258 (Ex. 254-258): Fabrication of OLED

An OLED was fabricated using the same procedure and the same material as Example 253, except that GEH2 (for Ex. 254), GEH3 (for Ex. 255), GEH4 (for Ex. 256), GEH5 (for Ex. 257) and GEH6 (for Ex. 258) of Formula 10 were used as the second host in the EML instead of GEH1.

Example 259 (Ex. 259): Fabrication of OLED

An OLED was fabricated using the same procedure and the same material as Example 253, except that GHH2 of Formula 8 was used as the first host in the EML instead of GHH1.

Examples 260-264 (Ex. 260-264): Fabrication of OLED

An OLED was fabricated using the same procedure and the same material as Example 259, except that GEH2 (for Ex. 260), GEH3 (for Ex. 261), GEH4 (for Ex. 262), GEH5 (for Ex. 263) and GEH6 (for Ex. 264) of Formula 10 were used as the second host in the EML instead of GEH1.

Comparative Example 5 (Ref. 5): Fabrication of OLED

An OLED was fabricated using the same procedure and the same material as Example 253, except CBP (90 wt %) as a sole host was used in the EML instead of GHH1 and GEH1.

Experimental Example 22: Measurement of Luminous Properties OLED

Optical properties for each of the OLED fabricated in Examples 253 to 264 and Comparative Example 5 were measured using the same procedures as Experimental Example 1. The measurement results are indicated in the following Table 22.

TABLE 22

Luminous Properties of OLED

| Sample | EML Dopant | EML Host | | Voltage (V) | EQE (%) | $LT_{95}$ (%) |
|---|---|---|---|---|---|---|
| Ref. 5 | 255 | CBP | | 4.36 | 100 | 100 |
| Ex. 253 | 255 | GHH1 | GEH1 | 4.25 | 134 | 124 |
| Ex. 254 | 255 | GHH1 | GEH2 | 4.29 | 134 | 126 |
| Ex. 255 | 255 | GHH1 | GEH3 | 4.13 | 130 | 125 |
| Ex. 256 | 255 | GHH1 | GEH4 | 4.22 | 131 | 130 |
| Ex. 257 | 255 | GHH1 | GEH5 | 4.15 | 128 | 125 |
| Ex. 258 | 255 | GHH1 | GEH6 | 4.12 | 126 | 128 |
| Ex. 259 | 255 | GHH2 | GEH1 | 4.29 | 127 | 125 |
| Ex. 260 | 255 | GHH2 | GEH2 | 4.22 | 127 | 129 |
| Ex. 261 | 255 | GHH2 | GEH3 | 4.35 | 127 | 126 |
| Ex. 262 | 255 | GHH2 | GEH4 | 4.33 | 128 | 123 |
| Ex. 263 | 255 | GHH2 | GEH5 | 4.30 | 126 | 120 |
| Ex. 264 | 255 | GHH2 | GEH6 | 4.38 | 122 | 121 |

As indicated in Table 22, in the OLEDs in which the EML included the host and the dopant of the present disclosure, the driving voltage was reduced and EQE and luminous lifespan ($LT_{95}$) were greatly improved.

Example 265 (Ex. 265): Fabrication of OLED

An OLED was fabricated using the same procedure and the same material as Example 253, except that GHH3 of Formula 8 was used as the first host in the EML instead of GHH1.

Examples 266-270 (Ex. 266-270): Fabrication of OLED

An OLED was fabricated using the same procedure and the same material as Example 265, except that GEH2 (for Ex. 266), GEH3 (for Ex. 267), GEH4 (for Ex. 268), GEH5 (for Ex. 269) and GEH6 (for Ex. 270) of Formula 10 were used as the second host in the EML instead of GEH1.

Example 271 (Ex. 271): Fabrication of OLED

An OLED was fabricated using the same procedure and the same material as Example 253, except that GHH4 of Formula 8 was used as the first host in the EML instead of GHH1.

Examples 272-276 (Ex. 272-276): Fabrication of OLED

An OLED was fabricated using the same procedure and the same material as Example 271, except that GEH2 (for Ex. 272), GEH3 (for Ex. 273), GEH4 (for Ex. 274), GEH5 (for Ex. 275) and GEH6 (for Ex. 276) of Formula 10 were used as the second host in the EML instead of GEH1.

Experimental Example 23: Measurement of Luminous Properties OLED

Optical properties for each of the OLED fabricated in Examples 265 to 275 were measured using the same procedures as Experimental Example 1. The measurement results are indicated in the following Table 23.

TABLE 23

Luminous Properties of OLED

| Sample | EML Dopant | EML Host | | Voltage (V) | EQE (%) | $LT_{95}$ (%) |
|---|---|---|---|---|---|---|
| Ref. 5 | 255 | CBP | | 4.36 | 100 | 100 |
| Ex. 265 | 255 | GHH3 | GEH1 | 4.18 | 127 | 123 |
| Ex. 266 | 255 | GHH3 | GEH2 | 4.31 | 130 | 127 |
| Ex. 267 | 255 | GHH3 | GEH3 | 4.36 | 127 | 125 |
| Ex. 268 | 255 | GHH3 | GEH4 | 4.26 | 129 | 123 |
| Ex. 269 | 255 | GHH3 | GEH5 | 4.17 | 127 | 122 |
| Ex. 270 | 255 | GHH3 | GEH6 | 4.32 | 127 | 120 |
| Ex. 271 | 255 | GHH4 | GEH1 | 4.33 | 130 | 118 |
| Ex. 272 | 255 | GHH4 | GEH2 | 4.07 | 129 | 125 |
| Ex. 273 | 255 | GHH4 | GEH3 | 4.23 | 130 | 118 |
| Ex. 274 | 255 | GHH4 | GEH4 | 4.17 | 129 | 119 |
| Ex. 275 | 255 | GHH4 | GEH5 | 4.24 | 131 | 115 |
| Ex. 276 | 255 | GHH4 | GEH6 | 4.15 | 124 | 119 |

As indicated in Table 23, in the OLEDs in which the EML included the host and the dopant of the present disclosure, the driving voltage was reduced and EQE and luminous lifespan ($LT_{95}$) were greatly improved.

Example 277 (Ex. 277): Fabrication of OLED

An OLED was fabricated using the same procedure and the same material as Example 253, except that GHH5 of Formula 8 was used as the first host in the EML instead of GHH1.

Examples 278-282 (Ex. 278-282): Fabrication of OLED

An OLED was fabricated using the same procedure and the same material as Example 277, except that GEH2 (for Ex. 278), GEH3 (for Ex. 279), GEH4 (for Ex. 280), GEH5 (for Ex. 281) and GEH6 (for Ex. 282) of Formula 10 were used as the second host in the EML instead of GEH1.

Example 283 (Ex. 283): Fabrication of OLED

An OLED was fabricated using the same procedure and the same material as Example 253, except that GHH6 of Formula 8 was used as the first host in the EML instead of GHH1.

Examples 284-288 (Ex. 284-288): Fabrication of OLED

An OLED was fabricated using the same procedure and the same material as Example 283, except that GEH2 (for Ex. 284), GEH3 (for Ex. 285), GEH4 (for Ex. 286), GEH5 (for Ex. 287) and GEH6 (for Ex. 288) of Formula 10 were used as the second host in the EML instead of GEH1.

Experimental Example 24: Measurement of Luminous Properties OLED

Optical properties for each of the OLED fabricated in Examples 277 to 288 were measured using the same procedures as Experimental Example 1. The measurement results are indicated in the following Table 24.

TABLE 24

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 5 | 255 | CBP | | 4.36 | 100 | 100 |
| Ex. 277 | 255 | GHH5 | GEH1 | 4.30 | 123 | 127 |
| Ex. 278 | 255 | GHH5 | GEH2 | 4.20 | 129 | 129 |
| Ex. 279 | 255 | GHH5 | GEH3 | 4.15 | 123 | 127 |
| Ex. 280 | 255 | GHH5 | GEH4 | 4.37 | 126 | 127 |
| Ex. 281 | 255 | GHH5 | GEH5 | 4.20 | 126 | 128 |
| Ex. 282 | 255 | GHH5 | GEH6 | 4.36 | 124 | 121 |
| Ex. 283 | 255 | GHH6 | GEH1 | 4.27 | 125 | 122 |
| Ex. 284 | 255 | GHH6 | GEH2 | 4.31 | 128 | 128 |
| Ex. 285 | 255 | GHH6 | GEH3 | 4.25 | 120 | 123 |
| Ex. 286 | 255 | GHH6 | GEH4 | 4.27 | 123 | 122 |
| Ex. 287 | 255 | GHH6 | GEH5 | 4.38 | 124 | 125 |
| Ex. 288 | 255 | GHH6 | GEH6 | 4.21 | 124 | 122 |

As indicated in Table 24, in the OLEDs in which the EML included the host and the dopant of the present disclosure, the driving voltage was reduced and EQE and luminous lifespan ($LT_{95}$) were greatly improved.

Examples 289-298 (Ex. 289-298): Fabrication of OLED

An OLED was fabricated using the same procedure and the same material as Example 1, except that each of Compounds 256, 257, 1, 2 and 27 was used as the dopant, GHH1 of Formula 8 was used as the first host, and GEH2 or GEH4 of Formula 10 was used as the second host, as indicated in the following Table 25, in the EML.

Comparative Examples 6-10 (Ref. 6-10): Fabrication of OLED

An OLED was fabricated using the same procedure and the same material as each of Examples 289-298 except that CBP as a sole host, as indicated in the following Table 25, was used in the EML.

Experimental Example 25: Measurement of Luminous Properties OLED

Optical properties for each of the OLED fabricated in Examples 289 to 298 and Comparative Examples 6 to 10 were measured using the same procedures as Experimental Example 1. The measurement results are indicated in the following Table 25.

TABLE 25

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 6 | 256 | CBP | | 4.32 | 100 | 100 |
| Ex. 289 | 256 | GHH1 | GEH2 | 4.14 | 134 | 129 |
| Ex. 290 | 256 | GHH1 | GEH4 | 4.24 | 128 | 126 |
| Ref. 7 | 257 | CBP | | 4.39 | 100 | 100 |
| Ex. 291 | 257 | GHH1 | GEH2 | 4.16 | 134 | 132 |
| Ex. 292 | 257 | GHH1 | GEH4 | 4.20 | 133 | 125 |
| Ref. 8 | 1 | CBP | | 4.24 | 100 | 100 |
| Ex. 293 | 1 | GHH1 | GEH2 | 4.07 | 135 | 127 |
| Ex. 294 | 1 | GHH1 | GEH4 | 4.06 | 131 | 125 |
| Ref. 9 | 2 | CBP | | 4.26 | 100 | 100 |
| Ex. 295 | 2 | GHH1 | GEH2 | 4.06 | 135 | 131 |
| Ex. 296 | 2 | GHH1 | GEH4 | 4.10 | 133 | 125 |
| Ref. 10 | 27 | CBP | | 4.32 | 100 | 100 |
| Ex. 297 | 27 | GHH1 | GEH2 | 4.03 | 133 | 128 |
| Ex. 298 | 27 | GHH1 | GEH4 | 4.15 | 132 | 128 |

As indicated in Table 25, in the OLEDs in which the EML included the host and the dopant of the present disclosure, the driving voltage was reduced and EQE and luminous lifespan ($LT_{95}$) were greatly improved.

Examples 299-308 (Ex. 299-308): Fabrication of OLED

An OLED was fabricated using the same procedure and the same material as Example 1, except that each of Compounds 16, 17, 32, 34 and 35 was used as the dopant, GHH1 of Formula 8 was used as the first host, and GEH2 or GEH4 of Formula 10 was used as the second host, as indicated in the following Table 26, in the EML.

Comparative Examples 11-15 (Ref 11-15): Fabrication of OLED

An OLED was fabricated using the same procedure and the same material as each of Examples 299-308 except that CBP as a sole host, as indicated in the following Table 26, was used in the EML.

Experimental Example 26: Measurement of Luminous Properties OLED

Optical properties for each of the OLED fabricated in Examples 299 to 308 and Comparative Examples 11 to 15 were measured using the same procedures as Experimental Example 1. The measurement results are indicated in the following Table 26.

TABLE 26

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 11 | 16 | CBP | | 4.26 | 100 | 100 |
| Ex. 299 | 16 | GHH1 | GEH2 | 4.11 | 134 | 129 |
| Ex. 300 | 16 | GHH1 | GEH4 | 4.02 | 134 | 128 |
| Ref. 12 | 17 | CBP | | 4.26 | 100 | 100 |
| Ex. 301 | 17 | GHH1 | GEH2 | 4.12 | 138 | 129 |
| Ex. 302 | 17 | GHH1 | GEH4 | 4.04 | 130 | 126 |
| Ref. 13 | 32 | CBP | | 4.43 | 100 | 100 |
| Ex. 303 | 32 | GHH1 | GEH2 | 4.15 | 138 | 130 |
| Ex. 304 | 32 | GHH1 | GEH4 | 4.09 | 131 | 127 |

TABLE 26-continued

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 14 | 34 | CBP | | 4.36 | 100 | 100 |
| Ex. 305 | 34 | GHH1 | GEH2 | 4.11 | 138 | 130 |
| Ex. 306 | 34 | GHH1 | GEH4 | 4.14 | 131 | 124 |
| Ref. 15 | 35 | CBP | | 4.36 | 100 | 100 |
| Ex. 307 | 35 | GHH1 | GEH2 | 4.21 | 136 | 129 |
| Ex. 308 | 35 | GHH1 | GEH4 | 4.18 | 127 | 129 |

As indicated in Table 26, in the OLEDs in which the EML included the host and the dopant of the present disclosure, the driving voltage was reduced and EQE and luminous lifespan ($LT_{95}$) were greatly improved.

Examples 309-318 (Ex. 309-318): Fabrication of OLED

An OLED was fabricated using the same procedure and the same material as Example 1, except that each of Compounds 136, 137, 142, 148 and 147 was used as the dopant, GHH1 of Formula 8 was used as the first host, and GEH2 or GEH4 of Formula 10 was used as the second host, as indicated in the following Table 27, in the EML.

Comparative Examples 16-20 (Ref 16-20): Fabrication of OLED

An OLED was fabricated using the same procedure and the same material as each of Examples 309-318 except that CBP as a sole host, as indicated in the following Table 27, was used in the EML.

Experimental Example 27: Measurement of Luminous Properties OLED

Optical properties for each of the OLED fabricated in Examples 309 to 318 and Comparative Examples 16 to 20 were measured using the same procedures as Experimental Example 1. The measurement results are indicated in the following Table 27.

TABLE 27

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 16 | 136 | CBP | | 4.22 | 100 | 100 |
| Ex. 309 | 136 | GHH1 | GEH2 | 4.05 | 134 | 132 |
| Ex. 310 | 136 | GHH1 | GEH4 | 4.02 | 130 | 125 |
| Ref. 17 | 137 | CBP | | 4.26 | 100 | 100 |
| Ex. 311 | 137 | GHH1 | GEH2 | 4.06 | 134 | 125 |
| Ex. 312 | 137 | GHH1 | GEH4 | 4.04 | 130 | 127 |
| Ref. 18 | 142 | CBP | | 4.32 | 100 | 100 |
| Ex. 313 | 142 | GHH1 | GEH2 | 4.09 | 139 | 130 |
| Ex. 314 | 142 | GHH1 | GEH4 | 4.18 | 128 | 128 |
| Ref. 19 | 148 | CBP | | 4.34 | 100 | 100 |
| Ex. 315 | 148 | GHH1 | GEH2 | 4.15 | 137 | 132 |
| Ex. 316 | 148 | GHH1 | GEH4 | 4.10 | 131 | 127 |
| Ref. 20 | 147 | CBP | | 4.30 | 100 | 100 |
| Ex. 317 | 147 | GHH1 | GEH2 | 4.08 | 134 | 130 |
| Ex. 318 | 147 | GHH1 | GEH4 | 4.16 | 131 | 127 |

As indicated in Table 27, in the OLEDs in which the EML included the host and the dopant of the present disclosure, the driving voltage was reduced and EQE and luminous lifespan ($LT_{95}$) were greatly improved.

Examples 319-328 (Ex. 319-328): Fabrication of OLED

An OLED was fabricated using the same procedure and the same material as Example 1, except that each of Compounds 251-255 (10 wt %) was used as the dopant, and GHH1 or GHH2 (90 wt %) of Formula 8 was used as the sole host, as indicated in the following Table 28, in the EML.

Comparative Examples 21-25 (Ref 21-25): Fabrication of OLED

An OLED was fabricated using the same procedure and the same material as each of Examples 319-328 except that CBP as the sole host, as indicated in the following Table 28, was used in the EML.

Experimental Example 28: Measurement of Luminous Properties OLED

Optical properties for each of the OLED fabricated in Examples 319 to 328 and Comparative Examples 21 to 25 were measured using the same procedures as Experimental Example 1. The measurement results are indicated in the following Table 28.

TABLE 28

| Luminous Properties of OLED | | | | | |
|---|---|---|---|---|---|
| | EML | | | | |
| Sample | Dopant | Host | Voltage (V) | EQE (%) | $LT_{95}$ (%) |
| Ref. 21 | 251 | CBP | 4.30 | 100 | 100 |
| Ex. 319 | 251 | GHH1 | 4.18 | 116 | 115 |
| Ex. 320 | 251 | GHH2 | 4.08 | 111 | 115 |
| Ref. 22 | 252 | CBP | 4.36 | 100 | 100 |
| Ex. 321 | 252 | GHH1 | 4.26 | 113 | 114 |
| Ex. 322 | 252 | GHH2 | 4.31 | 111 | 111 |
| Ref. 23 | 253 | CBP | 4.34 | 100 | 100 |
| Ex. 323 | 253 | GHH1 | 4.29 | 116 | 115 |
| Ex. 324 | 253 | GHH2 | 4.39 | 110 | 116 |
| Ref. 24 | 254 | CBP | 4.32 | 100 | 100 |
| Ex. 325 | 254 | GHH1 | 4.11 | 111 | 118 |
| Ex. 326 | 254 | GHH2 | 4.27 | 109 | 113 |
| Ref. 25 | 255 | CBP | 4.36 | 100 | 100 |
| Ex. 327 | 255 | GHH1 | 4.21 | 113 | 114 |
| Ex. 328 | 255 | GHH2 | 4.37 | 111 | 113 |

As indicated in Table 28, in the OLEDs in which the EML included the host and the dopant of the present disclosure, the driving voltage was reduced and EQE and luminous lifespan ($LT_{95}$) were greatly improved.

Examples 329-338 (Ex. 329-338): Fabrication of OLED

An OLED was fabricated using the same procedure and the same material as Example 1, except that each of Compounds 256, 257, 1, 2 and 27 (10 wt %) was used as the dopant, and GHH1 or GHH2 (90 wt %) of Formula 8 was used as the sole host, as indicated in the following Table 29, in the EML.

Comparative Examples 26-30 (Ref 26-30): Fabrication of OLED

An OLED was fabricated using the same procedure and the same material as each of Examples 329-338 except that CBP as the sole host, as indicated in the following Table 29, was used in the EML.

Experimental Example 29: Measurement of Luminous Properties OLED

Optical properties for each of the OLED fabricated in Examples 329 to 338 and Comparative Examples 26 to 30 were measured using the same procedures as Experimental Example 1. The measurement results are indicated in the following Table 29.

TABLE 29

Luminous Properties of OLED

| Sample | EML Dopant | EML Host | Voltage (V) | EQE (%) | $LT_{95}$ (%) |
|---|---|---|---|---|---|
| Ref. 26 | 256 | CBP | 4.32 | 100 | 100 |
| Ex. 329 | 256 | GHH1 | 4.21 | 113 | 115 |
| Ex. 330 | 256 | GHH2 | 4.25 | 106 | 115 |
| Ref. 27 | 257 | CBP | 4.39 | 100 | 100 |
| Ex. 331 | 257 | GHH1 | 4.27 | 113 | 119 |
| Ex. 332 | 257 | GHH2 | 4.23 | 112 | 114 |
| Ref. 28 | 1 | CBP | 4.24 | 100 | 100 |
| Ex. 333 | 1 | GHH1 | 4.10 | 115 | 115 |
| Ex. 334 | 1 | GHH2 | 4.23 | 109 | 111 |
| Ref. 29 | 2 | CBP | 4.26 | 100 | 100 |
| Ex. 335 | 2 | GHH1 | 4.20 | 115 | 116 |
| Ex. 336 | 2 | GHH2 | 4.22 | 110 | 114 |
| Ref. 30 | 27 | CBP | 4.32 | 100 | 100 |
| Ex. 337 | 27 | GHH1 | 4.21 | 115 | 116 |
| Ex. 338 | 27 | GHH2 | 4.29 | 111 | 111 |

As indicated in Table 29, in the OLEDs in which the EML included the host and the dopant of the present disclosure, the driving voltage was reduced and EQE and luminous lifespan ($LT_{95}$) were greatly improved.

Examples 339-348 (Ex. 339-348): Fabrication of OLED

An OLED was fabricated using the same procedure and the same material as Example 1, except that each of Compounds 16, 17, 32, 34 and 35 (10 wt %) was used as the dopant, and GHH1 or GHH2 (90 wt %) of Formula 8 was used as the sole host, as indicated in the following Table 30, in the EML.

Comparative Examples 31-35 (Ref 31-35): Fabrication of OLED

An OLED was fabricated using the same procedure and the same material as each of Examples 339-348 except that CBP as the sole host, as indicated in the following Table 30, was used in the EML.

Experimental Example 30: Measurement of Luminous Properties OLED

Optical properties for each of the OLED fabricated in Examples 339 to 348 and Comparative Examples 31 to 35 were measured using the same procedures as Experimental Example 1. The measurement results are indicated in the following Table 30.

TABLE 30

Luminous Properties of OLED

| Sample | EML Dopant | EML Host | Voltage (V) | EQE (%) | $LT_{95}$ (%) |
|---|---|---|---|---|---|
| Ref 31 | 16 | CBP | 4.26 | 100 | 100 |
| Ex. 339 | 16 | GHH1 | 4.16 | 113 | 116 |
| Ex. 340 | 16 | GHH2 | 4.18 | 112 | 116 |
| Ref. 32 | 17 | CBP | 4.26 | 100 | 100 |
| Ex. 341 | 17 | GHH1 | 4.11 | 116 | 115 |
| Ex. 342 | 17 | GHH2 | 4.15 | 110 | 113 |
| Ref. 33 | 32 | CBP | 4.43 | 100 | 100 |
| Ex. 343 | 32 | GHH1 | 4.34 | 114 | 116 |
| Ex. 344 | 32 | GHH2 | 4.32 | 109 | 114 |
| Ref. 34 | 34 | CBP | 4.36 | 100 | 100 |
| Ex. 345 | 34 | GHH1 | 4.20 | 114 | 115 |
| Ex. 346 | 34 | GHH2 | 4.34 | 112 | 113 |
| Ref. 35 | 35 | CBP | 4.36 | 100 | 100 |
| Ex. 347 | 35 | GHH1 | 4.19 | 112 | 118 |
| Ex. 348 | 35 | GHH2 | 4.35 | 107 | 113 |

As indicated in Table 30, in the OLEDs in which the EML included the host and the dopant of the present disclosure, the driving voltage was reduced and EQE and luminous lifespan ($LT_{95}$) were greatly improved.

Examples 349-358 (Ex. 349-358): Fabrication of OLED

An OLED was fabricated using the same procedure and the same material as Example 1, except that each of Compounds 136, 137, 142, 148 and 147 (10 wt %) was used as the dopant, and GHH1 or GHH2 (90 wt %) of Formula 8 was used as the sole host, as indicated in the following Table 31, in the EML.

Comparative Examples 36-40 (Ref 36-40): Fabrication of OLED

An OLED was fabricated using the same procedure and the same material as each of Examples 349-358 except that CBP as a sole host, as indicated in the following Table 31, was used in the EML.

Experimental Example 31: Measurement of Luminous Properties OLED

Optical properties for each of the OLED fabricated in Examples 349 to 358 and Comparative Examples 36 to 40 were measured using the same procedures as Experimental Example 1. The measurement results are indicated in the following Table 31.

TABLE 31

Luminous Properties of PLED

| Sample | EML Dopant | EML Host | Voltage (V) | EQE (%) | $LT_{95}$ (%) |
|---|---|---|---|---|---|
| Ref 36 | 136 | CBP | 4.22 | 100 | 100 |
| Ex. 349 | 136 | GHH1 | 4.04 | 112 | 115 |
| Ex. 350 | 136 | GHH2 | 4.21 | 110 | 112 |
| Ref. 37 | 137 | CBP | 4.26 | 100 | 100 |
| Ex. 351 | 137 | GHH1 | 4.13 | 112 | 113 |
| Ex. 352 | 137 | GHH2 | 4.31 | 109 | 112 |
| Ref. 38 | 142 | CBP | 4.32 | 100 | 100 |
| Ex. 353 | 142 | GHH1 | 4.20 | 117 | 117 |
| Ex. 354 | 142 | GHH2 | 4.29 | 109 | 112 |

TABLE 31-continued

| Luminous Properties of PLED | | | | | |
|---|---|---|---|---|---|
| | EML | | | | |
| Sample | Dopant | Host | Voltage (V) | EQE (%) | $LT_{95}$ (%) |
| Ref. 39 | 148 | CBP | 4.34 | 100 | 100 |
| Ex. 355 | 148 | GHH1 | 4.21 | 114 | 115 |
| Ex. 356 | 148 | GHH2 | 4.29 | 111 | 114 |
| Ref. 40 | 147 | CBP | 4.30 | 100 | 100 |
| Ex. 357 | 147 | GHH1 | 4.32 | 116 | 115 |
| Ex. 358 | 147 | GHH2 | 4.29 | 108 | 116 |

As indicated in Table 31, in the OLEDs in which the EML included the host and the dopant of the present disclosure, the driving voltage was reduced and EQE and luminous lifespan ($LT_{95}$) were greatly improved.

In summary, as shown in Tables 1-31, it may be possible to implement an OLED that may have a lower driving voltage and improved luminous efficiency and luminous lifespan by introducing the host and the dopant in accordance with the present disclosure.

It will be apparent to those skilled in the art that various modifications and variations may be made in the present disclosure without departing from the scope of the invention. Thus, it is intended that the present disclosure cover the modifications and variations of the present disclosure provided they come within the scope of the appended claims.

What is claimed is:

1. An organic light emitting diode including:

a first electrode;

a second electrode facing the first electrode; and an emissive layer disposed between the first and second electrodes and including at least one emitting material layer including:

a host including:

a first host having a structure represented by Formula 7, and a second host having a structure represented by Formula 9, and a dopant including an organometallic compound having a structure represented by Formula 1:

wherein:

Formula 1 is:

[Formula 1]

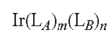

where in Formula 1, $L_A$ has a structure represented by Formula 2;

$L_B$ is an auxiliary ligand having a structure represented by Formula 5A or Formula 5B;

m is 1, 2 or 3;

n is 0, 1 or 2; and m+n is 3;

Formula 2 is:

[Formula 2]

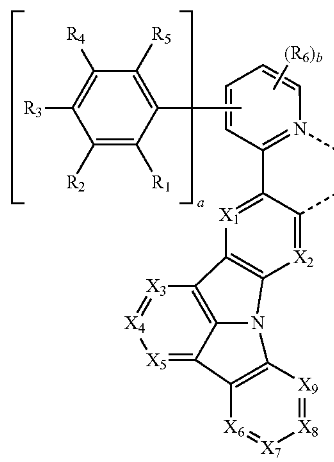

where in Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently $CR_9$ or N and at least one of $X_6$ to $X_9$ is $CR_9$;

each of $R_1$ to $R_9$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and where each $R_6$ is identical to or different from each other when b is 2, 3 or 4;

optionally, two adjacent R moieties among $R_1$ to $R_5$, and/or two adjacent $R_6$ when b is 2, 3 or 4, and/or $X_3$ and $X_4$ or $X_4$ and $X_5$, and/or $X_6$ and $X_7$, $X_7$ and $X_8$, or $X_8$ and $X_9$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is 0, 1 or 2;

b is 0, 1, 2, 3 or 4, and a+b is no more than 4,

Formula 5A or 5B is:

[Formula 5A]

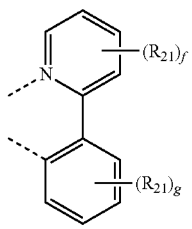

[Formula 5B]

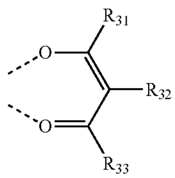

where in Formulae 5A and 5B, each of $R_{21}$, $R_{22}$ and $R_{31}$ to $R_{33}$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{21}$ when f is 2, 3 or 4, and/or two adjacent $R_{22}$ when g is 2, 3 or 4 and/or $R_{31}$ and $R_{32}$ or $R_{32}$ and $R_{33}$ are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring; and each of f and g is 0, 1, 2, 3 or 4, Formula 7 is:

[Formula 7]

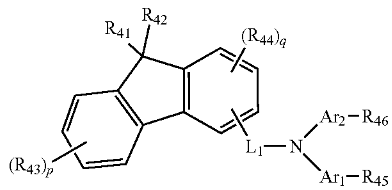

where in Formula 7, each of $R_{41}$ and $R_{42}$ is independently hydrogen, deuterium, unsubstituted or substituted $C_1$-$C_{20}$ alkyl, unsubstituted or substituted $C_6$-$C_{30}$ aryl or unsubstituted or substituted $C_3$-$C_{30}$ hetero aryl, optionally, each substituent on the substituted $C_6$-$C_{30}$ aryl and substituted $C_3$-$C_{30}$ hetero aryl is independently unsubstituted or further substituted with at least one of $C_6$-$C_{30}$ aryl and $C_3$-$C_{30}$ hetero aryl, optionally, $R_{41}$ and $R_{42}$ form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the substituted $C_6$-$C_{30}$ aryl, substituted $C_3$-$C_{30}$ hetero aryl, substituted $C_6$-$C_{30}$ aryl amino and substituted $C_3$-$C_{30}$ hetero aryl amino is independently unsubstituted or further substituted with at least one of $C_6$-$C_{30}$ aryl and $C_3$-$C_{30}$ hetero aryl, wherein each $R_{43}$ is identical to or different from each other when p is an integer of 2 or more and each $R_{44}$ is identical to or different from each other when q is an integer of 2 or more;

$L_1$ is a single bond, unsubstituted or substituted $C_6$-$C_{30}$ arylene or unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3,

Formula 9 is:

[Formula 9]

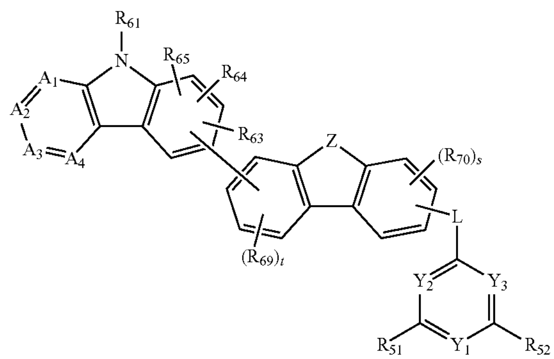

where in Formula 9, each of $R_{51}$, $R_{52}$ and $R_{61}$ is independently an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl or the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{53}$ or N, where at least one of $Y_1$, $Y_2$ and $Y_3$ is N;

$R_{53}$ is independently protium, deuterium, tritium, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $A_1$ to $A_4$ is independently $CR_{62}$ or N, where at least one of $A_1$ to $A_4$ is $CR_{62}$;

when two adjacent $R_{62}$ and/or two adjacent groups among $R_{63}$ to $R_{65}$ do not form a ring, each of $R_{62}$ to $R_{65}$ is independently protium, deuterium, tritium, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, optionally, two adjacent $R_{62}$ and/or two adjacent R moieties among $R_{63}$ to $R_{65}$ are further linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

when two adjacent $R_{69}$ when r is an integer of 2 or more and/or two adjacent $R_{70}$ when s is an integer of 2 or more do not form a ring, each of $R_{69}$ and $R_{70}$ is independently hydrogen, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, where each $R_{69}$ is identical to or different from each other when r is 2 or 3 and each $R_{70}$ is identical to or different from each other when s is 2 or 3, optionally, two adjacent $R_{69}$ when r is 2 or 3, and/or two adjacent $R_{70}$ when s is 2 or 3 are further linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

L is a single bond, an unsubstituted or substituted $C_6$-$C_{30}$ arylene or an unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

Z is O or S; and each of r and s is independently 0, 1, 2 or 3.

2. The organic light emitting diode of claim 1, wherein $L_A$ has a structure represented by Formula 4A or Formula 4B:

[Formula 4A]

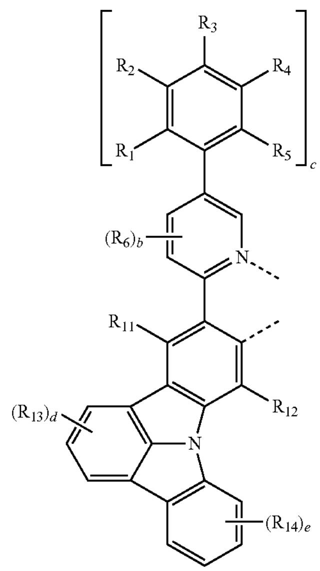

[Formula 4B]

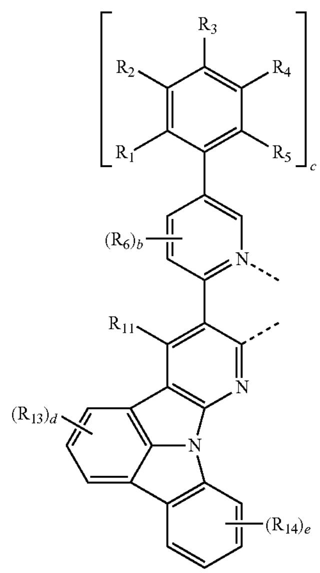

where in Formulae 4A and 4B, each of $R_1$ to $R_6$ and b is as defined in Formula 2;

each of $R_{11}$ to $R_{14}$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is 2 or 3, and/or two adjacent $R_{14}$ when e is 2, 3 or 4 are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is 0 or 1, and b+c is no more than 4;

d is 0, 1, 2 or 3; and e is 0, 1, 2, 3 or 4.

3. The organic light emitting diode of claim 1, wherein $L_A$ has a structure represented by Formula 4C or Formula 4D:

[Formula 4C]

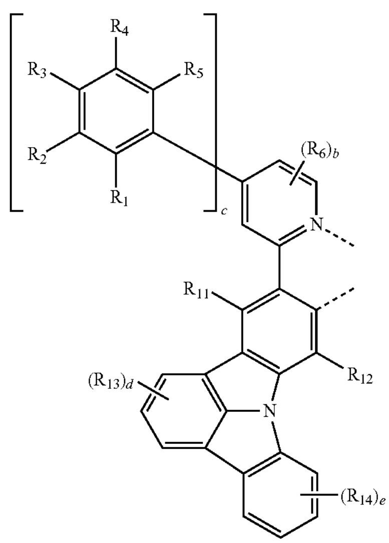

[Formula 4D]

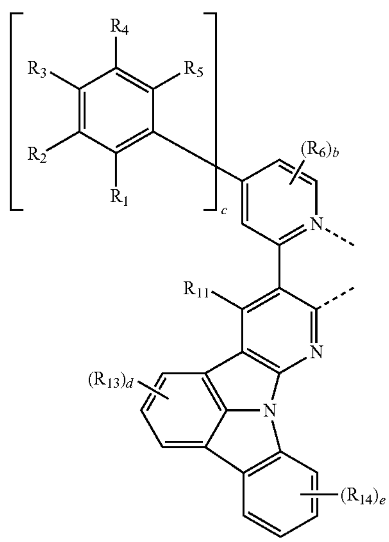

where in Formulae 4C and 4D, each of $R_1$ to $R_6$ and b is as defined in Formula 2;

each of $R_{11}$ to $R_{14}$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is 2 or 3, and/or two adjacent $R_{14}$ when e is 2, 3 or 4 are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is 0 or 1, and b+c is no more than 4;

d is 0, 1, 2 or 3; and e is 0, 1, 2, 3 or 4.

4. The organic light emitting diode of claim 1, wherein $X_1$ is $CR_7$, $X_2$ is $CR_7$ or N, each of $X_3$ to $X_5$ is independently $CR_8$ and each of $X_6$ to $X_9$ is independently $CR_9$, each of $R_7$ to $R_9$ is the same as defined in Formula 2.

5. The organic light emitting diode of claim 1, wherein the emissive layer includes:

a first emitting part disposed between the first and second electrodes and including a first emitting material layer;

a second emitting part disposed between the first emitting part and the second electrode and including a second emitting material layer; and a first charge generation layer disposed between the first and second emitting parts, wherein at least one of the first emitting material layer and the second emitting material layer includes the host and the dopant.

6. The organic light emitting diode of claim 5, wherein the second emitting material layer includes:

a first layer disposed between the first charge generation layer and the second electrode, and a second layer disposed between the first layer and the second electrode, wherein one of the first layer and the second layer includes the host and the dopant.

7. The organic light emitting diode of claim 6, wherein the second emitting material layer further includes a third layer disposed between the first layer and the second layer.

8. The organic light emitting diode of claim 5, wherein the emissive layer further includes:

a third emitting part disposed between the second emitting part and the second electrode and including a third emitting material layer, and a second charge generation layer disposed between the second and third emitting parts.

9. The organic light emitting diode of claim 8, wherein the second emitting material layer includes:

a first layer disposed between the first charge generation layer and the second electrode, and a second layer disposed between the first layer and the second electrode, wherein one of the first layer and the second layer includes the host and the dopant.

10. An organic light emitting device, including:
a substrate; and
the organic light emitting diode of claim 1 disposed on the substrate.
11. The organic light emitting diode of claim 1, wherein the organometallic compound includes at least one selected from the following compounds:
1
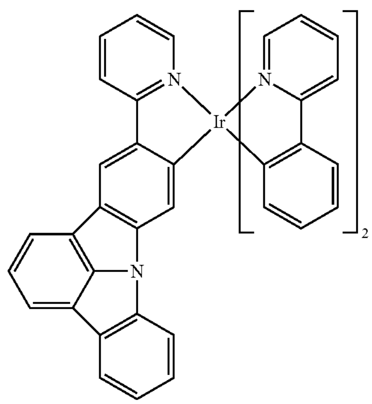
2
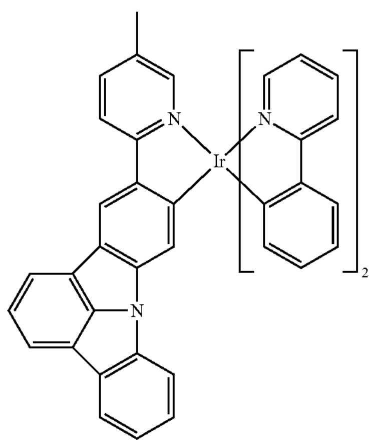
16
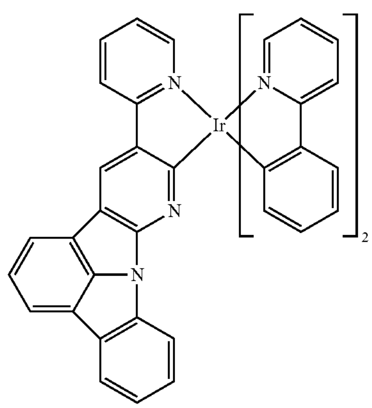
-continued
17
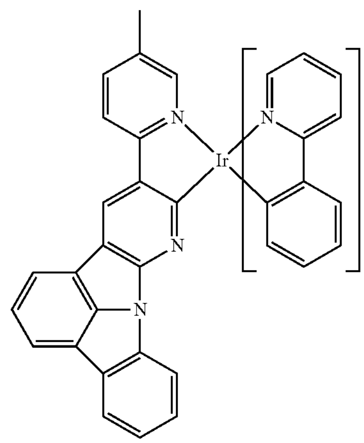
27
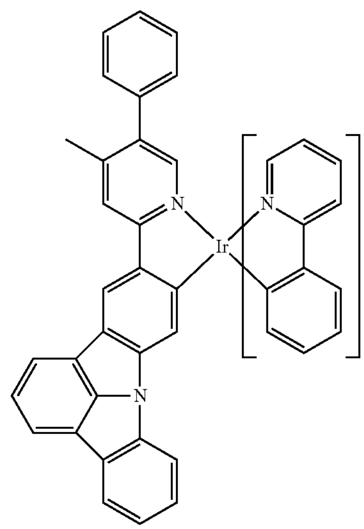
32
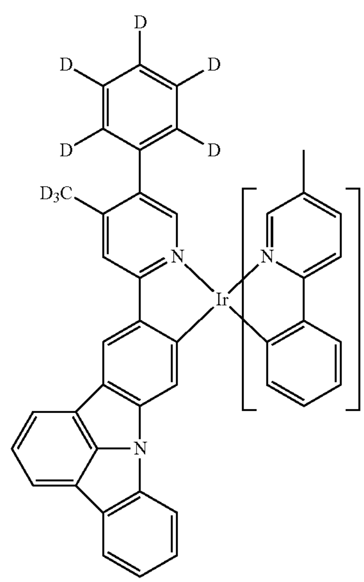

34
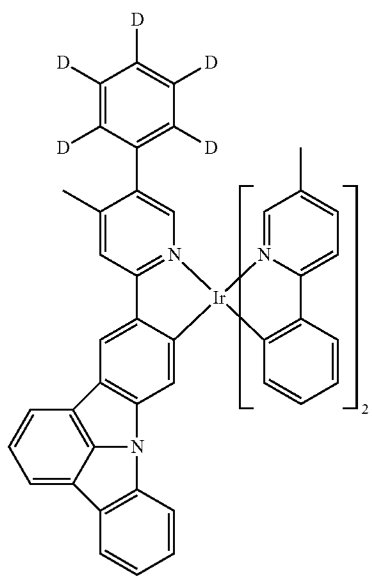
35
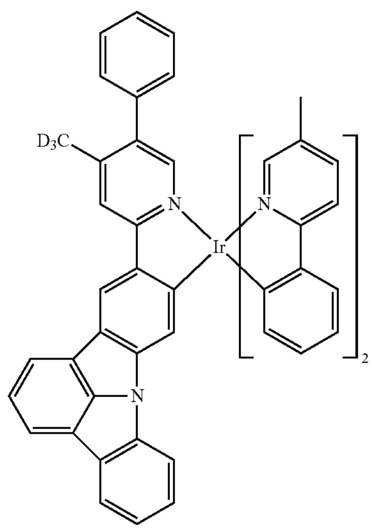
136
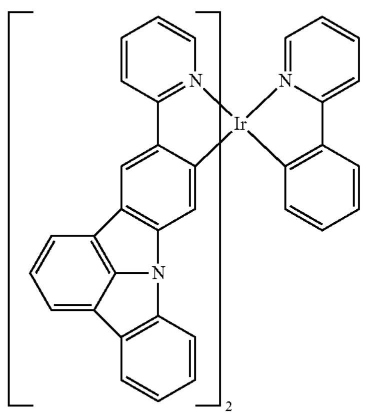
251
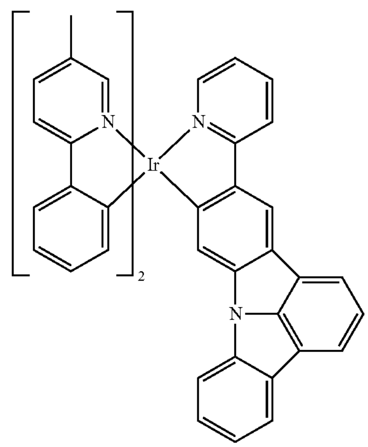
252
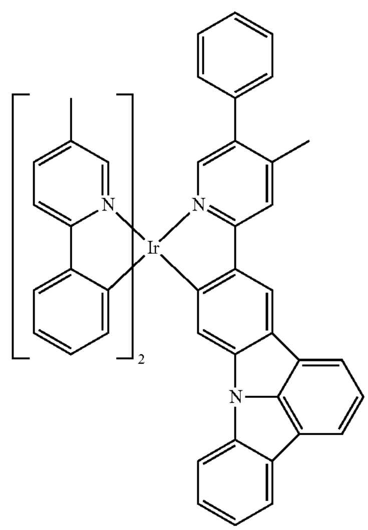
253
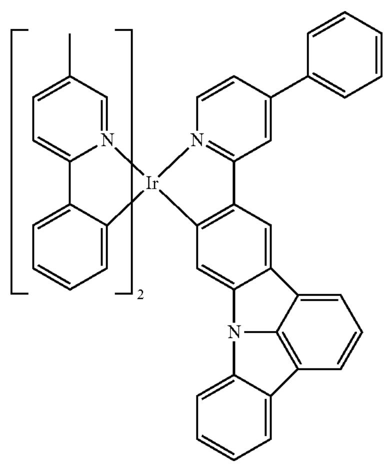

-continued

254

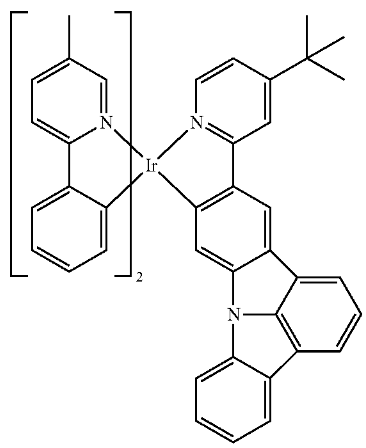

255

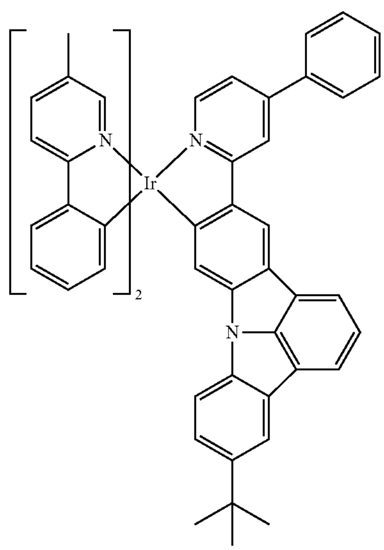

256

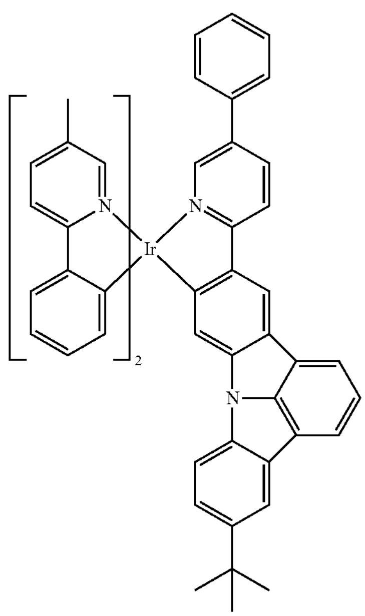

12. The organic light emitting diode of claim 1, wherein the first host includes the following compound:

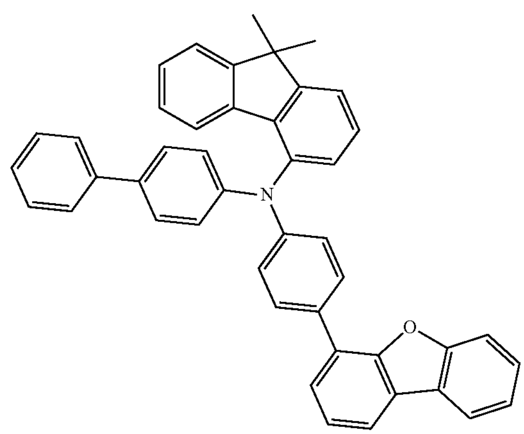

GHH1

13. The organic light emitting diode of claim 1, wherein the second host includes the following compound:

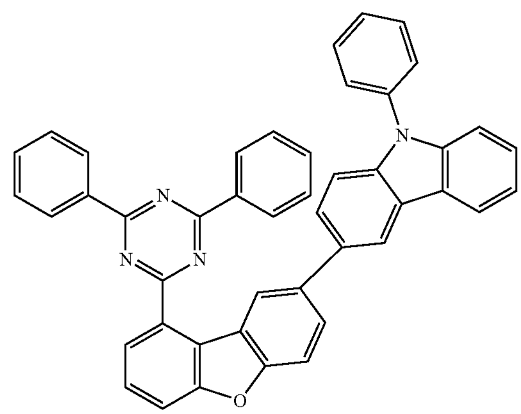

GEH2

14. An organic light emitting diode including:

a first electrode;

a second electrode facing the first electrode; and an emissive layer disposed between the first and second electrodes, the emissive layer includes:

a first emitting part disposed between the first and second electrodes and including a blue emitting material layer;

a second emitting part disposed between the first emitting part and the second electrode and including at least one emitting material layer; and a first charge generation layer disposed between the first and second emitting parts, wherein:

the at least one emitting material layer includes:

a host including:

a first host having a structure represented by Formula 7, and a second host having a structure represented by Formula 9, and a dopant including an organometallic compound having a structure represented by Formula 1:

[Formula 1]

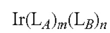

$Ir(L_A)_m(L_B)_n$ where in Formula 1, $L_A$ has a structure represented by Formula 2;

$L_B$ is an auxiliary ligand having a structure represented by Formula 5A or 5B;

m is 1, 2 or 3;

n is 0, 1 or 2; and m+n is 3;

Formula 2 is:

[Formula 2]

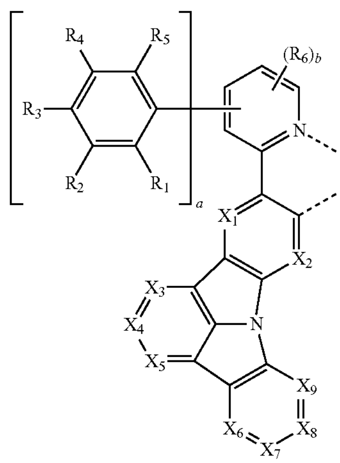

where in Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently $CR_9$ or N and at least one of $X_6$ to $X_9$ is $CR_9$;

each of $R_1$ to $R_9$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and where each $R_6$ is identical to or different from each other when b is 2, 3 or 4;

optionally, two adjacent R moieties among $R_1$ to $R_5$, and/or two adjacent $R_6$ when b is 2, 3 or 4, and/or $X_3$ and $X_4$ or $X_4$ and $X_5$, and/or $X_6$ and $X_7$, $X_7$ and $X_8$, or $X_8$ and $X_9$ are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is 0, 1 or 2;

b is 0, 1, 2, 3 or 4, and a+b is no more than 4,

Formula 5A or 5B is:

[Formula 5A]

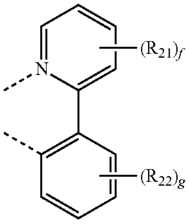

[Formula 5B]

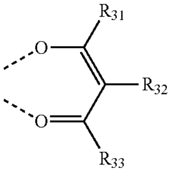

where in Formulae 5A and 5B, each of $R_{21}$, $R_{22}$ and $R_{31}$ to $R_{33}$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{21}$ when f is 2, 3 or 4, and/or two adjacent $R_{22}$ when g is 2, 3 or 4 and/or $R_{31}$ and $R_{32}$ or $R_{32}$ and $R_{33}$ are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring; and each of f and g is 0, 1, 2, 3 or 4, Formula 7 is:

[Formula 7]

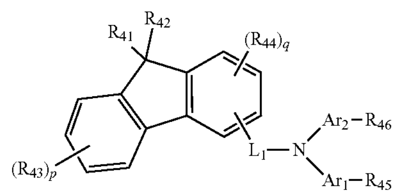

where in Formula 7, each of $R_{41}$ and $R_{42}$ is independently hydrogen, deuterium, unsubstituted or substituted $C_1$-$C_{20}$ alkyl, unsubstituted or substituted $C_6$-$C_{30}$ aryl or unsubstituted or substituted $C_3$-$C_{30}$ hetero aryl, optionally, each substituent on the substituted $C_6$-$C_{30}$ aryl and substituted $C_3$-$C_{30}$ hetero aryl is independently unsubstituted or further substituted with at least one of $C_6$-$C_{30}$ aryl and $C_3$-$C_{30}$ hetero aryl, optionally, $R_{41}$ and $R_{42}$ form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the substituted $C_6$-$C_{30}$ aryl, substituted $C_3$-$C_{30}$ hetero aryl, substituted $C_6$-$C_{30}$ aryl amino and substituted $C_3$-$C_{30}$ hetero aryl amino is independently unsubstituted or further substituted with at least one of $C_6$-$C_{30}$ aryl and $C_3$-$C_{30}$ hetero aryl, wherein each $R_{43}$ is identical to or different from each other when p is an integer of 2 or more and each $R_{44}$ is identical to or different from each other when q is an integer of 2 or more;

L is a single bond, unsubstituted or substituted $C_6$-$C_{30}$ arylene or unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3,

Formula 9 is:

[Formula 9]

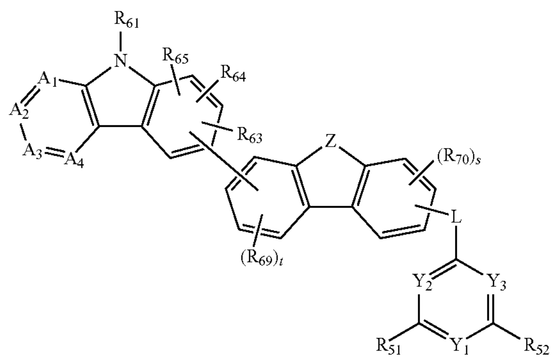

where in Formula 9, each of $R_{51}$, $R_{52}$ and $R_{61}$ is independently an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl or the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{53}$ or N, where at least one of $Y_1$, $Y_2$ and $Y_3$ is N;

$R_{53}$ is independently protium, deuterium, tritium, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $A_1$ to $A_4$ is independently $CR_{62}$ or N, where at least one of $A_1$ to $A_4$ is $CR_{62}$;

when two adjacent $R_{62}$ and/or two adjacent groups among $R_{63}$ to $R_{65}$ do not form a ring, each of $R_{62}$ to Ros is independently protium, deuterium, tritium, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, optionally, two adjacent $R_{62}$ and/or two adjacent R moieties among $R_{63}$ to $R_{65}$ are further linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

when two adjacent $R_{69}$ when r is an integer of 2 or more and/or two adjacent $R_{70}$ when s is an integer of 2 or more do not form a ring, each of $R_{69}$ and $R_{70}$ is independently hydrogen, an unsubstituted or substituted $C_1$-$C_{10}$ alkyl, an unsubstituted or substituted $C_6$-$C_{30}$ aryl or an unsubstituted or substituted $C_3$-$C_{30}$ hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring, where each $R_{69}$ is identical to or different from each other when r is 2 or 3 and each $R_{70}$ is identical to or different from each other when s is 2 or 3, optionally, two adjacent $R_{69}$ when r is 2 or 3, and/or two adjacent $R_{70}$ when s is 2 or 3 are further linked together to form an unsubstituted or substituted $C_6$-$C_{30}$ aromatic ring or an unsubstituted or substituted $C_3$-$C_{30}$ hetero aromatic ring, optionally, each of the unsubstituted or substituted $C_6$-$C_{30}$ aromatic ring and the unsubstituted or substituted $C_3$-$C_{30}$ hetero aromatic ring independently forms a spiro structure with an unsubstituted or substituted $C_6$-$C_{20}$ aromatic ring or an unsubstituted or substituted $C_3$-$C_{20}$ hetero aromatic ring;

L is a single bond, an unsubstituted or substituted $C_6$-$C_{30}$ arylene or an unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

Z is O or S; and each of r and s is independently 0, 1, 2 or 3.

15. The organic light emitting diode of claim 14, wherein $L_A$ has a structure represented by Formula 4A or Formula 4B:

[Formula 4A]

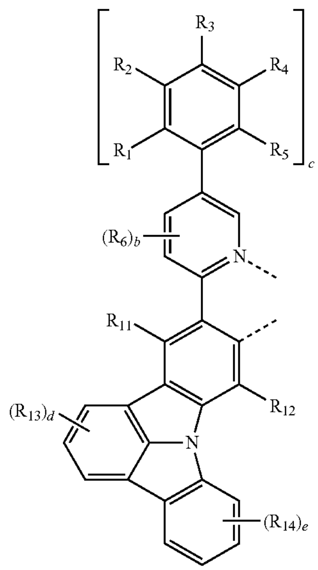

[Formula 4B]

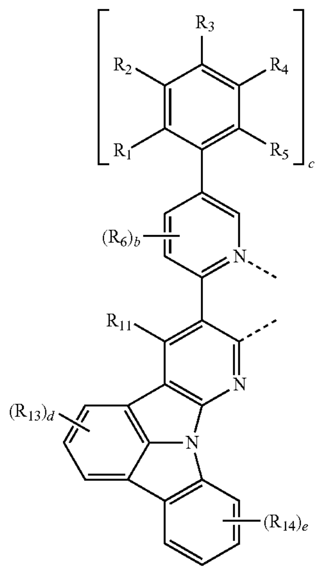

where in Formulae 4A and 4B, each of $R_1$ to $R_6$ and b is as defined in Formula 2;

each of $R_{11}$ to $R_{14}$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is 2 or 3, and/or two adjacent $R_{14}$ when e is 2, 3 or 4 are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is 0 or 1, and b+c is no more than 4;

d is 0, 1, 2 or 3; and e is 0, 1, 2, 3 or 4.

16. The organic light emitting diode of claim 14, wherein $L_A$ has a structure represented by Formula 4C or Formula 4D:

[Formula 4C]

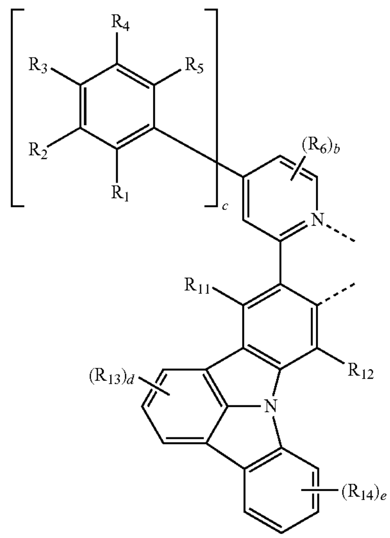

[Formula 4D]

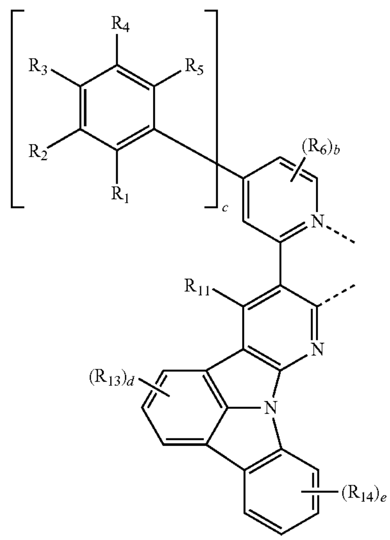

where in Formulae 4C and 4D, each of $R_1$ to $R_6$ and b is as defined in Formula 2;

each of $R_{11}$ to $R_{14}$ is independently protium, deuterium, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_1$-$C_{20}$ alkoxy, a carboxylic group, a nitrile, an isonitrile, a sulfanyl, a phosphine, an unsubstituted or substituted $C_1$-$C_{20}$ alkyl amino, an unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is 2 or 3, and/or two adjacent $R_{14}$ when e is 2, 3 or 4 are further linked together to form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is 0 or 1, and b+c is no more than 4;

d is 0, 1, 2 or 3; and e is 0, 1, 2, 3 or 4.

17. The organic light emitting diode of claim 14, wherein $X_1$ is $CR_7$, $X_2$ is $CR_7$ or N, each of $X_3$ to $X_5$ is independently $CR_8$ and each of $X_6$ to $X_9$ is independently $CR_9$, each of $R_7$ to $R_9$ is the same as defined in Formula 2.

18. The organic light emitting diode of claim 14, wherein the at least one emitting material layer further includes:

a first layer disposed between the first charge generation layer and the second electrode, the first layer including a red emitting material layer, and a second layer disposed between the first layer and the second electrode, the second layer including the host and the dopant.

19. The organic light emitting diode of claim 18, wherein the at least one emitting material layer further includes a third layer disposed between the first layer and the second layer, and wherein the third layer includes a yellow green emitting material layer.

20. The organic light emitting diode of claim 14, wherein the emissive layer further includes:

a third emitting part disposed between the second emitting part and the second electrode and including a blue emitting material layer, and a second charge generation layer disposed between the second and third emitting parts.

21. The organic light emitting diode of claim 20, wherein the at least one emitting material layer further includes:

a first layer disposed between the first charge generation layer and the second electrode, the first layer including a red emitting material layer, and a second layer disposed between the first layer and the second electrode, the second layer including the host and the dopant.

22. The organic light emitting diode of claim 21, wherein the at least one emitting material layer further includes a third layer disposed between the first layer and the second layer, wherein the third layer includes a yellow green emitting material layer.

23. An organic light emitting device, including:

a substrate; and the organic light emitting diode of claim 14 disposed on the substrate.

* * * * *